US012457863B2

(12) United States Patent
Dong

(10) Patent No.: US 12,457,863 B2
(45) Date of Patent: Oct. 28, 2025

(54) DISPLAY SUBSTRATE AND MANUFACTURING METHOD THEREOF, AND DISPLAY APPARATUS

(71) Applicant: BOE Technology Group Co., Ltd., Beijing (CN)

(72) Inventor: Tian Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1002 days.

(21) Appl. No.: 17/489,771

(22) Filed: Sep. 29, 2021

(65) Prior Publication Data

US 2022/0328600 A1 Oct. 13, 2022

Related U.S. Application Data

(63) Continuation-in-part of application No. 17/256,006, filed as application No. PCT/CN2020/124967 on Oct. 29, 2020, now Pat. No. 12,041,826.

(30) Foreign Application Priority Data

Oct. 29, 2019 (CN) ......................... 201911038883.4
Nov. 7, 2019 (CN) ......................... 201911082352.5

(51) Int. Cl.
*H10K 59/131* (2023.01)
*H10K 59/121* (2023.01)
*H10K 59/35* (2023.01)

(52) U.S. Cl.
CPC ....... *H10K 59/131* (2023.02); *H10K 59/1213* (2023.02); *H10K 59/1216* (2023.02); *H10K 59/353* (2023.02)

(58) Field of Classification Search
CPC ............. H10K 59/1216; H10K 59/124; H10K 59/126; H10K 59/131; H10K 71/00;
(Continued)

(56) References Cited

U.S. PATENT DOCUMENTS 8,004,178 B2 8/2011 Lee
8,144,086 B2 3/2012 Lee et al.
(Continued)

FOREIGN PATENT DOCUMENTS

CN 1455632 A 11/2003
CN 108010939 A 5/2018
(Continued)

OTHER PUBLICATIONS

International Search Report for PCT/CN2020/124967 Mailed Feb. 3, 2021.

(Continued)

*Primary Examiner* — Matthew E Warren
(74) *Attorney, Agent, or Firm* — Ling Wu; Stephen Yang; Ling and Yang Intellectual Property

(57) ABSTRACT

Disclosed are a display substrate and a manufacturing method thereof, and a display apparatus. The display substrate includes, in a plane parallel to the display substrate, a plurality of gate lines, a plurality of data lines, a plurality of power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers. The plurality of functional layers includes a semi-conductor layer, a first conductive layer, a second conductive layer, a third conductive layer and a fourth conductive layer which are sequentially arranged.

18 Claims, 55 Drawing Sheets

(58) Field of Classification Search
CPC ............... G09G 3/3233; G09G 3/3291; G09G 2300/0408; G09G 2300/0426
See application file for complete search history.

(56) References Cited

U.S. PATENT DOCUMENTS

| | | | | |
|---|---|---|---|---|
| 10,109,696 | B2 | 10/2018 | Zhang et al. | |
| 10,388,910 | B2 | 8/2019 | Bae et al. | |
| 10,529,793 | B2 | 1/2020 | Li | |
| 12,041,826 | B2 * | 7/2024 | Dong | H10K 59/124 |
| 2003/0205968 | A1 | 11/2003 | Chae et al. | |
| 2011/0241562 | A1 * | 10/2011 | Choi | H05B 45/60 315/291 |
| 2012/0105388 | A1 | 5/2012 | Han et al. | |
| 2016/0260781 | A1 | 9/2016 | Yang et al. | |
| 2018/0122881 | A1 | 5/2018 | Shin et al. | |
| 2018/0218684 | A1 * | 8/2018 | Choi | H10K 50/805 |
| 2018/0331171 | A1 | 11/2018 | Kim et al. | |
| 2020/0006401 | A1 | 1/2020 | Hwang et al. | |
| 2020/0075701 | A1 | 3/2020 | Song et al. | |
| 2020/0294446 | A1 | 9/2020 | Long | |
| 2020/0380903 | A1 | 12/2020 | Dong et al. | |
| 2020/0381495 | A1 * | 12/2020 | Jeon | H10K 59/38 |
| 2021/0020723 | A1 | 1/2021 | Park et al. | |
| 2021/0126075 | A1 * | 4/2021 | Wang | H10K 59/1213 |

FOREIGN PATENT DOCUMENTS

| | | | | |
|---|---|---|---|---|
| CN | 108376694 | A | 8/2018 | |
| CN | 108766988 | A | 11/2018 | |
| CN | 109256396 | A | 1/2019 | |
| CN | 208521584 | U | 2/2019 | |
| CN | 208753327 | U | 4/2019 | |
| CN | 109860259 | A | 6/2019 | |
| CN | 110162224 | A | 8/2019 | |
| CN | 110246864 | A | 9/2019 | |
| CN | 110690265 | A | 1/2020 | |
| CN | 110707139 | A | 1/2020 | |
| EP | 1755104 | A2 | 2/2007 | |
| KR | 20180089928 | A | 8/2018 | |
| KR | 102096051 | B1 * | 4/2020 | G09G 3/3233 |
| KR | 20210010717 | A | 1/2021 | |
| RU | 2669521 | C1 | 10/2018 | |
| WO | WO-2019203027 | A1 * | 10/2019 | G09G 3/3225 |
| WO | WO-2021035420 | A1 * | 3/2021 | G09G 3/3233 |

OTHER PUBLICATIONS

Office Action dated Jun. 25, 2021 for Chinese Patent Application No. 201911038883.4 and English Translation.

Office Action dated Apr. 7, 2022 for Korean Patent Application No. 10-2020-7036474 and English Translation.

Office Action dated Feb. 24, 2022 for Chinese Patent Application No. 201911038883.4 and English Translation.

European Search Report for 20824415.2 Mailed Oct. 16, 2023.

Office Action dated Sep. 19, 2023 for U.S. Appl. No. 17/256,006.

Office Action dated Jul. 23, 2025 for CN202111498970.5 and English Translation.

* cited by examiner

500

DISPLAY SUBSTRATE AND MANUFACTURING METHOD THEREOF, AND DISPLAY APPARATUS

CROSS-REFERENCE TO RELATED APPLICATION

The present application is a continuation-in-part application of the U.S. application Ser. No. 17/256,006, filed on Dec. 24, 2020 in the U.S. Patent and Trademark Office and entitled "Display Substrate and Manufacturing Method Thereof, and Display Apparatus", the contents of which should be regarded as being incorporated herein by reference.

TECHNICAL FIELD

The present application relates to the field of display technology, and particularly relates to a display substrate and a manufacturing method thereof, and a display apparatus.

BACKGROUND

An Organic Light-Emitting Device (OLED) display substrate is a display substrate different from a traditional Liquid Crystal Display (LCD), and has the advantages such as active light emission, good temperature characteristics, low power consumption, fast response, flexibility, ultra-thinness and low cost. Therefore, it has become one of the important developments and discoveries of new generation display apparatus and has attracted more and more attention.

In order to realize the high-frequency driving of an OLED display substrate, an OLED display substrate with dual data lines is proposed in the related art, that is, pixels in a single column are connected with two data lines. However, although an OLED display substrate in the related art can realize high-frequency driving, the resolution is generally low, which cannot meet the demand concerning high resolution of display devices on the market.

SUMMARY

The following is a summary of subject matter described in detail herein. This summary is not intended to limit the protection scope of the claims.

A display substrate is provided. The display substrate includes, in a plane parallel to the display substrate, a plurality of gate lines, a plurality of data lines, a plurality of power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers arranged on the base substrate. The plurality of functional layers includes a semiconductor layer, a first conductive layer, a second conductive layer, a third conductive layer and a fourth conductive layer which are sequentially arranged. A first insulating layer, a second insulating layer, a third insulating layer and a fourth insulating layer are respectively arranged between the plurality of functional layers. In an extension direction of the gate lines, the power lines are connected with each other through at least one functional layer.

In an exemplary implementation, in an extension direction of the data lines, the power lines include a plurality of sub-power lines connected sequentially, and at least one sub-power line is arranged in one sub-pixel; and a sub-power line of at least one sub-pixel includes a plurality of power supply parts connected sequentially, and there is an included angle of greater than 90 degrees and smaller than 180 degrees between at least one power supply part and a power supply part connected with the at least one power supply part.

In an exemplary implementation, one power supply part of the at least one power supply part and the power supply part connected with the at least one power supply part is arranged in parallel with the data lines.

In an exemplary implementation, the sub-power line includes a first power supply part, a second power supply part and a third power supply part; the second power supply part is configured to connect the first power supply part and the third power supply part, the first power supply part and the third power supply part are arranged in parallel with the data lines, an included angle between the second power supply part and the first power supply part is greater than 90 degrees and smaller than 180 degrees, and an included angle between the second power supply part and the third power supply part is greater than 90 degrees and smaller than 180 degrees.

In an exemplary implementation, the first power supply part is connected with a third power supply part in a sub-pixel located in a previous row in a column, and the third power supply part is connected with a first power supply part in a sub-pixel located in a next row in the same column.

In an exemplary implementation, an extension length of the first power supply part in the extension direction of the data lines is greater than an average width of the first power supply parts, an extension length of the second power supply part in an oblique direction is greater than an average width of the second power supply parts, and an extension length of the third power supply part in the extension direction of the data lines is greater than an average width of the third power supply parts. The oblique direction is a direction in which the second power supply part and the first power supply part have the included angle therebetween.

In an exemplary implementation, the average width of the third power supply parts is smaller than the average width of the first power supply parts.

In an exemplary implementation, a distance between an edge of the first power supply part close to a side of the third power supply part in the extension direction of the gate lines and an edge of the third power supply part close to a side of the first power supply part in the extension direction of the gate lines is equivalent to the average width of the third power supply parts.

In an exemplary implementation, the display substrate further includes a first connection part, a second electrode of a storage capacitor in at least one sub-pixel and a second electrode of a storage capacitor in an adjacent sub-pixel in the extension direction of the gate lines are connected with each other through the first connection part; in at least one sub-pixel, there is an overlapping area between an orthographic projection of the second power supply part on the base substrate and an orthographic projection of the second electrode of the storage capacitor on the base substrate, or there is an overlapping area between an orthographic projection of the second power supply part on the base substrate and an orthographic projection of the first connection part on the base substrate.

In an exemplary implementation, there is an overlapping area between the orthographic projection of the second power supply part on the base substrate and an orthographic projection of a first electrode of the storage capacitor on the base substrate.

In an exemplary implementation, there is an overlapping area between the orthographic projection of the second power supply part on the base substrate and an orthographic projection of the gate lines on the base substrate.

In an exemplary implementation, the plurality of transistors include a second transistor, and there is an overlapping area between an orthographic projection of the first power supply part on the base substrate and an orthographic projection of the second transistor on the base substrate.

In an exemplary implementation, the display substrate further includes a fifth insulating layer arranged on the fourth conductive layer and a fifth conductive layer arranged on the fifth insulating layer. The fifth insulating layer is provided with a fifth via configured to connect the fifth conductive layer with the fourth conductive layer. There is no overlapping area between an orthographic projection of the fifth via on the base substrate and an orthographic projection of the sub-power line on the base substrate.

In an exemplary implementation, in at least one sub-pixel, there is an overlapping area between an orthographic projection of the fifth via on the base substrate and an orthographic projection of a virtual extension line of the first power supply part in the sub-power line in the extension direction of the data lines on the base substrate.

In an exemplary implementation, the first insulating layer, the second insulating layer and the third insulating layer are provided with an eighth via configured to enable the data line to write a data signal to the semiconductor layer. There is no overlapping area between an orthographic projection of the eighth via on the base substrate and orthographic projections of the first power supply part and the second power supply part in the sub-power line on the base substrate.

In an exemplary implementation, in at least one sub-pixel, there is an overlapping area between the orthographic projection of the eighth via on the base substrate and an orthographic projection of a virtual extension line of the third power supply part in the sub-power line in the extension direction of the data lines on the base substrate.

In an exemplary implementation, the power lines are arranged on the third conductive layer or on the fourth conductive layer, and the power lines are arranged on a same layer as the data lines.

In an exemplary implementation, the power lines are arranged on the third conductive layer and the data lines are arranged on the fourth conductive layer, or the data lines are arranged on the third conductive layer and the power lines are arranged on the fourth conductive layer.

In an exemplary implementation, the display substrate further includes a first connection part. A second electrode of a storage capacitor in at least one sub-pixel and a second electrode of a storage capacitor in an adjacent sub-pixel in the extension direction of the gate lines are connected with each other through the first connection part.

In an exemplary implementation, there is at least one area including 2*4 sub-pixels. In one row, a second electrode of a storage capacitor in a first sub-pixel and a second electrode of a storage capacitor in a second sub-pixel are connected with each other through the first connection part, the second electrode of the storage capacitor in the second first sub-pixel is directly connected with a second electrode of a storage capacitor in a third sub-pixel, and the second electrode of the storage capacitor in the third sub-pixel and a second electrode of a storage capacitor in a fourth sub-pixel are connected with each other through the first connection part. In the other row, a second electrode of a storage capacitor in a first sub-pixel is directly connected with a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is directly connected with a second electrode of a storage capacitor in a fourth sub-pixel.

In an exemplary implementation, a semiconductor layer in a first sub-pixel is spaced apart from a semiconductor layer in a second sub-pixel, the semiconductor layer in the second sub-pixel is spaced apart from a semiconductor layer in a third sub-pixel, and the semiconductor layer in the third sub-pixel is spaced apart from a semiconductor layer in a fourth sub-pixel.

In an exemplary implementation, the third conductive layer includes a first pole of a fifth transistor. A first pole of a fifth transistor in a first sub-pixel is spaced apart from a first pole of a fifth transistor in a second sub-pixel, the first pole of the fifth transistor in the second sub-pixel is spaced apart from a first pole of a fifth transistor in a third sub-pixel, and the first pole of the fifth transistor in the third sub-pixel is spaced apart from a first pole of a fifth transistor in a fourth sub-pixel.

In an exemplary implementation, there is at least one area including 2*4 sub-pixels. In one row, a second electrode of a storage capacitor in a first sub-pixel and a second electrode of a storage capacitor in a second sub-pixel are connected with each other through the first connection part, the second electrode of the storage capacitor in the second sub-pixel is disconnected from a second electrode of a storage capacitor in a third sub-pixel, and the second electrode of the storage capacitor in the third sub-pixel and a second electrode of a storage capacitor in a fourth sub-pixel are connected with each other through the first connection part. In the other row, a second electrode of a storage capacitor in a first sub-pixel is disconnected from a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is disconnected from a second electrode of a storage capacitor in a fourth sub-pixel.

In an exemplary implementation, the third conductive layer includes a first pole of a fifth transistor and a second connection part. In one row, a first pole of a fifth transistor in a first sub-pixel is disconnected from a first pole of a fifth transistor in a second sub-pixel, the first pole of the fifth transistor in the second sub-pixel and a first pole of a fifth transistor in a third sub-pixel are connected with each other through the second connection part, and the first pole of the fifth transistor in the third sub-pixel is disconnected from a first pole of a fifth transistor in a fourth sub-pixel. In the other row, a first pole of a fifth transistor in a first sub-pixel and a first pole of a fifth transistor in a second sub-pixel are connected with each other through the second connection part, the first pole of the fifth transistor in the second sub-pixel is disconnected from a first pole of a fifth transistor in a third sub-pixel, and the first pole of the fifth transistor in the third sub-pixel and a first pole of a fifth transistor in a fourth sub-pixel are connected with each other through the second connection part.

In an exemplary implementation, in the extension direction of the gate lines, the power lines are connected with each other through the second electrodes of the storage capacitors and the first poles of the fifth transistors.

In an exemplary implementation, the fourth insulating layer is provided with first vias exposing the first poles of the fifth transistors, the third insulating layer is provided with second vias exposing the second electrodes of the storage capacitors, the power lines are connected with the first poles of the fifth transistors through the first vias, and the first poles of the fifth transistors are connected with the second electrodes of the storage capacitors through the second vias.

In an exemplary implementation, in at least one sub-pixel, there is one first via and a plurality of second vias, and the plurality of second vias are arranged in the extension direction of the data lines. The orthographic projection of the power lines on the base substrate includes an orthographic projection of the first via on the base substrate, and the orthographic projection of the first pole of the fifth transistor on the base substrate includes an orthographic projection of the second vias on the base substrate.

In an exemplary implementation, the semiconductor layer includes a third connection part. In one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel. In the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

In an exemplary implementation, in the extension direction of the gate lines, the power lines are connected with each other through the third connection part of the semiconductor layer and the second electrodes of the storage capacitors.

In an exemplary implementation, the third insulating layer is provided with eleventh vias exposing the second electrodes of the storage capacitors, and the first insulating layer, the second insulating layer and the third insulating layer are provided with twelfth vias exposing the third connection part of the semiconductor layer. The power lines are connected with the second electrodes of the storage capacitors through the eleventh vias, and the power lines are connected with the third connection part of the semiconductor layer through the twelfth vias.

In an exemplary implementation, in at least one sub-pixel, there is one eleventh via and a plurality of twelfth vias. The plurality of twelfth vias are arranged in the extension direction of the data lines. The orthographic projection of the power lines on the base substrate includes orthographic projections of the eleventh via and the twelfth vias on the base substrate.

In an exemplary implementation, the plurality of transistors include a first transistor, a second transistor, a third transistor, a fourth transistor, a fifth transistor, a sixth transistor and a seventh transistor. In at least one sub-pixel, the semiconductor layer at least includes a first active region at a position where the first transistor is located, a second active region at a position where the second transistor is located, a third active region at a position where the third transistor is located, a fourth active region at a position where the fourth transistor is located, a fifth active region at a position where the fifth transistor is located, a sixth active region at a position where the sixth transistor is located, and a seventh active region at a position where the seventh transistor is located. The first active region, the second active region, the third active region, the fourth active region, the fifth active region, the sixth active region and the seventh active region are an integrated structure.

In an exemplary implementation, a distance between the second active region and the first active region in the extension direction of the gate lines is smaller than a distance between the second active region and the seventh active region in the extension direction of the gate lines.

In an exemplary implementation, the seventh active region and the first active region are sequentially arranged in a direction from the data lines to the power lines in which data signals are written.

In an exemplary implementation, at least one sub-pixel includes a first region, a second region and a third region which are sequentially arranged in the extension direction of the data lines. The first active region and the seventh active region are arranged on a side of the first region away from the second region, the second active region and the fourth active region are arranged on a side of the first region close to the second region, the third active region is arranged in the second region, and the fifth active region and the sixth active region are arranged in the third region.

In an exemplary implementation, the first pole of the first transistor is connected with an initial signal line, the second pole of the first transistor is connected with the first electrode of the storage capacitor, the first pole of the second transistor is connected with the first electrode of the storage capacitor, the second pole of the second transistor is connected with the second pole of the sixth transistor, the first pole of the third transistor is connected with the second pole of the fourth transistor, the second pole of the third transistor is connected with the second pole of the sixth transistor, the first pole of the fourth transistor is connected with a data line, the first pole of the fifth transistor is connected with a power line, the second pole of the fifth transistor is connected with the first pole of the third transistor, the second pole of the sixth transistor is connected with an anode of a light-emitting device, the first pole of the seventh transistor is connected with an initial signal line, the second pole of the seventh transistor is connected with the anode of the light-emitting device; the first active region is respectively connected with the second active region and the seventh active region, the second active region is respectively connected with the third active region and the sixth active region, and the fourth active region is respectively connected with the third active region and the fifth active region.

In an exemplary implementation, semiconductor layers of adjacent sub-pixels are symmetrical with each other in the extension direction of the gate lines.

In an exemplary implementation, there is at least one area including 2*2 sub-pixels. A shape of a semiconductor layer in a first sub-pixel in one row is the same as a shape of a semiconductor layer in a second sub-pixel in the other row, and a shape of a semiconductor layer in a second sub-pixel in one row is the same as a shape of a semiconductor layer in a first sub-pixel in the other row.

In an exemplary implementation, the semiconductor layer includes a third connection part. A semiconductor layer in at least one sub-pixel is connected with a semiconductor layer in an adjacent sub-pixel in the extension direction of the gate lines through the third connection part.

In an exemplary implementation, the third connection part is connected with the active region of the fifth transistor.

In an exemplary implementation, there is an overlapping area between an orthographic projection of the third connection part on the base substrate and the orthographic projection of the power lines on the base substrate.

In an exemplary implementation, the first insulating layer, the second insulating layer and the third insulating layer are provided with twelfth vias exposing the third connection part, and the power lines are connected with the third connection part through the twelfth vias.

In an exemplary implementation, there is at least one area including 2*4 sub-pixels. In one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel. In the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

In an exemplary implementation, there is at least one pixel column, and in the extension direction of the data lines, the data line includes a plurality of sub-data lines connected sequentially; and there is at least one sub-pixel, such that two sub-data lines are arranged between the sub-pixel and an adjacent sub-pixel in the extension direction of the gate lines.

In an exemplary implementation, the two sub-data lines are parallel to each other.

In an exemplary implementation, in at least one sub-pixel, the first insulating layer, the second insulating layer and the third insulating layer are provided with eighth vias exposing the semiconductor layer, the fourth insulating layer is provided with third vias exposing the first pole of the fourth transistor, the data line is connected with the first pole of the fourth transistor through the third via, and the first pole of the fourth transistor is connected with the semiconductor layer through the eighth via.

In an exemplary implementation, in the extension direction of the gate lines, the eighth vias of adjacent sub-pixels are symmetrical with each other.

In an exemplary implementation, the data lines are arranged on a third conductor layer, and the power lines are arranged on the third conductor layer.

In an exemplary implementation, the data lines are arranged on the fourth conductor layer, and the power lines are arranged on the third conductor layer or the fourth conductor layer.

In an exemplary implementation, in at least one column of sub-pixels, the data line includes a first sub-data line and a second sub-data line, which are located on two sides of the column of sub-pixels, respectively.

In an exemplary implementation, the power line is located between the first sub-data line and the second sub-data line.

In an exemplary implementation, pixel structures of adjacent sub-pixels are symmetrical with each other in the extension direction of the gate lines.

In an exemplary implementation, there is at least one area including 2*2 sub-pixels, in which a pixel structure of a first sub-pixel in one row is the same as a pixel structure of a second sub-pixel in the other row, and a pixel structure of a second sub-pixel in one row is the same as a pixel structure of a first sub-pixel in the other row.

In an exemplary implementation, the display substrate further includes a reset signal line, a light emission control line and an initial signal line; the semiconductor layer at least includes active regions of a plurality of transistors, the first conductor layer at least includes a gate line, a light emission control line, a reset signal line, a first electrode of a storage capacitor, and gate electrodes of a plurality of transistors, the second conductor layer at least includes an initial signal line and a second electrode of a storage capacitor; and the third conductor layer at least includes source and drain electrodes of a plurality of transistors, and the fourth conductor layer at least includes a data line and a power line.

In an exemplary implementation, at least one sub-pixel includes a first region, a second region and a third region which are sequentially arranged in the extension direction of the data line; and the gate line, the initial signal line and the reset signal line are located in the first region, the first electrode and the second electrode of the storage capacitor are located in the second region, and the light emission control line is located in the third region.

In an exemplary implementation, the second conductor layer further includes a shield electrode, and in at least one sub-pixel, there is an overlapping area between an orthographic projection of the shield electrode on the base substrate and the orthographic projection of the power lines on the base substrate.

In an exemplary implementation, the power line is connected with the shield electrode through a via.

In an exemplary implementation, the shield electrode is arranged between the gate line and the reset signal line in the extension direction of the data lines.

In an exemplary implementation, the shield electrode includes a first part extending in the extension direction of the gate lines and a second part extending in the extension direction of the data lines, and an end of the first part close to the second part is connected with an end of the second part close to the first part.

In an exemplary implementation, the first conductor layer further includes a gate block extending in the extension direction of the data lines. The gate block is connected with the gate line. In the extension direction of the data lines, the gate block and the second part of the shield electrode have opposite areas therebetween.

In an exemplary implementation, the source and drain electrodes of the plurality of transistors include the first pole of the second transistor. The second insulating layer and the third insulating layer are provided with seventh vias exposing the first electrode of the storage capacitor. The first insulating layer, the second insulating layer and the third insulating layer are provided with ninth vias exposing the active region of the second transistor. One end of the first pole of the second transistor is connected with the first electrode of the storage capacitor through the seventh via, and the other end of the first pole of the second transistor is connected with the active region of the second transistor through the ninth via.

In an exemplary implementation, there is an overlapping area between an orthographic projection of the first pole of the second transistor on the base substrate and an orthographic projection of the gate line on the base substrate, and there is no overlapping area between the orthographic projection of the first pole of the second transistor on the base substrate and orthographic projections of the light emission control line, the reset signal line and the initial signal line on the base substrate.

In an exemplary implementation, the source and drain electrodes of the plurality of transistors include a first pole of a first transistor. The third insulating layer is provided with sixth vias exposing the initial signal line. The first insulating layer, the second insulating layer and the third insulating layer are provided with tenth vias exposing the active region of the first transistor. One end of the first pole of the first transistor is connected with the initial signal line through the sixth via, and the other end of the first pole of the first transistor is connected with the active region of the first transistor through the tenth via.

In an exemplary implementation, there is an overlapping area between an orthographic projection of the first pole of the first transistor on the base substrate and an orthographic projection of the reset signal line on the base substrate, and there is no overlapping area between the orthographic projection of the first pole of the first transistor on the base substrate and orthographic projections of the gate line and the light emission control line on the base substrate.

In an exemplary implementation, the display substrate further includes a fifth insulating layer arranged on the fourth conductive layer and a fifth conductive layer arranged on the fifth insulating layer. The fourth conductor layer further includes a connection electrode, and the source and drain electrodes of the plurality of transistors include a second pole of a sixth transistor. The fourth insulating layer is provided with fourth vias exposing the second pole of the sixth transistor, and the fifth insulating layer is provided with fifth vias exposing the connection electrode. The connection electrode is connected with the second pole of the sixth transistor through the fourth via, and the fifth conductor layer is connected with the connection electrode through the fifth via.

In an exemplary implementation, there is an overlapping area between an orthographic projection of the connection electrode on the base substrate and an orthographic projection of the first pole of the second transistor on the base substrate.

In an exemplary implementation, at least one sub-pixel at least includes: a first via exposing a first pole of a fifth transistor, the first via being configured to connect the first pole of the fifth transistor with the power line; a second via exposing a second electrode of a storage capacitor, the second via being configured to connect the second electrode with the first pole of the fifth transistor; a third via exposing a first pole of a fourth transistor, the third via being configured to connect the first pole of the fourth transistor with the data line; a fourth via exposing a second pole of a sixth transistor, the fourth via being configured to connect the second pole of the sixth transistor with a connection electrode; a fifth via exposing the connection electrode, the fifth via being configured to connect the connection electrode with an anode of the fifth conductor layer; a sixth via exposing the initial signal line, the sixth via being configured to connect the initial signal line with a first pole of a first transistor; a seventh via exposing a first electrode of the storage capacitor, the seventh via being configured to connect the first electrode with a first pole of a second transistor; an eighth via exposing an active region of the fourth transistor, the eighth via being configured to connect the active region of the fourth transistor with the first pole of the fourth transistor; a ninth via exposing an active region of the second transistor, the ninth via being configured to connect the active region of the second transistor with the first pole of the second transistor; and a tenth via exposing an active region of the first transistor, the tenth via being configured to connect the active region of the first transistor with the first pole of the first transistor.

In an exemplary implementation, at least one sub-pixel at least includes: an eleventh via exposing the second electrode of the storage capacitor, the eleventh via being configured to connect the second electrode with the power line; and a twelfth via exposing a third connection part, the twelfth via being configured to connect the third connection part with the power line.

A display apparatus, including the abovementioned display substrate, is provided.

A method for manufacturing a display substrate is provided and configured to manufacture the above display substrate. The display substrate includes, in a plane parallel to the display substrate, gate lines, data lines, power lines and a plurality of sub-pixels arranged on a base substrate. At least one sub-pixel includes a light-emitting device and a driving circuit configured to drive the light-emitting device to emit light, and the driving circuit includes a plurality of transistors and a storage capacitor.

The method includes: providing a base substrate; and forming a plurality of functional layers on the base substrate, the plurality of functional layers including a semiconductor layer, a first conductive layer, a second conductive layer, a third conductive layer and a fourth conductive layer which are sequentially arranged, a first insulating layer, a second insulating layer, a third insulating layer and a fourth insulating layer being respectively arranged between the plurality of functional layers, and in an extension direction of the gate lines, the power lines being connected with each other through at least one functional layer.

In one aspect, a driving backplane having a plurality of sub-pixel regions is provided. The driving backplane includes: a base; a plurality of pixel driving circuits disposed on the base, one of the plurality of pixel driving circuits being disposed in one of the plurality of sub-pixel regions; and a plurality of data lines and a plurality of first power supply voltage lines disposed on the base. The pixel driving circuit is electrically connected to a data line and a first power supply voltage line. The data line and the first power supply voltage line are disposed on a side, away from the base, of the pixel driving circuit, and the data line and the first power supply voltage line are disposed at intervals in a same layer. An orthographic projection of the data line on the base overlaps with an orthographic projection of the pixel driving circuit on the base. The pixel driving circuit includes: a driving transistor; a first switching transistor, and a first conductive pattern, the first conductive pattern being located on a side, away from the base, of the driving transistor and the first switching transistor. The first conductive pattern is electrically connected to a gate of the driving transistor through a first via. The first conductive pattern is electrically connected to a second electrode of the first switching transistor through a second via. An orthographic projection of the first conductive pattern on the base is located within an orthographic projection of the first power supply voltage line on the base.

In some implementation, an active pattern of the first switching transistor includes at least one first channel region, and a first source region and a first drain region located on both sides of the at least one first channel region. A gate of the first switching transistor is disposed on a side, away from the base, of a corresponding first channel region, and an orthographic projection of the at least one first channel region on the base overlaps with an orthographic projection of the gate of the first switching transistor on the base; and a first electrode and a second electrode of the first switching transistor are served by portions of the active pattern of the first switching transistor that are located in the first source region and the first drain region. An orthographic projection of the second electrode of the first switching transistor on the base is located within the orthographic projection of the first power supply voltage line on the base.

In some implementation, an active pattern of the driving transistor includes a second channel region, and a second source region and a second drain region located on both sides of the second channel region. An orthographic projection of the second channel region on the base overlaps with an orthographic projection of the gate of the driving transistor on the base, and a first electrode and a second electrode of the driving transistor are served by portions of the active pattern of the driving transistor that are located in the second source region and the second drain region. The active pattern of the driving transistor and the active pattern of the first switching transistor are disposed in a same layer.

In some implementation, the pixel driving circuit further includes a capacitor and a second conductive pattern. The gate of the driving transistor is multiplexed as a first storage electrode of the capacitor. A second storage electrode of the capacitor is located on a side, away from the base, of the first storage electrode. The second conductive pattern is electrically connected to the second storage electrode through at least one third via, and the second conductive pattern is electrically connected to the first power supply voltage line through a fourth via. The second conductive pattern and the first conductive pattern are disposed in a same layer, and the first power supply voltage line is disposed on a side, away from the second storage electrode, of a layer where the second conductive pattern and the first conductive pattern are located. The second storage electrode is provided with a hollow region, and the first via is directly opposite to the hollow region.

In some implementation, the fourth via includes a first sub-via and a second sub-via that are stacked in a thickness direction of the base; the second sub-via is located on a side, away from the base, of the first sub-via, and is communicated with the first sub-via; and a size of the second sub-via is greater than a size of the first sub-via. The second sub-via is disposed in an organic insulating layer, and the first sub-via is disposed in an inorganic insulating layer.

In some implementation, sub-pixel regions in a same row in the plurality of sub-pixel regions, second storage electrodes of capacitors in pixel driving circuits of any adjacent sub-pixel regions are electrically connected to each other.

In some implementation, the pixel driving circuit further includes a third conductive pattern. The first electrode of the first switching transistor is electrically connected to the third conductive pattern through a sixth via, the third conductive pattern is electrically connected to an initialization signal line through a seventh via, and the initialization signal line and the second storage electrode are disposed in a same layer. The third conductive pattern and the second conductive pattern are disposed in a same layer.

In some implementation, the pixel driving circuit further includes a second switching transistor and a fourth conductive pattern. A gate of the second switching transistor is served by a gate line, and the gate line and the gate of the driving transistor are disposed in a same layer. An active pattern of the second switching transistor includes a third channel region, and a third source region and a third drain region located on both sides of the third channel region. An orthographic projection of the gate of the second switching transistor on the base overlaps with an orthographic projection of the third channel region on the base, and a first electrode and a second electrode of the second switching transistor are served by portions of the active pattern of the second switching transistor that are located in the third source region and the third drain region. The first electrode of the second switching transistor is electrically connected to the fourth conductive pattern through an eighth via, and the fourth conductive pattern is electrically connected to the data line through a ninth via. The second electrode of the second switching transistor and the first electrode of the driving transistor are connected and formed as an integral structure. The fourth conductive pattern is disposed in a same layer as the first conductive pattern and the second conductive pattern.

In some implementation, the ninth via includes a third sub-via and a fourth sub-via that are stacked in a thickness direction of the base. The fourth sub-via is located on a side, away from the base, of the third sub-via, and is communicated with the third sub-via; and a size of the fourth sub-via is greater than a size of the third sub-via. The fourth sub-via is disposed in an organic insulating layer, and the third sub-via is disposed in an inorganic insulating layer.

In some implementation, the pixel driving circuit further includes a third switching transistor. A gate of the third switching transistor is served by the gate line. An active pattern of the third switching transistor includes a fourth channel region, and a fourth source region and a fourth drain region located on both sides of the fourth channel region. An orthographic projection of the gate of the third switching transistor on the base overlaps with an orthographic projection of the fourth channel region on the base, and a first electrode and a second electrode of the third switching transistor are served by portions of the active pattern of the third switching transistor that are located in the fourth source region and the fourth drain region. The first electrode of the third switching transistor and the second electrode of the driving transistor are connected and formed as an integral structure. The second electrode of the third switching transistor and the second electrode of the first switching transistor are connected and formed as an integral structure.

In some implementation, the pixel driving circuit further includes a fourth switching transistor. A gate of the fourth switching transistor is served by a light-emitting control line, and the light-emitting control line is disposed in a same layer as the gate of the driving transistor. An active pattern of the fourth switching transistor includes a fifth channel region, and a fifth source region and a fifth drain region located on both sides of the fifth channel region. An orthographic projection of the gate of the fourth switching transistor on the base overlaps with an orthographic projection of the fifth channel region on the base, and a first electrode and a second electrode of the fourth switching transistor are served by portions of the active pattern of the fourth switching transistor that are located in the fifth source region and the fifth drain region. The first electrode of the fourth switching transistor is electrically connected to the second conductive pattern through an eleventh via. The second electrode of the fourth switching transistor and the first electrode of the driving transistor are connected and formed as an integral structure.

In some implementation, the pixel driving circuit further includes a fifth switching transistor, a fifth conductive pattern, and a sixth conductive pattern. A gate of the fifth switching transistor is served by the light-emitting control line. An active pattern of the fifth switching transistor includes a sixth channel region, and a sixth source region and a sixth drain region located on both sides of the sixth channel region. An orthographic projection of the gate of the fifth switching transistor on the base overlaps with an orthographic projection of the sixth channel region on the base, and a first electrode and a second electrode of the fifth switching transistor are served by portions of the active pattern of the fifth switching transistor that are located in the sixth source region and the sixth drain region. The first electrode of the fifth switching transistor and the second electrode of the driving transistor are connected and are formed as an integral structure. The second electrode of the fifth switching transistor is electrically connected to the fifth conductive pattern through a twelfth via, and the fifth conductive pattern is electrically connected to the sixth conductive pattern through a thirteenth via. The sixth conductive pattern is configured to be electrically connected to a light-emitting device. The fifth conductive pattern and the second conductive pattern are disposed in a same layer. The sixth conductive pattern is disposed in a same layer as the data line and the first power supply voltage line.

In some implementation, the pixel driving circuit further includes a sixth switching transistor. A gate of the sixth switching transistor is served by a reset signal line. An active pattern of the sixth switching transistor includes a seventh channel region, and a seventh source region and a seventh drain region located on both sides of the seventh channel region. An orthographic projection of the gate of the sixth switching transistor on the base overlaps with an orthographic projection of the seventh channel region on the base, and a first electrode and a second electrode of the sixth switching transistor are served by portions of the active pattern of the sixth switching transistor that are located in the seventh source region and the seventh drain region. The first electrode of the sixth switching transistor and the first electrode of the first switching transistor are connected and formed as an integral structure. In Sub-pixel regions in a same column in the plurality of sub-pixel regions, except for sub-pixel regions in a first row, second electrodes of sixth switching transistors in pixel driving circuits of sub-pixel regions in each row and second electrodes of fifth switching transistors in pixel driving circuits of sub-pixel regions in a previous row are connected and formed as integral structures.

In some implementation, except for sub-pixel regions in the first row, a reset signal line electrically connected to the pixel driving circuits of sub-pixel regions in each row is shared with a gate line electrically connected to the pixel driving circuits of sub-pixel regions in the previous row.

In some implementation, pixel driving circuits of sub-pixel regions in a same column in the plurality of sub-pixel regions are electrically connected to two data lines. A first power supply voltage line electrically connected to the pixel driving circuits of sub-pixels in the same column is located between the two data lines.

In some implementation, one of the two data lines is electrically connected to pixel driving circuits of sub-pixel regions in odd rows of sub-pixel regions in the same column, and another of the two data lines is electrically connected to pixel driving circuits of sub-pixel regions in even rows of sub-pixel regions in the same column.

In some implementation, pixel driving circuits in any adjacent sub-pixel regions of sub-pixel regions in a same row are arranged in mirror symmetry.

In one aspect, a display panel is provided. The display panel includes the driving backplane described above and a light-emitting device disposed in each of the plurality of sub-pixel regions on the driving backplane. The light-emitting device is electrically connected to the pixel driving circuit.

In some implementation, the driving backplane further has a peripheral region. The display panel further includes a scan driver, a light-emitting driver, a data driver, a timing controller, and a plurality of multiplexers disposed in the peripheral region. Each of the plurality of multiplexers corresponds to pixel driving circuits of sub-pixel regions in a column in the plurality of sub-pixel regions. The scan driver is electrically connected to a plurality of gate lines and the timing controller, and the scan driver is configured to output gate scan signals to the plurality of gate lines one by one in response to a signal received from the timing controller. The light-emitting driver is electrically connected to a plurality of light-emitting control lines and the timing controller, and the light-emitting driver is configured to output light-emitting control signals to the light-emitting control lines one by one in response to the signal received from the timing controller. The data driver is electrically connected to the plurality of multiplexers and the timing controller, and the data driver is configured to output data signals to the plurality of multiplexers in response to the signal received from the timing controller. Each of the plurality of multiplexers is further electrically connected to the timing controller and two data lines that are electrically connected to pixel driving circuits of sub-pixel regions in a same column corresponding to each of the plurality of multiplexers, and each of the plurality of multiplexers is configured to transmit a data signal from the data driver to one of the two data lines and another of the two data lines in different time periods in response to the signal received from the timing controller.

Implementations of the disclosure provide a display panel, including: a base substrate, provided with a plurality of sub-pixels, at least one of the plurality of sub-pixels including a pixel circuit, here the pixel circuit includes a driving transistor, an initialization transistor and a voltage stabilizing transistor; a silicon semiconductor layer, on the base substrate, the silicon semiconductor layer including an active silicon layer of the driving transistor and an active silicon layer of the initialization transistor, here the active silicon layer is provided with a first region, a second region and a first channel region between the first region and the second region; a first insulating layer, at a side, facing away from the base substrate, of the silicon semiconductor layer; a first conducting layer, at a side, facing away from the base substrate, of the first insulating layer, the first conducting layer including a gate electrode of the driving transistor and a gate electrode of the initialization transistor; a second insulating layer, at a side, facing away from the base substrate, of the first conducting layer; an oxide semiconductor layer, at a side, facing away from the base substrate, of the second insulating layer, the oxide semiconductor layer including an active oxide layer of the voltage stabilizing transistor, here the active oxide layer is provided with a third region, a fourth region and a second channel region between the third region and the fourth region; and in a same sub-pixel, the second region of the active silicon layer of the initialization transistor is electrically connected to the third region of the active oxide layer of the voltage stabilizing transistor, and the fourth region of the active oxide layer of the voltage stabilizing transistor is electrically connected to the gate electrode of the driving transistor.

Optionally, in implementations of the present disclosure, the pixel circuit further includes a threshold compensation transistor.

The silicon semiconductor layer further includes an active silicon layer of the threshold compensation transistor.

The first conducting layer further includes a gate electrode of the threshold compensation transistor.

In the same sub-pixel, the second region of the active silicon layer of the threshold compensation transistor is electrically connected to the third region of the active oxide layer of the voltage stabilizing transistor, and the first region of the active silicon layer of the threshold compensation transistor is electrically connected to the second region of the active silicon layer of the driving transistor.

Optionally, in implementations of the present disclosure, the first conducting layer further includes a plurality of first scanning lines, a plurality of second scanning lines and a plurality of third scanning lines spaced from one another. The first scanning lines, the second scanning lines and the third scanning lines extend in a first direction and are arranged in a second direction.

An orthographic projection of each of the first scanning lines on the base substrate is overlapped with an orthographic projection of the first channel region of the active silicon layer of the initialization transistor on the base substrate to form a first overlapping region, and a part, in the first overlapping region, of the each of the first scanning lines is the gate electrode of the initialization transistor.

An orthographic projection of each of the second scanning lines on the base substrate is overlapped with an orthographic projection of the second channel region of the active oxide layer of the voltage stabilizing transistor on the base substrate to form a second overlapping region, and a part, in the second overlapping region, of the each of the second scanning lines is an gate electrode of the voltage stabilizing transistor.

An orthographic projection of each of the third scanning lines on the base substrate is overlapped with an orthographic projection of the first channel region of the active silicon layer of the threshold compensation transistor on the base substrate to form a third overlapping region, and a part, in the third overlapping region, of the each of the third scanning lines is the gate electrode of the threshold compensation transistor.

Optionally, in implementations of the present disclosure, a row of sub-pixels includes the first scanning line, the second scanning line and the third scanning line.

In the same sub-pixel, the orthographic projection of the second scanning line on the base substrate is between the orthographic projection of the first scanning line on the base substrate and the orthographic projection of the third scanning line on the base substrate, an orthographic projection of the active oxide layer of the voltage stabilizing transistor on the base substrate is between the orthographic projection of the first scanning line on the base substrate and the orthographic projection of the third scanning line on the base substrate, and the orthographic projection of the second scanning line on the base substrate is respectively not overlapped with an orthographic projection of the active silicon layer of the threshold compensation transistor on the base substrate and an orthographic projection of the active silicon layer of the initialization transistor on the base substrate.

Optionally, in implementations of the present disclosure, the active oxide layer of the voltage stabilizing transistor extends approximately in a straight line in the second direction.

The active silicon layer of at least one of the initialization transistor and the threshold compensation transistor extends approximately in a straight line in the second direction.

Optionally, in implementations of the present disclosure, the display panel further includes: a third insulating layer, at a side, facing away from the base substrate, of the oxide semiconductor layer; a second conducting layer, at the side, facing away from the base substrate, of the third insulating layer; a fourth insulating layer, at a side, facing away from the base substrate, of the second conducting layer; and a third conducting layer, at a side, facing away from the base substrate, of the fourth insulating layer, and the third conducting layer including a plurality of data lines spaced from one another, here a column of sub-pixels includes a data line; and in a same column of sub-pixels, both the orthographic projection of the active silicon layer of the initialization transistor on the base substrate and the orthographic projection of the active silicon layer of the threshold compensation transistor on the base substrate are at a side, facing away from an orthographic projection of the data line on the base substrate, of the orthographic projection of the active oxide layer of the voltage stabilizing transistor on the base substrate.

Optionally, in implementations of the present disclosure, the third conducting layer further includes a plurality of first connection parts; one of the sub-pixels includes a first connection part.

The sub-pixel further includes a first via hole, a second via hole and a third via hole spaced from one another. The first via hole penetrates through the third insulating layer and the fourth insulating layer, and both the second via hole and the third via hole penetrate through the first insulating layer, the second insulating layer, the third insulating layer and the fourth insulating layer.

In the same sub-pixel, the first connection part is electrically connected to the third region of the active oxide layer of the voltage stabilizing transistor through the first via hole, the first connection part is electrically connected to the second region of the active silicon layer of the initialization transistor through the second via hole, and the first connection part is electrically connected to the second region of the active silicon layer of the threshold compensation transistor through the third via hole.

Optionally, in implementations of the present disclosure, an orthographic projection of the first connection part on the base substrate is approximately T-shaped.

Optionally, in implementations of the present disclosure, in the same sub-pixel, the first via hole, the second via hole and the third via hole are approximately arranged in a triangle.

Optionally, in implementations of the present disclosure, in the same sub-pixel, the first via hole and the second via hole extend approximately in a straight line in the first direction, and an orthographic projection of the third via hole on the straight line where the first via hole and the second via hole are located is close to the second via hole.

Optionally, in implementations of the present disclosure, the first connection part includes a first sub-connection part and a second sub-connection part electrically connected to each other.

A first end of the first sub-connection part is electrically connected to the third region of the active oxide layer of the voltage stabilizing transistor through the first via hole, and a second end of the first sub-connection part is electrically connected to the second region of the active silicon layer of the initialization transistor through the second via hole.

A first end of the second sub-connection part is electrically connected to the second region of the active silicon layer of the threshold compensation transistor through the third via hole, and a second end of the second sub-connection part is electrically connected to the first sub-connection part.

Optionally, in implementations of the present disclosure, the first sub-connection part extends in the first direction, and the second sub-connection part extends in the second direction.

In a same row of sub-pixels, an orthographic projection of the first sub-connection part on the base substrate is between the orthographic projection of the first scanning line on the base substrate and the orthographic projection of the second scanning line on the base substrate, and an orthographic projection of the second sub-connection part on the base substrate is overlapped with the orthographic projection of the second scanning line on the base substrate to form an overlapping region.

Optionally, in implementations of the present disclosure, the second conducting layer includes a plurality of auxiliary scanning lines spaced from one another; a row of sub-pixels includes an auxiliary scanning line.

In the same sub-pixel, an orthographic projection of the auxiliary scanning line on the base substrate is overlapped with the orthographic projection of the second channel region of the active oxide layer of the voltage stabilizing transistor on the base substrate to form a fourth overlapping region.

The voltage stabilizing transistor is a double-gate transistor. The part, in the second overlapping region, of the second scanning line is a first gate electrode of the voltage stabilizing transistor, and a part, in the fourth overlapping region, of the auxiliary scanning line is a second gate electrode of the voltage stabilizing transistor.

Optionally, in implementations of the present disclosure, in the same sub-pixel, the orthographic projection of the auxiliary scanning line on the base substrate is overlapped with the orthographic projection of the second scanning line on the base substrate, and the auxiliary scanning line and the second scanning line in the same sub-pixel are electrically connected.

Optionally, in implementations of the present disclosure, the third conducting layer further includes a plurality of power lines spaced from the data lines and second connection parts. A column of sub-pixels includes a power line.

In the same sub-pixel, an orthographic projection of the power line on the base substrate is between the orthographic projection of the data line on the base substrate and an orthographic projection of the second connection part on the base substrate.

Optionally, in implementations of the present disclosure, the sub-pixel further includes a first light emitting control transistor and a second light emitting control transistor as well as a fourth via hole and a fifth via hole spaced from each other. Both the fourth via hole and the fifth via hole penetrate through the first insulating layer, the second insulating layer, the third insulating layer and the fourth insulating layer.

The silicon semiconductor layer further includes an active silicon layer of the first light emitting control transistor and an active silicon layer of the second light emitting control transistor.

The first conducting layer further includes a gate electrode of the first light emitting control transistor and a gate electrode of the second light emitting control transistor.

In the same sub-pixel, the power line is electrically connected to the first region of the active silicon layer of the first light emitting control transistor through the fourth via hole, the second region of the active silicon layer of the first light emitting control transistor is electrically connected to the first region of the active silicon layer of the driving transistor, the first region of the active silicon layer of the second light emitting control transistor is electrically connected to the second region of the active silicon layer of the driving transistor, and the second region of the active silicon layer of the second light emitting control transistor is electrically connected to a first electrode of a light emitting device through the fifth via hole.

Optionally, in implementations of the present disclosure, the first conducting layer further includes a plurality of light emitting control lines and a plurality of fourth scanning lines spaced from each other. A row of sub-pixels includes a light emitting control line and a fourth scanning line.

In the same sub-pixel, an orthographic projection of the light emitting control line on the base substrate is at a side, facing away from the orthographic projection of the second scanning line on the base substrate, of the orthographic projection of the third scanning line on the base substrate, an orthographic projection of the fourth scanning line on the base substrate is a side, facing away from the orthographic projection of the second scanning line on the base substrate, of the orthographic projection of the light emitting control line on the base substrate, and both orthographic projections of the active silicon layer and the gate electrode of the driving transistor on the base substrate are between the orthographic projection of the light emitting control line on the base substrate and the orthographic projection of the third scanning line on the base substrate.

The orthographic projection of the light emitting control line on the base substrate is overlapped with the first channel region of the active silicon layer of the first light emitting control transistor to form a fourth overlapping region, and a part, in the fourth overlapping region, of the light emitting control line is the gate electrode of the first light emitting control transistor.

The orthographic projection of the light emitting control line on the base substrate is overlapped with the first channel region of the active silicon layer of the second light emitting control transistor to form a fifth overlapping region, and a part, in the fifth overlapping region, of the light emitting control line is the gate electrode of the second light emitting control transistor.

Optionally, in implementations of the present disclosure, the third conducting layer further includes a plurality of second connection parts spaced from the data lines and the power lines. One of the sub-pixels includes a second connection part.

The sub-pixel further includes a sixth via hole and a seventh via hole. The sixth via hole penetrates through the third insulating layer and the fourth insulating layer, and the seventh via hole penetrates through the second insulating layer, the third insulating layer and the fourth insulating layer.

The second connection part is electrically connected to the fourth region of the active oxide layer of the voltage stabilizing transistor through the sixth via hole, and the second connection part is electrically connected to the gate electrode of the driving transistor through the seventh via hole.

Optionally, in implementations of the present disclosure, the second connection part includes a first conducting part and a first main part. The first conducting part is electrically connected to the fourth region of the active oxide layer of the voltage stabilizing transistor through the sixth via hole.

An orthographic projection of the first conducting part on the base substrate is respectively overlapped with the orthographic projection of the third scanning line on the base substrate and an orthographic projection of the fourth region of the active oxide layer of the voltage stabilizing transistor on the base substrate to form overlapping regions.

An orthographic projection of the first main part on the base substrate is overlapped with an orthographic projection of the gate electrode of the driving transistor on the base substrate to form an overlapping region, and the orthographic projection of the first main part on the base substrate is not overlapped with the orthographic projection of the third scanning line on the base substrate.

Optionally, in implementations of the present disclosure, in the same sub-pixel, the orthographic projection of the first main part on the base substrate is at least partially not overlapped with an orthographic projection of the first region of the second light emitting control transistor on the base substrate, the orthographic projection of the first main part on the base substrate is tangent to the orthographic projection of the light emitting control line on the base substrate, the orthographic projection of the first main part on the base substrate is close to the orthographic projection of the power line on the base substrate, and the orthographic projection of the first main part on the base substrate is close to the orthographic projection of the third scanning line on the base substrate.

Optionally, in implementations of the present disclosure, the sub-pixel further includes a storage capacitor, and the second conducting layer further includes a storage conducting part spaced from the auxiliary scanning lines.

In the same sub-pixel, an orthographic projection of the storage conducting part on the base substrate respectively covers the orthographic projection of the gate electrode of the driving transistor on the base substrate and the orthographic projection of the first main part on the base substrate, the orthographic projection of the storage conducting part on the base substrate is not overlapped with an orthographic projection of the seventh via hole on the base substrate, and the orthographic projection of the storage conducting part on the base substrate is not overlapped with the orthographic projection of the third scanning line on the base substrate.

Optionally, in implementations of the present disclosure, in the same sub-pixel, the orthographic projection of the storage conducting part on the base substrate is overlapped with the orthographic projection of the power line on the base substrate to form an overlapping region, and the orthographic projection of the storage conducting part on the base substrate is not overlapped with the orthographic projection of the data line on the base substrate.

Optionally, in implementations of the present disclosure, the sub-pixel further includes an eighth via hole; the eighth via hole penetrates through the fourth insulating layer.

In the same sub-pixel, the power line is electrically connected to the storage conducting part through the eighth via hole.

Optionally, in implementations of the present disclosure, in the same sub-pixel, orthographic projections of the eighth via hole, the fourth via hole and the fifth via hole on the base substrate are between the orthographic projection of the light emitting control line on the base substrate and the orthographic projection of the fourth scanning line on the base substrate.

Optionally, in implementations of the present disclosure, the display panel further includes: a fifth insulating layer, at a side, facing away from the base substrate, of the third conducting layer; and a fourth conducting layer, at a side, facing away from the base substrate, of the fifth insulating layer, and the fourth conducting layer including a plurality of auxiliary conducting parts spaced from one another, here one of the sub-pixels includes an auxiliary conducting part; and in the same sub-pixel, the auxiliary conducting part is electrically connected to the power line.

Optionally, in implementations of the present disclosure, the auxiliary conducting part includes a second conducting part and a second main part electrically connected to each other.

The second conducting part is electrically connected to the power line.

An orthographic projection of the second main part on the base substrate covers the orthographic projection of the first main part on the base substrate.

Optionally, in implementations of the present disclosure, the sub-pixel further includes an eleventh via hole; the eleventh via hole penetrates through the fifth insulating layer.

The second conducting part includes a first sub-conducting part and a second sub-conducting part. The first sub-conducting part extends in the first direction, and the second sub-conducting part extends in the second direction; a first end of the first sub-conducting part is electrically connected to the power line through the eleventh via hole, a second end of the first sub-conducting part is electrically connected to a first end of the second sub-conducting part, and a second end of the second sub-conducting part is electrically connected to the second main part.

The orthographic projection of the third scanning line on the base substrate is overlapped with an orthographic projection of the first sub-conducting part on the base substrate to form an overlapping region, and an orthographic projection of the second end of the first sub-conducting part on the base substrate is overlapped with the orthographic projection of the second channel region of the oxide semiconductor layer of the voltage stabilizing transistor on the base substrate to form an overlapping region.

An orthographic projection of the second sub-conducting part on the base substrate is respectively overlapped with an orthographic projection of the sixth via hole on the base substrate and the orthographic projection of the third scanning line on the base substrate to form overlapping regions.

Optionally, in implementations of the present disclosure, the fourth conducting layer further includes a plurality of initialization lines spaced from one another. A row of sub-pixels includes an initialization line, and in the same sub-pixel, the first region of the active silicon layer of the initialization transistor is electrically connected to the initialization line.

In the same sub-pixel, an orthographic projection of the initialization line on the base substrate is at a side, facing away from the orthographic projection of the second scanning line on the base substrate, of the orthographic projection of the first scanning line on the base substrate.

Optionally, in implementations of the present disclosure, the third conducting layer further includes a plurality of third connection parts; one of the sub-pixels includes a third connection part.

The sub-pixel further includes a ninth via hole and a tenth via hole spaced from each other. The ninth via hole penetrates through the fifth insulating layer, and the tenth via hole penetrates through the first insulating layer, the second insulating layer, the third insulating layer and the fourth insulating layer.

In the same sub-pixel, the initialization line is electrically connected to the third connection part through the ninth via hole, and the third connection part is electrically connected to the first region of the active silicon layer of the initialization transistor through the tenth via hole.

Implementations of the present disclosure provide a display device, including the above-mentioned display panel.

Other aspects will become apparent upon reading and understanding accompanying drawings and the detailed description.

BRIEF DESCRIPTION OF DRAWINGS

Accompanying drawings are used to provide an understanding of technical solutions of the present application and form a part of the specification. Together with embodiments of the present application, they are used to explain technical solutions of the present application and do not constitute a limitation on the technical solutions of the present application.

DETAILED DESCRIPTION

Figure 1:
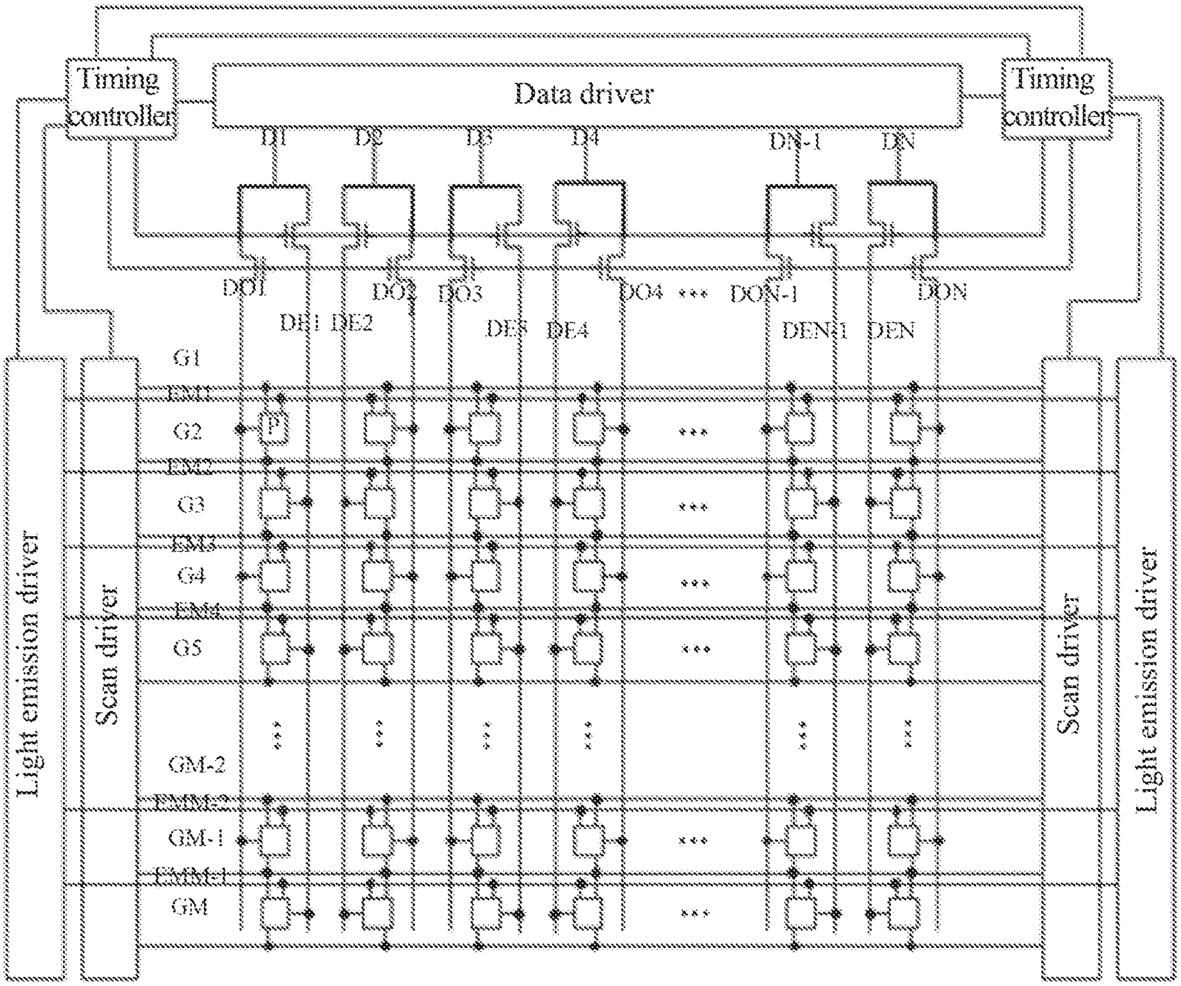
FIG. 1 is a schematic structural diagram of a display substrate according to the present application.

A plurality of embodiments are described in the present application, but the description is exemplary rather than limiting, and it is obvious to those of ordinary skills in the art that there may be more embodiments and implementation solutions within the scope of the embodiments described in the present application. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present application includes and contemplates combinations with features and elements known to those of ordinary skills in the art. Embodiments, features and elements already disclosed in this application may also be combined with any conventional features or elements to form a unique inventive solution defined by the claims. Any feature or element of any embodiment may also be combined with features or elements from other inventive solutions to form another unique inventive solution defined by the claims. Therefore, it should be understood that any of the features shown and/or discussed in the present application may be implemented individually or in any suitable combination. Therefore, the embodiments are not otherwise limited except in accordance with the appended claims and equivalents thereof. In addition, various modifications and changes can be made within the protection scope of the appended claims.

In addition, when describing representative embodiments, the specification may have presented a method and/or a process as a specific sequence of steps. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. Furthermore, the claims for the method and/or process should not be limited to performing their steps in the written order, and those skilled in the art may easily understand that these orders can be varied and still remain within the spirit and scope of the present application.

Unless otherwise defined, technical terms or scientific terms used in the embodiments of the present invention shall have common meanings as construed by those of ordinary skills in the art to which the present invention pertains. The words "first", "second" and the like used in the embodiments of the present invention do not represent any order, quantity or importance, but are merely used to distinguish among different components. Similar words such as "including" or "comprising" mean that elements or articles preceding the words cover elements or articles listed after the words and their equivalents, and do not exclude other elements or articles. Similar words such as "connect" or "link" are not limited to physical or mechanical connections, but may include electrical connections, whether direct or indirect. "Up", "down", "left", "right", etc. are only used to represent a relative position relationship that may change accordingly when an absolute position of an object being described changes.

The term "about" herein means that the limit is not strictly set, and a value within the range of process and measurement errors is allowed. The term "equivalent" herein refers to a state in which a ratio of one dimension to another dimension is 0.8 to 1.2.

Some embodiments of the present application provide a display substrate. The display substrate includes, in a plane parallel to the display substrate, gate lines, data lines, power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers arranged on the base substrate. The plurality of functional layers includes a semiconductor layer, a first conductive layer, a second conductive layer, a third conductive layer and a fourth conductive layer which are sequentially arranged. A first insulating layer, a second insulating layer, a third insulating layer and a fourth insulating layer are respectively arranged between the plurality of functional layers, and in an extension direction of the gate lines, the power lines are connected with each other through at least one functional layer. In an exemplary embodiment, the display substrate further includes a fifth insulating layer arranged on the fourth conductive layer and a fifth conductive layer arranged on the fifth insulating layer.

Figure 2:
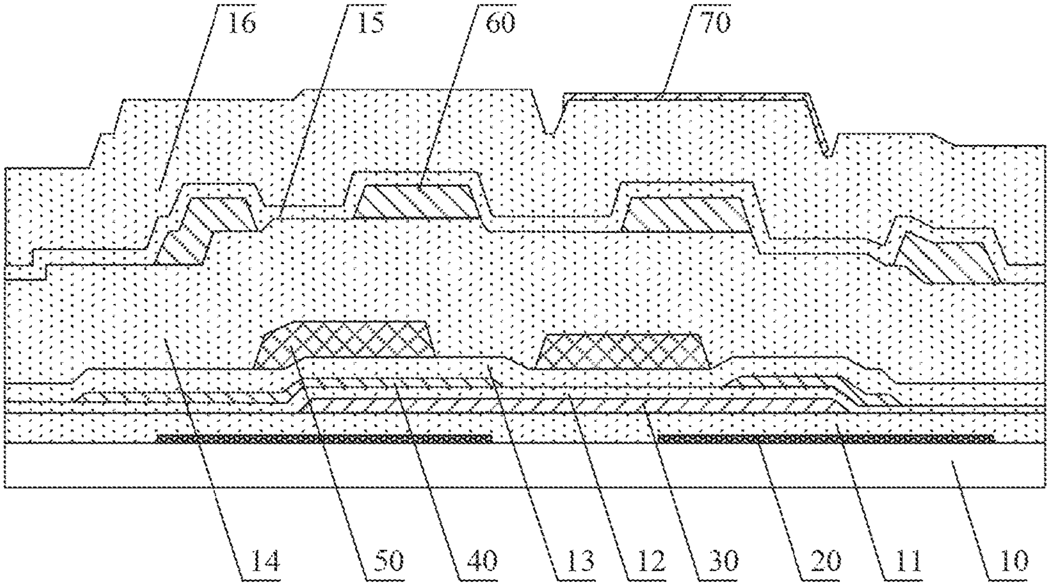
FIG. 2 is a side view of a sub-pixel in a display substrate according to the present application.
Figure 3:
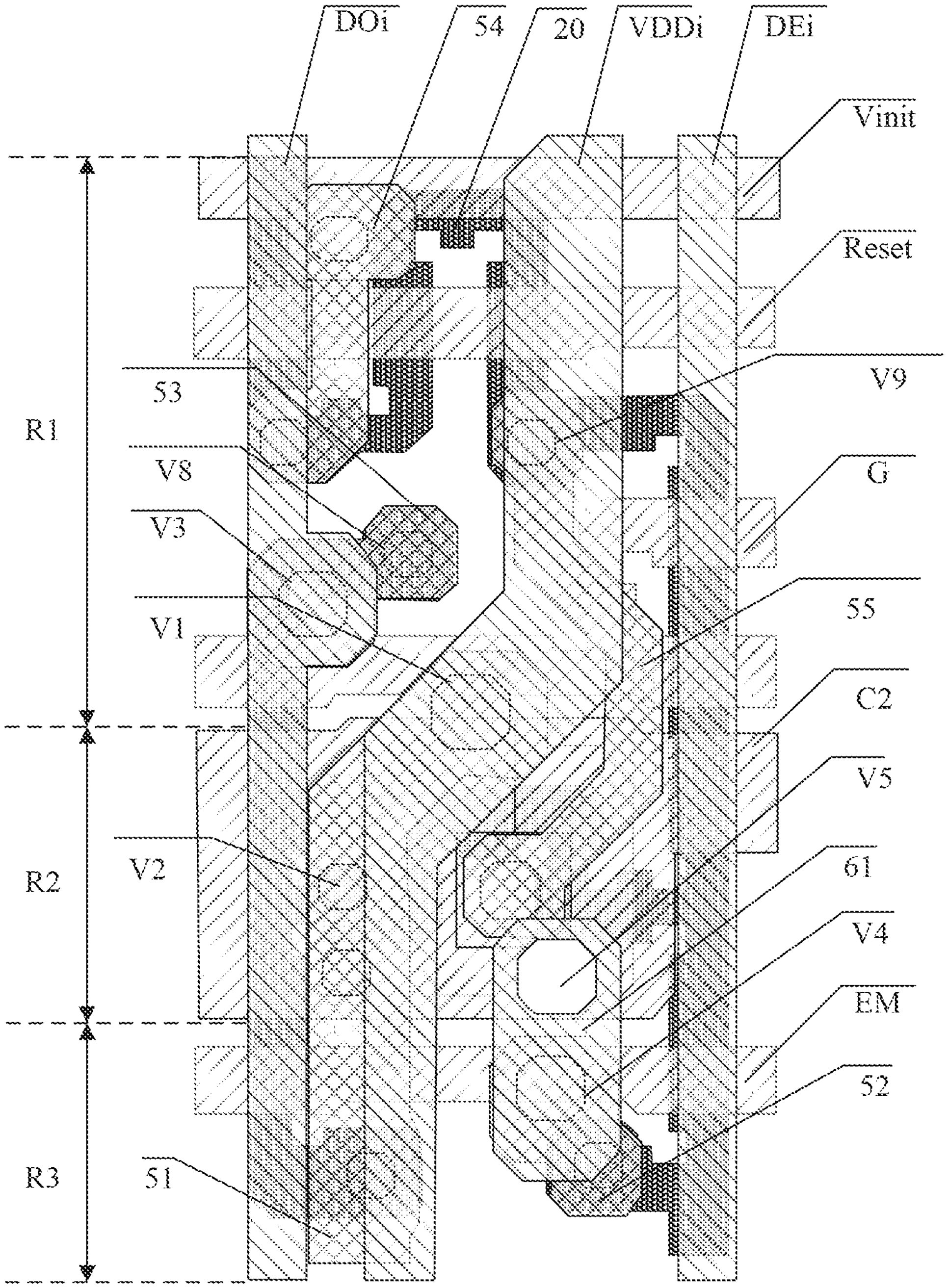
FIG. 3 is a top view of a sub-pixel in a display substrate according to the present application.

FIG. 1 is a schematic structural diagram of a display substrate according to the present application, FIG. 2 is a side view of a sub-pixel in a display substrate according to the present application, and FIG. 3 is a top view of a sub-pixel in a display substrate according to the present application. As shown in FIGS. 1-3, in a plane parallel to the display substrate, the display substrate according to the present application is provided with a gate line G, a data line D, a power line VDD, a reset signal line Reset, a light emission control line EM, an initial signal line Vinit and a plurality of sub-pixels P. Each sub-pixel includes: a light-emitting device and a driving circuit configured to drive the light-emitting device to emit light. The driving circuit includes a plurality of transistors and a storage capacitor. In a plane perpendicular to the display substrate, the display substrate includes: a base substrate 10, and a semiconductor layer 20, a first metal layer 30, a second metal layer 40, a third metal layer 50, a fourth metal layer 60 and a fifth metal layer 70 that are arranged on the base substrate 10 and insulated from each other. The first metal layer 30 serves as the first conductive layer, the second metal layer 40 serves as the second conductive layer, the third metal layer 50 serves as the third conductive layer, the fourth metal layer 60 serves as the fourth conductive layer, and the fifth metal layer 70 serves as the fifth conductive layer. In an exemplary embodiment, the display substrate includes a display area (AA) and a frame area located at a periphery of the display area. The display area includes a plurality of display sub-pixels, and the frame area includes a plurality of Dummy sub-pixels. The sub-pixels described herein refer to display sub-pixels in the display area.

In an exemplary embodiment, the semiconductor layer 20 may include active regions of the plurality of transistors. The first metal layer 30 may include the gate line G, the light emission control line EM, the reset signal line Reset, a first electrode C1 of the storage capacitor and gate electrodes of the plurality of transistors. The second metal layer 40 may include the initial signal line Vinit and a second electrode C2 of the storage capacitor. The third metal layer 50 may include first poles and second poles of the plurality of transistors. The fourth metal layer 60 may include the data line D and the power line VDD. The fifth metal layer 70 may include an anode of the light-emitting device.

In an exemplary embodiment, in the extension direction of the data line, the data line may include a plurality of sub-data lines connected sequentially, and the plurality of sub-data lines correspond to the plurality of sub-pixels. There is at least one sub-pixel, such that two sub-data lines are arranged between the sub-pixel and an adjacent sub-pixel in the extension direction of the gate line. In an exemplary embodiment, the two sub-data lines are parallel to each other.

As shown in FIG. 1, in an exemplary embodiment, M rows*N columns of sub-pixels, N columns of data lines D1-DN, N columns of power lines VDD1-VDDN, M rows of gate lines G1-GM, M−1 rows of light emission control lines EM1-EMM−1, a reset signal line Reset and an initial signal line Vinit may be arranged in the display substrate. The display substrate may further include: a data driver configured to provide data signals to the data lines, a scan driver configured to provide scan signals to the gate lines, a light emission driver configured to provide light emission control signals to the light emission control lines, and a timing controller configured to provide driving signals to the data driver, the scan driver and the light emission driver.

In some possible implementations, as shown in FIG. 1, driving circuits in the i-th column of sub-pixels are connected with the i-th column of data line. Each column of data line includes a first sub-data line DO and a second sub-data line DE. The first sub-data line DOi and the second sub-data line DEi in the i-th column of data line are located on two sides of the i-th column of sub-pixels, respectively, and $1 \le i \le N$, N is the number of total columns of sub-pixels.

In some possible implementations, two sub-data lines are arranged between two adjacent columns of sub-pixels, i.e., a first sub-data line DO of one column of sub-pixels and a second sub-data line DE of the adjacent column of sub-pixels are arranged between two adjacent columns of sub-pixels, or a second sub-data line DE of one column of sub-pixels and a first sub-data line DO of the adjacent column of sub-pixels are arranged between two adjacent columns of sub-pixels.

For example, the first sub-data line Doi of the i-th column of data line is located on a side of the i-th column of sub-pixels close to the i+1-th column of sub-pixels, and the first sub-data line DOi+1 of the i+1-th column of data line is located on a side of the i+1-th column of sub-pixels close to the i-th column of sub-pixels. Alternatively, the second sub-data line DEi of the i-th column of data line is located on a side of the i-th column of sub-pixels close to the i+1-th column of sub-pixels, and the second sub-data line DEi+1 of the i+1-th column of data line is located on a side of the i+1-th column of sub-pixels close to the i-th column of sub-pixels.

In some possible implementations, the base substrate 10 may be a rigid underlay substrate or a flexible underlay substrate. The rigid underlay substrate may be, but is not limited to, one or more of glass and metal foils. The flexible underlay substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In some possible implementations, a manufacturing material of the semiconductor layer 20 may be polysilicon or metal oxides, which is not limited in the present application.

In some possible implementations, a manufacturing material of the first metal layer may be metallic materials such as silver, aluminum or copper, which is not limited in the present application.

In some possible implementations, a manufacturing material of the second metal layer may be metallic materials such as silver, aluminum or copper, which is not limited in the present application.

In some possible implementations, a manufacturing material of the third metal layer may be metallic materials such as silver, aluminum or copper, which is not limited in the present application.

In some possible implementations, a manufacturing material of the fourth metal layer may be metallic materials such as silver, aluminum or copper, which is not limited in the present application.

In some possible implementations, a manufacturing material of the fifth metal layer may be metallic materials such as silver, aluminum or copper, which is not limited in the present application.

Figure 4A:
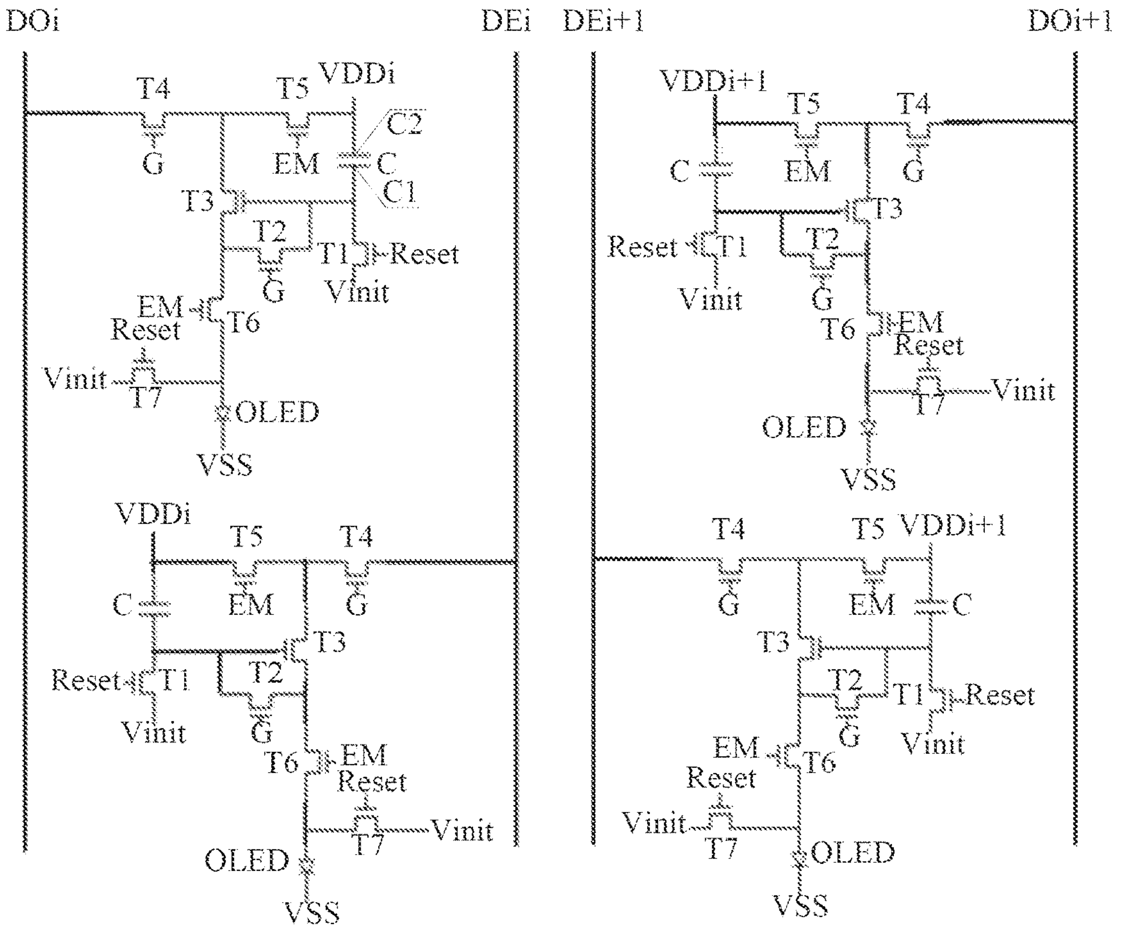
FIG. 4A is an equivalent circuit diagram of a driving circuit according to the present application.
Figure 4B:
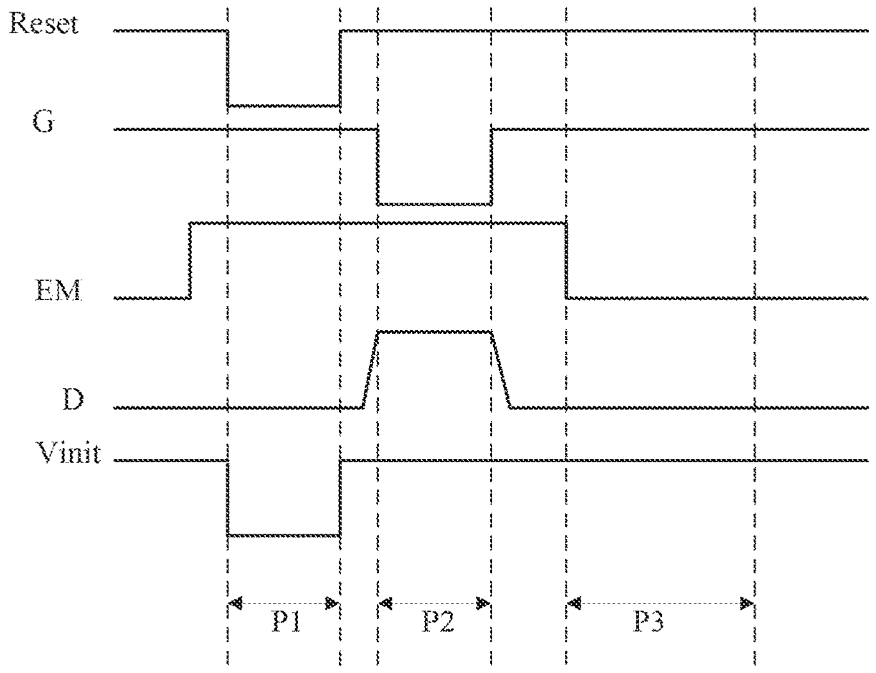
FIG. 4B is an operation timing diagram of a driving circuit according to the present application.

FIG. 4A is an equivalent circuit diagram of a driving circuit according to the present application, and FIG. 4B is an operation timing diagram of a driving circuit according to the present application. As shown in FIGS. 4A and 4B, FIG. 4A illustrates an example of driving circuits included in the i-th column of sub-pixels and the i+1-th column of sub-pixels. The driving circuit according to the present application may be a 7T1C structure, and may include: a first transistor T1 to a seventh transistor T7, and a storage capacitor C, wherein the storage capacitor C includes a first electrode C1 and a second electrode C2.

In an exemplary implementation, specifically, a gate electrode of the first transistor T1 is connected with the reset signal line Reset, a first pole of the first transistor T1 is connected with the initial signal line Vinit, and a second pole of the first transistor T1 is connected with the first electrode C1 of the storage capacitor C. A gate electrode of the second transistor T2 is connected with the gate line G, a first pole of the second transistor T2 is connected with the first electrode C1 of the storage capacitor C, and a second pole of the second transistor T2 is connected with a second pole of the sixth transistor T6. A gate electrode of the third transistor T3 is connected with the first electrode C1 of the storage capacitor C, a first pole of the third transistor T3 is connected with a second pole of the fourth transistor T4, and a second pole of the third transistor T3 is connected with the second pole of the sixth transistor T6. A gate electrode of the fourth transistor T4 is connected with the gate line G, and a first pole of the fourth transistor T4 is connected with the data line D. A gate electrode of the fifth transistor T5 is connected with the light emission control line EM, a first pole of the fifth transistor T5 is connected with the power line VDD, and a second pole of the fifth transistor T5 is connected with the first pole of the third transistor T3. A gate electrode of the sixth transistor T6 is connected with the light emission control line EM, and the second pole of the sixth transistor T6 is connected with an anode of a light-emitting device. A gate electrode of the seventh transistor T7 is connected with the reset signal line Reset, a first pole of the seventh transistor T7 is connected with the initial signal line Vinit, and a second pole of the seventh transistor T7 is connected with the anode of the light-emitting device. The second electrode C2 of the storage capacitor is connected with the power line VDD, and a cathode of the light-emitting device OLED is connected with a low-level power supply terminal VSS.

In an exemplary embodiment, the third transistor T3 is a driving transistor, other transistors than the third transistor T3 are all switching transistors, and the first transistor T1 to the seventh transistor T7 may all be P-type transistors or N-type transistors, which is not limited in the present application.

Taking the case as an example where the first transistor T1 to the seventh transistor T7 are all P-type transistors, the working process of the driving circuit may include a first stage P1 (a reset stage), a second stage P2 (a writing stage) and a third stage P3 (a light emission stage).

In the first stage P1 (the reset stage), the reset signal line Reset provides an effective level, the first transistor T1 and the seventh transistor T7 are turned on, and an initial signal provided by the initial signal line Vinit initializes a signal of the second pole of the sixth transistor T6 and a signal of the first electrode C1.

In the second stage P2 (the writing stage), the gate line G provides an effective level, the second transistor T2 and the fourth transistor T4 are turned on, a data signal provided by the data line D is written to the first pole of the third transistor T3, and signals of the gate electrode and the second pole of the second transistor T2 are made to have the same potential, to enable the third transistor T3 to be turned on.

In the third stage P3 (the light emission stage), the light emission control line EM provides an effective level, the fifth transistor T5 and the sixth transistor T6 are turned on, and the power line VDD provides a driving current to the light-emitting device OLED to drive the light-emitting device to emit light.

In some possible implementations, as shown in FIG. 4A, the light-emitting device in the present application may be an OLED.

The display substrate according to the present application is provided with a gate line, a data line, a power line, a reset signal line, a light emission control line, an initial signal line and a plurality of sub-pixels. Each sub-pixel includes: a light-emitting device and a driving circuit configured to drive the light-emitting device to emit light. The driving circuit may include: a plurality of transistors and a storage capacitor. The display substrate may include: a base substrate, and a semiconductor layer, a first metal layer, a second metal layer, a third metal layer, a fourth metal layer and a fifth metal layer which are sequentially arranged on the base substrate and are insulated from each other. The semiconductor layer includes active regions of the plurality of transistors. The first metal layer includes: the gate line, the light emission control line, the reset signal line, the first electrode of the storage capacitor, and gate electrodes of the plurality of transistors. The second metal layer includes: the initial signal line and the second electrode of the storage capacitor. The third metal layer includes: source and drain electrodes of the plurality of transistors. The fourth metal layer includes: the data line and the power line. The fifth metal layer includes: the anode of the light-emitting device. The i-th column of sub-pixels are connected with the i-th column of data line. Each column of data line includes a first sub-data line and a second sub-data line. A first sub-data line and a second sub-data line in the i-th column of data line are located on two sides of the i-th column sub-pixels, respectively, $1 \leq i \leq N$, N being the number of total columns of sub-pixels.

In the present application, five metal layers are arranged, and by arranging the data line and the power line in different layers from the source and drain electrodes of the plurality of transistors, the volume occupied by the sub-pixels and the data lines connected with the sub-pixels can be reduced, thereby improving the resolution of the OLED display substrate driven by high frequency.

In some possible implementations, as shown in FIG. 3, each sub-pixel in the display substrate according to the present application may be divided into a first region R1, a second region R2 and a third region R3 which are sequentially arranged in the extension direction of the data line.

The storage capacitor is located in the second region R2. The first region R1 and the third region R3 are located on two sides of the second region R2, respectively. The initial signal line Vinit, the gate line G and the reset signal line Reset connected to the driving circuit of the sub-pixel are located in the first region R1. The light emission control line EM connected to the driving circuit of the sub-pixel is located in the third region R3.

The driving circuits of adjacent sub-pixels in the same column are connected to different sub-data lines, i.e., if the sub-pixel in the i-th row and the j-th column is connected to the first sub-data line DOj in the j-th column of data line, the sub-pixel in the i+1-th row and the j-th column is connected to the second sub-data line Dej in the j-th column of data line; and if the sub-pixel in the i-th row and the j-th column is connected to the second sub-data line DEj in the j-th column of data line, the sub-pixel in the i+1-th row and the j-th column is connected to the first sub-data line DOj in the j-th column of data line.

In some possible implementations, as can be seen from FIG. 1 and FIG. 3, the driving circuits of the i-th column of sub-pixels are also connected with the i-th column of power line, 1≤i≤N. The i-th column of power line VDDi is located between the first sub-data line DOi and the second sub-data line DEi in the i-th column of data line.

Figure 5:
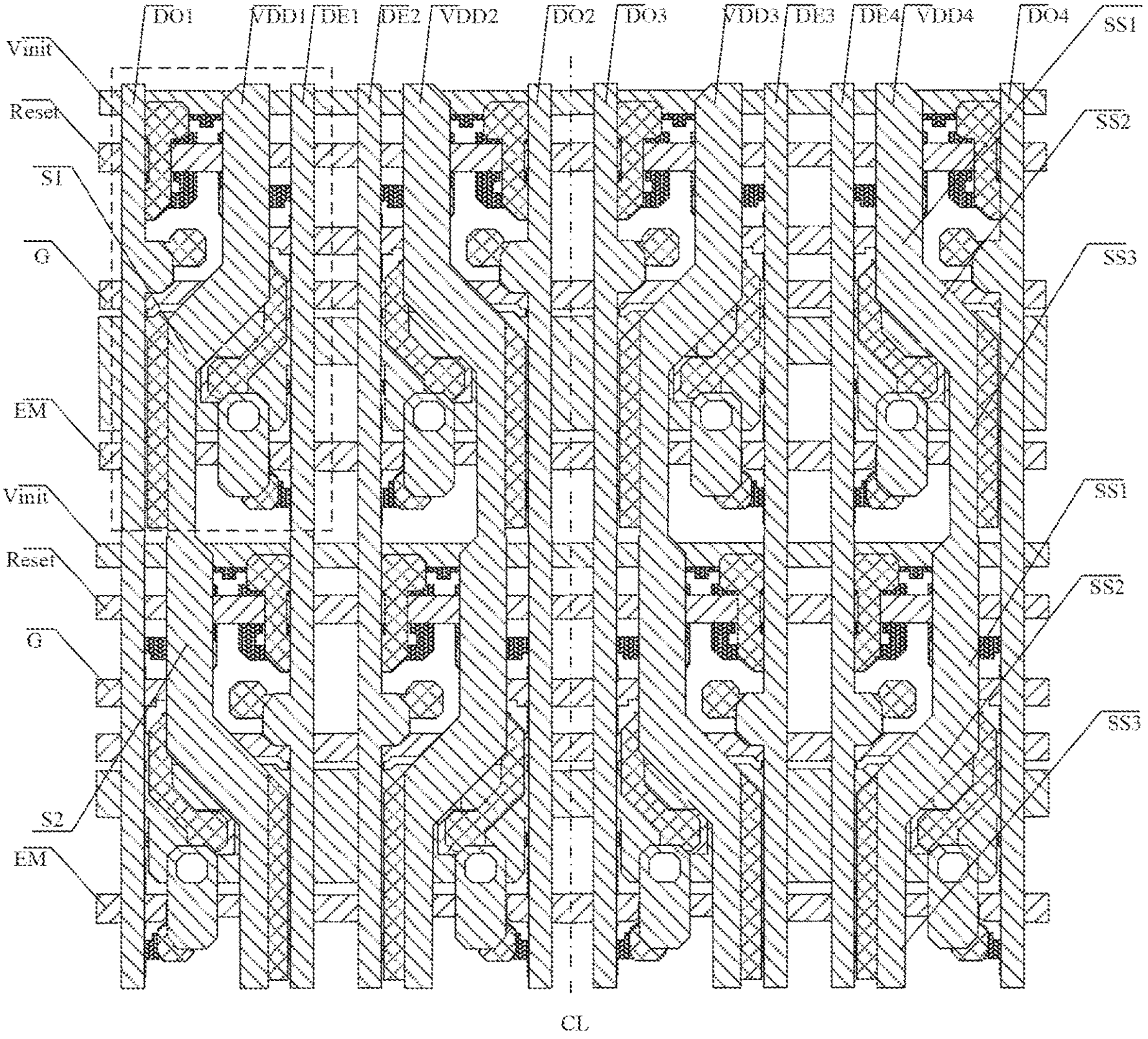
FIG. 5 is a top view of a plurality of sub-pixels in a display substrate according to the present application.

FIG. 5 is a top view of a plurality of sub-pixels in a display substrate according to the present application. As shown in FIG. 5, the pixel structures of adjacent sub-pixels in the same row are mirror symmetrical with each other about a center line CL of two sub-data lines between the adjacent sub-pixels. The pixel structure of the sub-pixel located in the i-th row and the j-th column is the same as the pixel structure of the sub-pixel located in the i-th row and the j+2-th column. The pixel structure of the sub-pixel located in the i-th row and the j+1-th column is the same as the pixel structure of the sub-pixel located in the i-th row and the j+3-th column. The pixel structure of the sub-pixel located in the i-th row and the j-th column is the same as the pixel structure of the sub-pixel located in the i+1-th row and the j+1-th column. The pixel structure of the sub-pixel located in the i-th row and the j+1-th column is the same as the pixel structure of the sub-pixel located in the i+1-th row and the j-th column. Here, the pixel structures being the same includes, but is not limited to, that the overall shapes, the connection relationship of respective parts and the trends of signal flow being the same.

As shown in FIG. 5, the power lines in two adjacent columns are mirror symmetric about a center line between the power lines in the two adjacent columns, i.e., the power lines of adjacent sub-pixels are symmetrical with each other. The center line CL of two sub-data lines located between the sub-pixel in the i-th row and the j-th column and the sub-pixel in the i-th row and the j+1-th column and the center line located between the power line in the j-th column and the power line in the j+1-th column may be the same center line.

In some possible implementations, as shown in FIG. 5, taking eight sub-pixels in two rows and four columns (an area including 2*4 sub-pixels) as an example, the power line in the i-th column includes a plurality of interconnected sub-power lines, S1 to SN. The plurality of sub-power lines correspond to all sub-pixels in each column of sub-pixels one by one, and the plurality of sub-power lines are respectively arranged in the plurality of sub-pixels in the column.

In an exemplary embodiment, the shape of the sub-power line corresponding to the sub-pixel in the i-th row and the j-th column after being mirrored along the center line of the first sub-data line and the second sub-data line in the data line in the j-th column is the same as the shape of the sub-power line corresponding to the sub-pixel in the i+1-th row and the j-th column. Here, the shapes of the power lines being the same includes, but is not limited to, that the overall shapes, the connection relationship of respective parts and the trends of signal flow being the same.

In an exemplary embodiment, each sub-power line may include a first power supply part SS1, a second power supply part SS2 and a third power supply part SS3 sequentially arranged in a second direction. The second power supply part SS2 is configured to connect the first power supply part SS1 and the third power supply part SS3. The first power supply part SS1 and the third power supply part SS3 may be arranged in parallel with the data line. An included angle between the second power supply part SS2 and the first power supply part SS1 is greater than 90 degrees and smaller than 180 degrees to form a zigzag sub-power line. The second direction is the extension direction of the data line.

Herein, "parallel" refers to a state in which two straight lines form an angle of −10 degrees or more and 10 degrees or less, and thus also includes a state in which the angle is −5 degrees or more and 5 degrees or less. In addition, "vertical" refers to a state in which two straight lines form an angle of 80 degrees or more and 100 degrees or less, and thus also includes a state of an angle being 85 degrees or more and 95 degrees or less. Herein, the first power supply part being parallel to the data line means that a main body part of the first power supply part is parallel to a main body part of the data line, without limiting that an edge of the first power supply part is parallel to an edge of the data line. The edge of the first power supply part and the edge of the data line are allowed to be uneven due to process errors. A connection area where the first power supply part and the second power supply part are connected with each other may belong to the first power supply part or may belong to the second power supply part.

In an exemplary embodiment, the first power supply part SS1, the second power supply part SS2, and the third power supply part SS3 may be an integrated structure.

As shown in FIG. 5, an extension length of the first power supply part SS1 in the second direction is greater than the average width of the first power supply part SS1, an extension length of the second power supply part SS2 in an oblique direction is greater than an average width of the second power supply part SS2, and an extension length of the third power supply part SS3 in the second direction is greater than an average width of the third power supply part SS3. The oblique direction is a direction in which the second power supply part and the first power supply part have the included angle therebetween. The average width of the third power supply part SS3 is smaller than the average width of the first power supply part SS1. This, on the one hand, is for the layout of the pixel structure, and on the other hand, is because the third power supply part SS3 is relatively close to the data line, and the third power supply part SS3 with a relatively small average width can reduce parasitic capacitance. In the present application, the widths of the first power supply part SS1 and the third power supply part SS3 refer to the dimensions of the first power supply part SS1 and the third power supply part SS3 in a first direction, the width of the second power supply part SS2 refers to the dimension in a direction perpendicular to the oblique direction, the average width refers to an average value of the widths at multiple positions, and the first direction is the extension direction of the gate line.

In an exemplary embodiment, in the first direction, the distance between the center line of the first power supply part SS1 and the center line of the third power supply part SS3 is equivalent to the average width of the third power supply part SS3.

In an exemplary embodiment, the first power supply part SS1 in the sub-power line corresponding to the sub-pixel in the i-th row and the j-th column is connected with the third power supply part SS3 in the sub-power line corresponding to the sub-pixel in the i−1-th row and the j-th column. The power supply part SS3 in the sub-power line corresponding to the sub-pixel in the i-th row and the j-th column is connected with the first power supply part SS1 in the sub-power line corresponding to the sub-pixel in the i+1-th row and the j-th column. The power supply parts connected with each other are sequentially arranged in the second direction (the extension direction of the data line).

As shown in FIG. 5, the power line in the present application may have a zigzag shape.

In an exemplary embodiment, with reference to FIG. 5, the working process of each sub-pixel includes a reset stage, a writing stage and a light emission stage. In the reset stage, the reset signal line Reset located in the first metal layer and the initial signal line Vinit located in the second metal layer provide signals to initialize the driving circuit. In the writing stage, the gate line G located in the first metal layer and the data line D located in the fourth metal layer provide signals to write data signals provided by the data line D into the driving circuit. In the light emission stage, the light emission control line EM located in the first metal layer provides signals, and the power line VDD provides power signals, to enable the driving circuit to provide a driving current to the light-emitting device OLED to drive the light-emitting device to emit light.

Pixels in the same row are turned on at the same time, and pixels in adjacent rows are turned on in sequence.

In some possible implementations, as shown in FIG. 2, the display substrate according to the present application may further include a first insulating layer 11, a second insulating layer 12, a third insulating layer 13 and a fourth insulating layer 14.

The first insulating layer 11 is arranged between the semiconductor layer 20 and the first metal layer 30, the second insulating layer 12 is arranged between the first metal layer 30 and the second metal layer 40, the third insulating layer 13 is arranged between the second metal layer 40 and the third metal layer 50, and the fourth insulating layer 14 is arranged between the third metal layer 50 and the fourth metal layer 60.

In some possible implementations, materials of the first insulating layer 11, the second insulating layer 12, the third insulating layer 13 and the fourth insulating layer 14 may be silicon oxide, silicon nitride, or a composite of silicon oxide and silicon nitride, which is not limited in the present application.

In an exemplary embodiment, as shown in FIG. 4A, the plurality of transistors of each sub-pixel may include a first transistor to a seventh transistor. The first pole of the fifth transistor is respectively connected with the power line VDD and the second electrode C2 of the storage capacitor.

In the present application, for each sub-pixel, the power line in each sub-pixel is connected with the second electrode of the storage capacitor through the first pole of the fifth transistor.

Second electrodes of storage capacitors of adjacent sub-pixels located in the second metal layer may be reused as power signal lines, which are configured to ensure that power signals provided by power lines of adjacent sub-pixels are the same, thereby avoiding poor display of the display substrate and ensuring the display effect of the display substrate.

In an exemplary embodiment, every four continuous sub-pixels constitute a pixel. In the j-th pixel, four continuous sub-pixels are sequentially the i-th sub-pixel, the i+1-th sub-pixel, the i+2-th sub-pixel and the i+3-th sub-pixel in the first direction, wherein i may take the value of 4j−3 in sequence and j is a positive integer.

In an exemplary embodiment, there are multiple implementations for connecting the second electrodes of the storage capacitors of a plurality of sub-pixels to the power lines.

Figure 6A:
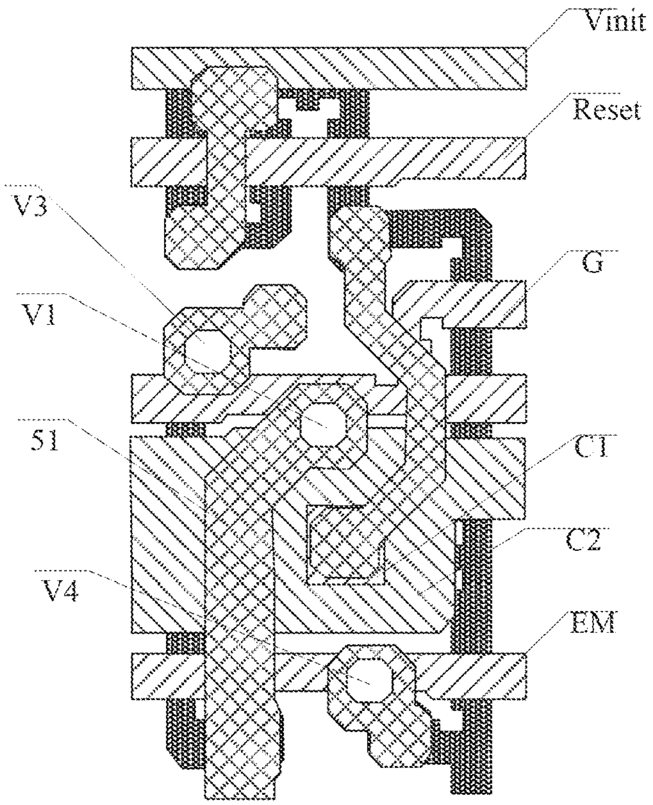
FIG. 6A is a top view of a sub-pixel corresponding to Implementation I.
Figure 6B:
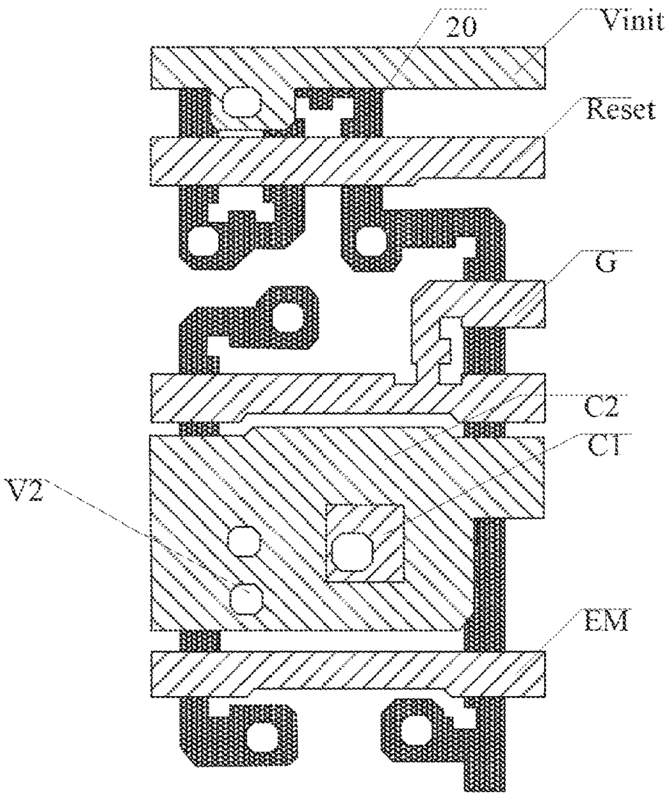
FIG. 6B is another top view of a sub-pixel corresponding to Implementation I.

As one implementation, FIG. 6A is a top view of sub-pixels corresponding to Implementation I, and FIG. 6B is another top view of sub-pixels corresponding to Implementation I. As shown in FIG. 6A, the fourth insulating layer is provided with a first via V1 exposing first poles 51 of partial fifth transistors, and the power line is connected with the first pole 51 of the fifth transistor through the first via V1. As shown in FIG. 6B, the third insulating layer is provided with a second via V2 exposing second electrodes C2 of partial storage capacitors, and the first pole 51 of the fifth transistor is connected with the second electrode C2 of the storage capacitor through the second via V2. It should be noted that in FIG. 3 and FIG. 5, Implementation I is taken as an example.

An orthographic projection of the power lines connected with the sub-pixels on the base substrate includes an orthographic projection of the first via V1 on the base substrate 10, and an orthographic projection of the second electrode of the storage capacitor includes an orthographic projection of the second via on the base substrate. Herein, "an orthographic projection of A including an orthographic projection of B" or "an orthographic projection of B is located within the range of an orthographic projection of A" means that the boundary of the orthographic projection of B falls within the range of the boundary of the orthographic projection of A, or the boundary of the orthographic projection of A overlaps with the boundary of the orthographic projection of B.

In some possible implementations, the number of first vias V1 may be one.

In some possible implementations, the number of second vias V2 may be at least one. Because the width of the first pole of the fifth transistor is relatively small, when there are multiple second vias V2, the multiple second vias are arranged in the extension direction of the data line. The more the vias are, the better the conductivity of the components connected through the vias is. In FIG. 6A, there is one first via V1, and FIG. 6B illustrates an example where there are two second vias V2, which is not limited in the present application.

In an exemplary embodiment, as shown in FIG. 6A, the fourth insulating layer further includes a third via V3 exposing the first pole of the fourth transistor T4. The data line is connected with the first pole of the fourth transistor T4 through the third via V3. The fourth insulating layer further includes a fourth via V4 exposing the second pole of the sixth transistor T6.

In an exemplary embodiment, as shown in FIG. 6B, the first insulating layer, the second insulating layer and the third insulating layer further include vias exposing partial active regions, so that the source and drain electrodes of the transistors are connected with the active regions through these vias. The source and drain electrodes of the transistors include first poles of the transistors and second poles of the transistors.

In an exemplary embodiment, the first pole of the fifth transistor is also connected with an active region through vias on the first insulating layer, the second insulating layer and the third insulating layer.

Figure 7A:
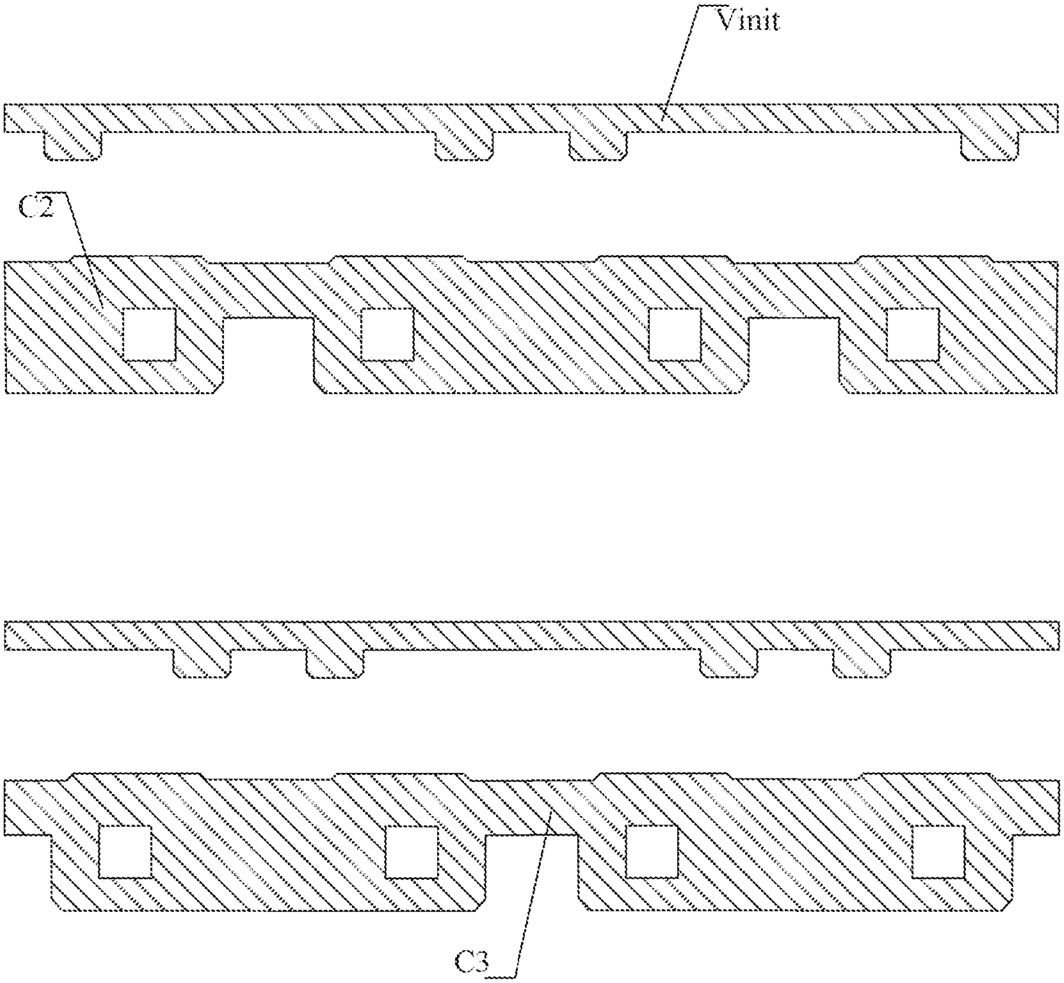
FIG. 7A is a top view of a second metal layer corresponding to Implementation I.
Figure 7B:
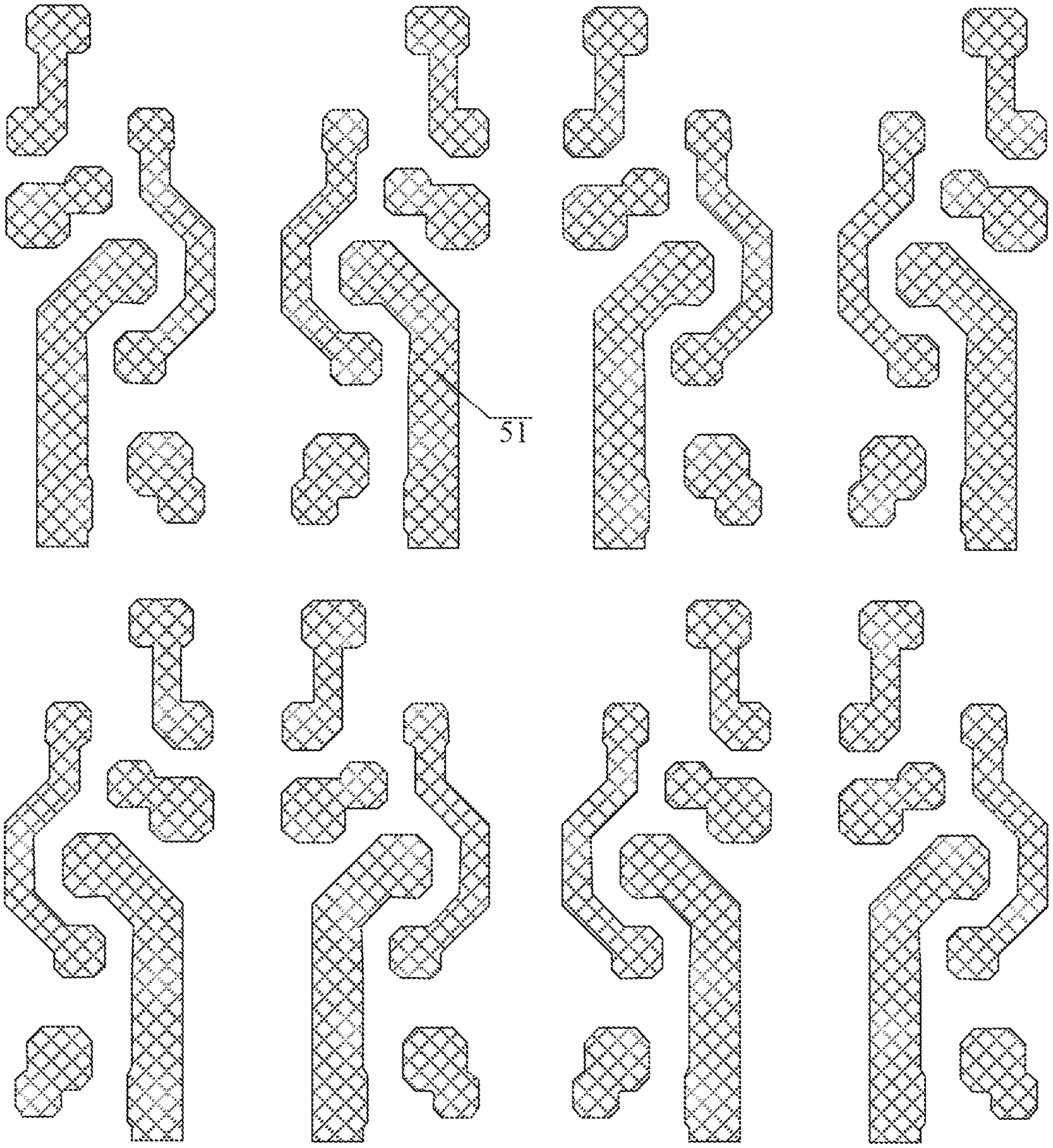
FIG. 7B is a top view of a third metal layer corresponding to Implementation I.

In an exemplary embodiment, each pixel may include four sub-pixels. FIG. 7A is a top view of a second metal layer corresponding to Implementation I, and FIG. 7B is a top view of a third metal layer corresponding to Implementation I. In order to explain the structure of the display substrate more clearly, FIGS. 7A and 7B illustrate an example of two pixels arranged in the column direction.

As shown in FIG. 7A, the second electrodes of the storage capacitors in adjacent sub-pixels in the same row are directly connected. As shown in FIG. 7B, the first poles 51 of the fifth transistors in adjacent sub-pixels in the same row are arranged at intervals.

In Implementation I, by interconnecting the second electrodes of the storage capacitors, which are arranged on the second metal layer, in a plurality of sub-pixels, the power signals provided by the power lines of adjacent sub-pixels are the same, thereby avoiding poor display of the display substrate and ensuring the display effect of the display substrate.

In an exemplary embodiment, through reasonable design of layout, interconnection of conductive layers of multiple sub-pixels can be realized only by the semiconductor layer, or interconnection of conductive layers of multiple sub-pixels can be realized only by the first metal layer, or interconnection of conductive layers of multiple sub-pixels can be realized only by the second metal layer, or interconnection of conductive layers of multiple sub-pixels can be realized only by the third metal layer, thus realizing that the power lines of sub-pixels located in the same row are interconnected in the extension direction of the gate lines through functional layers, which will not be described in detail here.

As shown in FIG. 7A, at least one sub-pixel further includes a first connection part C3, which is arranged on a side of the second electrode C2 in the first direction.

In an exemplary embodiment, in two adjacent rows of pixels, in one row of pixels, the second electrode C2 of the i-th sub-pixel and the second electrode C2 of the i+1-th sub-pixel are connected through the first connection part C3, the second electrode C2 of the i+1-th sub-pixel is directly connected with the second electrode C2 of the i+2-th sub-pixel, and the second electrode C2 of the i+2-th sub-pixel and the second electrode C2 of the i+3-th sub-pixel are connected through the first connection part C3. In the other row of pixels, the second electrode C2 of the i-th sub-pixel and the second electrode C2 of the i+1-th sub-pixel are directly connected, the second electrode C2 of the i+1-th sub-pixel and the second electrode C2 of the i+2-th sub-pixel are connected through the first connection part C3, and the second electrode C2 of the i+2-th sub-pixel and the second electrode C2 of the i+3-th sub-pixel are directly connected.

Figure 8A:
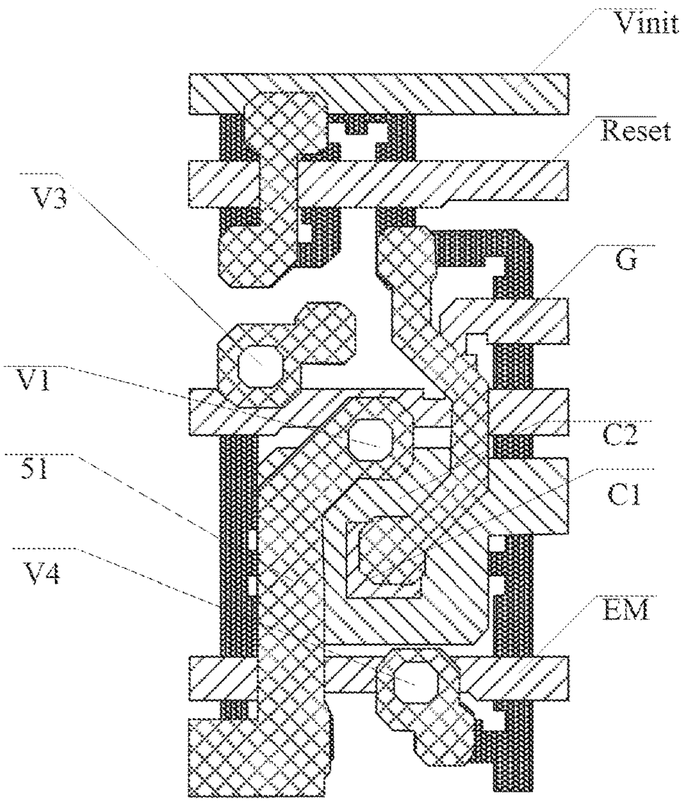
FIG. 8A is a top view of a sub-pixel corresponding to Implementation II.
Figure 8B:
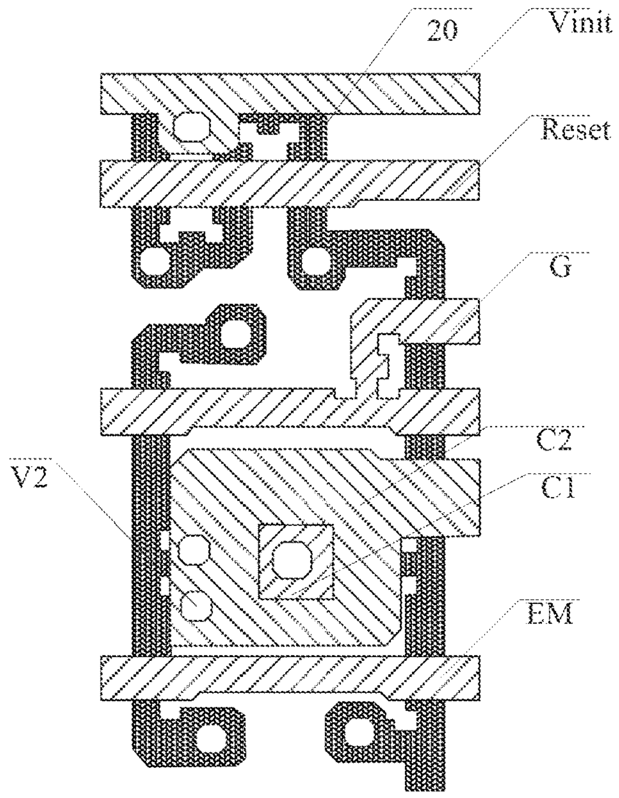
FIG. 8B is another top view of a sub-pixel corresponding to Implementation II.

As another implementation, FIG. 8A is a top view of a sub-pixel corresponding to Implementation II, and FIG. 8B is another top view of a sub-pixel corresponding to Implementation II. As shown in FIG. 8A, the fourth insulating layer is provided with a first via V1 exposing first poles 51 of partial fifth transistors T5, and the power line is connected with the first pole 51 of the fifth transistor T5 through the first via V1. As shown in FIG. 8B, the third insulating layer is provided with a second via V2 exposing second electrodes C2 of partial storage capacitors, and the first pole 51 of the fifth transistor T5 is connected with the second electrode C2 of the storage capacitor through the second via V2.

As shown in FIG. 8A and FIG. 8B, compared with Implementation I, in Implementation II, the area occupied by the second electrode of the storage capacitor of each sub-pixel provided is different, and the shape of the first pole 51 of the fifth transistor T5 of each sub-pixel is also different.

In an exemplary embodiment, as shown in FIG. 8A, the fourth insulating layer further includes a third via V3 exposing the first pole of the fourth transistor T4. The data line is connected with the first pole of the fourth transistor T4 through the third via V3. The fourth insulating layer further includes a fourth via V4 exposing the second pole of the sixth transistor T6.

As shown in FIGS. 3 and 8B, the first insulating layer, the second insulating layer and the third insulating layer may further include vias exposing partial active regions, so that the source and drain electrodes of the transistors are connected with the active regions through these vias. The first pole of the fifth transistor may also be connected with an active region through vias on the first insulating layer, the second insulating layer and the third insulating layer.

An orthographic projection of the power lines in the sub-pixels on the base substrate includes an orthographic projection of the first via V1 on the base substrate 10, and an orthographic projection of the second electrode of the storage capacitor on the base substrate includes an orthographic projection of the second via on the base substrate.

In some possible implementations, the number of first vias V1 may be one.

In some possible implementations, the number of second vias V2 is at least one. Because the width of the first pole of the fifth transistor is relatively small, the arrangement of multiple second vias in the extension direction of the data line can ensure the number of vias arranged. The more the vias are, the better the conductivity of the components connected through the vias is. In FIG. 8A, there is one first via V1, and FIG. 8B illustrates an example where there are two second vias V2, which is not limited in the present application.

Figure 9A:
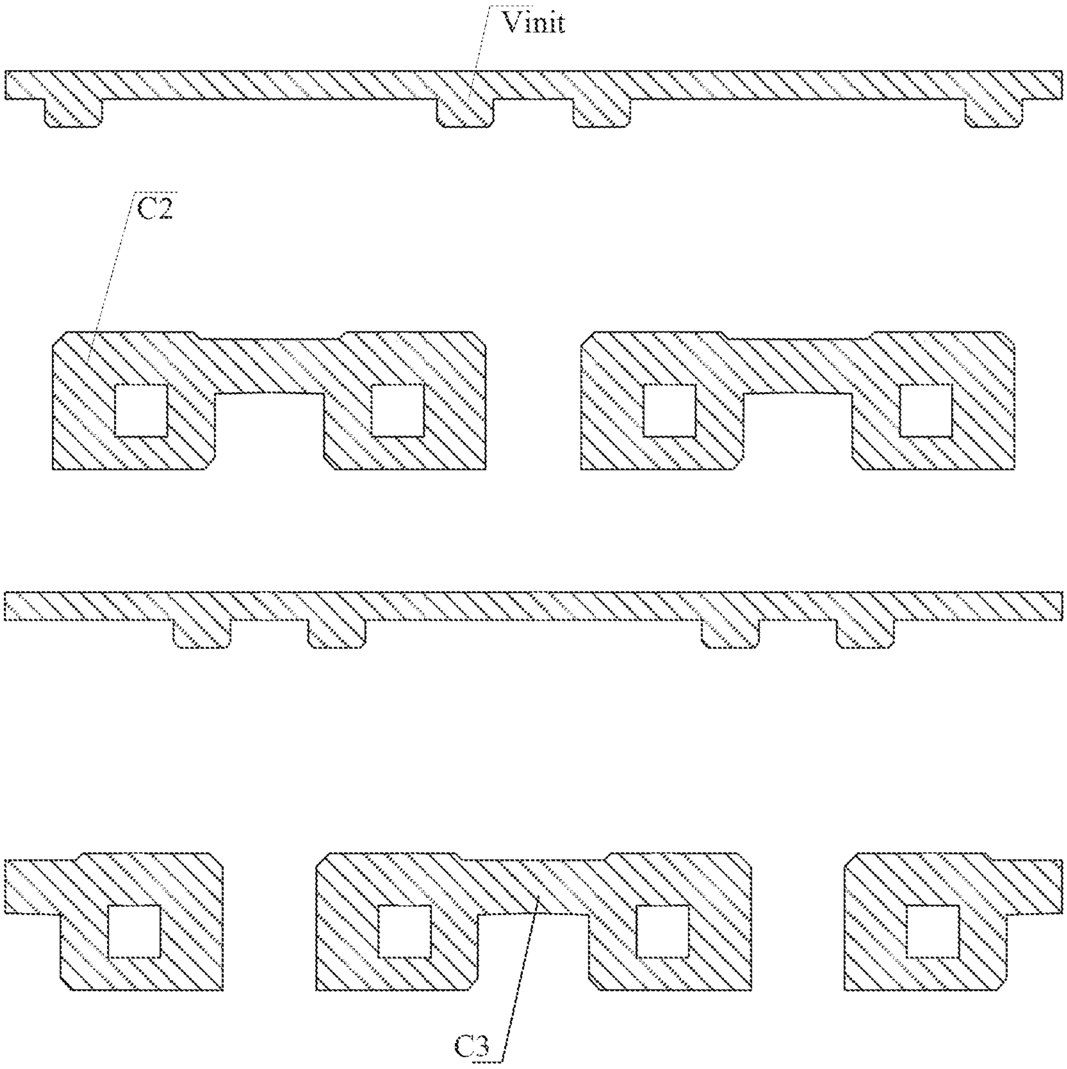
FIG. 9A is a top view of a second metal layer corresponding to Implementation II.
Figure 9B:
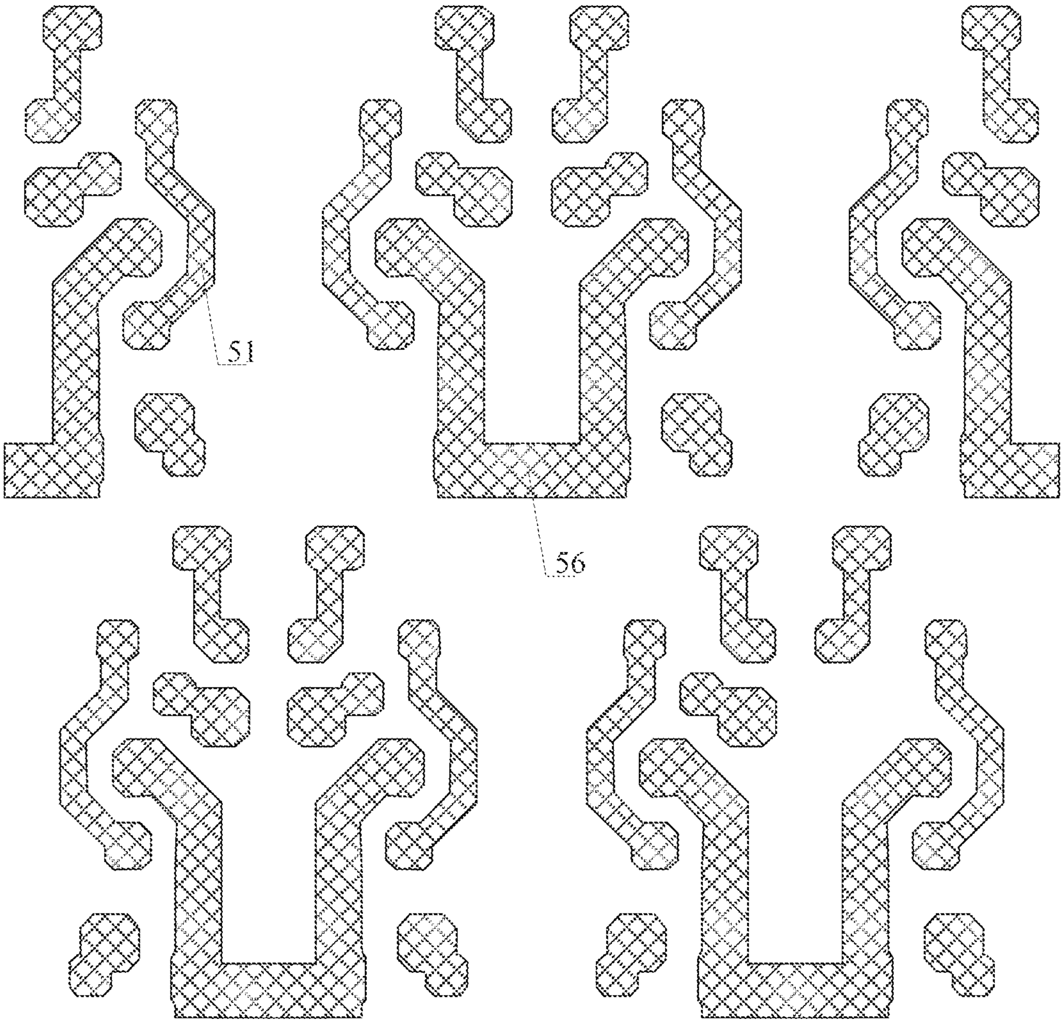
FIG. 9B is a top view of a third metal layer corresponding to Implementation II.
Figure 10:
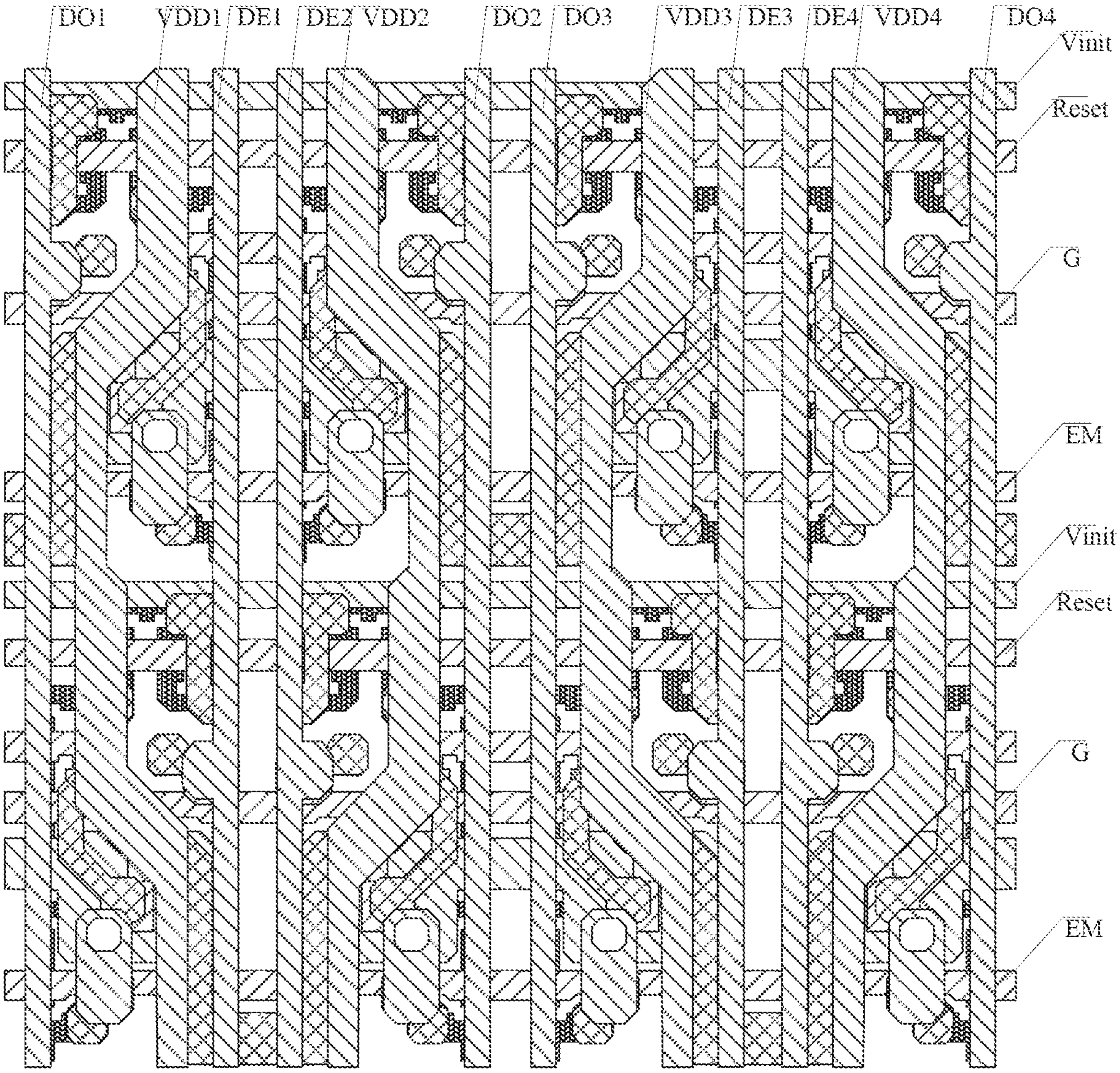
FIG. 10 is another top view of a plurality of sub-pixels in a display substrate according to the present application.

FIG. 9A is a top view of a second metal layer corresponding to Implementation II, FIG. 9B is a top view of a third metal layer corresponding to Implementation II, and FIG. 10 is another top view of a plurality of sub-pixels in a display substrate according to the present application. In order to explain the structure of the display substrate more clearly, FIGS. 9A and 9B illustrate an example of two pixels arranged in the column direction, FIG. 10 includes other film layers than the anode of the light-emitting device, and a plurality of sub-pixels included in FIG. 10 are sub-pixels corresponding to Implementation II.

As shown in FIG. 9A and FIG. 9B, in each pixel in one of two adjacent rows of pixels, the second electrode of the storage capacitor of the i-th sub-pixel and the second electrode of the storage capacitor of the i+1-th sub-pixel are connected through the first connection part C3, the second electrode of the storage capacitor of the i+1-th sub-pixel and the second electrode of the storage capacitor of the i+2-th sub-pixel are arranged at intervals, and the second electrode of the storage capacitor of the i+2-th sub-pixel and the second electrode of the storage capacitor of the i+3-th sub-pixel are connected through the first connection part C3. In each pixel in the other of the two adjacent rows of pixels, the second electrode of the storage capacitor of the i-th sub-pixel and the second electrode of the storage capacitor of the i+1-th sub-pixel are arranged at intervals, the second electrode of the storage capacitor of the i+1-th sub-pixel and the second electrode of the storage capacitor of the i+2-th sub-pixel are connected through the first connection part C3, and the second electrode of the storage capacitor of the i+2-th sub-pixel and the second electrode of the storage capacitor of the i+3-th sub-pixel are arranged at intervals.

As shown in FIG. 8A, the second electrode C2 of the storage capacitor in at least one sub-pixel may be rectangular, the first connection part C3 may be strip-shaped, and the first connection part C3 is arranged on a side of the second electrode C2 in the first direction.

In an exemplary embodiment, in two adjacent rows of pixels, in one row of pixels, the second electrode C2 of the i-th sub-pixel and the second electrode C2 of the i+1-th sub-pixel are connected with each other through the first connection part C3, the second electrode C2 of the i+1-th sub-pixel and the second electrode C2 of the i+2-th sub-pixel are arranged at intervals, and the second electrode C2 of the i+2-th sub-pixel and the second electrode C2 of the i+3-th sub-pixel are connected with each other through the first connection part C3. In the other row of pixels, the second electrode C2 of the i-th sub-pixel and the second electrode C2 of the i+1-th sub-pixel are arranged at intervals, the second electrode C2 of the i+1-th sub-pixel and the second electrode C2 of the i+2-th sub-pixel are connected with each other through the first connection part C3, and the second electrode C2 of the i+2-th sub-pixel and the second electrode C2 of the i+3-th sub-pixel are arranged at intervals.

It should be noted that FIG. 9A illustrates an example where the second electrode of the storage capacitor of the i-th sub-pixel and the second electrode of the storage capacitor of the i+1-th sub-pixel in the first row of pixels are directly connected through the first connection part C3, and the second electrode of the storage capacitor of the i+2-th sub-pixel and the second electrode of the storage capacitor of the i+3-th sub-pixel in the second row of pixels are directly connected through the first connection part C3.

In some possible implementations, as shown in FIG. 10, for each sub-pixel, there is an overlapping area between the orthographic projection of the first pole of the fifth transistor on the base substrate and the orthographic projection of the data line connected thereto on the base substrate.

In an exemplary embodiment, with reference to FIGS. 9A, 9B and 10, for the j-th pixel, a second connection part 56 may be included. Under the condition that the second electrode C2 of the storage capacitor of the i-th sub-pixel is connected with the second electrode C2 of the storage capacitor of the i+1-th sub-pixel, the first pole 51 of the fifth transistor T5 in the i+1-th sub-pixel is connected with the first pole 51 of the fifth transistor T5 in the i+2-th sub-pixel through the second connection part 56. The second electrode C2 of the storage capacitor in the i-th sub-pixel that is located in the second metal layer is connected with the second electrode C2 of the storage capacitor in the i+3-th sub-pixel that is located in the second metal layer through the first pole 51 of the fifth transistor T5 in the i+1-th sub-pixel that is located in the third metal layer, the second connection part 56, and the first pole 51 of the fifth transistor T5 in the i+2-th sub-pixel.

In an exemplary embodiment, for the j-th pixel, under the condition that the second electrode C2 of the storage capacitor of the i+1-th sub-pixel is connected with the second electrode C2 of the storage capacitor of the i+2-th sub-pixel, the first pole 51 of the fifth transistor T5 in the i-th sub-pixel is connected with the first pole 51 of the fifth transistor T5 in the i+1-th sub-pixel through the second connection part 56, and the first pole 51 of the fifth transistor T5 in the i+2-th sub-pixel is connected with the first pole 51 of the fifth transistor T5 in the i+3-th sub-pixel through the second connection part 56. The second electrode C2 of the storage capacitor of the i-th sub-pixel that is located in the second metal layer is connected with the second electrode C2 of the storage capacitor of the i+1-th sub-pixel that is located in the second metal layer through the first pole 51 of the fifth transistor T5 in the i-th sub-pixel that is located in the third metal layer, the second connection part 56, and the first pole 51 of the fifth transistor T5 in the i+1-th sub-pixel. The second electrode C2 of the storage capacitor of the i+2-th sub-pixel that is located in the second metal layer is connected with the second electrode C2 of the storage capacitor of the i+3-th sub-pixel that is located in the second metal layer through the first pole 51 of the fifth transistor T5 in the i+2-th sub-pixel that is located in the third metal layer, the second connection part 56, and the first pole 51 of the fifth transistor T5 in the i+3-th sub-pixel.

In Implementation II, the second metal layer and the third metal layer jointly complete transverse (first direction) bridging in the present application to realize the function of power supply connection lines, so that the power signals provided to each sub-pixel are the same, thereby ensuring the display effect of the display substrate.

It should be noted that since the resistivity of the third metal layer is smaller than that of the second metal layer, the display substrate provided in Implementation II can further reduce dynamic crosstalk, as compared with the display substrate provided in Implementation I.

In some possible implementations, as shown in FIG. 2, the display substrate provided by the present application may further include: a fifth insulating layer 15 and a flat layer 16 arranged between the fourth metal layer 60 and the fifth metal layer 70, and an organic light-emitting layer and a cathode (not shown in the figure) of the light-emitting device arranged on a side of the fifth metal layer 70 away from the base substrate 10. The fifth insulating layer 15 is arranged on a side of the flat layer 16 close to the base substrate 10. The cathode is arranged on a side of the organic light-emitting layer away from the base substrate 10.

As shown in FIG. 3, the fourth metal layer provided by the present application may further include a connection electrode 61. The connection electrode 61 is respectively connected with the fifth metal layer and the second pole of the sixth transistor. The fifth insulating layer and the flat layer are provided with a fifth via V5 exposing the connection electrode, and the fifth metal layer is connected with the connection electrode 61 through the fifth via V5 exposing the connection electrode 61. The fourth insulating layer is provided with a fourth via V4 exposing the second pole of the sixth transistor, and the connection electrode 61 is connected with the second pole of the sixth transistor through the fourth via V4 exposing the second pole of the sixth transistor.

In an exemplary embodiment of the present application, by arranging the data lines and power lines in different layers from the first poles and the second poles of a plurality of transistors, the area occupied by the sub-pixels and the data lines connected with the sub-pixels can be reduced, thereby improving the resolution of the OLED display substrate driven by high frequency.

Based on the same inventive concept, the present application further provides a method for manufacturing a display substrate, to manufacture the display substrates provided in the above embodiments. In an exemplary embodiment, in a plane parallel to the display substrate, the display substrate includes gate lines, data lines, power lines and a plurality of sub-pixels arranged on a base substrate, at least one sub-pixel includes a light-emitting device and a driving circuit configured to drive the light-emitting device to emit light, and the driving circuit includes a plurality of transistors and a storage capacitor.

The manufacturing method may include: providing a base substrate; and forming a plurality of functional layers on the base substrate, the plurality of functional layers including a semiconductor layer, a first conductive layer, a second conductive layer, a third conductive layer and a fourth conductive layer which are sequentially arranged, a first insulating layer, a second insulating layer, a third insulating layer and a fourth insulating layer being respectively arranged between the plurality of functional layers, and in an extension direction of the gate lines, the power lines being connected with each other through at least one functional layer.

Figure 11:
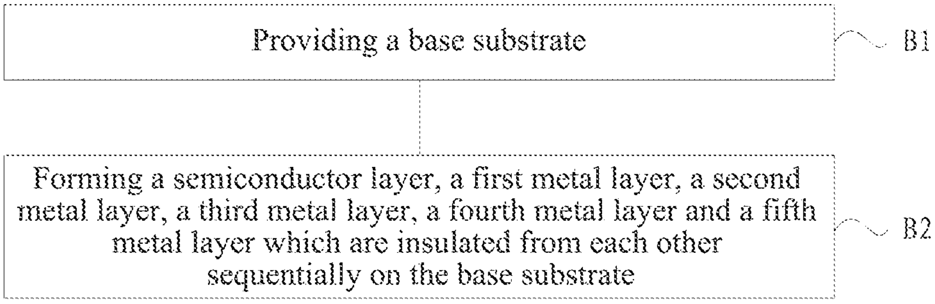
FIG. 11 is a flowchart of a method for manufacturing a display substrate according to the present application.

FIG. 11 is a flowchart of a method for manufacturing a display substrate according to the present application. As shown in FIG. 11, the method for manufacturing a display substrate provided by the present application may include step B1 and step B2.

In step B1, a base substrate is provided.

In step B2, a semiconductor layer, a first metal layer, a second metal layer, a third metal layer, a fourth metal layer and a fifth metal layer which are insulated from each other are sequentially formed on the base substrate.

In an exemplary embodiment, the semiconductor layer may include active regions of a plurality of transistors. The first metal layer may include a gate line, a light emission control line, a reset signal line, a first electrode of a storage capacitor, and gate electrodes of the plurality of transistors. The second metal layer may include an initial signal line and a second electrode of the storage capacitor. The third metal layer may include: source and drain electrodes of the plurality of transistors. The fourth metal layer may include: a data line and a power line. The fifth metal layer may include: an anode of a light-emitting device. Driving circuits of the i-th column of sub-pixels are connected with the i-th column of data line. Each column of data line includes: a first sub-data line and a second sub-data line. The first sub-data line and the second sub-data line in the i-th column of data line are located on two sides of the i-th column of sub-pixels, respectively. All sub-data lines between adjacent two columns of sub-pixels are merely the first sub-data lines or the second sub-data lines.

In the above, $1 \leq i \leq N$, N being the number of total columns of sub-pixels.

The display substrates manufactured by the method for manufacturing a display substrate according to the present application have similar implementation principles and implementation effects, which will not be described further here.

In some possible implementations, step B2 may include: sequentially forming a semiconductor layer and a first insulating layer on a base substrate; sequentially forming a first metal layer and a second insulating layer on the first insulating layer; sequentially forming a second metal layer and a third insulating layer on the second insulating layer; sequentially forming a third metal layer and a fourth insulating layer on the third insulating layer; sequentially forming a fourth metal layer, a fifth insulating layer and a flat layer on the fourth insulating layer; and sequentially forming a fifth metal layer, an organic light-emitting layer of a light-emitting device and a cathode of the light-emitting device on the flat layer.

Figure 12:
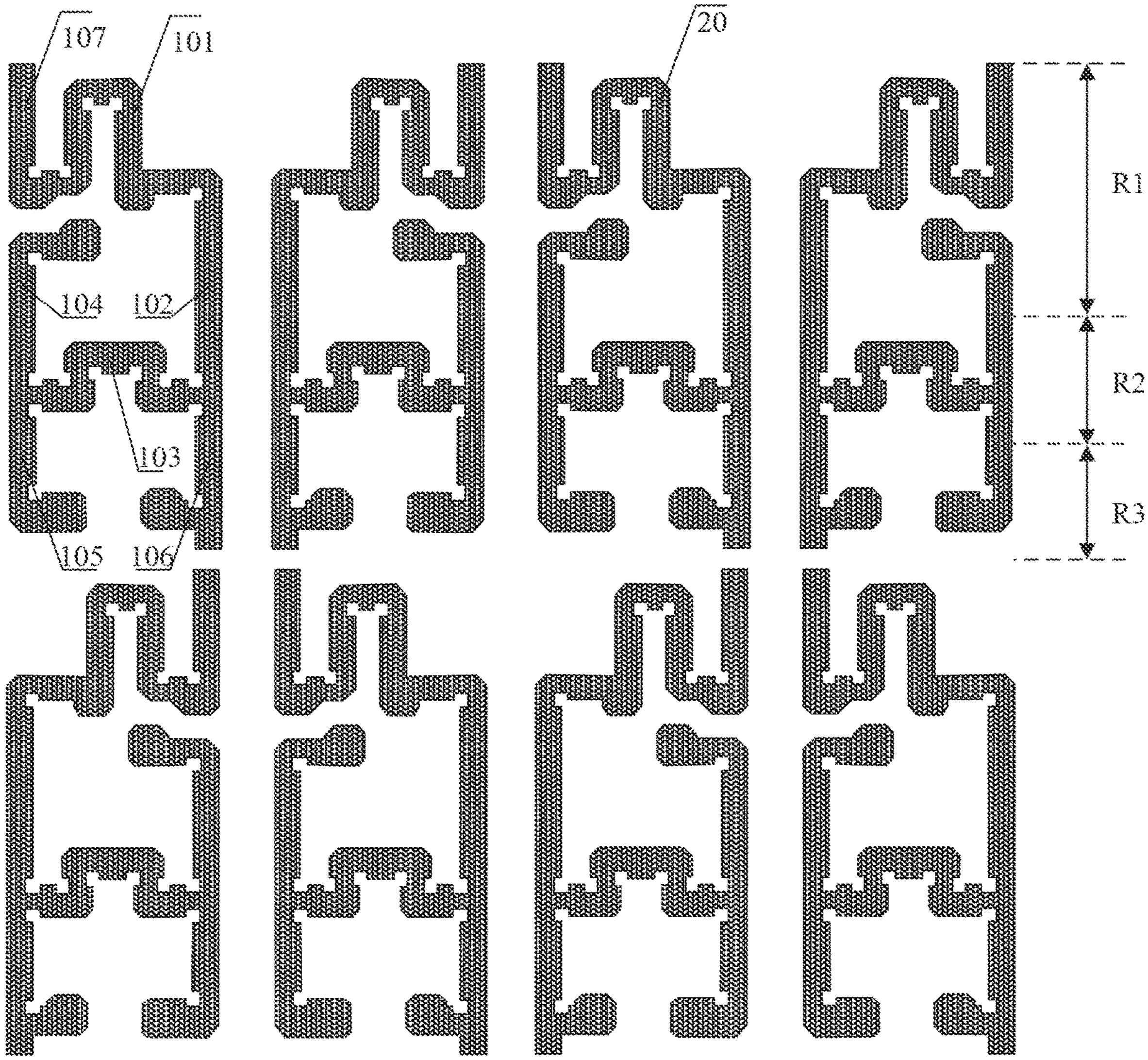
FIG. 12 is a first manufacturing schematic diagram of a display substrate according to the present application.
Figure 13:
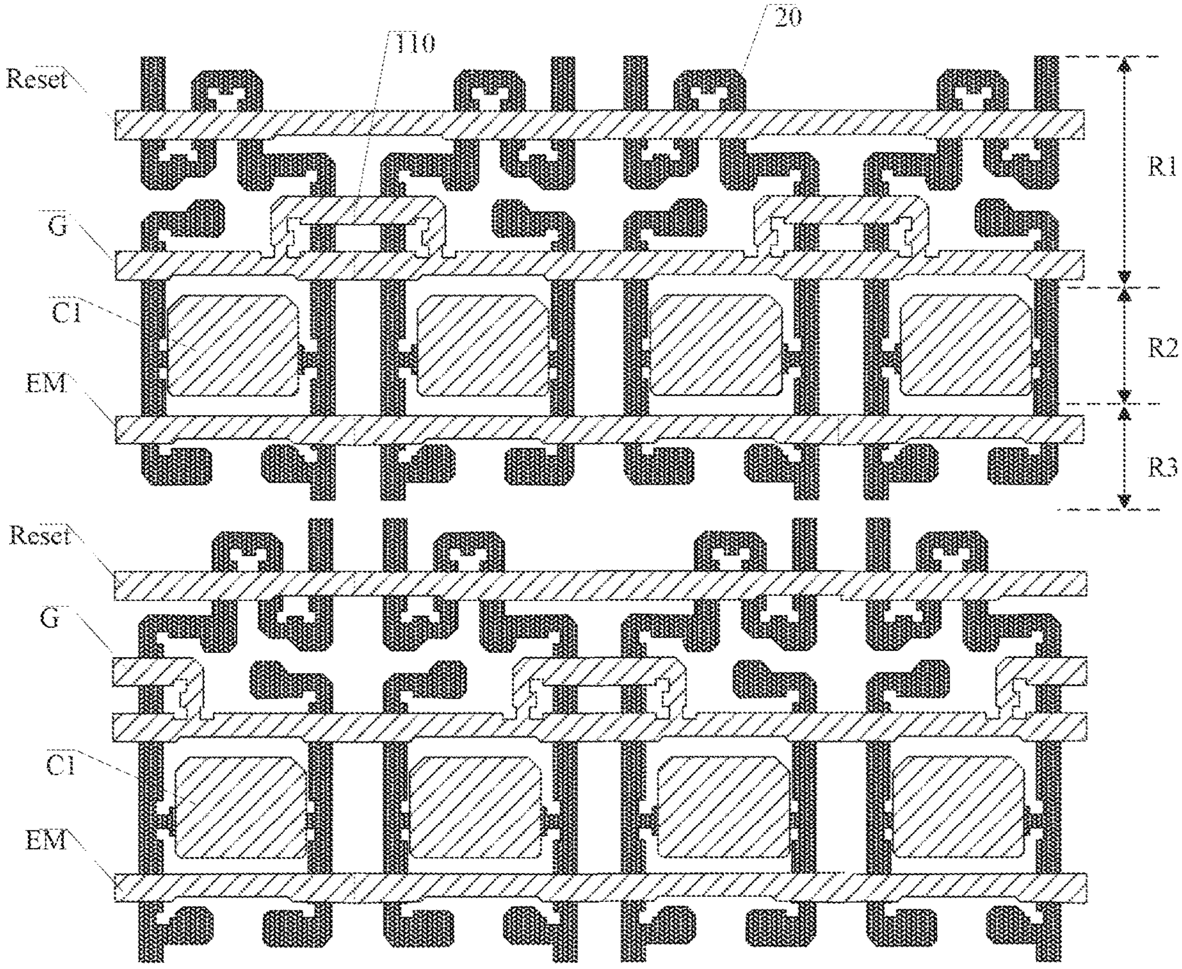
FIG. 13 is a second manufacturing schematic diagram of a display substrate according to the present application.
Figure 14A:
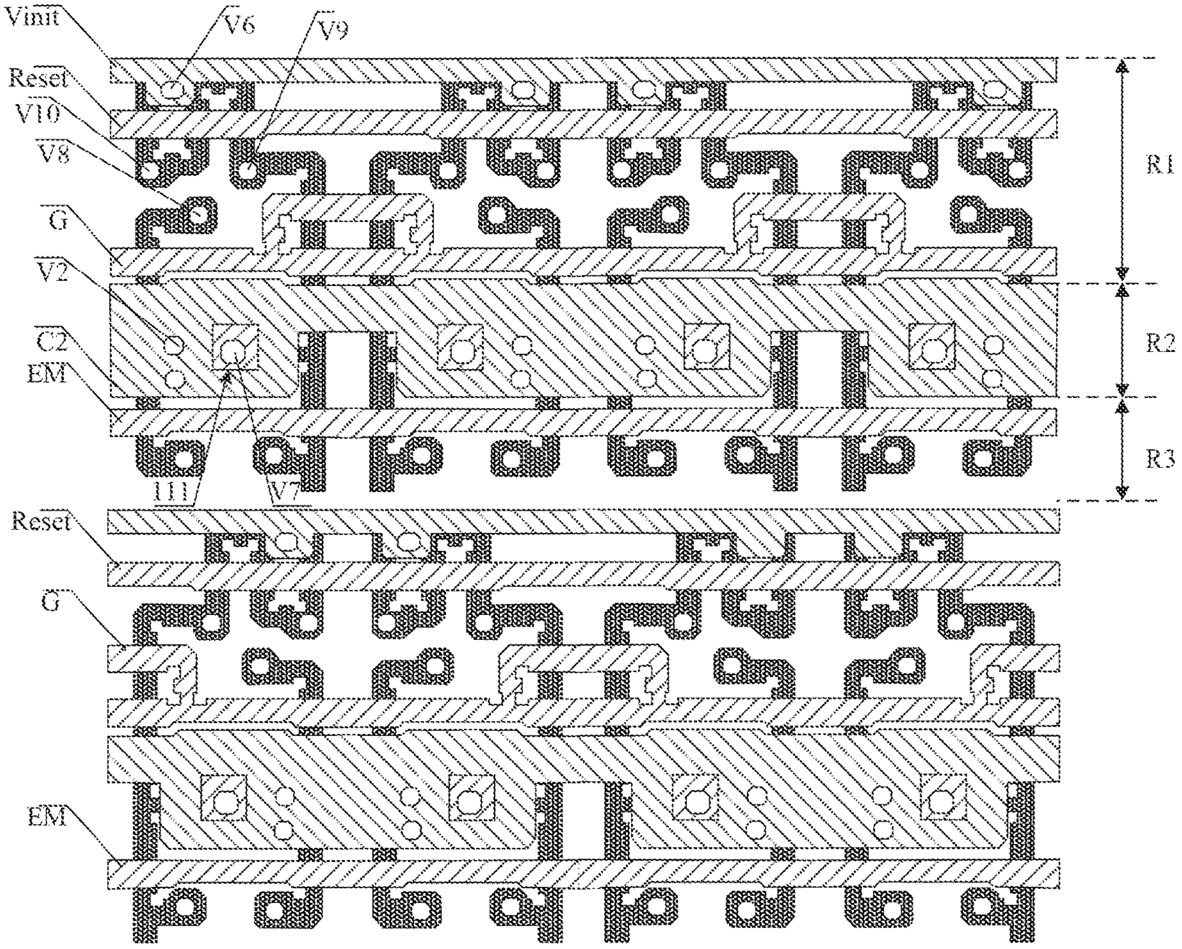
FIG. 14A is a third manufacturing schematic diagram of a display substrate according to the present application.
Figure 14B:
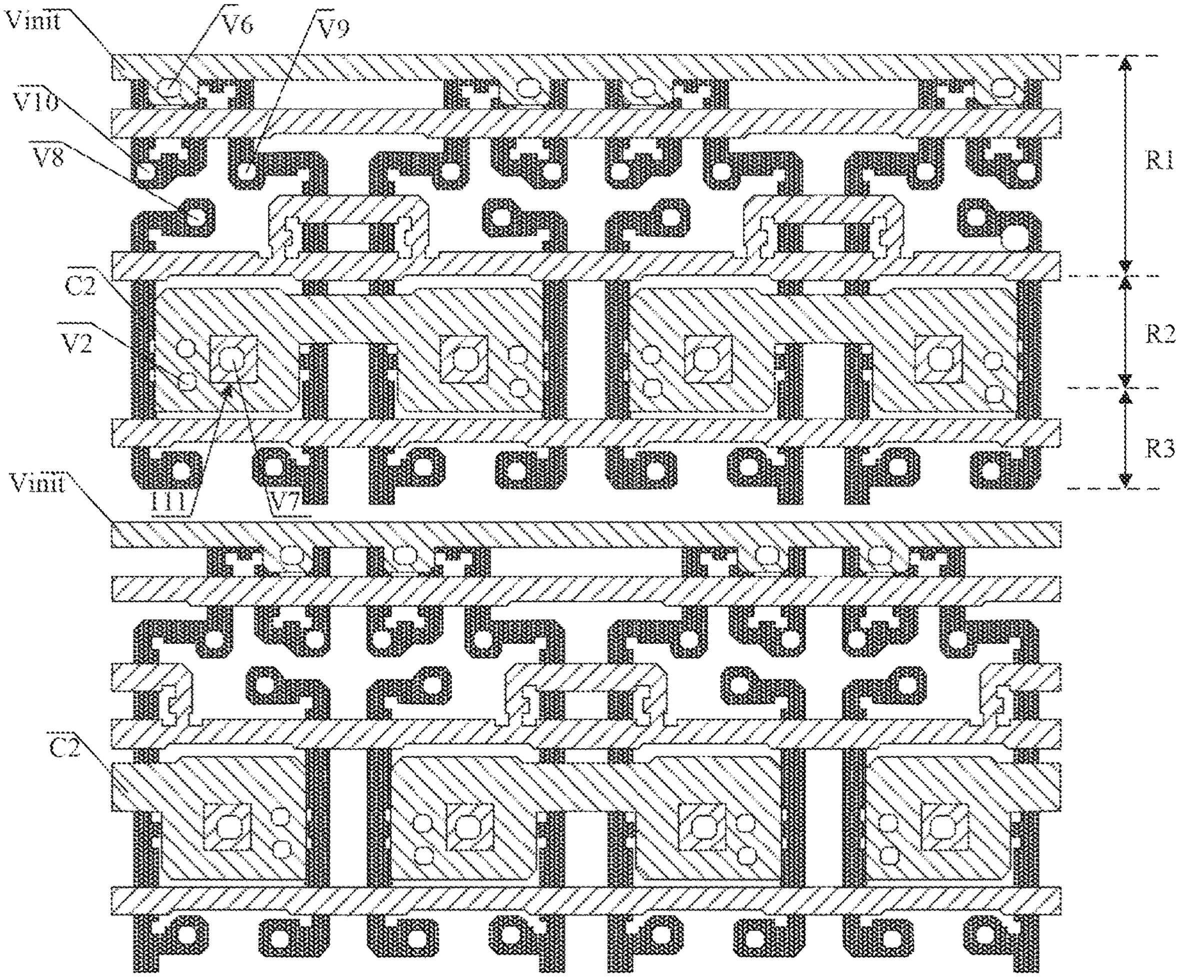
FIG. 14B is another third manufacturing schematic diagram of a display substrate according to the present application.
Figure 15A:
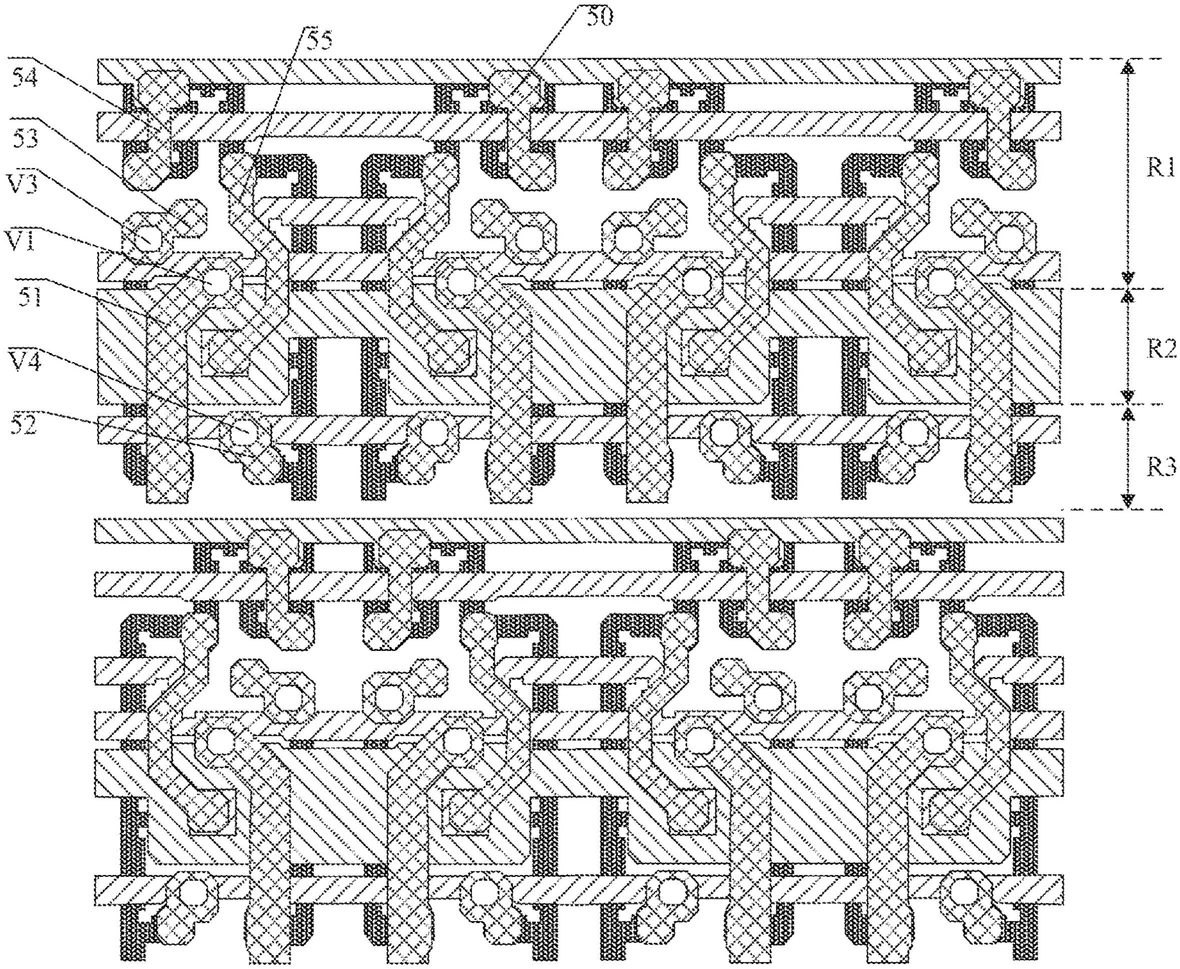
FIG. 15A is a fourth manufacturing schematic diagram of a display substrate according to the present application.
Figure 15B:
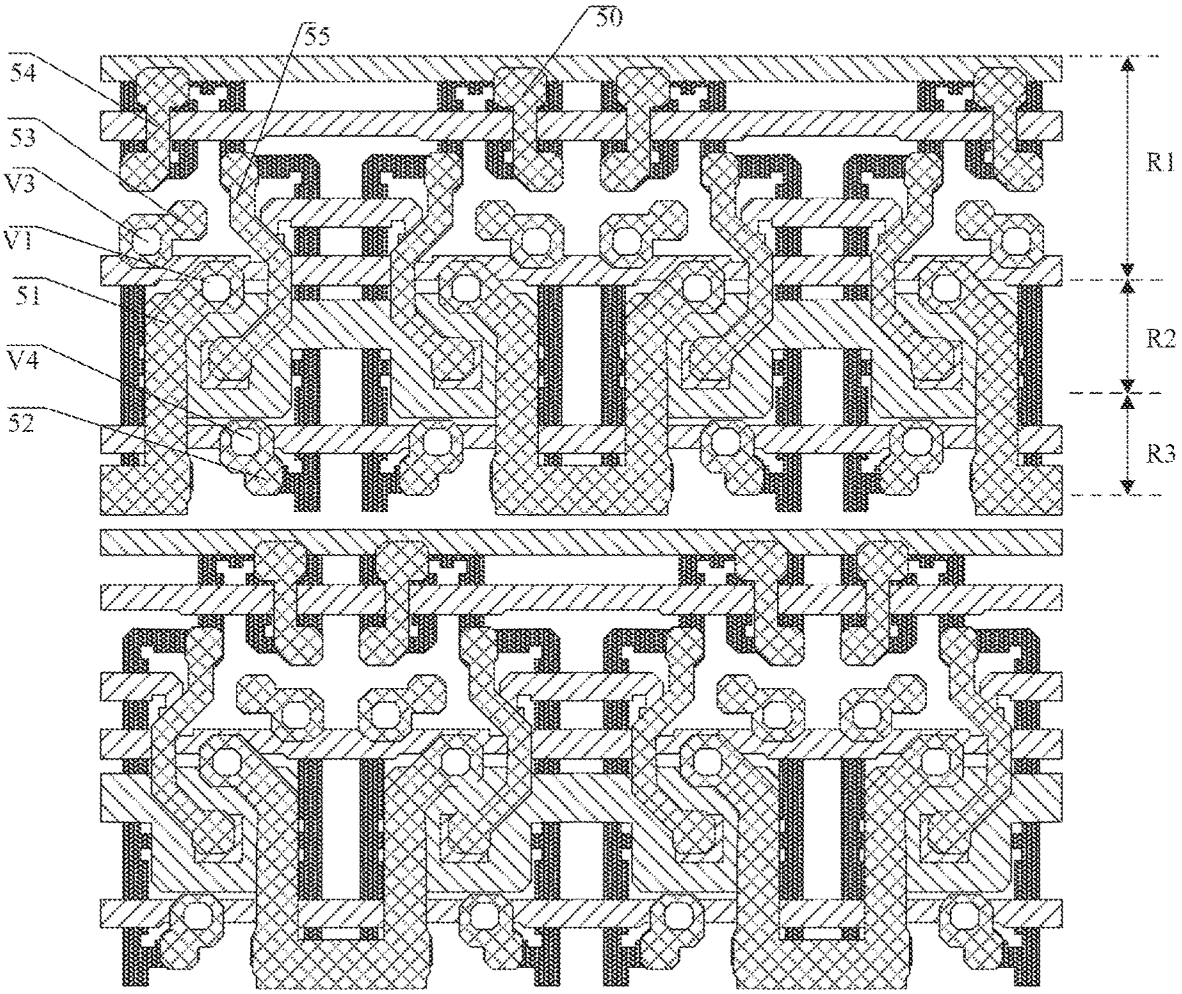
FIG. 15B is another fourth manufacturing schematic diagram of a display substrate according to the present application.
Figure 16A:
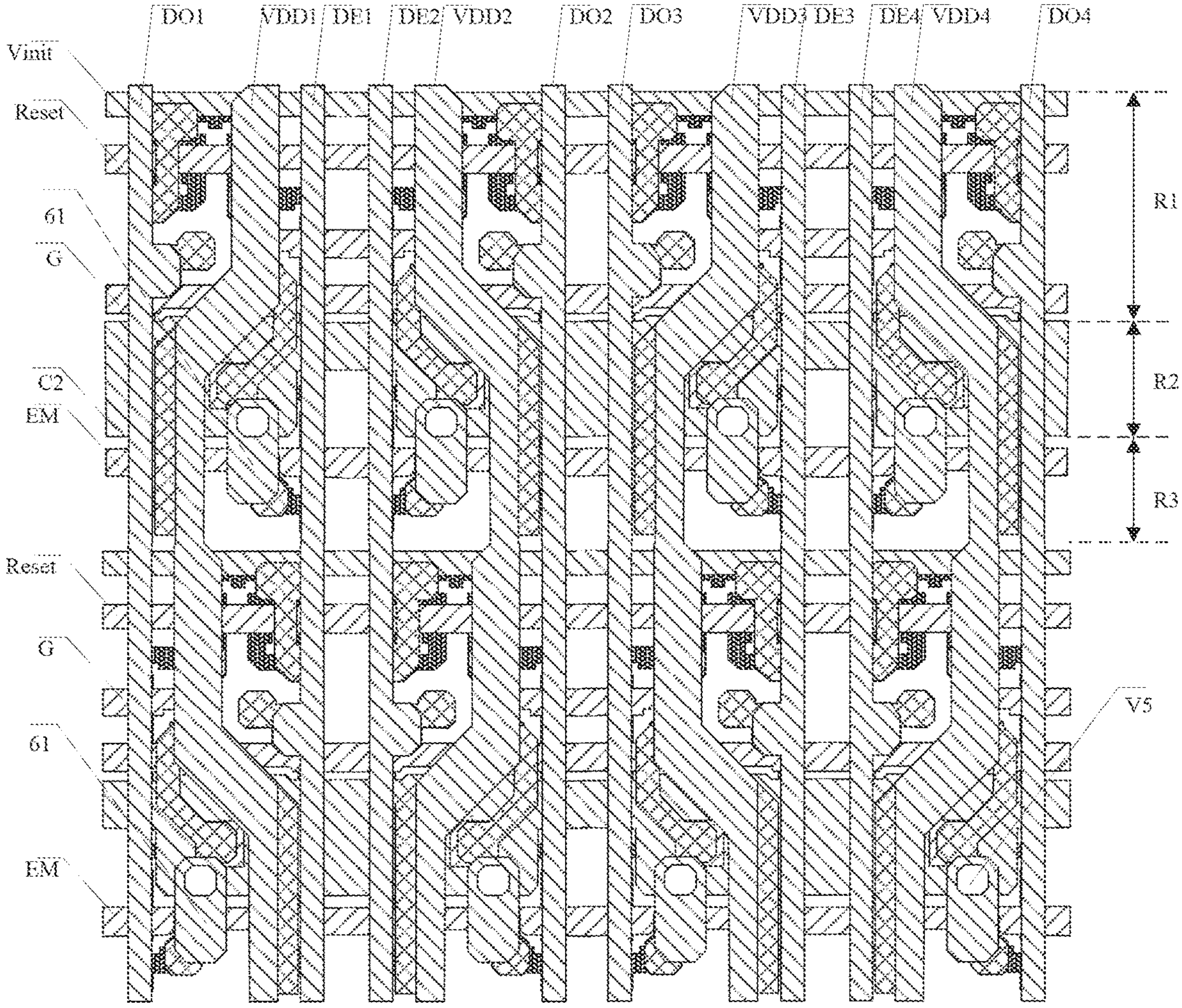
FIG. 16A is a fifth manufacturing schematic diagram of a display substrate according to the present application.
Figure 16B:
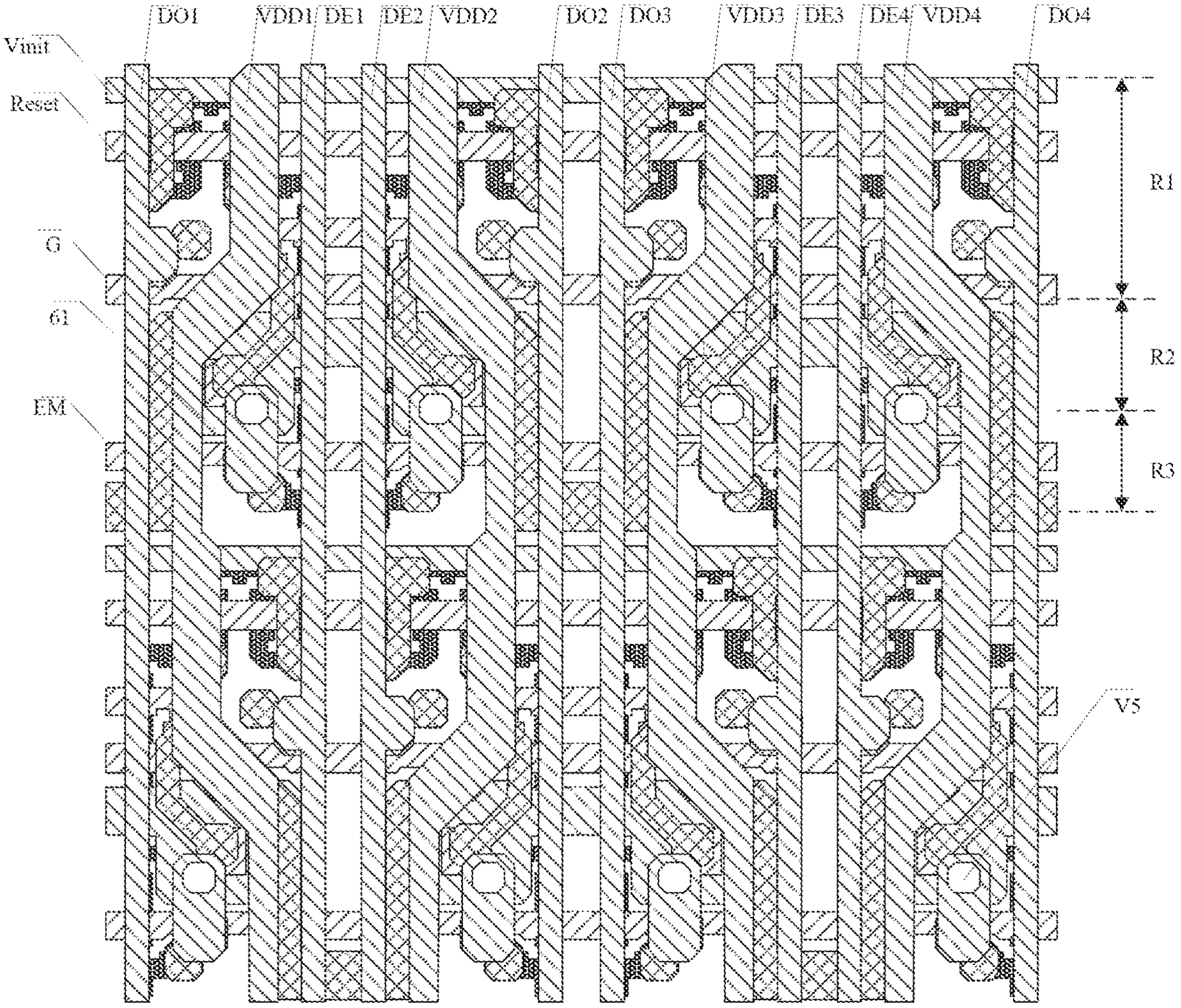
FIG. 16B is another fifth manufacturing schematic diagram of a display substrate according to the present application.

FIG. 12 is a first manufacturing schematic diagram of a display substrate according to the present application, FIG. 13 is a second manufacturing schematic diagram of a display substrate according to the present application, FIG. 14A is a third manufacturing schematic diagram of a display substrate according to the present application, FIG. 14B is another third manufacturing schematic diagram of a display substrate according to the present application, FIG. 15A is a fourth manufacturing schematic diagram of a display substrate according to the present application, FIG. 15B is another fourth manufacturing schematic diagram of a display substrate according to the present application, FIG. 16A is a fifth manufacturing schematic diagram of a display substrate according to the present application, and FIG. 16B is another fifth manufacturing schematic diagram of a display substrate according to the present application.

The "patterning process" mentioned in the present application includes processing, such as film layer deposition, photoresist coating, mask exposure, development, etching, and photoresist stripping. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not limited in the present application. "Thin film" refers to a layer of thin film fabricated by a certain material on a base substrate by using deposition or another process. If the "thin film" does not need a patterning process during the whole manufacturing process, the "thin film" may also be called a "layer". If the "thin film" needs a patterning process throughout the whole manufacturing process, it is referred to as a "thin film" before the patterning process and as a "layer" after the patterning process. The "layer" after the patterning process contains at least one "pattern".

Referring to FIGS. 12 to 16B, the manufacturing process of a display substrate provided by the present application may include the following operations.

In step 100, a base substrate 10 is provided, a semiconductor thin film is deposited on the base substrate 10, and the semiconductor thin film is processed by a patterning process to form a semiconductor layer 20, as shown in FIG. 12.

In an exemplary embodiment, the semiconductor layer 20 of each sub-pixel may include a first active region 101 at a position where the first transistor T1 is located, a second active region 102 at a position where the second transistor T2 is located, a third active region 103 at a position where the third transistor T3 is located, a fourth active region 104 at a position where the fourth transistor T4 is located, a fifth active region 105 at a position where the fifth transistor T5 is located, a sixth active region 106 at a position where the sixth transistor T6 is located, and a seventh active region 107 at a position where the seventh transistor T7 is located. The first active region 101 to the seventh active region 107 are an integrated structure in which they are connected with each other.

In an exemplary embodiment, the first active region 101 and the seventh active region 107 are arranged on a side of the first region R1 away from the second region R2, the second active region 102 and the fourth active region 104 are arranged on a side of the first region R1 close to the second region R2, the third active region 103 is arranged in the second region R2, and the fifth active region 105 and the sixth active region 106 are arranged in the third region R3.

In an exemplary embodiment, the first active region 101 is connected with the second active region 102 and the seventh active region 107, the second active region 102 is connected with the third active region 103 and the sixth active region 106, and the fourth active region 104 is connected with the third active region 103 and the fifth active region 105.

In an exemplary embodiment, the first active region 101 is "n"-shaped, the seventh active region 107 is "L"-shaped, and the seventh active region 107 is located on a side of the first active region 101 away from a center line of sub-pixels. The center line of sub-pixels is a straight line equally dividing the sub-pixels in the first direction and extending in the second direction. The second active region 102 is "7"-shaped and located on one side of the center line of sub-pixels, and the fourth active region 104 is "1"-shaped and located on the other side of the center line of sub-pixels. The third active region 103 has a "IL" shape, and the "IL" shape may be mirror symmetric with respect to the center line of sub-pixels. The fifth active region 105 is "L"-shaped, and the shape of the sixth active region 106 and the shape of the fifth active region 105 are mirror symmetric with respect to the center line of sub-pixels. Herein, an active region of a transistor having a certain shape refers to the shape of the active region in the vicinity of the gate of the transistor, including, but not limited to, a channel area, source and drain areas of the active region of the transistor, and a partial extension region of the active region used for connection with source and drain areas of other transistors.

In an exemplary embodiment, the active region of each transistor includes a first area, a second area, and a channel area located between the first area and the second area. In an exemplary embodiment, the first area of the first active region 101 also serves as the first area of the seventh active region 107, and the second area of the first active region 101 also serves as the first area of the second active region 102. The second area of the second active region 102, the second area of the third active region 103 and the first area of the sixth active region 106 are connected with each other, and the first area of the third active region 103, the second area of the fourth active region 104 and the second area of the fifth active region 105 are connected with each other. The first area of the fourth active region 104 is arranged on one side away from the third active region 103, and the first area of the fifth active region 105 is arranged on the other side away from the third active region 103. The second area of the sixth active region 106 also serves as the second area of the seventh active region 107.

In an exemplary embodiment, the distance between the second active region 102 and the first active region 101 in the first direction is smaller than the distance between the second active region 102 and the seventh active region 107 in the first direction. The distance between the second active region 102 and the third active region 103 in the first direction is smaller than the distance between the second active region 102 and the fourth active region 104 in the first direction. The distance between the second active region 102 and the third active region 103 in the first direction is smaller than the distance between the second active region 102 and the fifth active region 105 in the first direction. The distance between the second active region 102 and the first active region 101 in the first direction is equivalent to the distance between the second active region 102 and the third active region 103 in the first direction.

In an exemplary embodiment, the seventh active region 107 and the first active region 101 are sequentially arranged in the direction from the data line to the power line in which a data signal is written.

In an exemplary embodiment, the shape of the semiconductor layer 20 of the sub-pixel in the i-th row and the j-th column is the same as the shape of the semiconductor layer 20 of the sub-pixel in the i+1-th row and the j+1-th column, and the shape of the semiconductor layer 20 of the sub-pixel in the i-th row and the j+1-th column is the same as the shape of the semiconductor layer 20 of the sub-pixel in the i+1-th row and the j-th column. In the first direction, for the center line between adjacent sub-pixels, semiconductor layers 20 of the adjacent sub-pixels are mirror symmetric about the center line, that is, in the first direction, the semiconductor layers of adjacent sub-pixels are symmetrical with each other. Here, the shapes of the semiconductor layers being the same includes, but is not limited to, that the overall shapes, the connection relationship of respective parts and the trends of signal flow being the same.

In an exemplary embodiment, the manufacturing schematic diagram of the active region in Implementation I is the same as the manufacturing schematic diagram of the active region in Implementation II.

The semiconductor layers of the exemplary embodiments of the present application have a reasonable layout and a simple structure, and can ensure the display effect of the display substrate.

In step 200, a first insulating thin film and a first metal thin film are sequentially deposited on the semiconductor layer 20, and the first metal thin film is processed by a patterning process to form a first insulating layer covering the semiconductor layer 20 and a first metal layer 30 arranged on the first insulating layer, as shown in FIG. 13.

In an exemplary embodiment, the first metal layer 30 may include: a gate line G, a reset signal line Reset, a light emission control line EM, and a first electrode C1 of a storage capacitor.

In an exemplary embodiment, the gate line G, the reset signal line Reset and the light emission control line EM extend in the first direction, the gate line G and the reset signal line Reset are arranged in the first region R1, and the light emission control line EM is arranged in the third region R3. The first electrode C1 of the storage capacitor may be rectangular, and the corners of the rectangle may be chamfered. The first electrode C1 is arranged in the second region R2 and located between the gate line G and the light emission control line EM. There is an overlapping area between the orthographic projection of the first electrode C1 on the base substrate and the orthographic projection of the third active region on the base substrate. In an exemplary embodiment, a first pole plate C1 also serves as the gate electrode of the third transistor.

In an exemplary embodiment, the reset signal line Reset of the first region R1 may be arranged with unequal widths, and the width of the reset signal line Reset is the dimension of the reset signal line Reset in the second direction. The reset signal line Reset includes an area overlapping with the semiconductor layer 20 and an area not overlapping with the semiconductor layer 20, and the width of the reset signal line Reset in the area overlapping with the semiconductor layer 20 may be greater than the width of the reset signal line Reset in the area not overlapping with the semiconductor layer 20.

In an exemplary embodiment, the gate line G in the first region R1 may be arranged with unequal widths, and the width of the gate line G is the dimension of the gate line Gin the second direction. In an area of the gate line G overlapping with the semiconductor layer 20 and an area of the gate line G not overlapping with the semiconductor layer 20, the width of the gate line G in the area overlapping with the semiconductor layer 20 may be greater than the width of the gate line G in the area not overlapping with the semiconductor layer 20.

In an exemplary embodiment, the light emission control line EM in the third region R3 may be arranged with unequal widths, and the width of the light emission control line EM is the dimension of the light emission control line EM in the second direction. The light emission control line EM includes an area overlapping with the semiconductor layer 20 and an area not overlapping with the semiconductor layer 20, and the width of the light emission control line EM in the area overlapping with the semiconductor layer 20 may be greater than the width of the light emission control line EM in the area not overlapping with the semiconductor layer 20.

In an exemplary embodiment, the gate line G in the i-th row may include a first gate line segment extending from the j-th column of sub-pixels to the j+1-th column of sub-pixels in the first direction. A first end of the first gate line segment is connected with the gate line G through a connection strip in the sub-pixel in the i-th row and the j-th column, and a second end of the first gate line segment is connected with the gate line G through a connection strip in the sub-pixel in the i-th row and the j+1-th column, to form a dual gate structure simultaneously in the sub-pixel in the i-th row and the j-th column and in the sub-pixel in the i-th row and j+1 column. The gate line G in the i+1-th row may include a second gate line segment extending from the j+1-th column of sub-pixels to the j+2-th column of sub-pixels in the first direction. A first end of the second gate line segment is connected with the gate line G through a connection strip in the sub-pixel in the i+1-th row and the j+1-th column, and a second end of the second gate line segment is connected with the gate line G through a connection strip in the sub-pixel in the i+1-th row and the j+2-th column, to form a dual gate structure simultaneously in the sub-pixel in the i+1-th row and the j+1-th column and in the sub-pixel in the i+1-th row and the j+2-th column. In this way, second transistors T2 of dual gate structure are formed simultaneously in the j-th column of sub-pixels and the j+1-th column of sub-pixels, and the second transistors T2 of the j-th column of sub-pixels and the second transistors T2 of the j+1-th column of sub-pixels form a dual gate region 110.

In an exemplary embodiment, an area of the first electrode C1 overlapping with the third active region serves as a third gate electrode (a dual gate structure), an area of the gate line G overlapping with the second active region serves as a second gate electrode (a dual gate structure), an area of the reset signal line Reset overlapping with the first active region serves as a first gate electrode (a dual gate structure), an area of the gate line G overlapping with the fourth active region serves as a fourth gate electrode, an area of the reset signal line Reset overlapping with the seventh active region serves as a seventh gate electrode, an area of the light emission control line EM overlapping with the fifth active region serves as a fifth gate electrode, and an area of the light emission control line EM overlapping with the sixth active region serves as a sixth gate electrode.

In an exemplary embodiment, since the first transistor T1, the second transistor T2 and the third transistor T3 are all dual gate transistors, the distance between the dual-gate second transistor T2 and other dual-gate transistors (the first transistor T1 and the third transistor T3) in the first direction is smaller than the distance between the second transistor T2 and the single-gate fourth transistor T4, fifth transistor T5 and seventh transistor T7 in the first direction.

In an exemplary embodiment, after the pattern of the first metal layer 30 is formed, the semiconductor layer may be subjected to a conductive treatment by using the first metal layer 30 as a shield. The semiconductor layer in an area shielded by the first metal layer 30 forms channel areas of the first transistor T1 to the seventh transistor T7, and the semiconductor layer in an area not shielded by the first metal layer 30 is made to be conductive, that is, the first areas and the second areas of the first transistor T1 to the seventh transistor T7 are made to be conductive.

In an exemplary embodiment, the manufacturing schematic diagram of the first metal layer in Implementation I is the same as the manufacturing schematic diagram of the first metal layer in Implementation II.

The first metal layers of the exemplary embodiments of the present application have a reasonable layout and a simple structure, and can ensure the display effect of the display substrate.

In step 300, a second insulating thin film and a second metal thin film are sequentially deposited on the first metal layer 30, and the second metal thin film is processed by a patterning process to form a second insulating layer covering the first metal layer 30 and a second metal layer 40 arranged on the second insulating layer. The second metal layer 40 at least includes an initial signal line Vinit and a second electrode C2 of the storage capacitor. Then, a third insulating thin film is deposited on the second metal layer 40, and the third insulating thin film is processed by a patterning process to form a third insulating layer covering the second metal layer 40. The third insulating layer is provided with a plurality of vias, as shown in FIGS. 14A and 14B.

In an exemplary embodiment, the plurality of vias on the third insulating layer at least include: a second via V2 exposing the second electrode C2, a sixth via V6 exposing the initial signal line Vinit, a seventh via V7 exposing the first electrode C1, an eighth via V8 exposing the fourth active region, a ninth via V9 exposing the second active region, a tenth via V10 exposing the first active region, and a plurality of vias exposing other active regions in the semiconductor layer. The third insulating layer in the second via V2 exposing the second electrode C2 and in the sixth via V6 exposing the initial signal line Vinit is etched away, the second insulating layer and the third insulating layer in the seventh via V7 exposing the first electrode C1 are etched away, and the first insulating layer, the second insulating layer and the third insulating layer in the eighth via V8 exposing the fourth active region, in the ninth via V9 exposing the second active region, in the tenth via V10 exposing the first active region, and in the vias exposing other active regions in the semiconductor layer are etched away.

In an exemplary embodiment, the second via V2 is configured to connect the second electrode C2 with the first pole of the fifth transistor T5 that is formed subsequently, the sixth via V6 is configured to connect the initial signal line Vinit with the first pole of the first transistor T1 that is formed subsequently, the seventh via V7 is configured to connect the first electrode C1 with the first pole of the second transistor T2 that is formed subsequently, the eighth via V8 is configured to connect the active layer of the fourth transistor T4 with the first pole of the fourth transistor T4 that is formed subsequently, the ninth via V9 is configured to connect the active layer of the second transistor T2 with the first pole of the second transistor T2 that is formed subsequently, and the tenth via V10 is configured to connect the active layer of the first transistor T1 with the first pole of the first transistor T1 that is formed subsequently. Since the first pole of the fourth transistor T4 that is formed subsequently is connected with the data line D that is formed subsequently, the eighth via V8 is a data writing hole.

In an exemplary embodiment, the distance between the data writing hole and the second transistor T2 in the first direction is greater than the distance between the data writing hole and the first transistor T1 in the first direction, and is greater than the distance between the data writing hole and the seventh transistor T7 in the first direction. The distance between the data writing hole and the third transistor T3 in the second direction is smaller than the distance between the data writing hole and the fifth transistor T5 in the second direction, and is smaller than the distance between the data writing hole and the sixth transistor T6 in the second direction.

In an exemplary embodiment, the number of second vias V2 may be two, and the two second vias are sequentially arranged in the second direction. Since the width of a fifth first pole is relatively small, the arrangement of two second vias V2 may improve the reliability of connection between the second electrode and the fifth first pole.

In an exemplary embodiment, the initial signal line Vinit extends in the first direction, and is arranged in the first region R1 and located on a side of the reset signal line Reset away from the second region R2. The second electrode C2 of the storage capacitor in each sub-pixel may have a rectangular profile, and is arranged in the second region R2 and located between the gate line G and the light emission control line EM.

In an exemplary embodiment, the profile of the second electrode C2 may be rectangular, and the corners of the rectangle may be chamfered. There is an overlapping area between the orthographic projection of the second electrode C2 on the base substrate and the orthographic projection of the first electrode C1 on the base substrate. The middle of the second electrode C2 is provided with an opening 111 which can be rectangular, so that the second electrode C2 forms an annular structure. The opening 111 exposes the second insulating layer covering the first electrode C1, and the orthographic projection of the first electrode C1 on the base substrate includes the orthographic projection of the opening 111 on the base substrate. In an exemplary embodiment, the orthographic projection of the opening 111 on the base substrate includes the orthographic projection of the seventh via V7 exposing the first electrode C1 on the base substrate.

The orthographic projection of an edge of the second electrode C2 close to the first region R1 on the base substrate overlaps with the orthographic projection of the boundary line between the first region R1 and the second region R2 on the base substrate, and the orthographic projection of an edge of the second electrode C2 close to the third region R3 on the base substrate overlaps with the orthographic projection of the boundary line between the second region R2 and the third region R3 on the base substrate, that is, a second length of the second electrode C2 is equal to a second length of the second region R2, the second length referring to the dimension in the second direction.

In Implementation I, the second electrodes C2 of adjacent sub-pixels in one row are an integrated structure in which they are connected with each other. With this structure, the second electrodes C2 of adjacent sub-pixels may be reused as power signal lines, which can ensure that power signals provided by the power lines of adjacent sub-pixels are the same, thereby avoiding poor display of the display substrate and ensuring the display effect of the display substrate.

In Implementation II, the second electrode C2 of the sub-pixel in the i-th row and the j+1-th column and the second electrode C2 of the sub-pixel in the i-th row and the j+1-th column are an integrated structure in which they are connected with each other by the first connection part. The second electrode C2 of the sub-pixel in the i-th row and the j+1-th column is disconnected from the second electrode C2 of the sub-pixel in the i-th row and the j+2-th column. The second electrode C2 of the sub-pixel in the i-th row and the j+2-th column and the second electrode C2 of the sub-pixel in the i-th row and the j+3-th column are an integrated structure in which they are connected with each other by the first connection part. The second electrode C2 of the sub-pixel in the i+1-th row and the j-th column is disconnected from the second electrode C2 of the sub-pixel in the i+1-th row and the j+1-th column. The second electrode C2 of the sub-pixel in the i+1-th row and the j+1-th column and the second electrode C2 of the sub-pixel in the i+1-th row and the j+2-th column are an integrated structure in which they are connected with each other by the first connection part. The second electrode C2 of the sub-pixel in the i+1-th row and the j+2-th column is disconnected from the second electrode C2 of the sub-pixel in the i+1-th row and the j+3-th column. With this structure, the second electrodes C2 of adjacent sub-pixels may be reused as power signal lines, which can ensure that power signals provided by the power lines of adjacent sub-pixels are the same, thereby avoiding poor display of the display substrate and ensuring the display effect of the display substrate.

FIG. 14A is a manufacturing schematic diagram of Implementation I, and FIG. 14B is a manufacturing schematic diagram of Implementation II.

The second metal layers and the vias of the exemplary embodiments of the present application have a reasonable layout and a simple structure, and can ensure the display effect of the display substrate.

In step 400, a third metal thin film is deposited on the third insulating layer, and the third meal thin film is processed by a patterning process to form a third metal layer 50. The third meal layer 50 at least includes the first pole 51 of the fifth transistor T5, the second pole 52 of the sixth transistor T6, the first pole 53 of the fourth transistor T4, the first pole 54 of the first transistor T1 and the first pole 55 of the second transistor T2. The first pole 51 of the fifth transistor T5 is connected with the second electrode C2 through the second via V2. The second pole 52 of the sixth transistor T6 is connected with the active layer of the sixth transistor through a via. The first pole 53 of the fourth transistor T4 is connected with the active layer of the fourth transistor T4 through the eighth via V8. One end of the first pole 54 of the first transistor T1 is connected with the initial signal line Vinit through the sixth via V6, and the other end is connected with the active layer of the first transistor T1 through the tenth via V10. One end of the first pole 55 of the second transistor T2 is connected with the first electrode C1 through the seventh via V7, and the other end is connected with the active layer of the second transistor T2 through the ninth via V9. A fourth insulating thin film is then deposited on the third metal layer 50, the fourth insulating thin film is processed by a patterning process to form a fourth insulating layer covering the third metal layer 50, and the fourth insulating layer is provided with a plurality of vias, as shown in FIGS. 15A and 15B.

In an exemplary embodiment, the plurality of vias on the fourth insulating layer at least include: a first via V1 exposing the first pole 51 of the fifth transistor T5, a fourth via V4 exposing the second pole 52 of the sixth transistor T6, and a third via V3 exposing the first pole 53 of the fourth transistor T4. The first via V1 exposing the first pole 51 of the fifth transistor T5 is configured to connect the first pole 51 of the fifth transistor T5 with a power line VDD that is formed subsequently, the fourth via V4 exposing the second pole 52 of the sixth transistor T6 is configured to connect the second pole 52 of the sixth transistor T6 with a connection electrode that is formed subsequently, and the third via V3 exposing the first pole 53 of the fourth transistor T4 is configured to connect the first pole 53 of the fourth transistor T4 with a data line D that is formed subsequently.

In an exemplary embodiment, there is an overlapping area between the orthographic projection of the first via V1 on the base substrate and the orthographic projection of the gate line G on the base substrate.

In an exemplary embodiment, there is an overlapping area between the orthographic projection of the first via V1 on the base substrate and the orthographic projection of the second electrode C2 on the base substrate.

In an exemplary embodiment, there is an overlapping area between the orthographic projection of the third via V3 on the base substrate and the orthographic projection of the gate line G on the base substrate.

In an exemplary embodiment, there is an overlapping area between the orthographic projection of the fourth via V4 on the base substrate and the orthographic projection of the light emission control line EM on the base substrate.

In Implementation I, the first poles 51 of the fifth transistors T5 of adjacent sub-pixels in the same row are arranged at intervals.

In Implementation II, the first pole 51 of the fifth transistor T5 in the sub-pixel in the i-th row and the j+1-th column is connected with the first pole 51 of the fifth transistor T5 in the sub-pixel in the i-th row and the j+2-th column by the second connection part, the first pole 51 of the fifth transistor T5 in the sub-pixel in the i+1-th row and the j-th column is connected with the first pole 51 of the fifth transistor T5 in the sub-pixel in the i-th row and the j+1-th column by the second connection part, and the first pole 51 of the fifth transistor T5 in the sub-pixel in the i+1-th row and the j+2-th column is connected with the first pole 51 of the fifth transistor T5 in the sub-pixel in the i-th row and the j+3-th column by the second connection part.

FIG. 15A is a manufacturing schematic diagram of Implementation I, and FIG. 15B is a manufacturing schematic diagram of Implementation II.

The third metal layers and the vias of the exemplary embodiments of the present application have a reasonable layout and a simple structure, and can ensure the display effect of the display substrate.

In step 500, a fourth metal thin film is deposited on the fourth insulating layer, and the fourth metal thin film is processed by a patterning process to form a fourth metal layer 60 including a first sub-data line DO, a second sub-data line DE, a power line VDD and a connection electrode 61. The first sub-data line DO and the second sub-data line DE are respectively connected to the first pole 53 of the fourth transistor T4 through the third vias V3 in the sub-pixels, in which the first sub-data line DO and the second sub-data line DE are located, exposing the first pole 53 of the fourth transistor T4. The power line VDD is connected to the first pole 51 of the fifth transistor T5 through the first via V1 exposing the first pole 51 of the fifth transistor T5. The connection electrode 61 is connected to the second pole 52 of the sixth transistor T6 through the fourth via V4 exposing the second pole 52 of the sixth transistor T6. A fifth insulating thin film is then deposited on the fourth metal layer 60, a flat thin film is coated onto the fifth insulating thin film, and the flat thin film and the fifth insulating thin film are processed by a patterning process to form a fifth insulating layer covering the fourth metal layer 60 and a flat layer arranged on the fifth insulating layer, the flat layer being provided with a plurality of vias, as shown in FIGS. 16A and 16B.

In an exemplary embodiment, the first sub-data line DO, the second sub-data line DE and the power line VDD extend in the second direction. The first sub-data line DO is located on one side of a sub-pixel and the second sub-data line DE is located on the other side of the sub-pixel. The power line VDD is located between the first sub-data line DO and the second sub-data line DE.

In an exemplary embodiment, the first sub-data line DO and the second sub-data line DE may be straight lines with equal widths, and the widths of the first sub-data line DO and the second sub-data line DE are the dimensions of the first sub-data line DO and the second sub-data line DE in the first direction.

In an exemplary embodiment, the first poles of the fourth transistors of adjacent sub-pixels located in the same column are connected to different sub-data lines. For example, the sub-pixel in the i-th row and the j-th column is connected to the first sub-data line in the j-th column of data line, and the sub-pixel in the i+1-th row and the j-th column is connected to the second sub-data line in the j-th column of data line. Alternatively, the sub-pixel in the i-th row and the j-th column is connected to the second sub-data line in the j-th column of data line, and the sub-pixel in the i+1-th row and the j-th column is connected to the first sub-data line in the j-th column of data line.

In an exemplary embodiment, in at least one sub-pixel, the first sub-data line DO is connected with the first pole 53 of the fourth transistor T4 through the third via V3 in the sub-pixel where the first sub-data line DO is located, and the first pole 53 of the fourth transistor T4 is connected with the fourth active region through the eighth via V8. The eighth via V8 is a data writing hole, and the first sub-data line DO is the data line of the sub-pixel for writing data signals. In at least one sub-pixel, the second sub-data line DE is connected with the first pole 53 of the fourth transistor T4 through the third via V3 in the sub-pixel where the second sub-data line DE is located, and the first pole 53 of the fourth transistor T4 is connected with the fourth active region through the eighth via V8. The eighth via V8 is a data writing hole, and the second sub-data line DE is the data line of the sub-pixel for writing data signals.

In an exemplary embodiment, the power line VDD of each sub-pixel is connected with the first pole 51 of the fifth transistor T5 through the first via V1. Since the first pole 51 of the fifth transistor T5 is connected with the second electrode C2 of the storage capacitor, and the second electrodes C2 of the storage capacitors of adjacent sub-pixels are connected with each other, the connection between the power line VDD and the second electrode C2 is realized, and the function of power supply connection line of the second electrode C2 is also realized, so that the power signals provided to each sub-pixel are the same, thereby ensuring the display effect of the display substrate.

In an exemplary embodiment, the power line VDD of each sub-pixel may be a zigzag line. In the second direction, the power line VDD of each sub-pixel may include a first power supply part, a second power supply part and a third power supply part connected in sequence. In the power line corresponding to the sub-pixel in the i-th row and the j-th column, a first end of the first power supply part is connected with a second end of the third power supply part in the sub-pixel located in the i−1-th row and the j-th column, and a second end of the first power supply part extends in the second direction and is connected with a first end of the second power supply part. A second end of the second power supply part extends in an oblique direction and is connected with a first end of the third power supply part. There is an included angle between the oblique direction and the second direction, and the included angle may be greater than 0 degree and smaller than 90 degrees. The second end of the third power supply part extends in the second direction, and is connected with a first end of the first power supply part in the sub-pixel located in the i+1-th row and the j-th column.

In an exemplary embodiment, the first power supply part may be a straight line with equal widths, the second power supply part may be an oblique line with equal widths, and the third power supply part may be a straight line with equal widths. The first power supply part and the second power supply part are parallel to the first sub-data line (or the second sub-data line), an included angle between the second power supply part and the first power supply part may be greater than 90 degrees and smaller than 180 degrees, and an included angle between the second power supply part and the third power supply part may be greater than 90 degrees and smaller than 180 degrees.

In an exemplary embodiment, an extension length of the first power supply part in the first direction is greater than an average width of the first power supply part, an extension length of the second power supply part in the oblique direction is greater than an average width of the second power supply part, and an extension length of the third power supply part in the first direction is greater than an average width of the third power supply part. The oblique direction is a direction in which the second power supply part and the first power supply part have an included angle therebetween.

In an exemplary embodiment, the average width of the third power supply part may be smaller than that of the first power supply part, and the average width of the third power supply part may be smaller than that of the second power supply part. The power line VDD is provided as a zigzag line with variable width, which not only can facilitate the layout of pixel structures, but also can reduce the parasitic capacitance of the power line VDD and the data line. Since the distance between the third power supply part and the data line is relatively small, to reduce the average width of the third power supply part can reduce the parasitic capacitance of the third power supply part and the data line.

In an exemplary embodiment, the average width of the first power supply part may be greater than or equal to that of the second power supply part, or the average width of the first power supply part may be smaller than that of the second power supply part.

In an exemplary embodiment, the length of the second power supply part in the extension direction is equivalent to a second length of the first electrode C1. The second length of the first electrode C1 is the dimension of the first electrode C1 in the second direction. The length of the first power supply part in the extension direction is equivalent to a second length of the second electrode C2, and the length of the third power supply part in the extension direction is equivalent to the second length of the second electrode C2. The second length of the second electrode C2 is the dimension of the second electrode C2 in the second direction.

As shown in FIGS. 3, 16A and 16B, in an exemplary embodiment, there is an overlapping area between the orthographic projection of the first power supply part on the base substrate and orthographic projections of the first pole 55 of the second transistor T2 and the ninth via V9 on the base substrate, so there is an overlapping area between the orthographic projection of the first power supply part on the base substrate and the orthographic projection of the second transistor T2 on the base substrate. There is an overlapping area between the orthographic projection of the second power supply part on the base substrate and the orthographic projection of the first via V1 on the base substrate, and there is an overlapping area between the orthographic projection of the third power supply part on the base substrate and the orthographic projection of the first pole 51 of the fifth transistor T5 on the base substrate, so the orthographic projections of the second power supply part and the third power supply part on the base substrate both have an overlapping area with the first pole 51 of the fifth transistor T5.

In an exemplary embodiment, there is an overlapping area between the orthographic projection of the first via V1 on the base substrate and the orthographic projection of an extension line of the first power supply part in the second direction on the base substrate, and there is an overlapping area between the orthographic projection of the first via V1 on the base substrate and the orthographic projection of an extension line of the third power supply part in the second direction on the base substrate, so in the first direction, the distance between the first power supply part and the third power supply part in the first direction is smaller than a first length of the first via V1 or the average width of the third power supply part. That is, the distance between an edge of a side of the first power supply part close to the third power supply part and an edge of a side of the third power supply part close to the first power supply part is smaller than the first length of the first via V1 or the width of the third power supply part. The first length of the first via V1 refers to the dimension of the first via V1 in the first direction. Therefore, for the second power supply part extending in the oblique direction, it can be understood as the second power supply part bending the power line VDD. In the first direction, the degree of bending is equivalent to the first length of the first via V1 or the width of the third power supply part; and in the second direction, the degree of bending is equivalent to the second length of the first electrode C1. Herein, edges of two power supply parts refer to the edges of the overall profiles of the two power supply parts.

In an exemplary embodiment, there is an overlapping area between the orthographic projection of the second power supply part on the base substrate and the orthographic projection of the second electrode on the base substrate.

In an exemplary embodiment, there is an overlapping area between the orthographic projection of the second power supply part on the base substrate and the orthographic projection of the first connection part on the base substrate.

In an exemplary embodiment, there is an overlapping area between the orthographic projection of the second power supply part on the base substrate and the orthographic projection of the first electrode C1 on the base substrate.

In an exemplary embodiment, there is an overlapping area between the orthographic projection of the second power supply part on the base substrate and the orthographic projection of the gate line G on the base substrate. That is, there is an overlapping area between the orthographic projection of the second power supply part on the base substrate and the orthographic projections of the gate electrode of the second transistor T2 and the gate electrode of the fourth transistor T4 on the base substrate.

In an exemplary embodiment, the connection electrode 61 has a strip shape extending in the second direction, and the extension direction of the connection electrode 61 is parallel to the extension direction of the third power supply part, and the length of the connection electrode 61 in the second direction is equivalent to that of the third power supply part in the second direction.

In an exemplary embodiment, there is an overlapping area between the orthographic projection of the connection electrode 61 on the base substrate and the orthographic projection of the second electrode C2 on the base substrate.

In an exemplary embodiment, there is an overlapping area between the orthographic projection of the connection electrode 61 on the base substrate and the orthographic projection of the opening 111 in the middle of the second electrode C2 on the base substrate.

In an exemplary embodiment, there is an overlapping area between the orthographic projection of the connection electrode 61 on the base substrate and the orthographic projection of a second first pole 55 on the base substrate.

In an exemplary embodiment, the extension direction of the connection electrode 61 overlaps with that of the first power supply part. That is, there is an overlapping area between the orthographic projection of the connection electrode 61 on the base substrate and the orthographic projection of the virtual extension line of the first power supply part in the second direction on the base substrate.

In an exemplary embodiment, the eighth via V8 (i.e., the data writing hole) is located on the virtual extension line of the third power supply part in the second direction. That is, there is an overlapping area between the orthographic projection of the eighth via V8 on the base substrate and the orthographic projection of the virtual extension line of the third power supply part in the second direction on the base substrate.

In an exemplary embodiment, the power line VDD of each sub-pixel is connected with the first pole 51 of the fifth transistor T5 through the first via V1, and the first pole 51 of the fifth transistor T5 is connected with the second electrode C2 of the storage capacitor through the second via V2, so that the power line VDD is connected with the second electrode C2 of the storage capacitor. Thus, the first via V1 is called a power supply writing hole.

In an exemplary embodiment, the orthographic projection of the power supply writing hole on the base substrate is located within the range of the orthographic projection of the second power supply part on the base substrate. The distance between the power supply writing hole and the fourth transistor T4 in the first direction is equivalent to the distance between the power supply writing hole and the second transistor T2 in the first direction. The distance between the power supply writing hole and the second transistor T2 in the second direction is smaller than the distance between the power supply writing hole and the first transistor T1 in the second direction, and smaller than the distance between the power supply writing hole and the seventh transistor T7 in the second direction. The distance between the power supply writing hole and the third transistor T3 in the second direction is smaller than the distance between the power supply writing hole and the fifth transistor T5 in the second direction, and smaller than the distance between the power supply writing hole and the sixth transistor T6 in the second direction.

In an exemplary embodiment, the plurality of vias on the fifth insulating layer and the flat layer at least include: a fifth via V5 exposing the connection electrode 61. The fifth via V5 exposing the connection electrode 61 is configured to connect the connection electrode 61 with a fifth metal layer (anode) subsequently formed. Due to the connection between the connection electrode 61 and the sixth second pole 52, the connection between the sixth second pole 52 and the fifth metal layer is realized, and the driving circuit can drive the light-emitting device to emit light.

In an exemplary embodiment, the connection electrode 61 is connected to the second pole 52 of the sixth transistor T6 through a fourth via V4 located at an end of the connection electrode 61 away from the second power supply part. The connection electrode 61 is connected with the subsequently formed anode through the fifth via V5. The fifth via V5 is located at an end of the connection electrode 61 close to the second power supply part, and there is an overlapping area between the orthographic projection of the fifth via V5 on the base substrate and the orthographic projection of the second electrode C2 of the storage capacitor on the base substrate.

In an exemplary embodiment, the fifth via V5 is located on the virtual extension line of the first power supply part in the second direction. That is, there is an overlapping area between the orthographic projection of the fifth via V5 on the base substrate and the orthographic projection of the virtual extension line of the first power supply part in the second direction on the base substrate.

FIG. 16A is a manufacturing schematic diagram of Implementation I, and FIG. 16B is a manufacturing schematic diagram of Implementation II.

The fourth metal layers and the vias of the exemplary embodiments of the present application have a reasonable layout and a simple structure, and can ensure the display effect of the display substrate.

In step 600, a fifth metal thin film is deposited on the flat layer, and the fifth metal thin film is processed by a patterning process to form a fifth metal layer 70. The fifth metal layer 70 at least includes an anode connected with the connection electrode 61 through the fifth via exposing the connection electrode 61. As the anode is connected with the connection electrode 61 and the connection electrode 61 is connected with the second pole 52 of the sixth transistor T6, the connection between the second pole 52 of the sixth transistor T6 and the anode is realized, and the sixth transistor can drive the light-emitting device to emit light. Then, a pixel definition thin film is coated onto the fifth metal layer, and the pixel definition thin film is processed by a patterning process to form a pixel definition layer. The pixel definition layer of each sub-pixel is provided with a pixel opening exposing the anode. Subsequently, an organic light-emitting layer is formed by an evaporation process, and a cathode is formed on the organic light-emitting layer.

The structure shown in the present application and the preparation process thereof are merely an exemplary description. In an exemplary implementation, corresponding structures may be changed and patterning processes may be added or reduced according to actual needs. For example, the power lines VDD and the first poles or the second poles of some transistors may be located on the third metal layer 50, and the data lines D and the first poles or the second poles of some transistors may be located on the fourth metal layer 60. In another example, the data lines D and the first poles or the second poles of some transistors may be located on the third metal layer 50, and the power lines VDD and the first poles or the second poles of some transistors may be located on the fourth metal layer 60. In a further example, the power lines VDD and the data lines D may be located on the third metal layer 50, and the first poles and the second poles of the first to seventh transistors may be located on the fourth metal layer 60, which is not limited in the present application.

Figure 17:
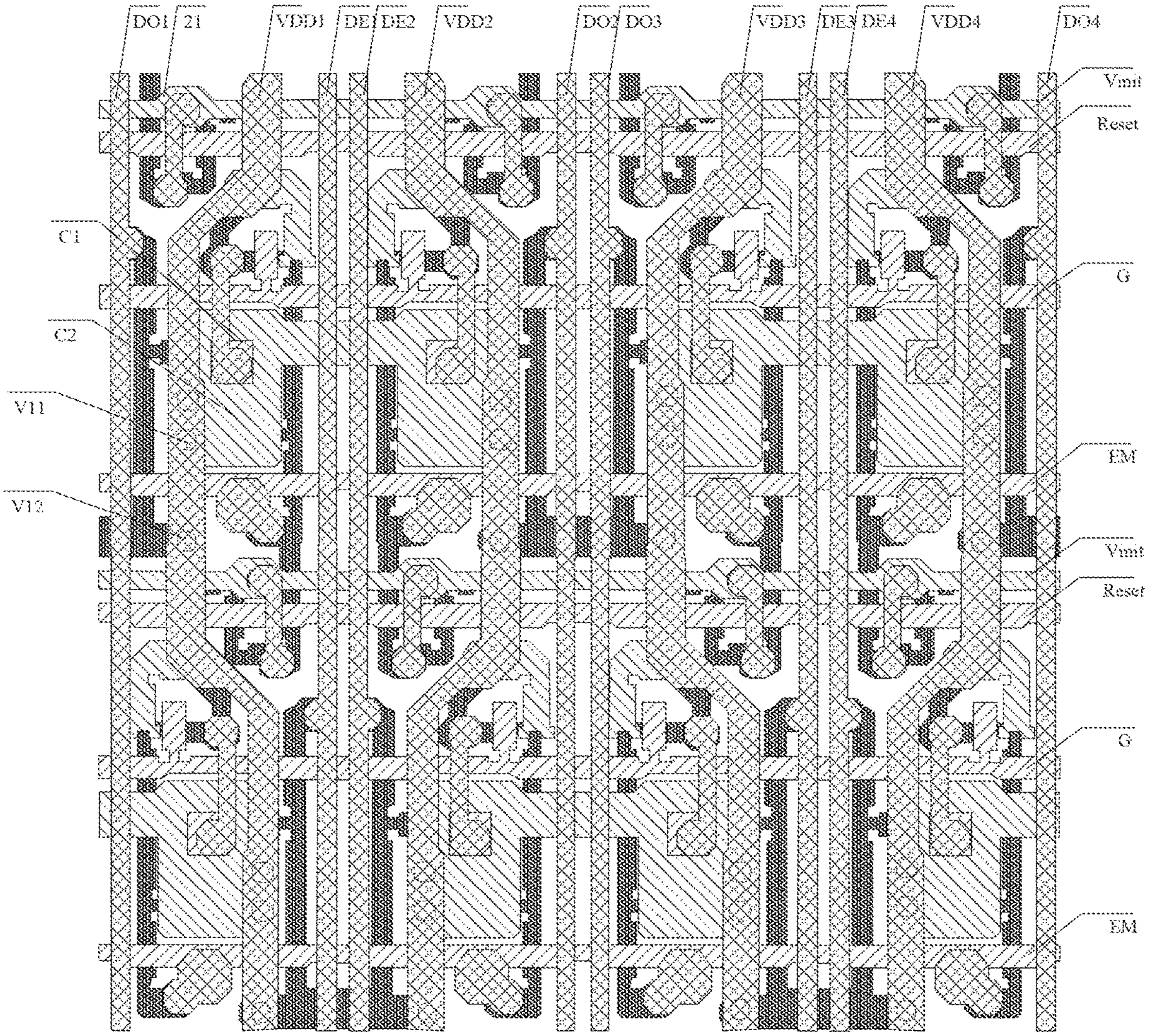
FIG. 17 is a top view of a plurality of sub-pixels in another display substrate according to the present application.
Figure 18:
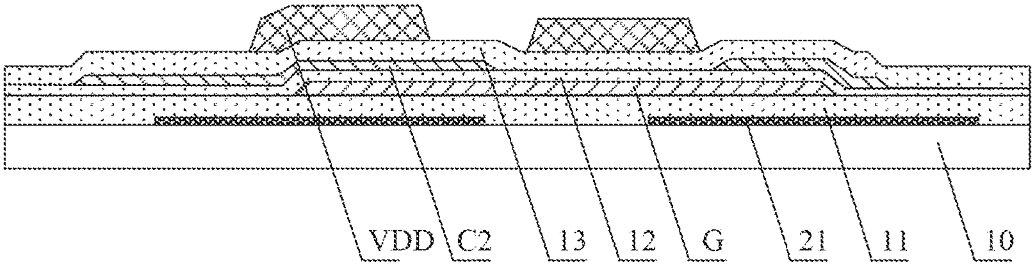
FIG. 18 is a sectional view of a plurality of sub-pixels in another display substrate according to the present application.

FIG. 17 is a top view of a plurality of sub-pixels in another display substrate according to the present application, and FIG. 18 is a sectional view of a plurality of sub-pixels in another display substrate according to the present application. FIG. 17 schematically illustrates an example where there are 8 sub-pixels (sub-pixels in the first four columns and the first two rows). As shown in FIG. 1, FIG. 17 and FIG. 18, the display substrate according to the present application includes: a base substrate 10, and a plurality of sub-pixels P, a plurality of columns of power lines VDD, and data lines D arranged on the same layer as the power lines VDD, which are arranged on the base substrate 10. Each sub-pixel P includes a driving circuit. The driving circuit may include a plurality of transistors and a storage capacitor. The storage capacitor includes a first electrode C1 and a second electrode C2 which are oppositely arranged. An active region 21 of the transistor is located on a side of the second electrode C2 of the storage capacitor close to the base substrate 10. The power lines VDD are located on a side of the second electrode C2 of the storage capacitor away from the base substrate 10.

In an exemplary embodiment, at least one sub-pixel and the power lines VDD are respectively connected with the second electrode C2 of the storage capacitor and the third connection part of the semiconductor layer. The second electrode C2 of the storage capacitor of each sub-pixel is connected with the second electrode C2 of the storage capacitor of an adjacent sub-pixel in the same row, and the semiconductor layer of each sub-pixel is connected with the semiconductor layer of the other adjacent sub-pixel in the same row through the third connection part.

In some possible implementations, as shown in FIG. 17, the driving circuits of the i-th column of sub-pixels are connected with the i-th column of data line and the i-th column of power line, 1≤i≤N. Each column of data line includes a first sub-data line and a second sub-data line. The first sub-data line DOi and the second sub-data line DEi in the i-th column of data line Di are located on the two sides of the i-th column of sub-pixels, respectively. The i-th column of power line VDDi is located between the first sub-data line DOi and the second sub-data line DEi in the i-th column of data line Di.

In some possible implementations, adjacent sub-pixels in the same column are connected to different sub-data lines. That is, if the sub-pixel in the i-th row and the j-th column is connected to the first sub-data line DOj in the j-th column of data line, the sub-pixel in the i+1-th row and the j-th column is connected to the second sub-data line DEj in the j-th column of data line; and if the sub-pixel in the i-th row and the j-th column is connected to the second sub-data line DEj in the j-th column of data line, the sub-pixel in the i+1-th row and the j-th column is connected to the first sub-data line DOj in the j-th column of data line. In some possible implementations, the arrangement modes of the first sub-data lines and the second sub-data lines in adjacent data lines are opposite.

That is, when the first sub-data line DOi of the i-th column of data line Di is located on a first side of the i-th column of sub-pixels, and the second sub-data line DEi of the i-th column of data line Di is located on a second side of the i-th column of sub-pixels, the second sub-data line DEi+1 of the i+1-th column of data line Di+1 is located on a first side of the i+1-th column of sub-pixels, and the first sub-data line DOi+1 of the i+1-th column of data line Di+1 is located on a second side of the i+1-th column of sub-pixels. Alternatively, when the first sub-data line DOi of the i-th column of data line Di is located on the second side of the i-th column of sub-pixels, and the second sub-data line DEi of the i-th column of data line Di is located on the first side of the i-th column of sub-pixels, the second sub-data line DEi+1 of the i+1-th column of data line Di+1 is located on the second side of the i+1-th column of sub-pixels, and the first sub-data line DOi+1 of the i+1-th column of data line Di+1 is located on the first side of the i+1-th column of sub-pixels.

As shown in FIGS. 17 and 18, in an exemplary embodiment, the display substrate may include: a first insulating layer 11, a second insulating layer 12 and a third insulating layer 13 which are sequentially arranged on the base substrate 10, a gate line G, a reset signal line Reset, a light emission control signal line EM, and an initial signal line Vinit. The gate line G, the reset signal line Reset, the light emission control signal line EM, the first electrode C1 of the storage capacitor and the gate electrode of the transistor are arranged on the same layer. The second electrode C2 of the storage capacitor and the initial signal line Vinit are arranged on the same layer. The data line D, the power line VDD and the source and drain electrodes of the transistor are arranged on the same layer. The source and drain electrodes of the transistors include first poles and second poles of the transistors.

In an exemplary embodiment, the first insulating layer 11 is arranged between the active region 21 of the transistor and the gate electrode of the transistor, the second insulating layer 12 is arranged between the gate electrode of the transistor and the second electrode C2 of the storage capacitor, and the third insulating layer 13 is arranged between the second electrode C2 of the storage capacitor and the data line.

In an exemplary embodiment, manufacturing materials of the gate electrode of the transistor, the source and drain electrodes of the transistor, the data line D and the power line VDD are all metals, which, for example, may be metal materials such as silver, aluminum or copper, which is not limited in the present application.

In an exemplary embodiment, a manufacturing material of the active region 21 is polysilicon, which is not limited in the present application.

In the present application, by the interconnected second electrodes of the storage capacitors and the interconnected semiconductor layers, it is ensured that power signals provided by the power lines in all sub-pixels in the same row are the same, thereby avoiding poor display of the display substrate and ensuring the display effect of the display substrate.

In the present application, the second electrodes of the storage capacitors and the semiconductor layers are reused as power supply connection lines to transmit power signals of the power lines, and the distance between the active region of the transistor and the data line is greater than the distance between the second electrode of the storage capacitor and the data line. Thus, the technical solutions of the present application increase the distance between partial power lines and data lines, reduce the load of the data lines, and therefore reduce the power consumption of the display substrate and reduce the writing time of data signals.

In an exemplary embodiment, the active regions of adjacent sub-pixels located in the same column are connected with each other through the third connection part.

In an exemplary embodiment, the pixel structure of the sub-pixel located in the i-th row and the j-th column is the same as that of the sub-pixel located in the i+1-th row and the j+1-th column.

In an exemplary embodiment, adjacent power lines are symmetrical with each other, and the power line VDDi in the i-th column and the power line VDDi+1 in the i+1-th column are symmetrically arranged in the extension direction of the data lines.

In an exemplary embodiment, the power lines VDD are in a zigzag shape.

In an exemplary embodiment, each pixel in the display substrate may include four sub-pixels. The pixels may include first pixels and second pixels. In a first pixel, the second electrode of the storage capacitor in the i-th sub-pixel and the second electrode of the storage capacitor in the i+1-th sub-pixel are connected with each other through the first connection part, the active region of the transistor in the i-th sub-pixel is disconnected from the active region of the transistor in the i+1-th sub-pixel, the active region of the transistor in the second sub-pixel and the active region of the transistor in the third sub-pixel are connected with each other through the third connection part, and the second electrode of the storage capacitor in the second sub-pixel is disconnected from the second electrode of the storage capacitor in the third sub-pixel. In a second pixel, the second electrode of the storage capacitor in the second sub-pixel and the second electrode of the storage capacitor in the third sub-pixel are connected with each other through the first connection part, the active region of the transistor in the second sub-pixel is disconnected from the active region of the transistor in the third sub-pixel, the active region of the transistor in the i-th sub-pixel and the active region of the transistor in the i+1-th sub-pixel are connected with each other through the third connection part, and the second electrode of the storage capacitor in the i-th sub-pixel is disconnected from the second electrode of the storage capacitor in the i+1-th sub-pixel. In the above, i is an odd number smaller than 4.

FIG. 17 illustrates an example of two pixels arranged in the column direction. The upper pixel is the first pixel, and the lower pixel is the second pixel, which is not limited in the present application. Since the pixel structures of adjacent sub-pixels are symmetrical, in the display substrate, the first pixel is arranged between adjacent second pixels, and the second pixel is arranged between adjacent first pixels.

Figure 19:
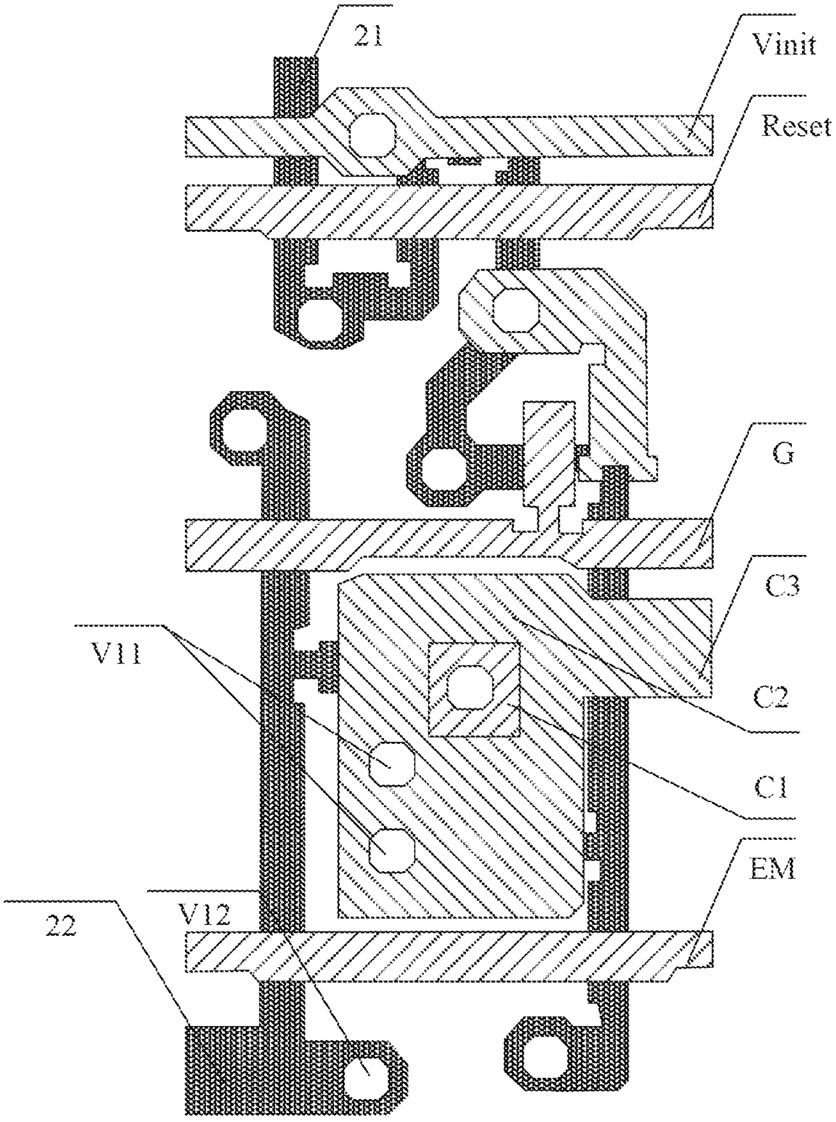
FIG. 19 is a partial top view of a sub-pixel in another display substrate according to the present application.
Figure 20:
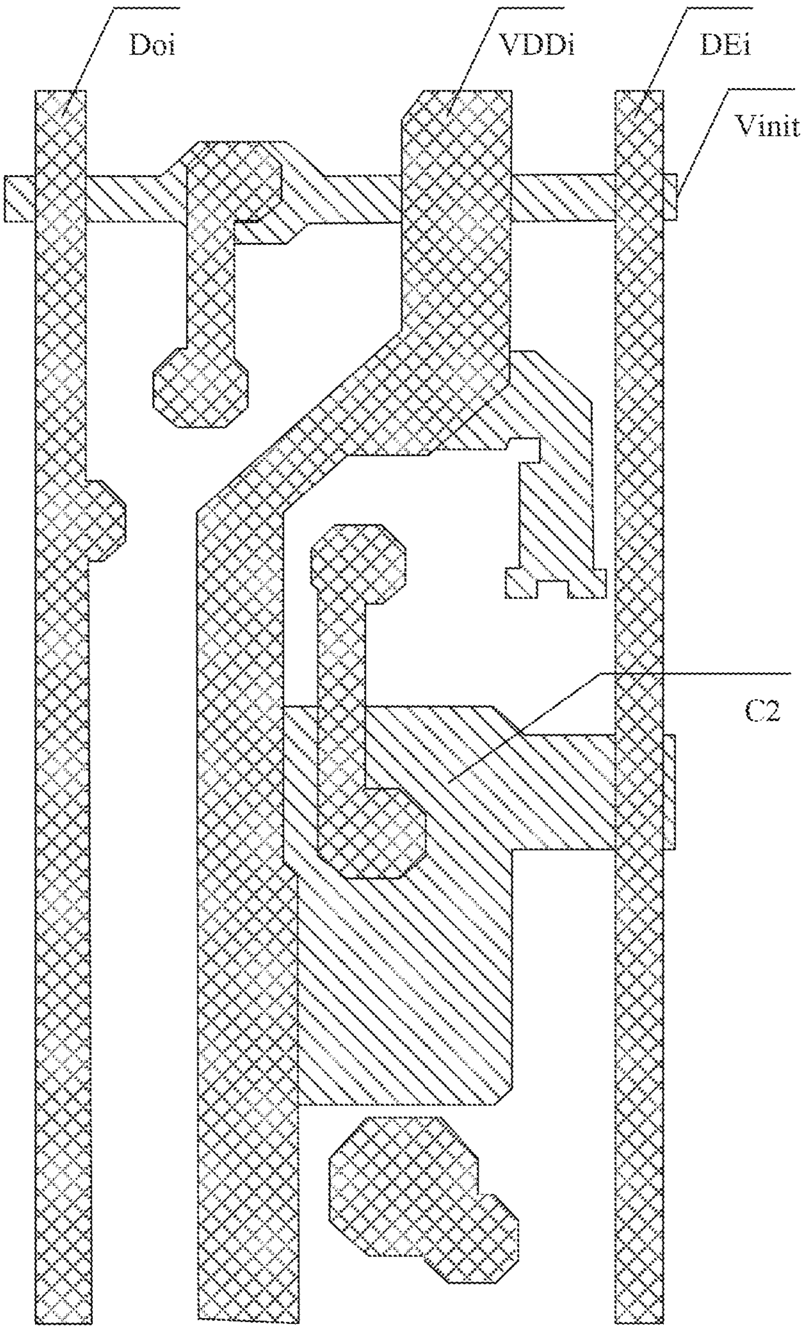
FIG. 20 is another partial top view of a sub-pixel in another display substrate according to the present application.
Figure 21:
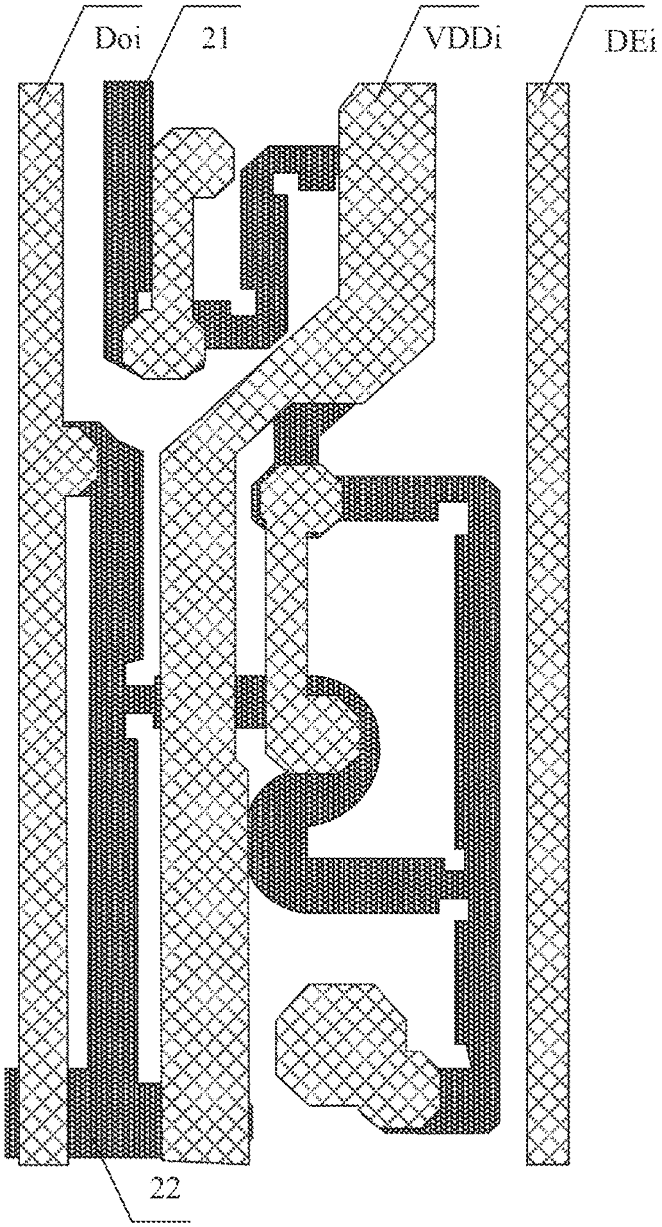
FIG. 21 is a further partial top view of a sub-pixel in another display substrate according to the present application.

FIG. 19 is a partial top view of sub-pixels in another display substrate according to the present application, not including power lines, data lines and source and drain electrodes of transistors. FIG. 20 is another partial top view of sub-pixels in another display substrate according to the present application, only including the film layer where the second electrode of the storage capacitor is located and the film layer where the data lines are located. FIG. 21 is a further partial top view of sub-pixels in another display substrate according to the present application, only including the film layers where the active regions of the transistors and the data lines are located. As shown in FIG. 19, eleventh vias V11 are provided on the third insulating layer in the display substrate.

In an exemplary embodiment, with reference to FIGS. 19 and 21, in each sub-pixel, the orthographic projection of the second electrode C2 of the storage capacitor on the base substrate includes the orthographic projection of the eleventh via V11 on the base substrate, and the power line is connected with the second electrode C2 of the storage capacitor through the eleventh via V11.

In an exemplary embodiment, the number of eleventh vias V11 is at least one.

Specifically, the more the eleventh vias V11 are, the better the conductivity between the power line and the second electrode of the storage capacitor is.

In an exemplary embodiment, as shown in FIG. 19, a twelfth via V12 is provided in the first insulating layer, the second insulating layer and the third insulating layer in the display substrate.

In an exemplary embodiment, with reference to FIG. 19 and FIG. 21, in each sub-pixel, there is an overlapping area between the orthographic projection of the twelfth via V12 on the base substrate and the orthographic projection of the third connection part 22 on the base substrate, and the power line is connected with the third connection part 22 of the transistor through the twelfth via V12.

In an exemplary embodiment, the number of twelfth vias V12 is at least one. The more the vias are, the better the conductivity of components connected through the vias is.

FIGS. 19 to 21 illustrate an example where there are two eleventh vias V11 and one twelfth via V12, which is not limited in the present application.

In an exemplary embodiment, through a reasonable design of layout, interconnection of conductive layers of multiple sub-pixels may be realized only by the semiconductor layers, or interconnection of conductive layers of multiple sub-pixels may be realized only by the first metal layers, or interconnection of conductive layers of multiple sub-pixels may be realized only by the second metal layers, or interconnection of conductive layers of multiple sub-pixels may be realized only by the third metal layers, thus realizing that the power lines of sub-pixels located in the same row are interconnected in the extension direction of the gate lines through the driving circuits, which will not be described in detail here.

Figure 22:
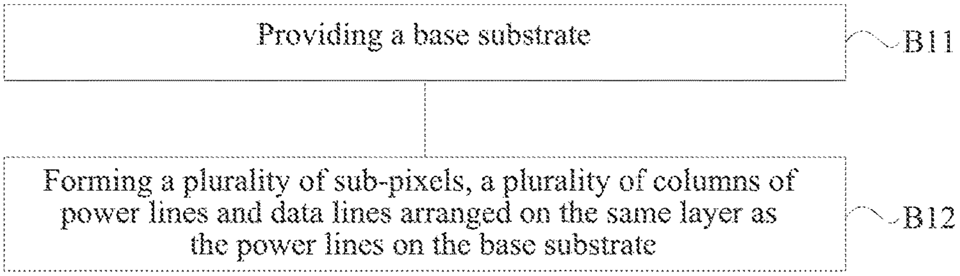
FIG. 22 is a flowchart of a method for manufacturing another display substrate according to the present application.

The present application further provides a method for manufacturing another display substrate, which is used to manufacture another display substrate provided in the above embodiments. FIG. 22 is a flowchart of a method for manufacturing another display substrate according to the present application. As shown in FIG. 22, the method for manufacturing another display substrate provided by the present application includes step B11 and step B12.

In step B11, a base substrate is provided.

In step B12, a plurality of sub-pixels, a plurality of columns of power lines and data lines arranged on the same layer as the power lines are formed on the base substrate.

In an exemplary embodiment, each sub-pixel may include a driving circuit. The driving circuit may include a plurality of transistors and a storage capacitor. The storage capacitor may include a first electrode and a second electrode which are oppositely arranged. The active region of the transistor is located on a side of the second electrode of the storage capacitor close to the base substrate, and the power line is located on a side of the second electrode of the storage capacitor away from the base substrate.

In an exemplary embodiment, for each sub-pixel, the power line is respectively connected with the second electrode of the storage capacitor and the third connection part of the semiconductor layer. The second electrode of the storage capacitor of each sub-pixel is connected with the second electrode of the storage capacitor of an adjacent sub-pixel in the same row through the first connection part, and the active region of the transistor of each sub-pixel is connected with the active region of the transistor of the other adjacent sub-pixel in the same row through the third connection part.

The method for manufacturing another display substrate provided by the present application is used to manufacture another display substrate provided by the above embodiments, and has a similar implementation principle and similar implementation effect, which will not be described further here.

Figure 23:
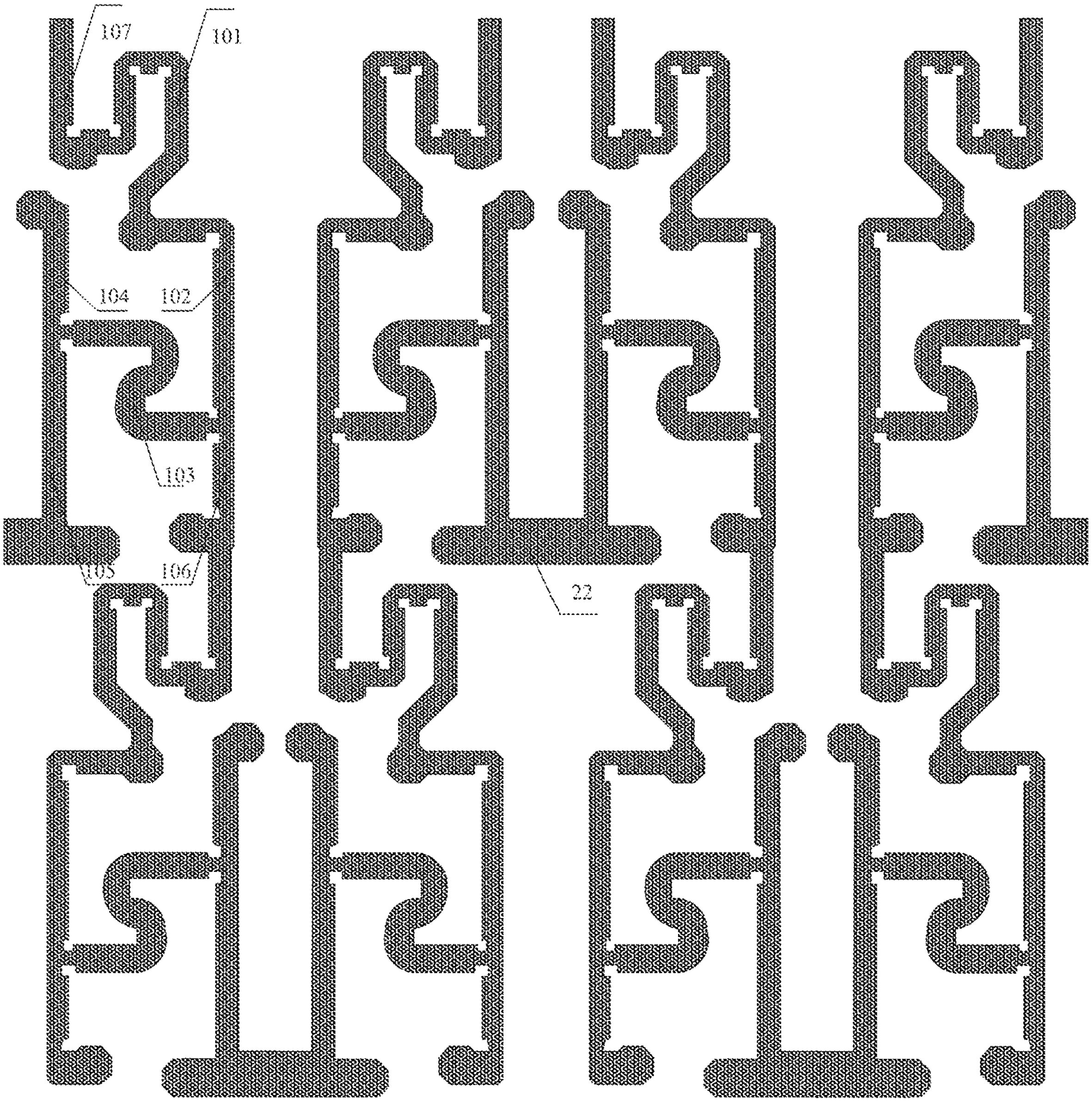
FIG. 23 is a schematic diagram of manufacturing of an active region of another display substrate according to the present application.
Figure 24:
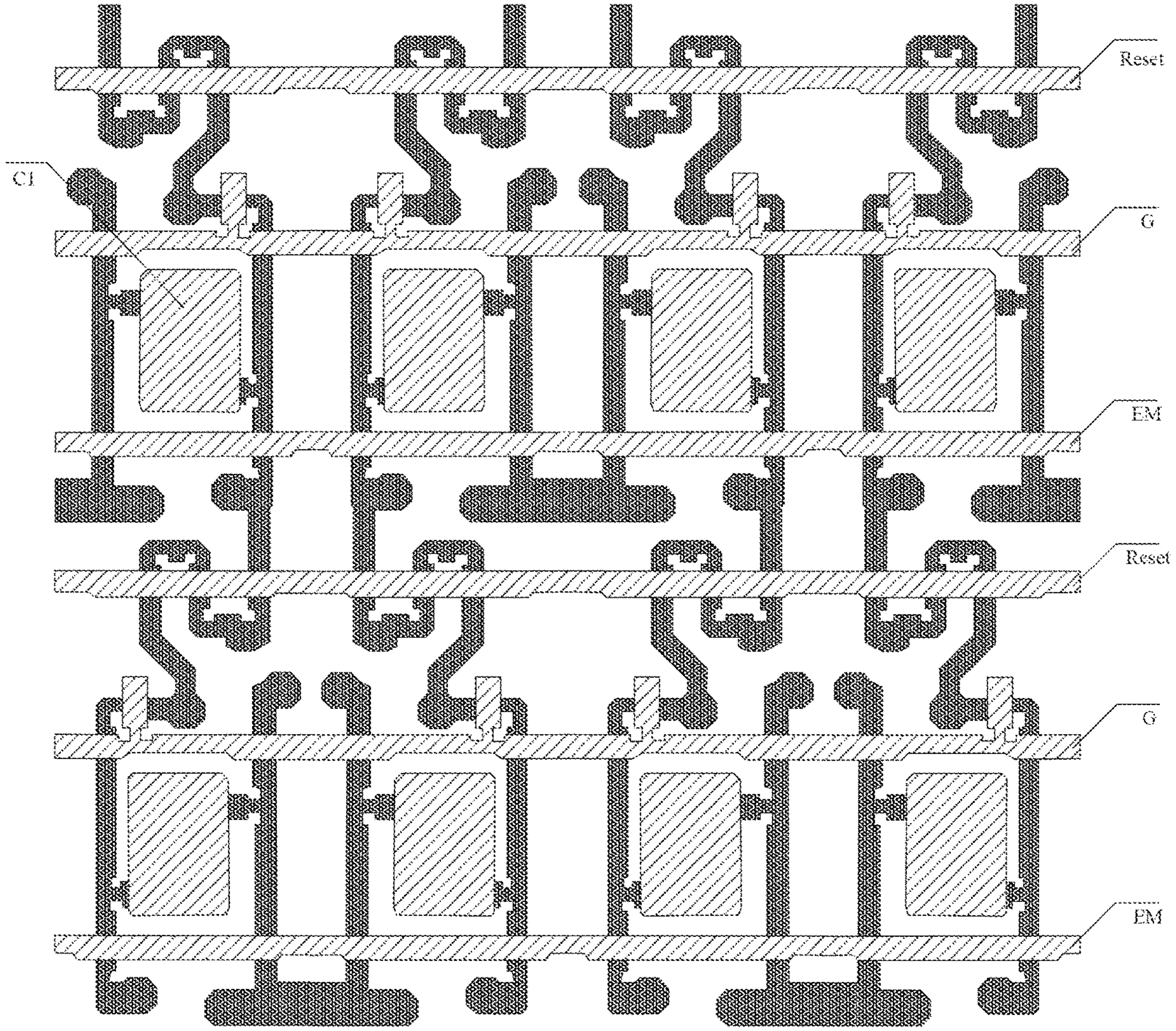
FIG. 24 is a schematic diagram of manufacturing of a first insulating layer and a first metal layer of another display substrate according to the present application.
Figure 25:
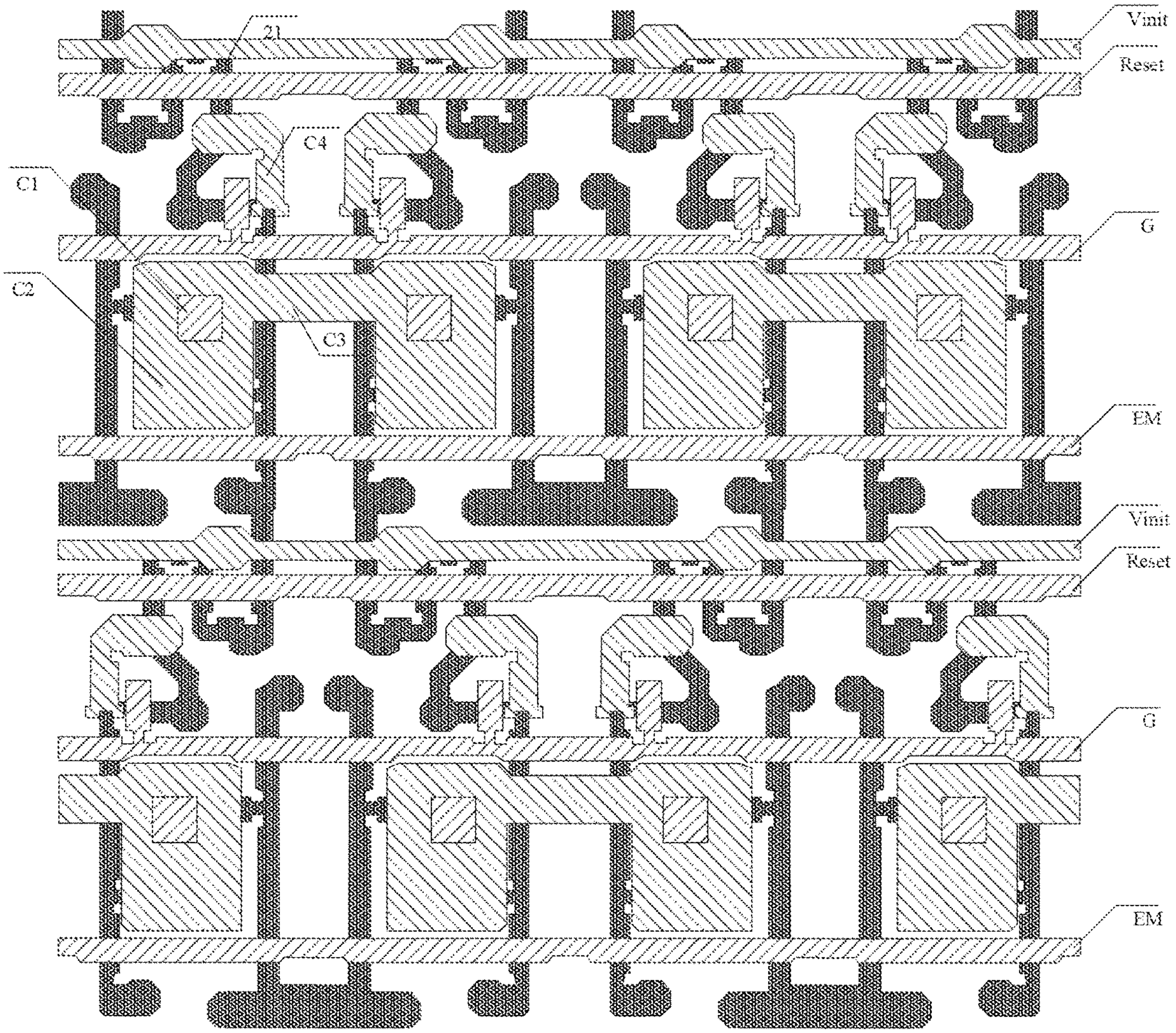
FIG. 25 is a schematic diagram of manufacturing of a second insulating layer and a second metal layer of another display substrate according to the present application.
Figure 26:
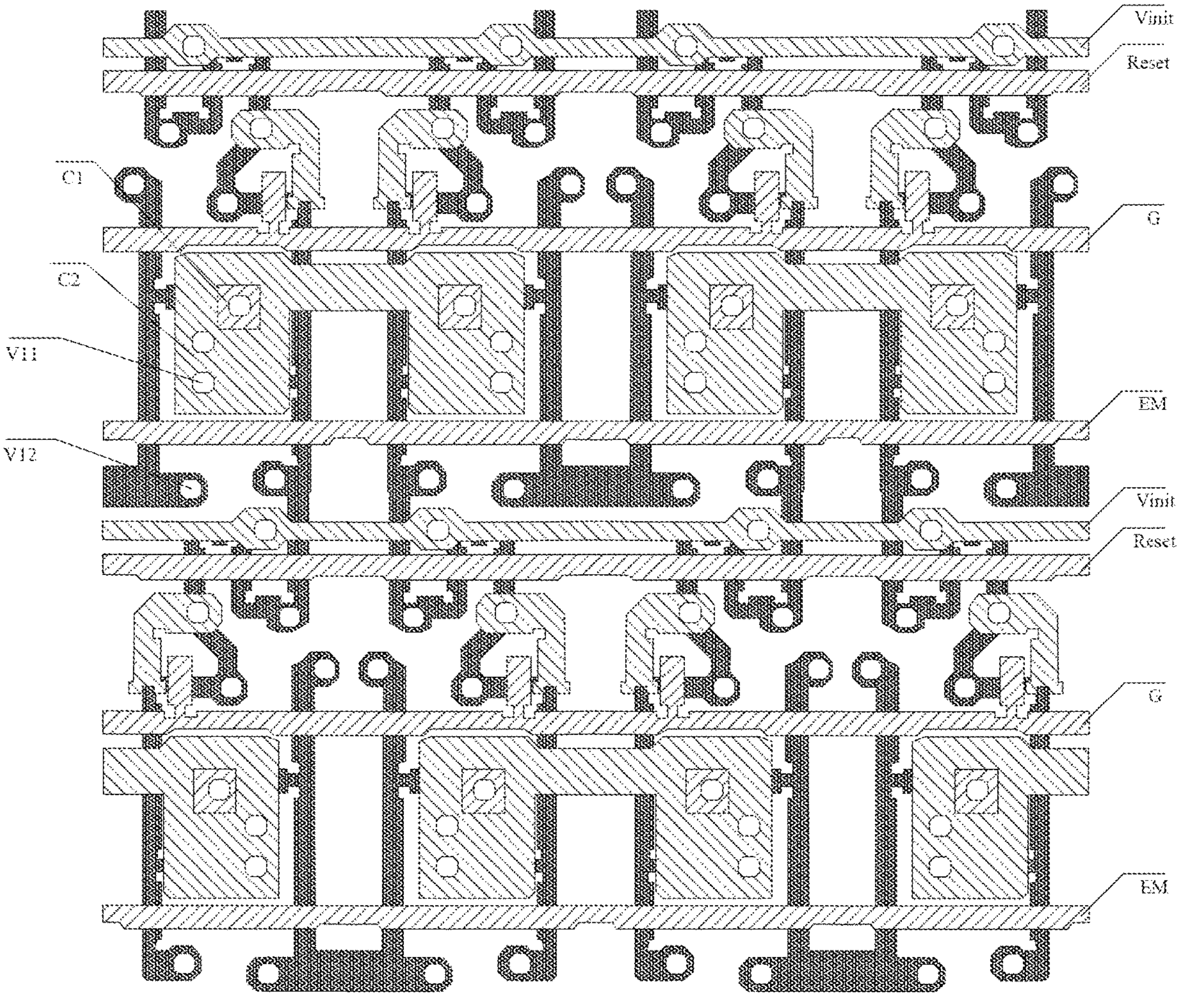
FIG. 26 is a schematic diagram of manufacturing of a third insulating layer of another display substrate according to the present application.

Taking the case of forming two pixels arranged in the extension direction of the data line as an example, each pixel includes four sub-pixels. FIG. 23 is a schematic diagram of manufacturing of an active region of another display substrate according to the present application, FIG. 24 is a schematic diagram of manufacturing of the first insulating layer and the first metal layer of another display substrate according to the present application, FIG. 25 is a schematic diagram of manufacturing of the second insulating layer and the second metal layer of another display substrate according to the present application, and FIG. 26 is a schematic diagram of manufacturing of the third insulating layer of another display substrate according to the present application. With reference to FIGS. 23 to 26, the method for manufacturing the display substrate may include step 1001 to step 1005.

In step 1001, a base substrate is provided, and a semiconductor layer is formed on the base substrate, as shown in FIG. 23.

In an exemplary embodiment, the semiconductor layer of each sub-pixel may include a first active region to a seventh active region, and the first active region to the seventh active region are an integrated structure in which they are connected with each other. In an exemplary embodiment, the positions of the first active region to the seventh active region are similar to those in the preceding embodiments, and thus will not be described in detail here.

In an exemplary embodiment, in the first direction, for the center line between adjacent sub-pixels, the semiconductor layers of the adjacent sub-pixels are mirror symmetric about the center line. The shape of the semiconductor layer of the sub-pixel in the i-th row and the j-th column is the same as the shape of the semiconductor layer of the sub-pixel in the i+1-th row and the j+1-th column, and the shape of the semiconductor layer of the sub-pixel in the i-th row and the j+1-th column is the same as the shape of the semiconductor layer of the sub-pixel in the i+1-th row and the j-th column.

In an exemplary embodiment, the semiconductor layer of each sub-pixel is connected with the semiconductor layer of another adjacent sub-pixel in the same row through the third connection part, and the semiconductor layer of each sub-pixel and the semiconductor layer of another adjacent sub-pixel located in the same column are connected with each other.

In an exemplary embodiment, the semiconductor layer of at least one sub-pixel further includes a third connection part 22. In the i-th row of sub-pixels, the semiconductor layers of the j-th column of sub-pixels are disconnected from the semiconductor layers of the j+1-th column of sub-pixels, the semiconductor layers of the j+1-th column of sub-pixels and the semiconductor layers of the j+2-th column of sub-pixels are connected with each other through the third connection part 22, and the semiconductor layers of the j+2-th column of sub-pixels are disconnected from the semiconductor layers of the j+3-th column of sub-pixels. In the i+1-th row of sub-pixels, the semiconductor layers of the j-th column of sub-pixels and the semiconductor layers of the j+1-th column of sub-pixels are connected with each other through the third connection part 22, the semiconductor layers of the j+1-th column of sub-pixels are disconnected from the semiconductor layers of the j+2-th column of sub-pixels, and the semiconductor layers of the j+2-th column of sub-pixels and the semiconductor layers of the j+3-th column of sub-pixels are connected with each other through the third connection part 22.

In an exemplary embodiment, a first end of the third connection part 22 is connected with the active region 105 of the fifth transistor in the same sub-pixel, and a second end of the third connection part 22 is connected with the active region 105 of the fifth transistor in an adjacent sub-pixel.

In an exemplary embodiment, there is an overlapping area between the orthographic projection of the third connection part 22 on the base substrate and the orthographic projections of the subsequently formed data lines and power lines on the base substrate.

In an exemplary embodiment, by arranging the semiconductor layers of adjacent sub-pixels to be connected with each other, the third connection part 22 of the semiconductor layer may be reused as a power supply connection line to transmit power signals of the power lines.

The semiconductor layers of the exemplary embodiments of the present application have a reasonable layout and a simple structure, and can ensure the display effect of the display substrate.

In step 1002, a first insulating layer is formed on the semiconductor layer, and a first metal layer is formed on the first insulating layer, as shown in FIG. 24.

In an exemplary embodiment, the first metal layer may include: a gate line G, a reset signal line Reset, a light emission control signal line EM, and a first electrode C1 of a storage capacitor.

In an exemplary embodiment, the gate line G, the reset signal line Reset and the light emission control line EM extend in the first direction, and the gate line G is arranged between the reset signal line Reset and the light emission control line EM. The first electrode C1 of the storage capacitor may have a shape of rectangle whose corners may be chamfered, and is arranged between the gate line G and the light emission control line EM. There is an overlapping area between the orthographic projection of the first electrode C1 on the base substrate and the orthographic projection of the third active region on the base substrate. In an exemplary embodiment, a first pole plate C1 also serves as the gate electrode of the third transistor.

In an exemplary embodiment, the gate line G, the reset signal line Reset and the light emission control line EM may be arranged with unequal widths. The gate line G is provided with a gate block protruding towards a side of the reset signal line Reset, and there is an overlapping area between the orthographic projection of the gate block on the base substrate and the orthographic projection of the second active region on the base substrate, to form a dual gate structure.

In an exemplary embodiment, after the pattern of the first metal layer is formed, the semiconductor layer may be subjected to a conductive treatment by using the first metal layer as a shield. The semiconductor layer in an area shielded by the first metal layer forms channel areas of the first transistor T1 to the seventh transistor T7, and the semiconductor layer in an area not shielded by the first metal layer is made to be conductive.

The first metal layers of the exemplary embodiments of the present application have a reasonable layout and a simple structure, and can ensure the display effect of the display substrate.

In step 1003, a second insulating layer is formed on the first metal layer, and a second metal layer is formed on the second insulating layer, as shown in FIG. 25.

In an exemplary embodiment, the second metal layer may include: an initial signal line Vinit and a second electrode C2 of the storage capacitor.

In an exemplary embodiment, the initial signal line Vinit extends in the first direction and is arranged on a side of the reset signal line Reset away from the gate line G. The second electrode C2 of the storage capacitor in each sub-pixel may have a rectangular profile, and is located between the gate line G and the light emission control line EM.

In an exemplary embodiment, the profile of the second electrode C2 may be rectangular, and the corners of the rectangle may be chamfered. There is an overlapping area between the orthographic projection of the second electrode C2 on the base substrate and the orthographic projection of the first electrode C1 on the base substrate. The middle of the second electrode C2 is provided with an opening which may be rectangular, so that the second electrode C2 forms an annular structure. The opening exposes the second insulating layer covering the first electrode C1, and the orthographic projection of the first electrode C1 on the base substrate includes the orthographic projection of the opening on the base substrate.

In an exemplary embodiment, the second electrode C2 of the sub-pixel in the i-th row and the j-th column and the second electrode C2 of the sub-pixel in the i-th row and the j+1-th column are an integrated structure in which they are connected with each other by the first connection part C3. The second electrode C2 of the sub-pixel in the i-th row and the j+1-th column is disconnected from the second electrode C2 of the sub-pixel in the i-th row and the j+2-th column. The second electrode C2 of the sub-pixel in the i-th row and the j+2-th column and the second electrode C2 of the sub-pixel in the i-th row and the j+3-th column are an integrated structure in which they are connected with each other by the first connection part C3. The second electrode C2 of the sub-pixel in the i+1-th row and the j-th column is disconnected from the second electrode C2 of the sub-pixel in the i+1-th row and the j+1-th column. The second electrode C2 of the sub-pixel in the i+1-th row and the j+1-th column and the second electrode C2 of the sub-pixel in the i+1-th row and the j+2-th column are an integrated structure in which they are connected with each other by the first connection part C3. The second electrode C2 of the sub-pixel in the i+1-th row and the j+2-th column is disconnected from the second electrode C2 of the sub-pixel in the i+1-th row and the j+3-th column. With this structure, the second electrodes C2 of adjacent sub-pixels may be reused as power supply signal lines, which can ensure that power signals provided by the power lines of adjacent sub-pixels are the same, thereby avoiding poor display of the display substrate and ensuring the display effect of the display substrate.

In an exemplary embodiment, the second metal layer may further include a shield electrode C4. There is an overlapping area between the orthographic projection of the shield electrode C4 on the base substrate and the orthographic projection of the subsequently formed power lines on the base substrate. The power lines are connected with the shield electrode C4 through vias. In an exemplary embodiment, the shield electrode C4 is configured to shield the influence of the data line on the driving circuit.

In an exemplary embodiment, the shield electrode C4 is "7"-shaped and includes a first part extending in the first direction and a second part extending in the second direction, an end of the first part close to the second part being connected with an end of the second part close to the first part to form a zigzag line with a right angle.

In an exemplary embodiment, in the second direction, the shield electrode C4 is arranged between the gate line G and the reset signal line Reset, and in the first direction, the second part of the shield electrode C4 is arranged between the subsequently formed data line and power line.

In an exemplary embodiment, the second part of the shield electrode C4 and the gate block of the first metal layer both extend in the second direction, and they have opposite areas therebetween. That is, an edge of the shield electrode C4 close to a side of the gate block in the first direction and an edge of the gate block close to a side of the shield electrode C4 in the first direction have opposite areas therebetween.

The second metal layers of the exemplary embodiments of the present application have a reasonable layout and a simple structure, and can ensure the display effect of the display substrate.

In step 1004, a third insulating layer is formed on the second metal layer, the third insulating layer is provided with an eleventh via V11 exposing the second electrode of the storage capacitor, and the first insulating layer, the second insulating layer and the third insulating layer are provided with a twelfth via V12 exposing the third connection part, as shown in FIG. 26.

In an exemplary embodiment, the eleventh via V11 is configured to connect the second electrode C2 with the subsequently formed power lines, and the twelfth via V12 is configured to connect the third connection part of the semiconductor layer with the subsequently formed power lines, so that the interconnected second electrodes C2 in adjacent sub-pixels and the interconnected third connection parts in adjacent sub-pixels are reused as power supply connection lines.

In an exemplary embodiment, the number of eleventh vias V11 may be two, and the two eleventh vias V11 are sequentially arranged in the second direction, which can improve the reliability of connection between the second electrodes and the power lines.

The vias of the exemplary embodiments of the present application have a reasonable layout and a simple structure, and can ensure the display effect of the display substrate.

In step 1005, a third metal layer is formed on the third insulating layer, as shown in FIG. 17.

In an exemplary embodiment, the third metal layer includes a data line D, a power line VDD, and source and drain electrodes of a plurality of transistors. The data line D includes a first sub-data line DO and a second sub-data line DE.

In an exemplary embodiment, the first sub-data line DO, the second sub-data line DE and the power line VDD extend in the second direction. The first sub-data line DO is located on one side of a sub-pixel and the second sub-data line DE is located on the other side of the sub-pixel. The power line VDD is located between the first sub-data line DO and the second sub-data line DE.

In an exemplary embodiment, adjacent sub-pixels located in the same column are connected to different sub-data lines. For example, the sub-pixel in the i-th row and the j-th column is connected to the first sub-data line in the j-th column of data line, and the sub-pixel in the i+1-th row and the j-th column is connected to the second sub-data line in the j-th column of data line. Alternatively, the sub-pixel in the i-th row and the j-th column is connected to the second sub-data line in the j-th column of data line, and the sub-pixel in the i+1-th row and the j-th column is connected to the first sub-data line in the j-th column of data line.

In an exemplary embodiment, the power line VDD of each sub-pixel is connected to the second electrode C2 through the eleventh via V11, and the power line VDD of each sub-pixel is connected to the third connection part of the semiconductor layer through the twelfth via V12. In this way, in one row, the second electrodes C2 of the storage capacitors of an adjacent sub-pixel are connected with each other, the third connection parts of the semiconductor layers of another adjacent sub-pixel are connected with each other, and the interconnected second electrodes C2 in adjacent sub-pixels and the interconnected semiconductor layers in adjacent sub-pixels are reused together as power supply connection lines, so that the power signals provided to each sub-pixel are the same, thereby ensuring the display effect of the display substrate.

In an exemplary embodiment, the power line VDD of each sub-pixel may be a zigzag line. In the second direction, the power line VDD of each sub-pixel may include a first power supply part, a second power supply part and a third power supply part connected in sequence. In the power line corresponding to the sub-pixel in the i-th row and the j-th column, a first end of the first power supply part is connected with a second end of the third power supply part in the sub-pixel located in the i−1-th row and the j-th column, and a second end of the first power supply part extends in the second direction and is connected with a first end of the second power supply part. A second end of the second power supply part extends in an oblique direction and is connected with a first end of the third power supply part. There is an included angle between the oblique direction and the second direction, and the included angle may be greater than 0 degree and smaller than 90 degrees. The second end of the third power supply part extends in the second direction, and is connected with the first end of the first power supply part in the sub-pixel located in the i+1-th row and the j-th column.

In an exemplary embodiment, the first power supply part may be a straight line with equal widths, the second power supply part may be an oblique line with variable widths, and the third power supply part may be a straight line with equal widths. The first power supply part and the second power supply part are parallel to the first sub-data line (or the second sub-data line), an included angle between the second power supply part and the first power supply part may be greater than 90 degrees and smaller than 180 degrees, and an included angle between the second power supply part and the third power supply part may be greater than 90 degrees and smaller than 180 degrees.

In an exemplary embodiment, the width of the third power supply part may be smaller than that of the first power supply part. The power line VDD is provided as a zigzag line with variable widths, which not only can facilitate the layout of the pixel structures, but also can reduce the parasitic capacitance of the power line VDD and the data line.

In an exemplary embodiment, there is an overlapping area between the orthographic projection of the third power supply part on the base substrate and the orthographic projection of the second electrode C2 on the base substrate.

In an exemplary embodiment, there is an overlapping area between the orthographic projection of the third power supply part on the base substrate and the orthographic projection of the first electrode C1 on the base substrate.

In an exemplary embodiment, there is an overlapping area between the orthographic projection of the third power supply part on the base substrate and the orthographic projection of the gate line G on the base substrate.

The structure shown in the present application and the preparation process thereof are merely an exemplary description. In an exemplary implementation, corresponding structures may be changed and patterning processes may be added or reduced according to actual needs. For example, the display substrate may include a fourth metal layer, and the data lines D, the power lines VDD, and the source and drain electrodes of a plurality of transistors may be located on different metal layers, which is not limited in the present application.

In the present application, the second pole plates of the storage capacitors and the active regions of the transistors are reused as power supply connection lines to transmit power signals of the power lines, and the distance between the active regions of the transistors and the data lines is relatively larger. Thus, the solutions of the present application increase the distance between partial power supply connection lines and the data lines, reduce the load of the data lines, and therefore reduce the power consumption of the display substrate and reduce the writing time of data signals.

The present application further provides a display apparatus. In an exemplary embodiment, the display apparatus includes the aforementioned display substrate.

In some possible implementations, the display substrate may be an OLED display substrate. The display apparatus may be any product or component with a display function, such as a mobile phone, a tablet computer, a television, a display, a notebook computer, a digital photo frame, a navigator, etc., and the embodiments of the present invention are not limited thereto.

The display substrate is the display substrate provided in the preceding embodiments, and has a similar implementation principle and implementation effects, which will not be described further here.

Figure 27:
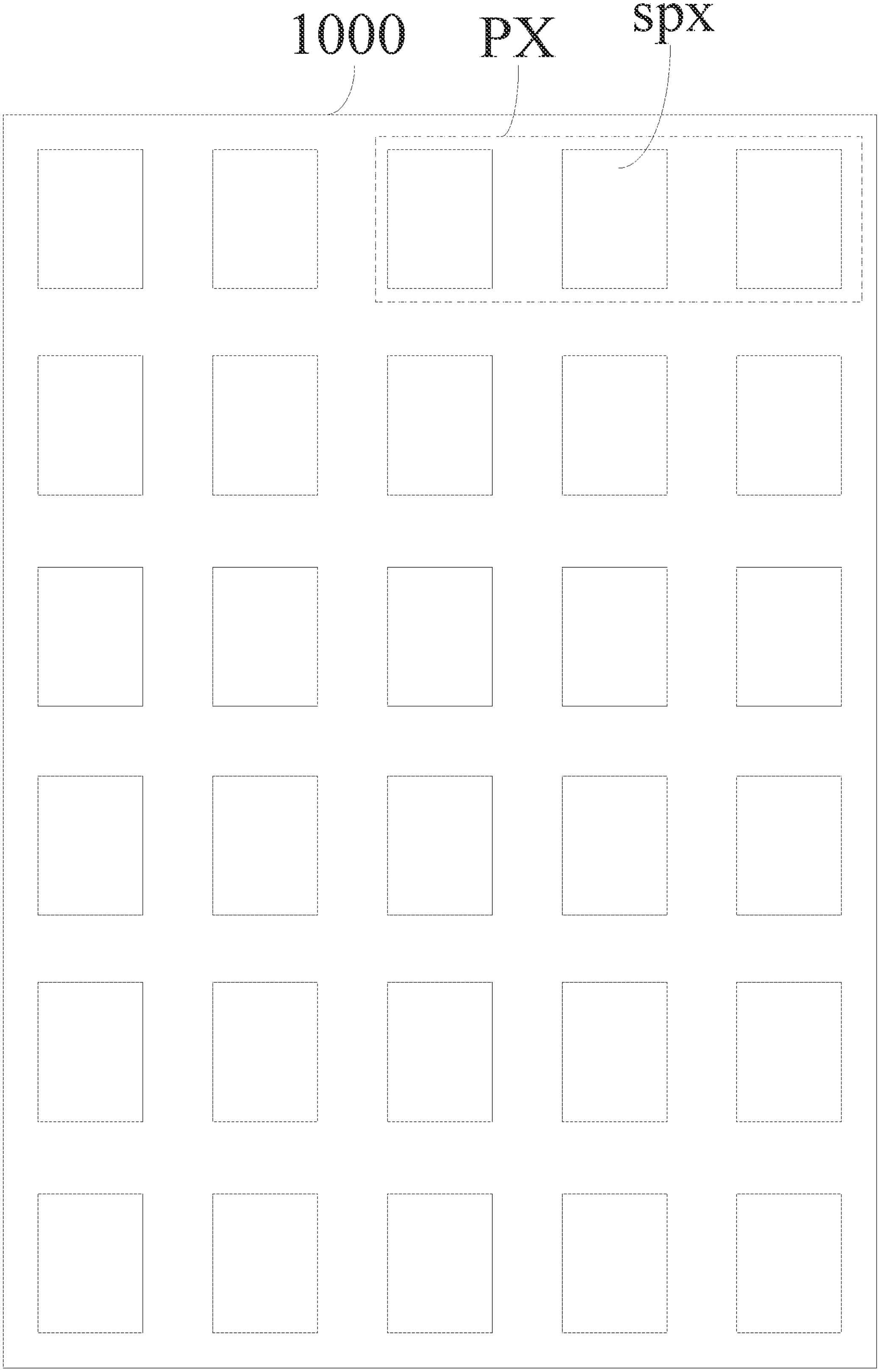
FIG. 27 is a schematic structural diagram of a display panel provided by embodiments of the disclosure.
Figure 28A:
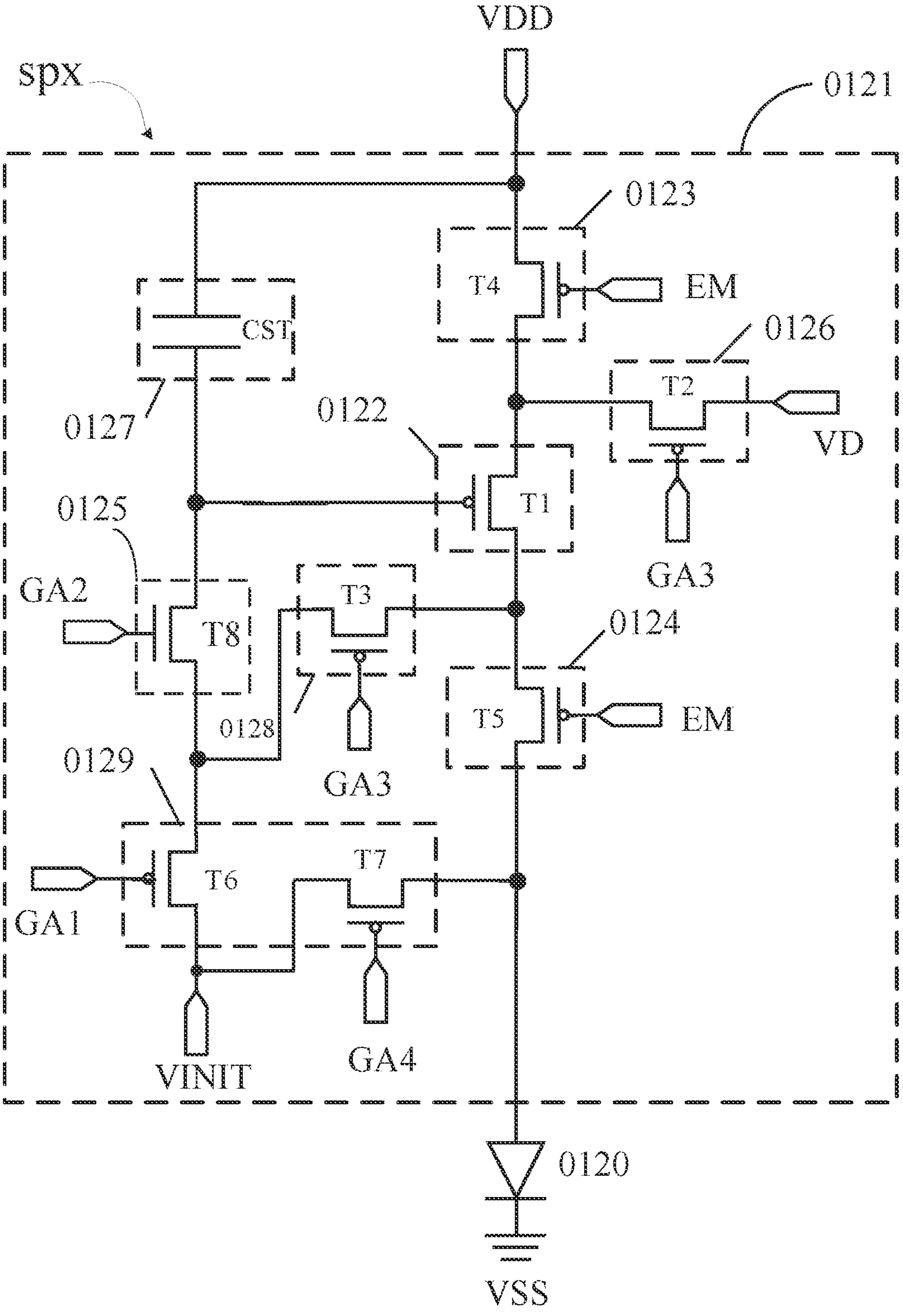
FIG. 28A is a schematic structural diagram of a pixel driving circuit provided by embodiments of the disclosure.

As shown in FIG. 27, a display panel provided by embodiments of the disclosure may include a base substrate 1000, and a plurality of pixel units PX in a display region of the base substrate 1000. Each of the pixel units PX may include a plurality of sub-pixels spx. Exemplarily, as shown in FIG. 27 and FIG. 28A, at least one of the plurality of sub-pixels spx may include a pixel driving circuit 0121 and a light emitting device 0120. The pixel driving circuit 0121 is provided with a transistor and a capacitor. An electric signal is generated by the interaction of the transistor and the capacitor, and the generated electric signal is input to a first electrode of the light emitting device 0120. Moreover, a second electrode of the light emitting device 0120 is loaded with a corresponding voltage to drive the light emitting device 0120 to emit light.

As shown FIG. 28A, the pixel driving circuit 0121 may include a driving control circuit 0122, a first light emitting control circuit 0123, a second light emitting control circuit 0124, a voltage stabilizing circuit 0125, a data writing circuit 0126, a storage circuit 0127, a threshold compensation circuit 0128 and a reset circuit 0129.

The driving control circuit 0122 may include a control end, a first end and a second end. Moreover, the driving control circuit 0122 is configured to provide a driving current for the light emitting device 0120 to drive the light emitting device 0120 to emit light. For example, the first light emitting control circuit 0123 is connected to the first end of the driving control circuit 0122 and a first voltage end VDD. Moreover, the first light emitting control circuit 0123 is configured to realize the connection or disconnection between the driving control circuit 0122 and the first voltage end VDD.

The second light emitting control circuit 0124 is electrically connected to the second end of the driving control circuit 0122 and the first electrode of the light emitting device 0120. Moreover, the second light emitting control circuit 0124 is configured to realize the connection or disconnection between the driving control circuit 0122 and the light emitting device 0120.

The voltage stabilizing circuit 0125 is electrically connected to the control end of the driving control circuit 0122, the reset circuit 0129 and the threshold compensation circuit 0128 respectively, and the voltage stabilizing circuit 0125 is configured to connect the control end of the driving control circuit 0122 with the reset circuit 0129 to reset the control end of the driving control circuit 0122. The voltage stabilizing circuit 0125 is configured to connect the control end of the driving control circuit 0122 with the threshold compensation circuit 0128 so as to perform threshold compensation.

The data writing circuit 0126 is electrically connected to the first end of the driving control circuit 0122. Moreover, the second light emitting control circuit 0124 is configured to write a signal on a data line VD into the storage circuit 0127.

The storage circuit 0127 is electrically connected to the control end of the driving control circuit 0122 and the first voltage end VDD. Moreover, the storage circuit 0127 is configured to store a data signal.

The threshold compensation circuit 0128 is electrically connected to the voltage stabilizing circuit 0125 and the second end of the driving control circuit 0122. Moreover, the threshold compensation circuit 0128 is configured to perform threshold compensation on the driving control circuit 0122.

The reset circuit 0129 is further electrically connected to the first electrode of the light emitting device 0120. Moreover, the reset circuit 0129 is configured to reset the first electrode of the light emitting device 0120 and provide a signal transmitted on an initialization line VINIT to the voltage stabilizing circuit 0125 so as to reset the control end of the driving control circuit 0122 when the control end of the driving control circuit 0122 is connected with the reset circuit 0129 by the voltage stabilizing circuit 0125.

The light emitting device 0120 may be set as an electroluminescent diode such as at least one of an OLED and a QLED. The light emitting device 0120 may include a first electrode, a light emitting functional layer and a second electrode which are stacked. Exemplarily, the first electrode may be an anode, and the second electrode may be a cathode. The light emitting functional layer may include a light emitting layer. Further, the light emitting functional layer may further include film layers such as a hole injection layer, a hole transport layer, a light emitting layer, an electron transfer layer and an electron injection layer. Of course, during actual application, the light emitting device 0120 may be designed and determined according to a demand of an actual application environment, which is not limited herein.

Exemplarily, as shown in FIG. 28A, the driving control circuit 0122 includes a driving transistor T1, the control end of the driving control circuit 0122 includes a gate electrode of the driving transistor T1, the first end of the driving control circuit 0122 includes a first electrode of the driving transistor T1, and the second end of the driving control circuit 0122 includes a second electrode of the driving transistor T1.

Exemplarily, as shown in FIG. 28A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a first light emitting control transistor T4. The second light emitting control circuit 0124 includes a second light emitting control transistor T5. The reset circuit 0129 includes an initialization transistor T6 and a second reset transistor T7. The voltage stabilizing circuit 0125 includes a voltage stabilizing transistor T8.

Specifically, a first electrode of the data writing transistor T2 is electrically connected to the first electrode of the driving transistor T1, a second electrode of the data writing transistor T2 is configured to be electrically connected to the data line VD so as to receive a data signal, and a gate electrode of the data writing transistor T2 is configured to be electrically connected to a third scanning line GA3 so as to receive a signal.

A first electrode of the storage capacitor CST is electrically connected to a first power end VDD, and a second electrode of the storage capacitor CST is electrically connected to the gate electrode of the driving transistor T1.

A first electrode of the threshold compensation transistor T3 is electrically connected to the second electrode of the driving transistor T1, a second electrode of the threshold compensation transistor T3 is electrically connected to a first electrode of the voltage stabilizing transistor T8, and a gate electrode of the threshold compensation transistor T3 is configured to be electrically connected to a third scanning line GA3 so as to receive a signal.

A first electrode of the initialization transistor T6 is configured to be electrically connected to the initialization line VINIT so as to receive a reset signal, a second electrode of the initialization transistor T6 is electrically connected to the first electrode of the voltage stabilizing transistor T8, and a gate electrode of the initialization transistor T6 is configured to be electrically connected to a first scanning line GA1 so as to receive a signal.

A first electrode of the second reset transistor T7 is configured to be electrically connected to the initialization line VINIT so as to receive a reset signal, a second electrode of the second reset transistor T7 is electrically connected to the first electrode of the light emitting device 0120, and a gate electrode of the second reset transistor T7 is configured to be electrically connected to a fourth scanning line GA4 so as to receive a signal.

A first electrode of the first light emitting control transistor T4 is electrically connected to the first power end VDD, a second electrode of the first light emitting control transistor T4 is electrically connected to the first electrode of the driving transistor T1, and a gate electrode of the first light emitting control transistor T4 is configured to be electrically connected to a light emitting control line EM so as to receive a light emitting control signal.

A first electrode of the second light emitting control transistor T5 is electrically connected to the second electrode of the driving transistor T1, a second electrode of the second light emitting control transistor T5 is electrically connected to the first electrode of the light emitting device 0120, and a gate electrode of the second light emitting control transistor T5 is configured to be electrically connected to the light emitting control line EM so as to receive a light emitting control signal.

A second electrode of the voltage stabilizing transistor T8 is electrically connected to the gate electrode of the driving transistor T1, and a gate electrode of the voltage stabilizing transistor T8 is configured to be electrically connected to the first scanning line GA1 so as to receive a signal.

The second electrode of the light emitting device 0120 is electrically connected to a second power end VSS. The first electrodes and the second electrodes of the above-mentioned transistors may be determined as source electrodes or drain electrodes according to actual application, which is not limited herein.

Exemplarily, one of the first power end VDD and the second power end VSS is a high-voltage end, and the other one is a low-voltage end. For example, in embodiments as shown in FIG. 28A, the first power end VDD is a voltage source so as to output a constant first voltage which is a positive voltage; and the second power end VSS may be a voltage source so as to output a constant second voltage which is a negative voltage. For example, in some examples, the second power end VSS may be grounded.

Figure 28B:
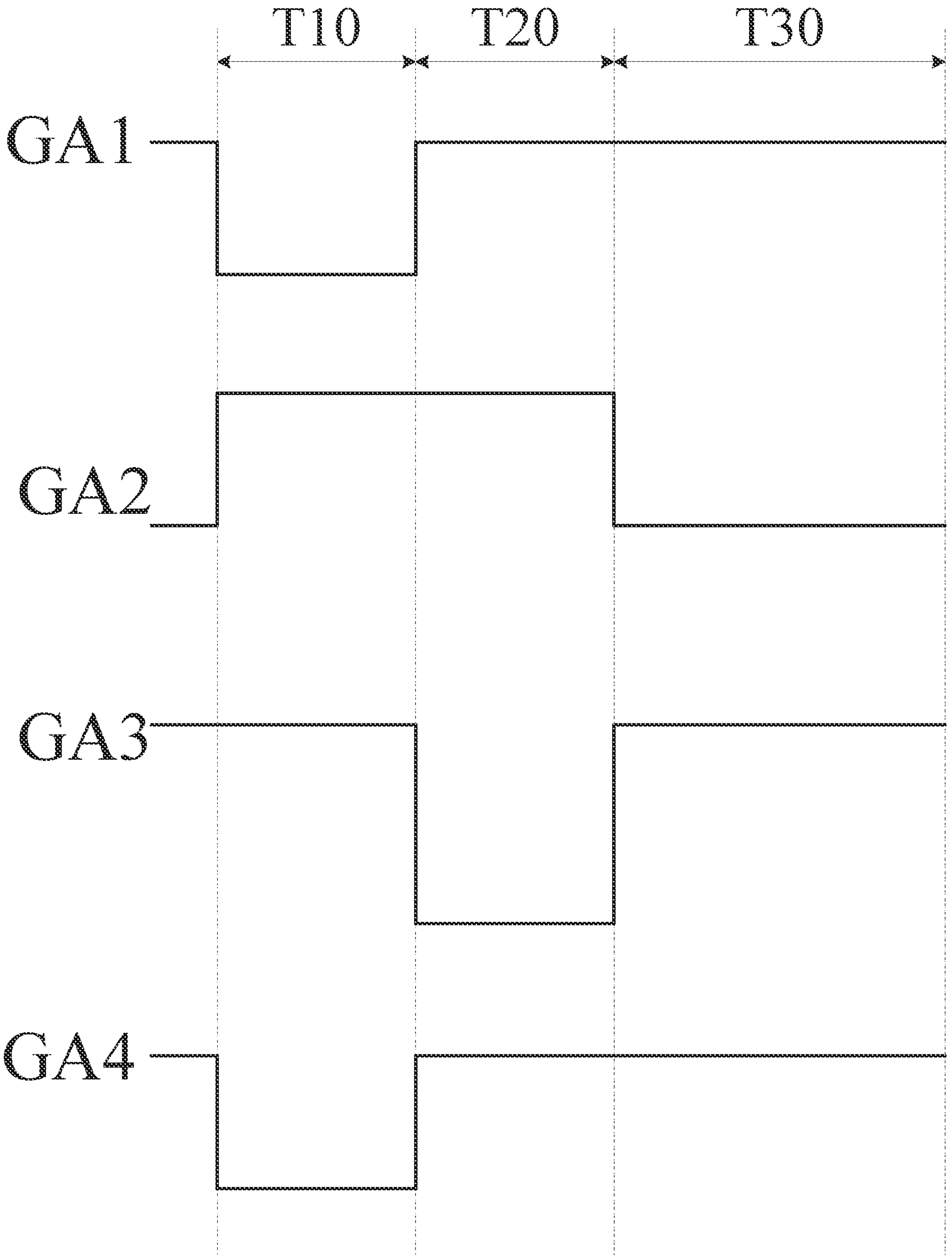
FIG. 28B is a timing diagram of signals provided by embodiments of the disclosure.

A timing diagram of signals corresponding to the pixel driving circuit as shown in FIG. 28A is shown in FIG. 28B. Within one-frame display time, a working process of the pixel driving circuit is divided into three stages: stage T10, stage T20 and stage T30, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. The signal ga4 controls the second reset transistor T7 to be turned on, so that the signal transmitted on the initialization line VINIT may be provided to the first electrode of the light emitting device 0120 to reset the first electrode of the light emitting device 0120. Moreover, at this stage, the signal ga3 controls both the data writing transistor T2 and the threshold compensation transistor T3 to be turned off. The signal em controls both the first light emitting control transistor T4 and the second light emitting control transistor T5 to be turned off.

At stage T20, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T30, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

Figure 28C:
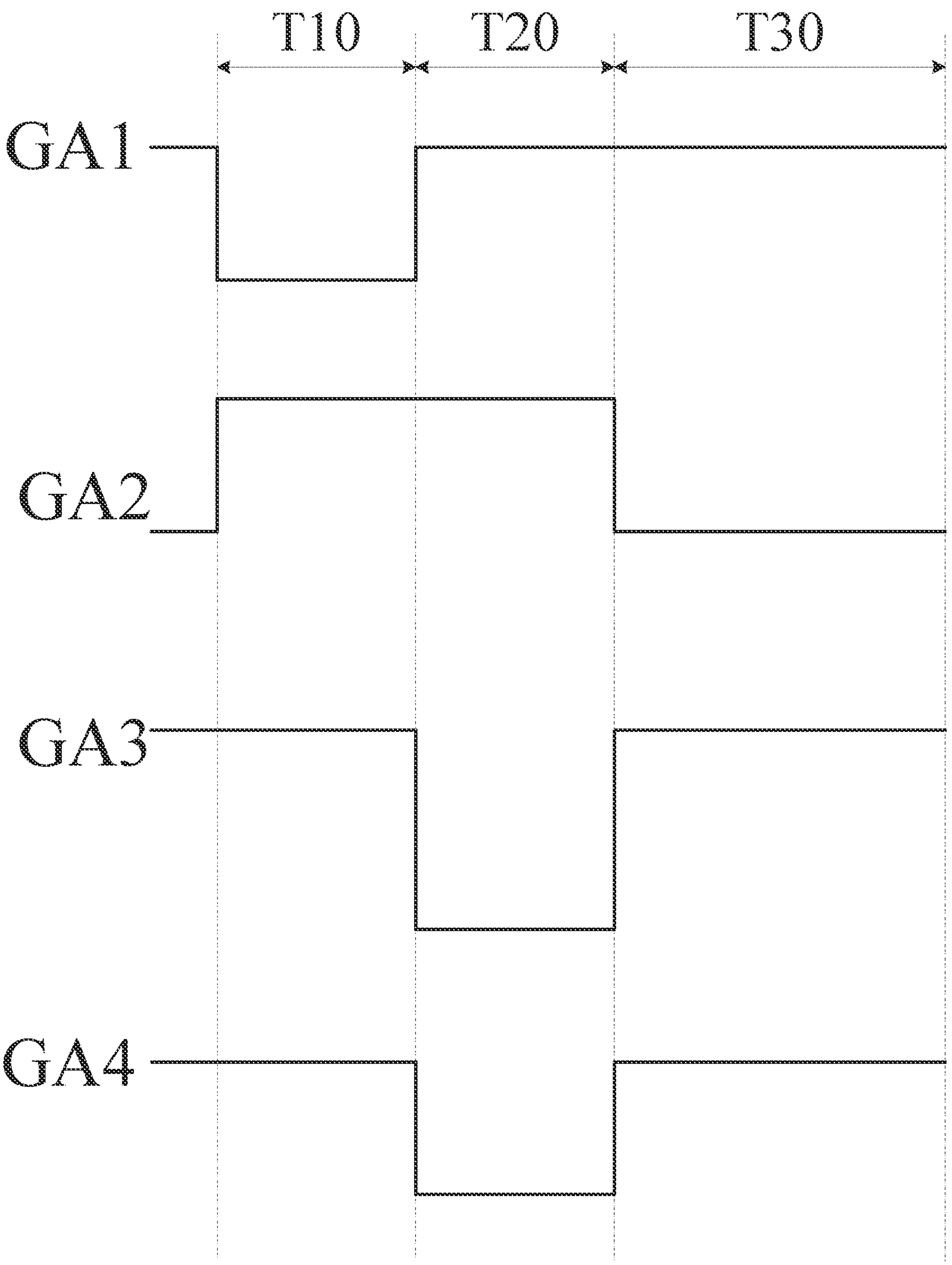
FIG. 28C is another timing diagram of signals provided by embodiments of the disclosure.

In some examples, another timing diagram of signals corresponding to the pixel driving circuit as shown in FIG. 28A is shown in FIG. 28C. Within one-frame display time, a working process of the pixel driving circuit is divided into three stages: stage T10, stage T20 and stage T30, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga4 controls the second reset transistor T7 to be turned off, the rest working process may refer to the above-mentioned embodiment, which is not described in detail herein.

At stage T20, the signal ga4 controls the second reset transistor T7 to be turned on, so that the signal transmitted on the initialization line VINIT may be provided to the first electrode of the light emitting device 0120 to reset the first electrode of the light emitting device 0120. The rest working process may refer to the above-mentioned embodiment, which is not described in detail herein.

At stage T30, the working process at this stage may refer to the above-mentioned embodiment, which is not described in detail herein.

Figure 28D:
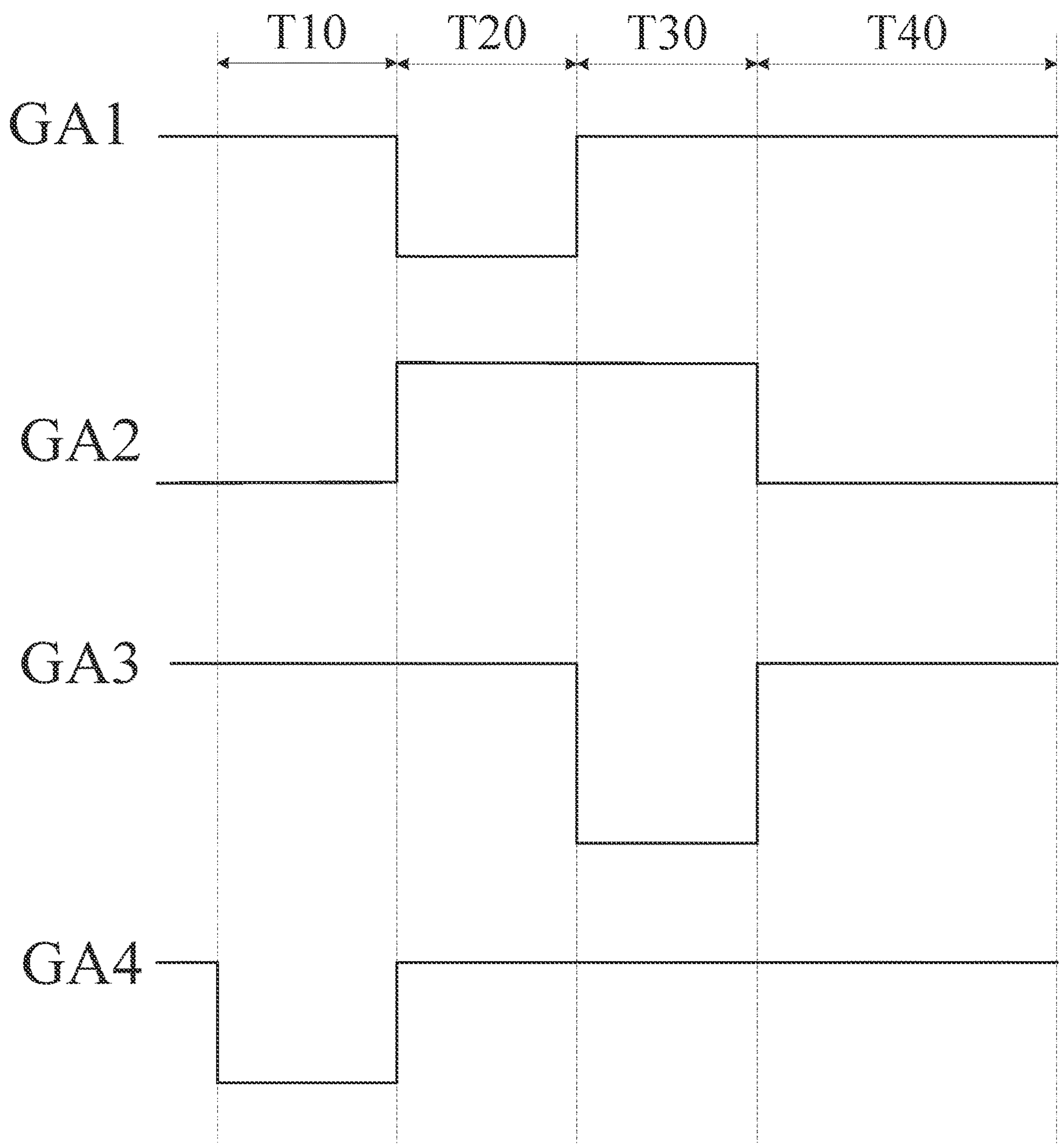
FIG. 28D is a further timing diagram of signals provided by embodiments of the disclosure.

In some examples, a further timing diagram of signals corresponding to the pixel driving circuit as shown in FIG. 28A is shown in FIG. 28D. Within one-frame display time, a working process of the pixel driving circuit is divided into three stages: stage T10, stage T20, stage T30 and stage T40, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga4 controls the second reset transistor T7 to be turned on, so that the signal transmitted on the initialization line VINIT is provided to the first electrode of the light emitting device 0120 to reset the first electrode of the light emitting device 0120. Moreover, at this stage, the signal ga1 controls the initialization transistor T6 to be turned off, and the signal ga3 controls both the data writing transistor T2 and the threshold compensation transistor T3 to be turned off. The signal em controls both the first light emitting control transistor T4 and the second light emitting control transistor T5 to be turned off. The signal ga2 controls the voltage stabilizing transistor T8 to be turned off.

At stage T20, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. Moreover, at this stage, the signal ga4 controls the second reset transistor T7 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T30, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T40, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

Figure 28E:
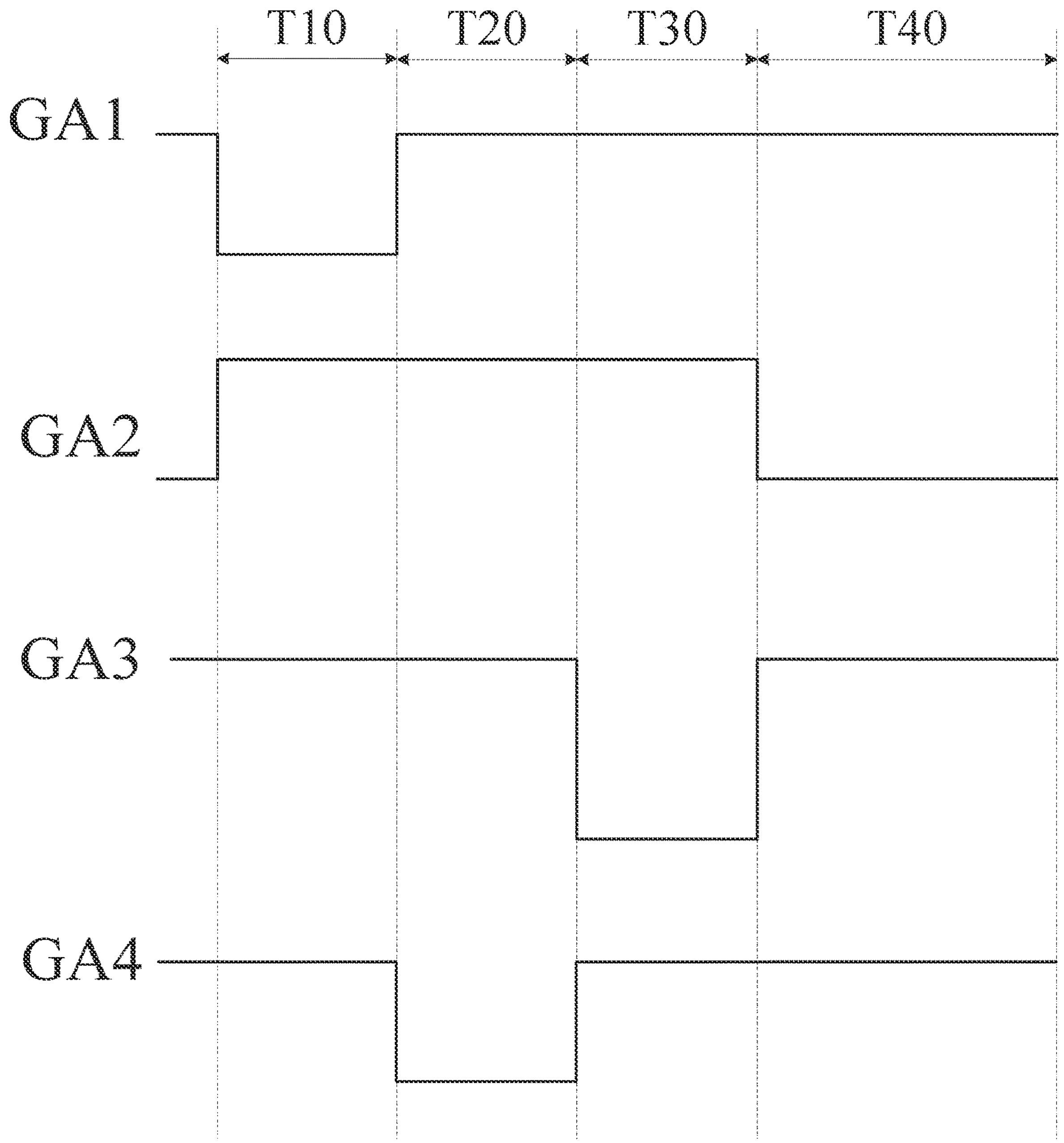
FIG. 28E is a yet further timing diagram of signals provided by embodiments of the disclosure.

In some examples, a yet further timing diagram of signals corresponding to the pixel driving circuit as shown in FIG. 28A is shown in FIG. 28E. Within one-frame display time, a working process of the pixel driving circuit is divided into three stages: stage T10, stage T20, stage T30 and stage T40, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. Moreover, at this stage, the signal ga4 controls the second reset transistor T7 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T20, the signal ga4 controls the second reset transistor T7 to be turned on, so that the signal transmitted on the initialization line VINIT may be provided to the first electrode of the light emitting device 0120 to reset the first electrode of the light emitting device 0120. Moreover, at this stage, the signal ga1 controls the initialization transistor T6 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T30, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T40, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

It should be noted that, in embodiments of the disclosure, the pixel driving circuit in the sub-pixel may also be of a structure including another number of transistors in addition to the structure as shown in FIG. 28A, which is not limited herein.

Figure 29:
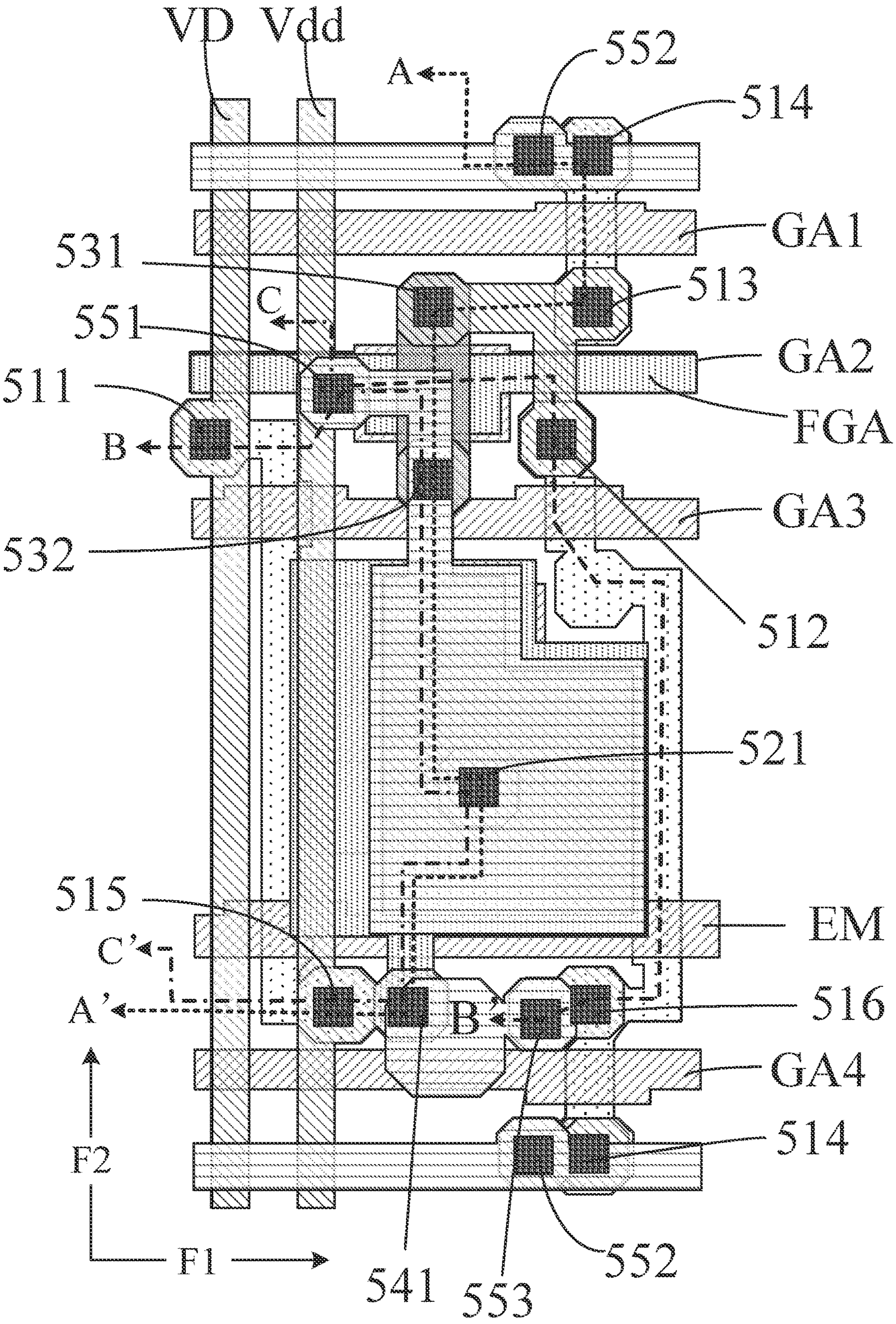
FIG. 29 is a schematic structural diagram showing layout of a pixel driving circuit provided by embodiments of the disclosure.

FIG. 29 is a schematic structural diagram showing layout of a pixel driving circuit provided by embodiments of the disclosure. FIG. 30A to FIG. 30F are schematic diagrams of each layer of the pixel driving circuit provided by embodiments of the disclosure. Examples shown in FIG. 29 to FIG. 30F are described with a pixel driving circuit of one sub-pixel spx as an example. FIG. 29 to FIG. 30F further show a first scanning line GA1, a second scanning line GA2, a third scanning line GA3, a fourth scanning line GA4, an initialization line VINIT, a light emitting control line EM, a data line VD and a power line Vdd which are electrically connected to a pixel driving circuit 0121. The power line Vdd is configured to input a driving voltage (that is, a first voltage) to the first power end VDD. Exemplarily, a plurality of data lines VD may be arranged in a first direction F1.

Figure 30A:
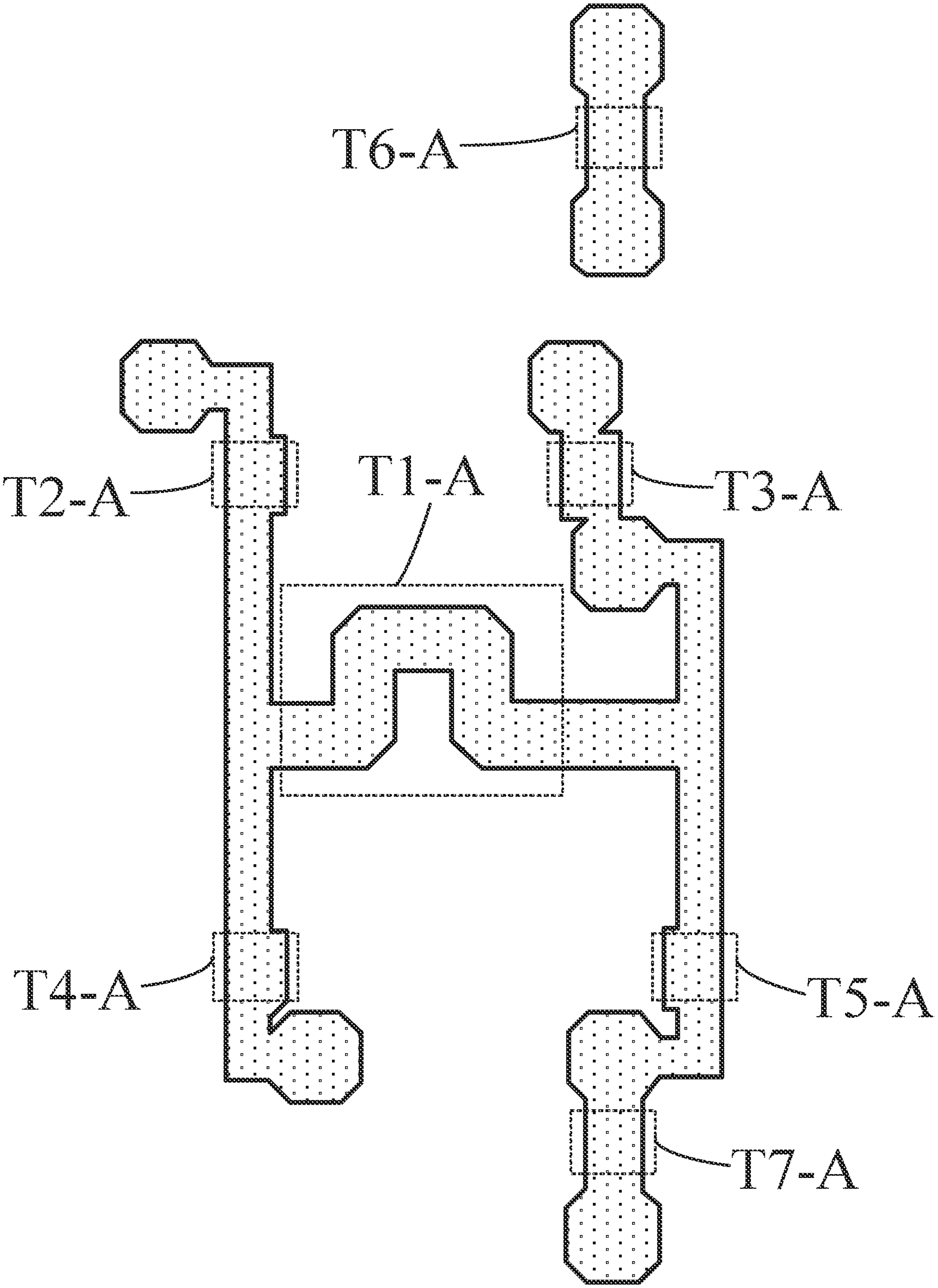
FIG. 30A is a schematic structural diagram of a silicon semiconductor layer provided by embodiments of the disclosure.

Exemplarily, as shown in FIG. 29, FIG. 30A, FIG. 31A to FIG. 32, a silicon semiconductor layer 500 of the pixel driving circuit 0121 is shown. The silicon semiconductor layer 500 may be formed by patterning an amorphous silicon material or an LTPS (Low Temperature Poly-Silicon) material. The silicon semiconductor layer 500 may be used for manufacturing active silicon layers of the driving transistor T1, the data writing transistor T2, the threshold compensation transistor T3, the first light emitting control transistor T4, the second light emitting control transistor T5, the initialization transistor T6 and the second reset transistor T7. Moreover, each of the active silicon layer may include a first region, a second region and a first channel region between the first region and the second region. For example, FIG. 30A shows a first channel region T1-A of the driving transistor T1, a first channel region T2-A of the data writing transistor T2, a first channel region T3-A of the threshold compensation transistor T3, a first channel region T4-A of the first light emitting control transistor T4, a first channel region T5-A of the second light emitting control transistor T5, a first channel region T6-A of the initialization transistor T6 and a first channel region T7-A of the second reset transistor T7. It should be noted that each of the above-mentioned first region and second region may be a conductor region formed by a region, in which n-type impurities or p-type impurities are doped, in the silicon semiconductor layer 500. Therefore, the first region and the second region may be used as a source electrode region and a drain electrode region of the active silicon layer for performing an electrical connection.

Exemplarily, as shown in FIG. 29 and FIG. 30A, the active silicon layer of the initialization transistor T6 may extend approximately in a straight line in a second direction F2. For example, an extension direction of the active silicon layer of the initialization transistor T6 is approximately parallel to the second direction F2. It should be noted that, in an actual process, due to restrictions of process conditions or other factors, the extension direction of the active silicon layer of the initialization transistor T6 may not be completely parallel to the second direction, it is possible to generate some deviations, and therefore, as long as the above-mentioned extension direction of the active silicon layer of the initialization transistor T6 and the second direction shall approximately meet parallel conditions, it shall fall within the protective scope of the disclosure. For example, the above-mentioned parallel may be allowed within an error allowable range.

Exemplarily, as shown in FIG. 29 and FIG. 30A, the active silicon layer of the threshold compensation transistor T3 may extend approximately in a straight line in the second direction F2. For example, an extension direction of the active silicon layer of the threshold compensation transistor T3 is approximately parallel to the second direction F2. It should be noted that, in an actual process, due to restrictions of process conditions or other factors, the extension direction of the active silicon layer of the threshold compensation transistor T3 may not be completely parallel to the second direction, it is possible to generate some deviations, and therefore, as long as the above-mentioned extension direction of the active silicon layer of the threshold compensation transistor T3 and the second direction approximately meet parallel conditions, it shall fall within the protective scope of the disclosure. For example, the above-mentioned parallel may be allowed within an error allowable range.

Figure 30B:
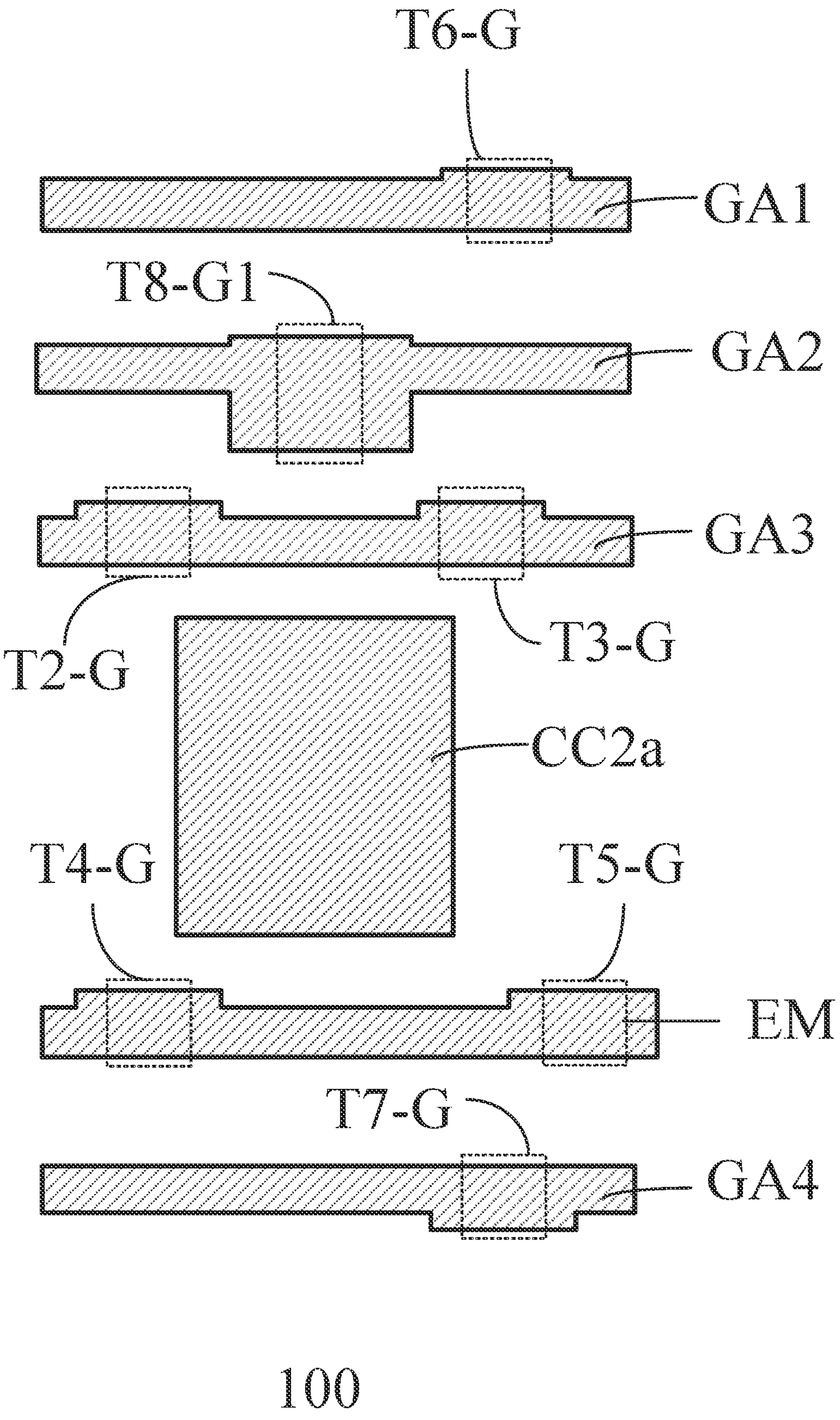
FIG. 30B is a schematic structural diagram of a first conducting layer provided by embodiments of the disclosure.
Figure 31A:
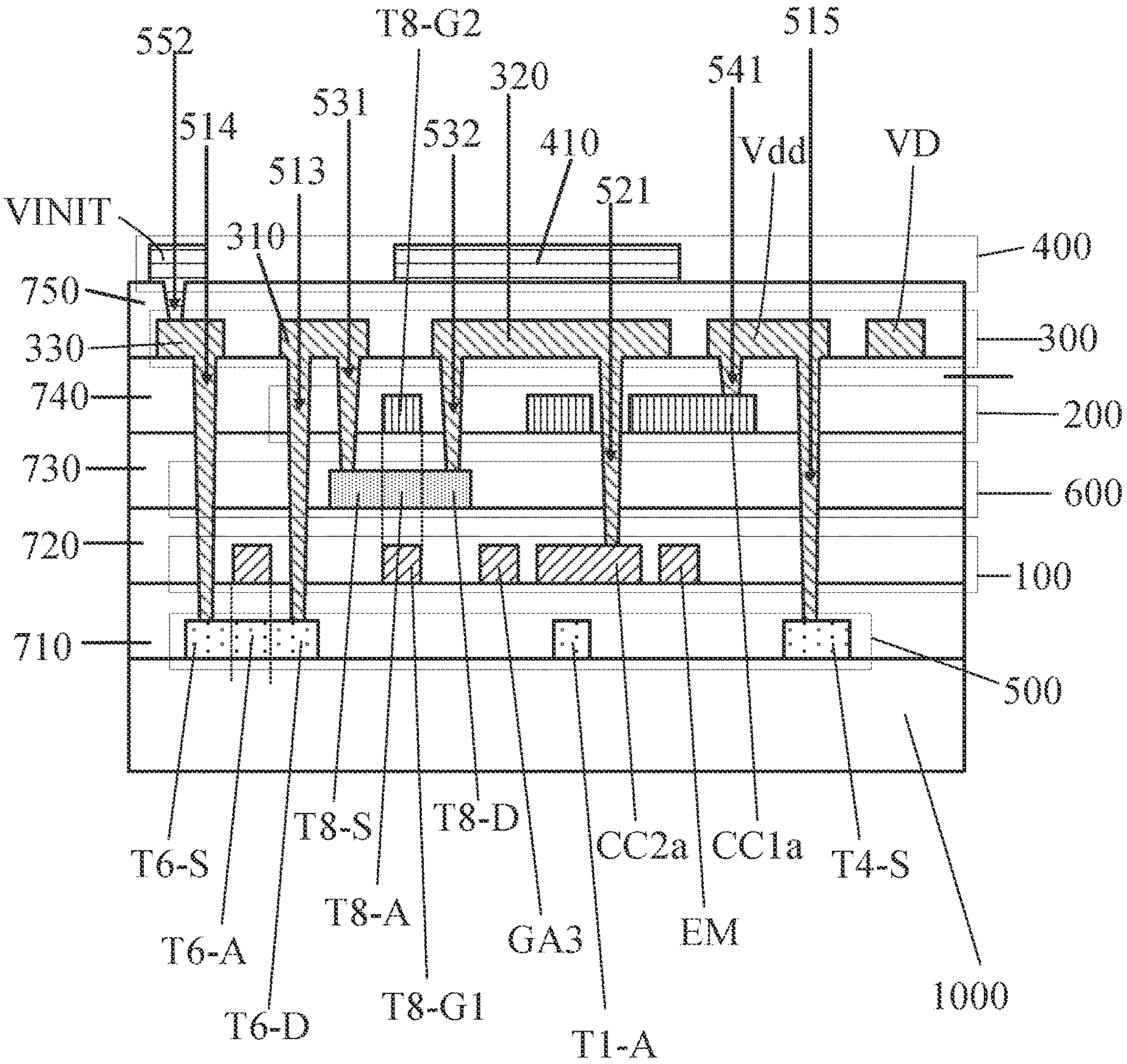
FIG. 31A is a section view in AA' direction in the schematic structural diagram showing the layout of the pixel driving circuit in FIG. 29.
Figure 31B:
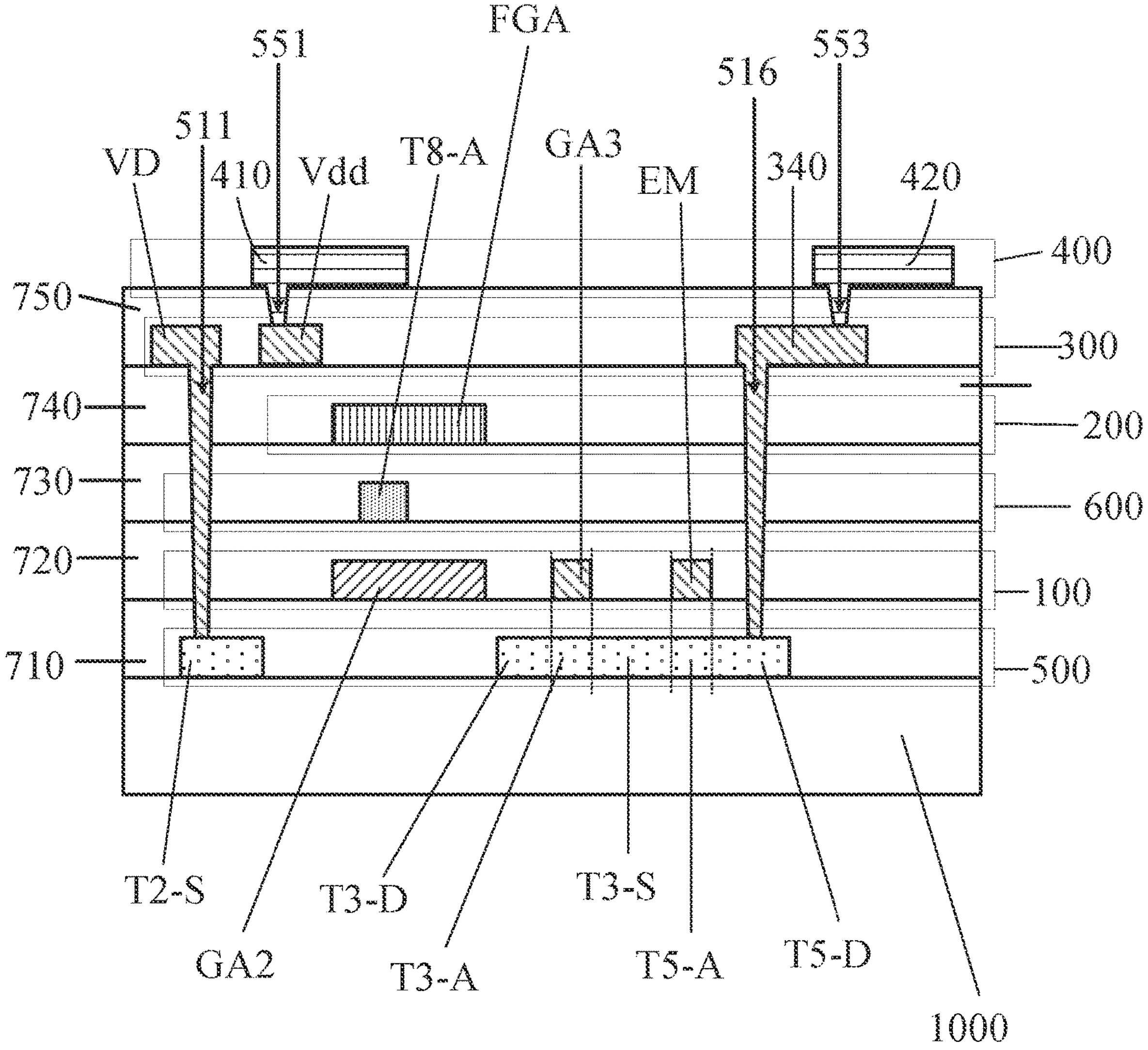
FIG. 31B is a section view in BB' direction in the schematic structural diagram showing the layout of the pixel driving circuit in FIG. 29.

Exemplarily, as shown in FIG. 31A and FIG. 31B, a first insulating layer 710 is formed on the above-mentioned silicon semiconductor layer 500 and is used for protecting the above-mentioned silicon semiconductor layer 500. As shown in FIG. 29, FIG. 30B, FIG. 31A to FIG. 32, a first conducting layer 100 of the pixel driving circuit 0121 is shown. The first conducting layer 100 is arranged at a side, facing away from the base substrate 1000, of the first insulating layer 710, thereby being insulated from the silicon semiconductor layer 500. The first conducting layer 100 may include a plurality of scanning lines spaced from one another, a plurality of light emitting control lines EM spaced from one another as well as a gate electrode CC2*a* of the driving transistor T1, a gate electrode T2-G of the data writing transistor T2, a gate electrode T3-G of the threshold compensation transistor T3, a gate electrode T4-G of the first light emitting control transistor T4, a gate electrode T5-G of the second light emitting control transistor T5, a gate electrode T6-G of the initialization transistor T6, a gate electrode T7-G of the second reset transistor T7 and a first gate electrode T8-G1 of the voltage stabilizing transistor T8. Exemplarily, the plurality of scanning lines may include, for example, a plurality of first scanning lines GA1, a plurality of second scanning lines GA2, a plurality of third scanning lines GA3 and a plurality of fourth scanning lines GA4 spaced from one another. Exemplarily, a row of sub-pixels corresponds to one of the first scanning lines GA1, one of the second scanning lines GA2, one of the third scanning lines GA3, one of the fourth scanning lines GA4 and one of the light emitting control lines EM.

For example, as shown in FIG. 29 to FIG. 30B, the gate electrode T2-G of the data writing transistor T2 may be a first part, overlapped with the silicon semiconductor layer 500, of the third scanning line GA3. An orthographic projection of the third scanning line GA3 on the base substrate 1000 is overlapped with an orthographic projection of the first channel region T3-A of the active silicon layer of the threshold compensation transistor T3 on the base substrate 1000 to form a third overlapping region, and a part, in the third overlapping region, of the third scanning line GA3 is the gate electrode T3-G of the threshold compensation transistor T3, that is, the gate electrode T3-G of the threshold compensation transistor T3 may be a second part, overlapped with the silicon semiconductor layer 500, of the third scanning line GA3. An orthographic projection of the light emitting control line EM on the base substrate 1000 is overlapped with the first channel region T4-A of the active silicon layer of the first light emitting control transistor T4 to form a fourth overlapping region, and a part, in the fourth overlapping region, of the light emitting control line EM is the gate electrode T4-G of the first light emitting control transistor T4, that is, the gate electrode T4-G of the first light emitting control transistor T4 may be a first part, overlapped with the silicon semiconductor layer 500, of the light emitting control line EM. An orthographic projection of the light emitting control line EM on the base substrate 1000 is overlapped with the first channel region T5-A of the active silicon layer of the second light emitting control transistor T5 to form a fifth overlapping region, and a part, in the fifth overlapping region, of the light emitting control line EM is the gate electrode T5-G of the second light emitting control transistor T5, that is, the gate electrode T5-G of the second light emitting control transistor T5 may be a second part, overlapped with the silicon semiconductor layer 500, of the light emitting control line EM.

Moreover, an orthographic projection of the first scanning line GA1 on the base substrate 1000 is overlapped with an orthographic projection of the first channel region T6-A of the active silicon layer of the initialization transistor T6 on the base substrate 1000 to form a first overlapping region, and a part, in the first overlapping region, of the first scanning line GA1 is the gate electrode T6-G of the initialization transistor T6, that is, the gate electrode T6-G of the initialization transistor T6 may be a first part, overlapped with the silicon semiconductor layer 500, of the first scanning line GA1, and the gate electrode T7-G of the second reset transistor T7 may be a first part, overlapped with the silicon semiconductor layer 500, of the fourth scanning line GA4. The first gate electrode T8-G1 of the voltage stabilizing transistor T8 may be a first part, overlapped with the silicon semiconductor layer 500, of the second scanning line GA2. Moreover, the gate electrode CC2*a* of the driving transistor T1 may be set as an electrode plate of the storage capacitor CST. In other words, the gate electrode CC2*a* of the driving transistor T1 and one electrode plate of the storage capacitor CST are of an integrated structure. Moreover, an orthographic projection of the second scanning line GA2 on the base substrate 1000 is overlapped with an orthographic projection of the second channel region T8-A of an active oxide layer of the voltage stabilizing transistor T8 on the base substrate 1000 to form a second overlapping region, and a part, in the second overlapping region, of the second scanning line GA2 is the gate electrode of the voltage stabilizing transistor T8-A.

Exemplarily, as shown in FIG. 29 and FIG. 30B, the first scanning line GA1, the second scanning line GA2, the third scanning line GA3, the light emitting control line EM and the fourth scanning line GA4 extend in the first direction F1. Moreover, the first scanning line GA1, the second scanning line GA2, the third scanning line GA3, the light emitting control line EM and the fourth scanning line GA4 are arranged in the second direction F2. In the same sub-pixel, the orthographic projection of the second scanning line GA2 on the base substrate 1000 is located between the orthographic projection of the first scanning line GA1 on the base substrate 1000 and the orthographic projection of the third scanning line GA3 on the base substrate 1000. The orthographic projection of the third scanning line GA3 on the base substrate 1000 is located between the orthographic projection of the second scanning line GA2 on the base substrate 1000 and the orthographic projection of the light emitting control line EM on the base substrate 1000. An orthographic projection of the fourth scanning line GA4 on the base substrate 1000 is at a side, facing away from the orthographic projection of the third scanning line GA3 on the base substrate 1000, of the orthographic projection of the light emitting control line EM on the base substrate 1000. Moreover, in the same sub-pixel, an orthographic projection of the active oxide layer of the voltage stabilizing transistor T8 on the base substrate 1000 is located between the orthographic projection of the first scanning line GA1 on the base substrate 1000 and the orthographic projection of the third scanning line GA3 on the base substrate 1000, and the orthographic projection of the second scanning line GA2 on the base substrate 1000 is respectively not overlapped with an orthographic projection of the active silicon layer of the threshold compensation transistor T3 on the base substrate 1000 and an orthographic projection of the active silicon layer of the initialization transistor T6 on the base substrate 1000. Of course, it is possible that the orthographic projection of the second scanning line GA2 on the base substrate 1000 is partially overlapped with an orthographic projection of the first region of the active silicon layer of the threshold compensation transistor T3 on the base substrate 1000. Or, the orthographic projection of the second scanning line GA2 on the base substrate 1000 may also partially overlapped with an orthographic projection of the second region of the active silicon layer of the initialization transistor T6 on the base substrate 1000. Of course, these setting ways may be designed and determined according to a demand of actual application, which is not limited herein.

Exemplarily, as shown in FIG. 29 and FIG. 30B, in the same sub-pixel, an orthographic projection of the light emitting control line EM on the base substrate 1000 is at a side, facing away from the orthographic projection of the second scanning line GA2 on the base substrate 1000, of the orthographic projection of the third scanning line GA3 on the base substrate 1000. The orthographic projection of the fourth scanning line GA3 on the base substrate 1000 is at the side, facing away from the orthographic projection of the second scanning line GA2 on the base substrate 1000, of the orthographic projection of the light emitting control line EM on the base substrate 1000. Both orthographic projections of the active silicon layer and the gate electrode of the driving transistor T1 on the base substrate 1000 are between the orthographic projection of the light emitting control line EM on the base substrate 1000 and the orthographic projection of the third scanning line GA2 on the base substrate 1000.

Exemplarily, as shown in FIG. 29 and FIG. 30B, in the second direction F2, an orthographic projection of the gate electrode CC2*a* of the driving transistor T1 on the base substrate 1000 is between the orthographic projection of the third scanning line GA3 on the base substrate 1000 and the orthographic projection of the light emitting control line EM on the base substrate 1000. Moreover, in the second direction F2, the gate electrode T2-G of the data writing transistor T2, the gate electrode T3-G of the threshold compensation transistor T3, the gate electrode T6-G of the initialization transistor T6 and the first gate electrode T8-G1 of the voltage stabilizing transistor T8 are located at the side, facing away from the light emitting control line EM, of the gate electrode of the driving transistor T1, and the gate electrode T7-G of the second reset transistor T7, the gate electrode T4-G of the first light emitting control transistor T4 and the gate electrode T5-G of the second light emitting control transistor T5 are located at the side, facing away from the first scanning line GA1, of the gate electrode of the driving transistor T1.

For example, in some embodiments, as shown in FIG. 29 and FIG. 30B, in the first direction F1, both the gate electrode T2-G of the data writing transistor T2 and the gate electrode T4-G of the first light emitting control transistor T4 are located at a third side of the gate electrode of the driving transistor T1, and the gate electrode T3-G of the threshold compensation transistor T3, the gate electrode T5-G of the second light emitting control transistor T5, the gate electrode T6-G of the initialization transistor T6 and the gate electrode T7-G of the second reset transistor T7 are located at a fourth side of the gate electrode of the driving transistor T1. The third side and the fourth side of the gate electrode of the driving transistor T1 are two sides, opposite to each other in the first direction F1, of the gate electrode of the driving transistor T1. Moreover, the first gate electrode T8-G1 of the voltage stabilizing transistor T8 and the gate electrode of the driving transistor T1 are arranged, in the first direction F1, in a straight line. For example, the center of the first gate electrode T8-G1 of the voltage stabilizing transistor T8 and the center of the gate electrode of the driving transistor T1 are arranged, in the first direction F1, in a straight line.

Exemplarily, as shown in FIG. 31A and FIG. 31B, a second insulating layer 720 is formed on the above-mentioned first conducting layer 100 and is used for protecting the above-mentioned first conducting layer 100. In FIG. 29, FIG. 30C, FIG. 31A to FIG. 32, an oxide semiconductor layer 600 of the pixel driving circuit 0121 is shown. The oxide semiconductor layer 600 is arranged at a side, facing away from the base substrate 1000, of the second insulating layer 720. The oxide semiconductor layer 600 may be formed by patterning an oxide semiconductor material. Exemplarily, the oxide semiconductor material may be, for example, IGZO (Indium Gallium Zinc Oxide).

Figure 30C:
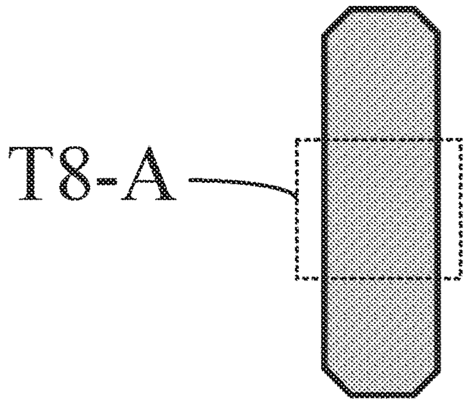
FIG. 30C is a schematic structural diagram of an oxide semiconductor layer provided by embodiments of the disclosure.
Figure 30D:
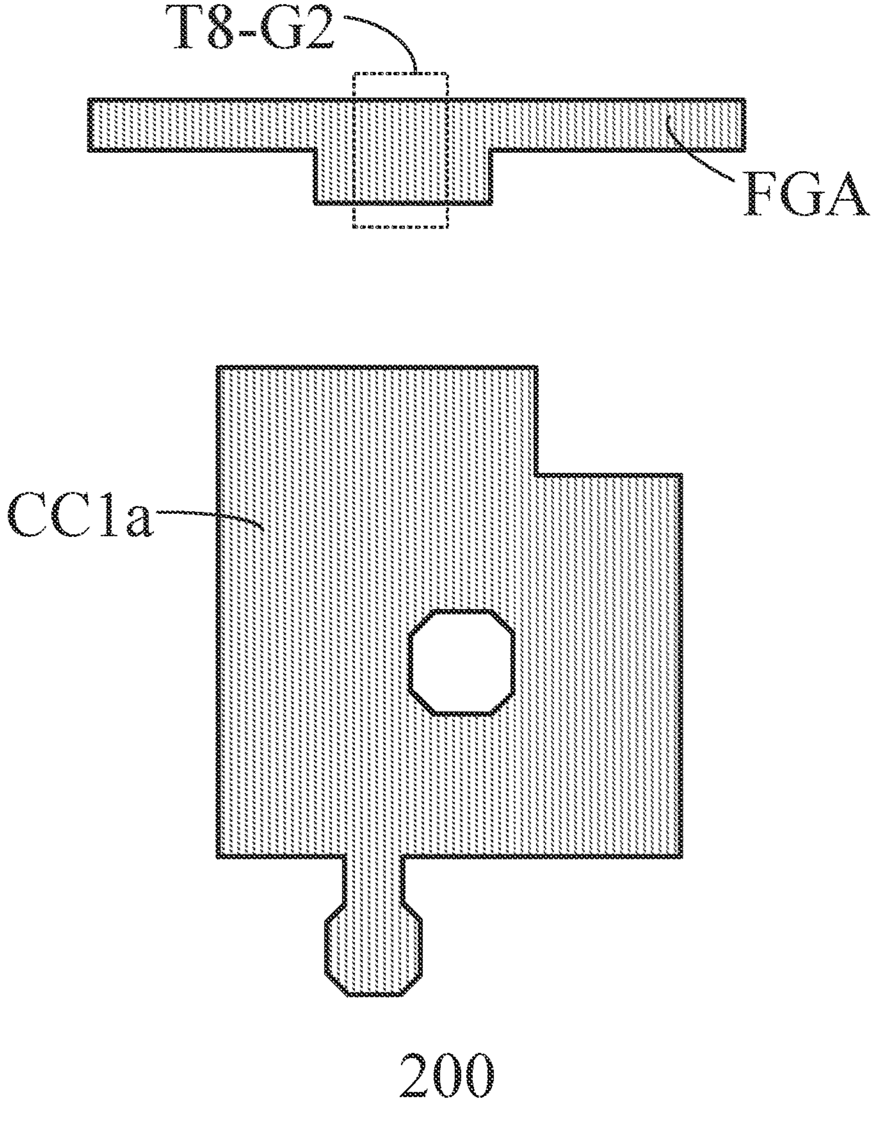
FIG. 30D is a schematic structural diagram of a second conducting layer provided by embodiments of the disclosure.

Moreover, the oxide semiconductor layer 600 may include the active oxide layer of the voltage stabilizing transistor T8. The active oxide layer is provided with a third region, a fourth region and a second channel region T8-A between the third region and the fourth region. For example, FIG. 30C shows the second channel region T8-A of the voltage stabilizing transistor T8. It should be noted that each of the third region and the fourth region may be a conductor region formed by a region, in which n-type impurities or p-type impurities are doped, in the oxide semiconductor layer 600. Therefore, the third region and the fourth region may be used as a source electrode region and a drain electrode region of the active oxide layer for performing an electrical connection.

Exemplarily, as shown in FIG. 29 and FIG. 30C, the active oxide layer of the voltage stabilizing transistor T8 extends approximately in a straight line in the second direction F2. For example, an extension direction of the active oxide layer of the voltage stabilizing transistor T8 is approximately parallel to the second direction F2. It should be noted that, in an actual process, due to restrictions of process conditions or other factors, the extension direction of the active oxide layer of the voltage stabilizing transistor T8 may not be completely parallel to the second direction, it is possible to generate some deviations, and therefore, as long as the extension direction of the active oxide layer of the above-mentioned voltage stabilizing transistor T8 and the second direction approximately meet parallel directions, it shall fall within the protective scope of the disclosure. For example, the above-mentioned parallel may be allowed within an error allowable range.

Exemplarily, as shown in FIG. 31A and FIG. 31B, a third insulating layer 730 is formed on the above-mentioned oxide semiconductor layer 600 and is used for protecting the above-mentioned oxide semiconductor layer 600. As shown in FIG. 29, FIG. 30D, FIG. 31A to FIG. 32, a second conducting layer 200 of the pixel driving circuit 0121 is shown. The second conducting layer 200 is arranged at a side, facing away from the base substrate 1000, of the third insulating layer 730. The second conducting layer 200 may include a plurality of auxiliary scanning lines FGA spaced from one another and a storage conducting part CC1*a* spaced from the auxiliary scanning lines FGA. Exemplarily, an orthographic projection of the storage conducting part CC1*a* on the base substrate 1000 is at least partially overlapped with the orthographic projection of the gate electrode CC2*a* of the driving transistor T1 on the base substrate 1000 to form a storage capacitor CST. Moreover, exemplarily, a row of sub-pixels corresponds to one of the auxiliary scanning lines FGA. An orthographic projection of the auxiliary scanning line FGA on the base substrate 1000 is overlapped with an orthographic projection of the second channel region T8-A of the active oxide layer of the voltage stabilizing transistor T8 on the base substrate 1000 to form a fourth overlapping region. In this way, the second gate electrode T8-G2 of the voltage stabilizing transistor T8 may be a first part, overlapped with the second channel region T8-A, of the auxiliary scanning line FGA. In this way, the voltage stabilizing transistor T8 is a double-gate transistor. The part, in the second overlapping region, of the second scanning line GA2 is a first gate electrode T8-G1 of the voltage stabilizing transistor T8, and the part, in the fourth overlapping region, of the auxiliary scanning line FGA is a second gate electrode T8-G2 of the voltage stabilizing transistor T8.

Exemplarily, as shown in FIG. 29, FIG. 30D, FIG. 31A to FIG. 32, in the same sub-pixel, the orthographic projection of the auxiliary scanning line FGA on the base substrate 1000 is overlapped with the orthographic projection of the second scanning line GA2 on the base substrate FPA, and the auxiliary scanning line FGA and the second scanning line GA2 in the same sub-pixel are electrically connected.

Exemplarily, the auxiliary scanning line FGA and the second scanning line GA2 in the same sub-pixel may be electrically connected on an edge of an effective display region through a via hole. For another example, the auxiliary scanning line FGA and the second scanning line GA2 in the same sub-pixel may be electrically connected in the display region through the via hole.

Exemplarily, as shown in FIG. 31A and FIG. 31B, a fourth insulating layer 740 is formed on the above-mentioned second conducting layer 200 and is used for protecting the above-mentioned second conducting layer 200. As shown in FIG. 29, FIG. 30E, FIG. 31A to FIG. 32, a third conducting layer 300 of the pixel driving circuit 0121 is shown. The third conducting layer 300 is arranged at a side, facing away from the base substrate 1000, of the fourth insulating layer 740. The third conducting layer 300 may include a plurality of data lines VD, a plurality of power lines Vdd, a plurality of first connection parts 310, a plurality of second connection parts 320, a plurality of third connection parts 330 and a plurality of fourth connection parts 340 spaced from one another. The data lines VD, the power lines Vdd, the first connection parts 310, the second connection parts 320, the third connection parts 330 and the fourth connection parts 340 are spaced from one another.

Exemplarily, as shown in FIG. 29, FIG. 30E, FIG. 31A to FIG. 32, the data lines VD and the power lines Vdd are arranged in a first direction, and the data lines VD and the power lines Vdd extend in a second direction. One of the first connection parts 310, one of the second connection parts 320, one of the third connection parts 330 and one of the fourth connection parts 340 are arranged in one sub-pixel. Exemplarily, a column of sub-pixels corresponds to one of the power lines Vdd and one of the data lines VD. Moreover, in the same sub-pixel, an orthographic projection of the power line Vdd on the base substrate 1000 is located between an orthographic projection of the data line VD on the base substrate 1000 and an orthographic projection of the second connection part 320 on the base substrate 1000. In the same column of sub-pixels, both the orthographic projection of the active silicon layer of the initialization transistor T6 on the base substrate 1000 and the orthographic projection of the active silicon layer of the threshold compensation transistor T3 on the base substrate 1000 are located at a side, facing away from the orthographic projection of the data line VD on the base substrate 1000, of the orthographic projection of the active oxide layer of the voltage stabilizing transistor T8 on the base substrate 1000. For example, the orthographic projection of the active silicon layer of the initialization transistor T6 on the base substrate 1000 is a first orthographic projection, the orthographic projection of the active silicon layer of the threshold compensation transistor T3 on the base substrate 1000 is a second orthographic projection, the orthographic projection of the active oxide layer of the voltage stabilizing transistor T8 on the base substrate 1000 is a third orthographic projection, the orthographic projection of the data line VD on the base substrate 1000 is a fourth orthographic projection, the first orthographic projection is located at a side, facing away from the fourth orthographic projection, of the third orthographic projection, and the second orthographic projection is also located at the side, facing away from the fourth orthographic projection, of the third orthographic projection, so that both the first orthographic projection and the second orthographic projection may be located at the side, facing away from the fourth orthographic projection, of the third orthographic projection.

Exemplarily, as shown in FIG. 31A and FIG. 31B, a fifth insulating layer 750 is formed on the above-mentioned third conducting layer 300 and is used for protecting the above-mentioned third conducting layer 300. As shown in FIG. 29, FIG. 30F, FIG. 31A to FIG. 32, a fourth conducting layer 400 of the pixel driving circuit 0121 is shown. The fourth conducting layer 400 is arranged at a side, facing away from the base substrate 1000, of the fifth insulating layer 750. The fourth conducting layer 400 may include a plurality of initialization lines VINIT spaced from one another, a plurality of auxiliary conducting parts 410 spaced from one another and a plurality of switching parts 420. The initialization lines VINIT, the auxiliary conducting parts 410 and the switching parts 420 are spaced from one another. A sub-pixel is provided with one auxiliary conducting part 410 and one switching part 420. A row of sub-pixels corresponds to one of the initialization lines VINIT. Exemplarily, in the same sub-pixel, an orthographic projection of the initialization line VINIT on the base substrate 1000 is located at the side, facing away from the orthographic projection of the second scanning line GA2 on the base substrate 1000, of the orthographic projection of the first scanning line GA1 on the base substrate 1000.

Figure 31C:
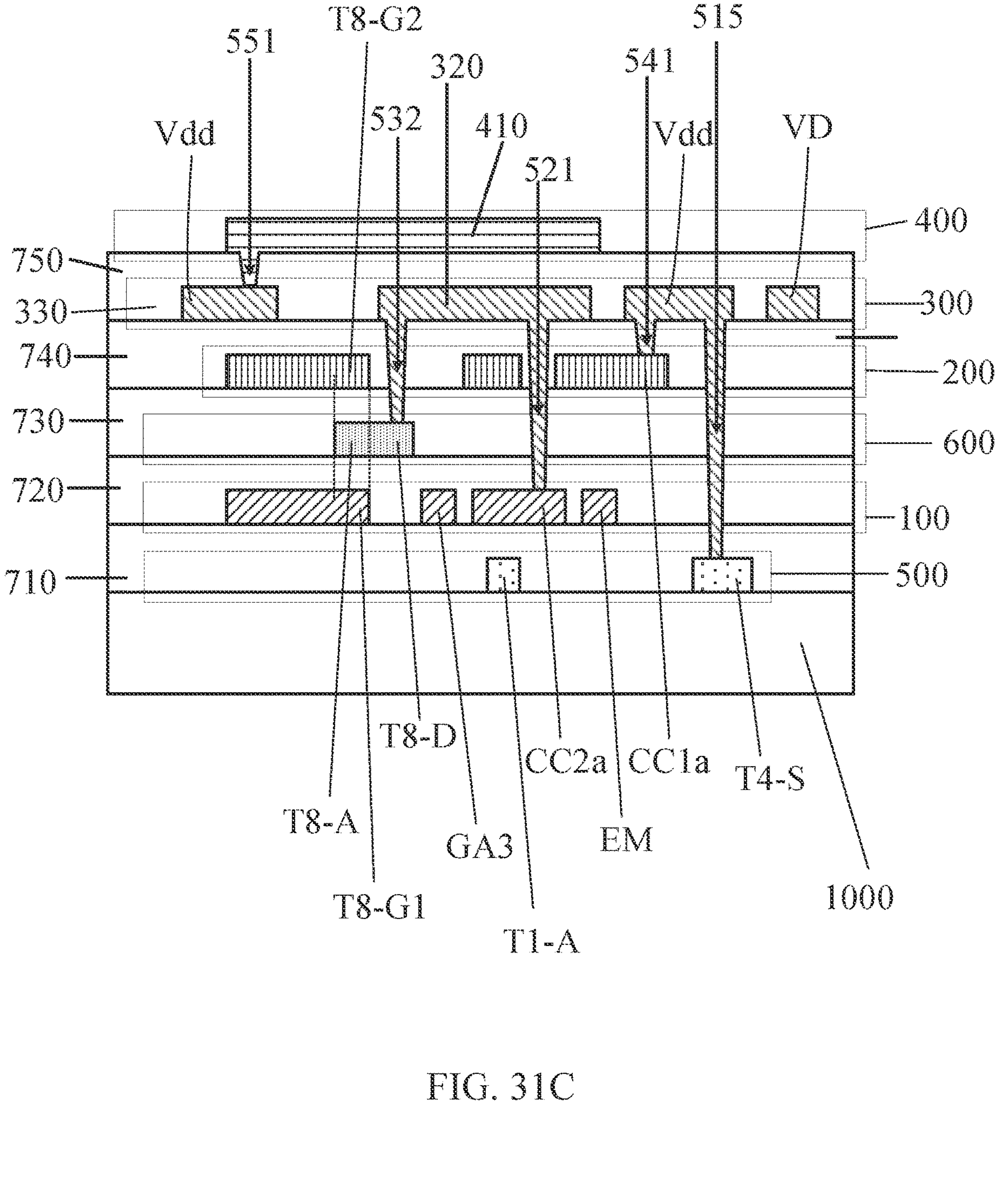
FIG. 31C is a section view in CC' direction in the schematic structural diagram showing the layout of the pixel driving circuit in FIG. 29.
Figure 31D:
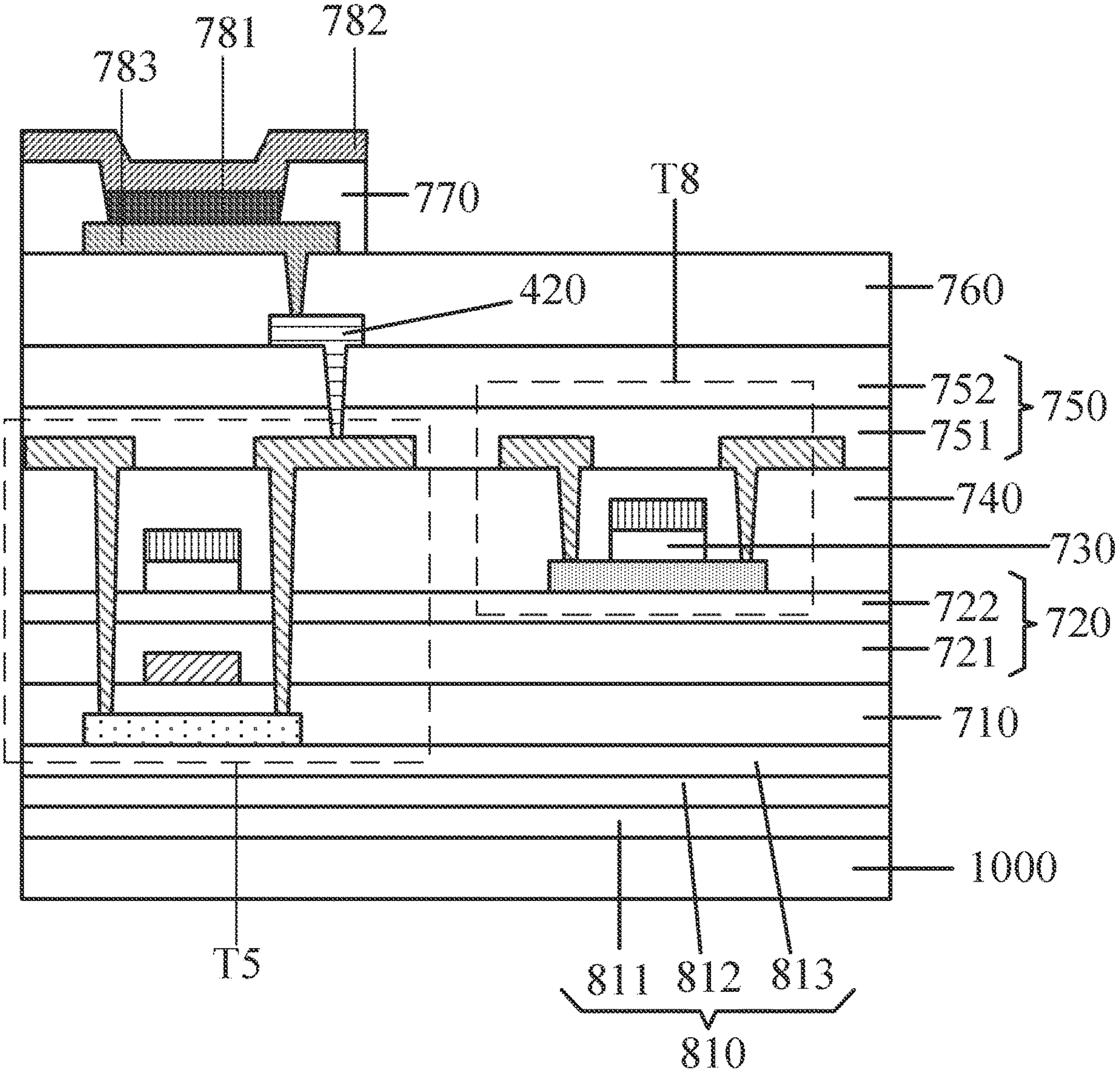
FIG. 31D is a partial section view of the schematic structural diagram showing the layout of the pixel driving circuit in FIG. 29.
Figure 32:
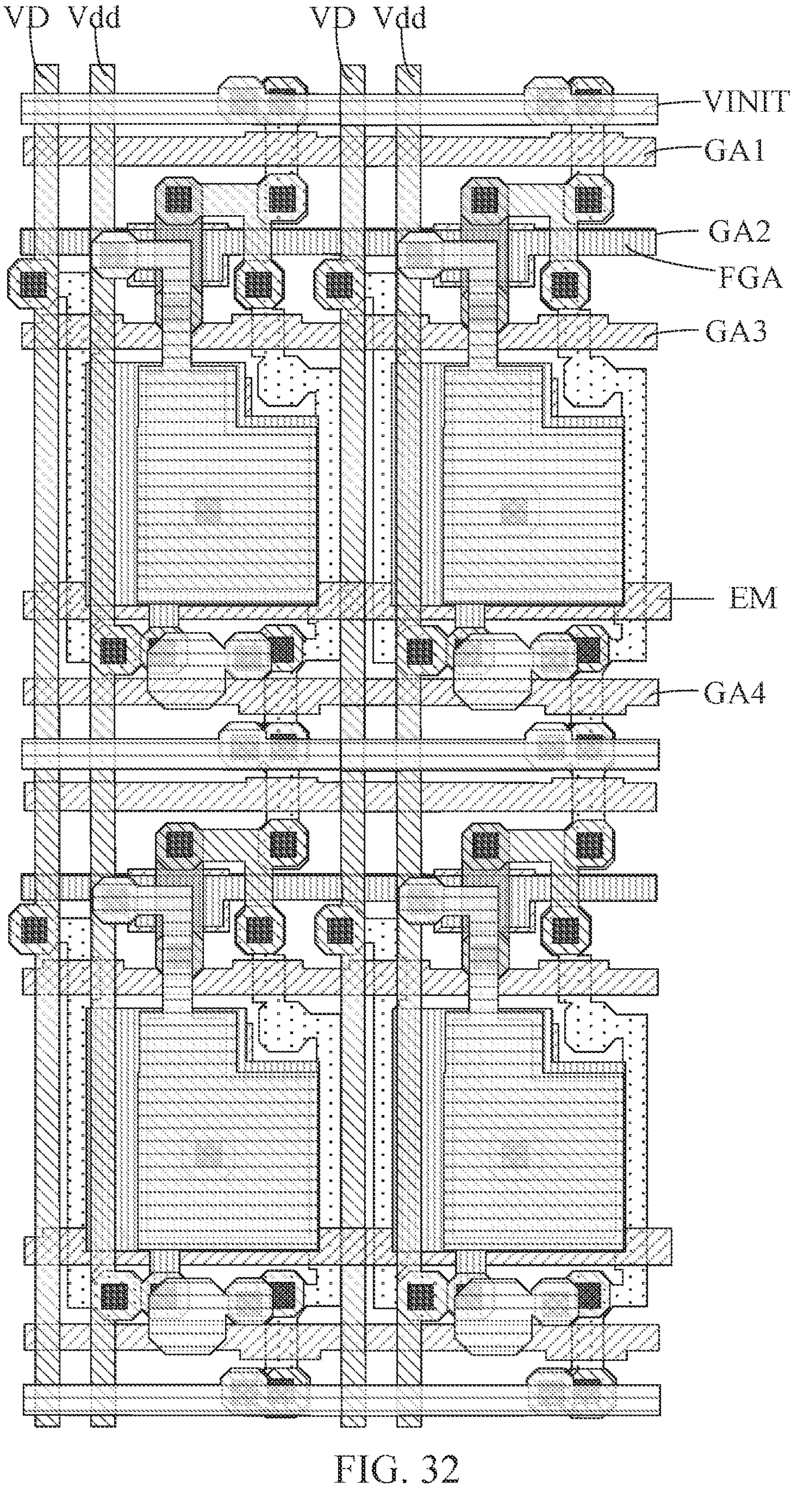
FIG. 32 is a schematic structural diagram showing layout of pixel driving circuits in two rows and two columns of sub-pixels in embodiments of the disclosure.

FIG. 31A is a sectional view in AA' direction in the schematic structural diagram showing the layout of the pixel driving circuit in FIG. 29. FIG. 31B is a sectional view in BB' direction in the schematic structural diagram showing the layout in FIG. 29. FIG. 31C is a sectional view in CC' direction in the schematic structural diagram showing the layout in FIG. 29. FIG. 31D is a partial sectional view in the schematic structural diagram showing the layout in FIG. 29. FIG. 32 is a schematic structural diagram showing layout of pixel driving circuits in two rows and two columns of sub-pixels in embodiments of the disclosure. FIG. 31D only shows the voltage stabilizing transistor T8 and the second light emitting control transistor T5 in the pixel driving circuit 0121.

As shown in FIG. 31A to FIG. 32, a first buffer layer 810 is arranged between the silicon semiconductor layer 500 and the base substrate 1000. The first insulating layer 710 is arranged between the silicon semiconductor layer 500 and the first conducting layer 100 The second insulating layer 720 is arranged between the first conducting layer 100 and the oxide semiconductor layer 600. The third insulating layer 730 is arranged between the oxide semiconductor layer 600 and the second conducting layer 200. The fourth insulating layer 740 is arranged between the second conducting layer 200 and the third conducting layer 300. The fifth insulating layer 750 is arranged between the third conducting layer 300 and the fourth conducting layer 400. Further, the side, facing away from the base substrate 1000, of the fourth conducting layer 400 is provided with a first planarization layer 760. A side, facing away from the base substrate 1000, of the first planarization layer 760 is provided with a first electrode layer. A side, facing away from the base substrate 1000, of the first electrode layer is sequentially provided with a pixel defining layer 770, a light emitting functional layer 781 and a second electrode layer 782. The first electrode layer may include a plurality of first electrodes 783 spaced from one another, and the first electrodes 783 are electrically connected to the switching parts 420 through via holes penetrating through the first planarization layer 760. It should be noted that the via holes penetrating through the first planarization layer 760 are not shown in FIG. 31A and FIG. 31B.

Exemplarily, the above-mentioned insulating layers may be made of organic material or inorganic material (such as SiOx and SiNx), which is not limited herein.

Exemplarily, as shown in FIG. 31D, the first buffer layer 810 may include a first sub-buffer layer 811, a second sub-buffer layer 812 and a third sub-buffer layer 813 which are stacked. The first sub-buffer layer 811 is between the base substrate 1000 and the second sub-buffer layer 812, and the third sub-buffer layer 813 is between the second sub-buffer layer 812 and the silicon semiconductor layer 500. Exemplarily, at least one of the first sub-buffer layer 811, the second sub-buffer layer 812 and the third sub-buffer layer 813 may be set to be made of the inorganic material or the organic material. For example, the first sub-buffer layer 811 is set to be made of the organic material such as PI (Polyimide), and the second sub-buffer layer 812 and the third sub-buffer layer 813 may be set to be made of the inorganic material such as SiOx and SiNx.

Exemplarily, as shown in FIG. 31D, the second insulating layer 720 may include a second sub-insulating layer 721 and a second buffer layer 722 which are stacked. The second sub-insulating layer 721 is located between the first conducting layer 100 and the second buffer layer 722, and the second buffer layer 722 is located between the second sub-insulating layer 721 and the oxide semiconductor layer 600. Exemplarily, the second sub-insulating layer 721 may be set to be made of an inorganic material such as SiNx and SiOx, and SiNx may be adopted during specific implementation. The second buffer layer 722 may be set to be made of an inorganic material such as SiNx and SiOx, and SiOx may be adopted during specific implementation.

Exemplarily, as shown in FIG. 31D, the fifth insulating layer 750 may include a PVX (Passivation) layer 751 and a second planarization layer 752 which are stacked. The PVX layer 752 is located between the third conducting layer 300 and the second planarization layer 752, and the second planarization layer 752 is located between the PVX layer 752 and the fourth conducting layer 400. Exemplarily, the PVX layer 751 may be made of an inorganic material such as SiOx and SiNx, and the second planarization layer 752 may be made of an organic material.

Exemplarily, the sub-pixel spx may include first connection through holes 511, 512, 513, 514, 515 and 516. The sub-pixel spx may include a second connection through hole 521. The sub-pixel spx may include third connection through holes 531 and 532. The sub-pixel spx may include a fourth connection through hole 541. The sub-pixel spx may include fifth connection through holes 551, 552 and 553. The first connection through holes 511, 512, 513, 514, 515 and 516 penetrate through the first insulating layer 710, the second insulating layer 720, the third insulating layer 730 and the fourth insulating layer 740. The second connection through hole 521 penetrates through the second insulating layer 720, the third insulating layer 730 and the fourth insulating layer 740. The third connection through holes 531 and 532 penetrate through the third insulating layer 730 and the fourth insulating layer 740. The fourth connection through hole 541 penetrates through the fourth insulating layer 740. The fifth connection through holes 551, 552 and 553 penetrate through the fifth insulating layer 750. Moreover, the above-mentioned connection through holes are disposed at intervals. Exemplarily, the third connection through hole 531 is used as a first via hole, the first connection through hole 513 is used as a second via hole, and the first connection through hole 512 is used as a third via hole.

In the same sub-pixel, the data line VD is electrically connected to the first region of the data writing transistor T2 in the silicon semiconductor layer 500 through at least one first connection through hole 511. The power line Vdd is electrically connected to a first region T4-S of the first light emitting control transistor T4 in the silicon semiconductor layer 500 through at least one first connection through hole 515 (that is, a fourth via hole). Moreover, the power line Vdd is further electrically connected to the storage conducting part CC1*a* through at least one fourth connection through hole 541 (that is, an eighth via hole). One end of the third connection part 330 is electrically connected to a first region T6-S of the initialization transistor T6 in the silicon semiconductor layer 500 through at least one first connection through hole 514 (that is, a tenth via hole). The other end of the third connection part 330 is electrically connected to the initialization line VINIT through at least one fifth connection through hole 552 (that is, a ninth via hole). The first connection part 310 is electrically connected to a second region T6-D of the initialization transistor T6 in the silicon semiconductor layer 500 through at least one first connection through hole 513 (that is, the second via hole). The first connection part 310 is further electrically connected to a second region T3-D of the threshold compensation transistor T3 in the silicon semiconductor layer 500 through at least one first connection through hole 512 (that is, the third via hole). The first connection part 310 is further electrically connected to a third region T8-S of the voltage stabilizing transistor T8 in the oxide semiconductor layer 600 through at least one third connection through hole 531 (that is, the first via hole). One end of the fourth connection part 340 is electrically connected to each of a second region T5-D of the second light emitting control transistor T5 in the silicon semiconductor layer 500 and a second region T7-D of the second reset transistor T7 in the silicon semiconductor layer 500 through at least one first connection through hole 516 (that is, a fifth via hole). The other end of the fourth connection part 340 is electrically connected to the switching part 420 through at least one fifth connection through hole 553. One end of the second connection part 320 is electrically connected to a fourth region T8-D of the voltage stabilizing transistor T8 in the oxide semiconductor layer 600 through at least one third connection through hole 532 (that is, a sixth via hole). The other end of the second connection part 320 is electrically connected to the gate electrode CC2*a* of the driving transistor T1 through at least one second connection through hole 521 (that is, a seventh via hole). The auxiliary conducting part 410 is electrically connected to the power line Vdd through at least one fifth connection through hole 551.

Exemplarily, the number of each of the first connection through holes 511, 512, 513, 514, 515 and 516 in the sub-pixel may be set to be one or two or more. In actual application, the number may be designed and determined according to a demand of an actual application environment, which is not limited herein.

Exemplarily, the number of the second connection through hole 521 in the sub-pixel may be set to be one or two or more. In actual application, the number may be designed and determined according to a demand of an actual application environment, which is not limited herein.

Exemplarily, the number of each of the third connection through holes 531 and 532 in the sub-pixel may be set to be one or two or more. In actual application, the number may be designed and determined according to a demand of an actual application environment, which is not limited herein.

Exemplarily, the number of the fourth connection through hole 541 in the sub-pixel may be set to be one or two or more. In actual application, the number may be designed and determined according to a demand of an actual application environment, which is not limited herein.

Exemplarily, the number of each of the fifth connection through holes 551, 552 and 553 in the sub-pixel may be set to be one or two or more. In actual application, the number may be designed and determined according to a demand of an actual application environment, which is not limited herein.

It should be noted that a positional arrangement relationship among the transistors in each sub-pixel spx is not limited to examples as shown in FIG. 29 to FIG. 30F, and positions of the above-mentioned transistors may be set specifically according to a demand of actual application.

It should be noted that the first direction F1 may be a row direction of the sub-pixels, and the second direction F2 may be a column direction of the sub-pixels. Or, the first direction F1 may be the column direction of the sub-pixels, and the second direction F2 may be the row direction of the sub-pixels. In actual application, the first direction F1 and the second direction F2 may be set according to a demand of actual application, which is not limited herein.

During specific implementation, in embodiments of the present disclosure, as shown in FIG. 29 to FIG. 32, the first region T6-S of the active silicon layer of the initialization transistor T6 is used as the first electrode of the initialization transistor T6, and the second region T6-D of the active silicon layer of the initialization transistor T6 is used as the second electrode of the initialization transistor T6. The third region T8-S of the active oxide layer of the voltage stabilizing transistor T8 is used as the first electrode of the voltage stabilizing transistor T8, and the fourth region T8-S of the active oxide layer of the voltage stabilizing transistor T8 is used as the second electrode of the voltage stabilizing transistor T8. Moreover, in the same sub-pixel, the second region T6-D of the active silicon layer of the initialization transistor T6 is electrically connected to the third region T8-S of the active oxide layer of the voltage stabilizing transistor T8, and the fourth region T8-D of the active oxide layer of the voltage stabilizing transistor T8 is electrically connected to the gate electrode of the driving transistor T1. In this way, an active oxide layer may be arranged between the gate electrode of the driving transistor and the second region T6-D of the active silicon layer of the initialization transistor T6, so that a signal flow path between the gate electrode of the driving transistor and the second region T6-D of the active silicon layer of the initialization transistor T6 may pass through the active oxide layer. Since the transistor with the active layer made of a metal oxide semiconductor material generates a little leakage current, an off-state current of the voltage stabilizing transistor T8 is relatively small and is even negligible. Therefore, influences of the leakage current to the voltage of the gate electrode of the driving transistor may be reduced, and the stability of the voltage of the gate electrode of the driving transistor may be improved.

During specific implementation, in embodiments of the disclosure, as shown in FIG. 29 to FIG. 32, a first region T3-S of the active silicon layer of the threshold compensation transistor T3 is used as the first electrode of the threshold compensation transistor T3, and a second region T3-D of the active silicon layer of the threshold compensation transistor T3 is used as the second electrode of the threshold compensation transistor T3. A first region T1-S of the active silicon layer of the driving transistor T1-D is used as the first electrode of the driving transistor T1, and a second region T1-D of the active silicon layer of the driving transistor T1-D is used as the second electrode of the driving transistor T1. Moreover, in the same sub-pixel, the second region T3-D of the active silicon layer of the threshold compensation transistor T3 is electrically connected to the third region T8-S of the active oxide layer of the voltage stabilizing transistor T8, and the first region T3-S of the active silicon layer of the threshold compensation transistor T3 is electrically connected to the second region T1-D of the active silicon layer of the driving transistor T1-D. In this way, an active oxide layer may be arranged between the gate electrode of the driving transistor and the second region T3-D of the active silicon layer of the threshold compensation transistor T3, so that a signal flow path between the gate electrode of the driving transistor and the second region T3-D of the active silicon layer of the threshold compensation transistor T3 may pass through the active oxide layer. Since the transistor with the active layer made of a metal oxide semiconductor material generates a little leakage current, an off-state current of the voltage stabilizing transistor T8 is relatively small and is even negligible. Therefore, influences of the leakage current to the voltage of the gate electrode of the driving transistor may be reduced, and the stability of the voltage of the gate electrode of the driving transistor may be improved.

During specific implementation, in embodiments of the disclosure, as shown in FIG. 29, FIG. 30E, FIG. 31A to FIG. 32, the first connection part 310 may include a first sub-connection part and a second sub-connection part which are electrically connected with each other. A first end of the first sub-connection part is electrically connected to the third region T8-S of the active oxide layer of the voltage stabilizing transistor T8 through the first via hole (that is, the third connection through hole 531), and a second end of the first sub-connection part is electrically connected to the second region T6-D of the active silicon layer of the initialization transistor T6 through the second via hole (that is, the first connection through hole 513). A first end of the second sub-connection part is electrically connected to the second region T3-D of the active silicon layer of the threshold compensation transistor T3 through the third via hole (that is, the first connection through hole 512), and a second end of the second sub-connection part is electrically connected to the first sub-connection part.

Figure 30E:
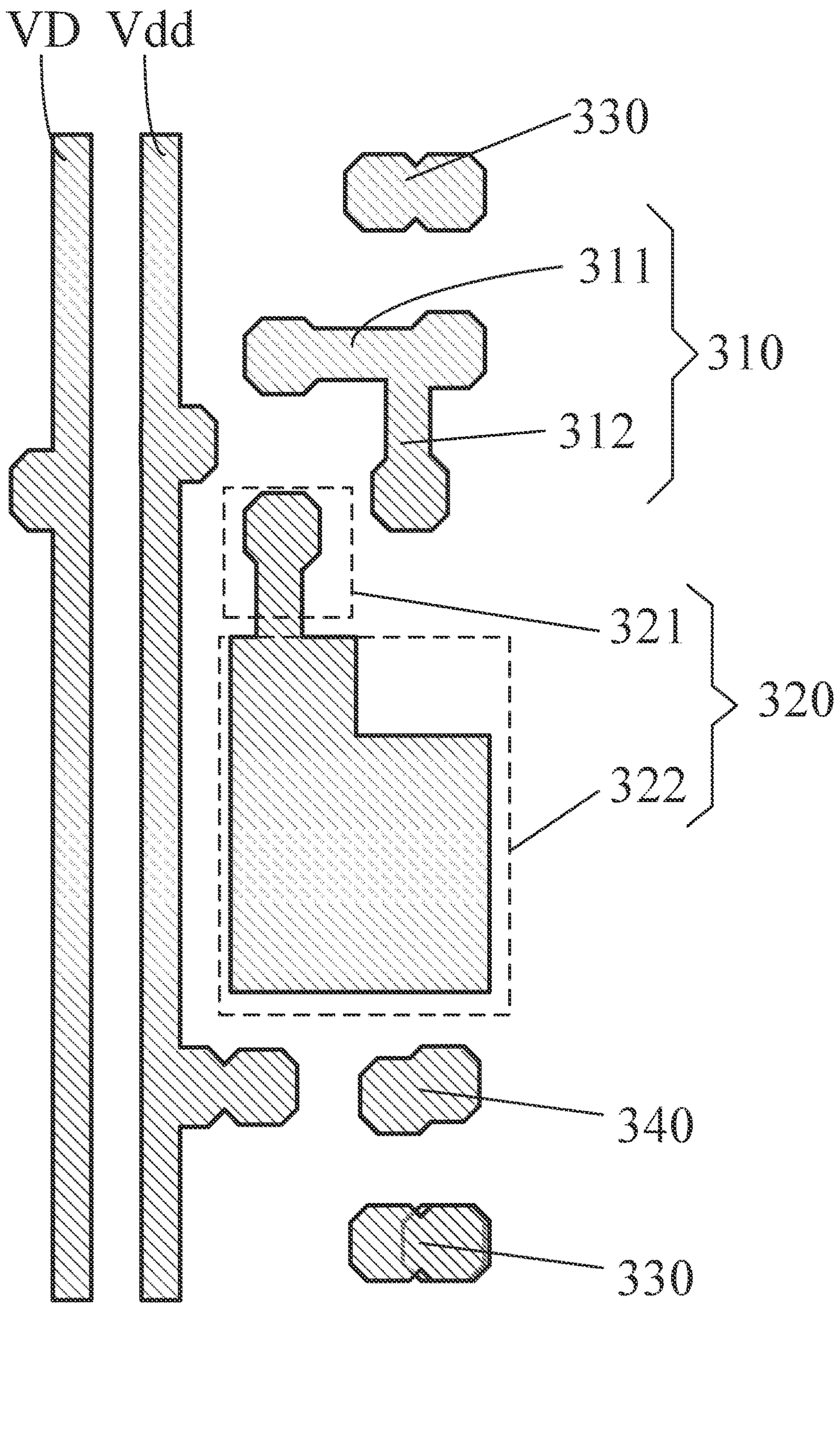
FIG. 30E is a schematic structural diagram of a third conducting layer provided by embodiments of the disclosure.
Figure 30F:
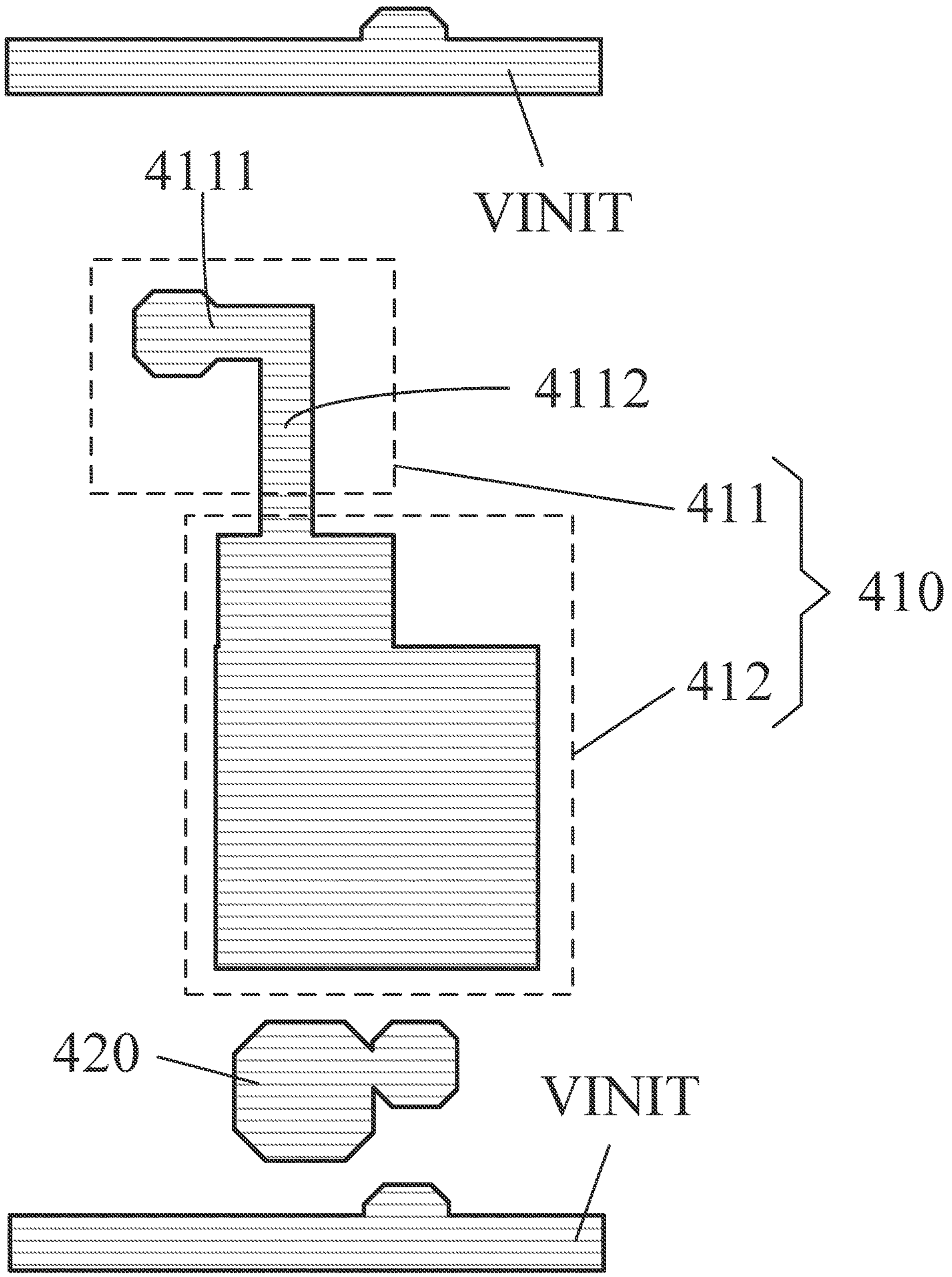
FIG. 30F is a schematic structural diagram of a fourth conducting layer provided by embodiments of the disclosure.

During specific implementation, in embodiments of the disclosure, as shown in FIG. 29 and FIG. 30E, the first sub-connection part may extend in the first direction. For example, the first sub-connection part may extend in a straight line in the first direction, in other words, an extension direction of the first sub-connection part may be approximately parallel to the first direction F1. It should be noted that, in an actual process, due to restrictions of process conditions or other factors, the extension direction of the first sub-connection part may not be completely parallel to the first direction F1, it is possible to generate some deviations, and therefore, as long as the extension direction of the above-mentioned first sub-connection part and the first direction F1 approximately meet parallel conditions, it shall fall within the protective scope of the disclosure. For example, the above-mentioned parallel may be allowed within an error allowable range.

During specific implementation, in embodiments of the disclosure, as shown in FIG. 29 and FIG. 30E, the second sub-connection part may extend in the second direction. For example, the second sub-connection part may extend in a straight line in the second direction, in other words, an extension direction of the second sub-connection part may be approximately parallel to the second direction F2. It should be noted that, in an actual process, due to restrictions of process conditions or other factors, the extension direction of the second sub-connection part may not be completely parallel to the second direction F2, it is possible to generate some deviations, and therefore, as long as the extension direction of the above-mentioned second sub-connection part and the second direction F2 approximately meet parallel conditions, it shall fall within the protective scope of the disclosure. For example, the above-mentioned parallel may be allowed within an error allowable range.

During specific implementation, in embodiments of the disclosure, as shown in FIG. 29, an orthographic projection of the first connection part on the base substrate 1000 may be approximately T-shaped. Or, the third connection through hole 531 is used as the first via hole, the first connection through hole 513 is used as the second via hole, and the first connection through hole 512 is used as the third via hole. In the same sub-pixel, the first via hole, the second via hole and the third via hole may be approximately arranged in a triangle. Further, in the same sub-pixel, the first via hole and the second via hole extend approximately in a straight line in the first direction F1. An orthographic projection of the third via hole on a straight line where the first via hole and the second via hole are located is close to the second via hole. It should be noted that, in an actual process, due to restrictions of process conditions or other factors, the orthographic projection of the first connection part on the base substrate 1000 may not be completely T-shaped, and the first via hole and the second via hole may not completely extend in a straight line in the first direction F1, it is possible to generate some deviations, and therefore, the above-mentioned ways shall fall within the protective scope of the disclosure as long as parallel conditions are approximately met. For example, the above-mentioned ways may be allowed within an error allowable range.

During specific implementation, in embodiments of the disclosure, as shown in FIG. 29, in the same sub-pixel, an orthographic projection of the first sub-connection part on the base substrate 1000 is located between the orthographic projection of the first scanning line GA1 on the base substrate 1000 and the orthographic projection of the second scanning line GA2 on the base substrate 1000, and an orthographic projection of the second sub-connection part on the base substrate 1000 is overlapped with the orthographic projection of the second scanning line GA2 on the base substrate 1000 to form an overlapping region. Exemplarily, in the same row of sub-pixels, an orthographic projection of the first via hole (that is, the third connection through hole 531) on the base substrate 1000 and an orthographic projection of the second via hole (that is, the first connection through hole 513) on the base substrate 1000 are approximately arranged in a straight line in the first direction F1.

During specific implementation, in embodiments of the disclosure, as shown in FIG. 29, FIG. 30D, FIG. 31A to FIG. 32, the first region T4-S of the active silicon layer of the first light emitting control transistor T4 is used as the first electrode of the first light emitting control transistor T4, and the second region T4-D of the active silicon layer of the first light emitting control transistor T4 is used as the second electrode of the first light emitting control transistor T4. The first region T4-S of the active silicon layer of the second light emitting control transistor T5 is used as the first electrode of the second light emitting control transistor T5, and the second region T4-D of the active silicon layer of the second light emitting control transistor T5 is used as the second electrode of the second light emitting control transistor T5. Exemplarily, the second region T4-D of the active silicon layer of the first light emitting control transistor T4 is electrically connected to the first region T1-S of the active silicon layer of the driving transistor T1, and the first region T5-S of the active silicon layer of the second light emitting control transistor T5 is electrically connected to the second region T1-D of the active silicon layer of the driving transistor T1, and the second region T5-D of the active silicon layer of the second light emitting control transistor T5 is electrically connected to the first electrode of the light emitting device through the fifth via hole.

During specific implementation, in embodiments of the disclosure, as shown in FIG. 29 to FIG. 32, the second connection part 320 includes a first conducting part 321 and a first main part 322. The first conducting part 321 is electrically connected to the fourth region T8-D of the active oxide layer of the voltage stabilizing transistor T8 through the sixth via hole (that is, the third connection through hole 532). Moreover, an orthographic projection of the first conducting part 321 on the base substrate 1000 is respectively overlapped with the orthographic projection of the third scanning line GA3 on the base substrate 1000 and the orthographic projection of the fourth region T8-D of the active oxide layer of the voltage stabilizing transistor T8 on the base substrate 1000 to form overlapping regions. In addition, an orthographic projection of the first main part 322 on the base substrate 1000 is overlapped with the orthographic projection of the gate electrode of the driving transistor T1 on the base substrate 1000 to form an overlapping region, and the orthographic projection of the first main part 322 on the base substrate 1000 is not overlapped with the orthographic projection of the third scanning line GA3 on the base substrate 1000.

During specific implementation, in embodiments of the disclosure, as shown in FIG. 29 to FIG. 32, in the same sub-pixel, the orthographic projection of the first main part 322 on the base substrate 1000 is at least partially not overlapped with an orthographic projection of the first region T5-S of the second light emitting control transistor T5 on the base substrate 1000. Exemplarily, the orthographic projection of the first main part 322 on the base substrate 1000 may be tangent to the orthographic projection of the first region T5-S of the second light emitting control transistor T5 on the base substrate 1000. Or, the orthographic projection of the first main part 322 on the base substrate 1000 may be not overlapped with the orthographic projection of the first region T5-S of the second light emitting control transistor T5 on the base substrate 1000. Of course, the present disclosure includes, but is not limited to this.

During specific implementation, in embodiments of the disclosure, as shown in FIG. 29 to FIG. 32, in the same sub-pixel, the orthographic projection of the first main part 322 on the base substrate 1000 is tangent to the orthographic projection of the light emitting control line EM on the base substrate 1000, the orthographic projection of the first main part 322 on the base substrate 1000 is close to the orthographic projection of the power line Vdd on the base substrate 1000, and the orthographic projection of the first main part 322 on the base substrate 1000 is close to the orthographic projection of the third scanning line GA3 on the base substrate 1000.

During specific implementation, in embodiments of the disclosure, as shown in FIG. 29 to FIG. 32, in the same sub-pixel, an orthographic projection of the storage conducting part CC1*a* on the base substrate 1000 respectively covers the orthographic projection of the gate electrode of the driving transistor T1 on the base substrate 1000 and the orthographic projection of the first main part 322 on the base substrate 1000. The orthographic projection of the storage conducting part CC1*a* on the base substrate 1000 is not overlapped with an orthographic projection of the seventh via hole (that is, the second connection through hole 521) on the base substrate 1000, and the orthographic projection of the storage conducting part CC1*a* on the base substrate 1000 is not overlapped with the orthographic projection of the third scanning line GA3 on the base substrate 1000.

During specific implementation, in embodiments of the disclosure, as shown in FIG. 29 to FIG. 32, in the same sub-pixel, the orthographic projection of the storage conducting part CC1*a* on the base substrate 1000 is overlapped with the orthographic projection of the power line Vdd on the base substrate 1000 to form an overlapping region, and the orthographic projection of the storage conducting part CC1*a* on the base substrate 1000 is not overlapped with the orthographic projection of the data line VD on the base substrate 1000. In this way, a signal on the storage conducting part CC1*a* may be prevented from being interfered by a signal transmitted on the data line VD. Moreover, the voltage transmitted by the power line Vdd is a fixed voltage, the orthographic projection of the storage conducting part CC1*a* on the base substrate 1000 is overlapped with the orthographic projection of the power line Vdd on the base substrate 1000 to form the overlapping region, and thus, not only may an area of the storage conducting part CC1*a* be increased, but also signal interference may be reduced.

During specific implementation, in embodiments of the disclosure, as shown in FIG. 29 to FIG. 32, in the same sub-pixel, orthographic projections of the eighth via hole (that is, the fourth connection through hole 541), the fourth via hole (that is, the first connection through hole 515) and the fifth via hole (that is, the first connection through hole 516) on the base substrate 1000 are located between the orthographic projection of the light emitting control line EM on the base substrate 1000 and the orthographic projection of the fourth scanning line GA4 on the base substrate 1000.

During specific implementation, in embodiments of the disclosure, as shown in FIG. 29 to FIG. 32, in the same row of sub-pixels, the orthographic projections of the eighth via hole (that is, the fourth connection through hole 541), the fourth via hole (that is, the first connection through hole 515) and the fifth via hole (that is, the first connection through hole 516) on the base substrate 1000 are approximately arranged in a straight line in the first direction F1.

During specific implementation, in embodiments of the disclosure, as shown in FIG. 29 to FIG. 32, the auxiliary conducting part 410 may include a second conducting part 411 and a second main part 412 electrically connected to each other. The second conducting part 411 is electrically connected to the power line Vdd through at least one fifth connection through hole 551. Moreover, an orthographic projection of the second main part 412 on the base substrate 1000 covers the orthographic projection of the first main part 322 on the base substrate 1000. In this way, the auxiliary conducting part and the storage conducting part CC1*a* in the same sub-pixel may be electrically connected.

During specific implementation, in embodiments of the disclosure, as shown in FIG. 29 to FIG. 32, the sub-pixel may further include an eleventh via hole (that is, the fifth connection through hole 551). Moreover, the second conducting part 411 may include a first sub-conducting part 4111 and a second sub-conducting part 4112. The first sub-conducting part 4111 extends in the first direction F1, and the second sub-conducting part 4112 extends in the second direction F2; a first end of the first sub-conducting part 4111 is electrically connected to the power line Vdd through the eleventh via hole (that is, the fifth connection through hole 551), a second end of the first sub-conducting part 4111 is electrically connected to a first end of the second sub-conducting part 4112, and a second end of the second sub-conducting part 4112 is electrically connected to the second main part 412. Moreover, the orthographic projection of the third scanning line GA3 on the base substrate 1000 is overlapped with an orthographic projection of the first sub-conducting part 4111 on the base substrate 1000 to form an overlapping region, and an orthographic projection of the second end of the first sub-conducting part 4111 on the base substrate 1000 is overlapped with the orthographic projection of the second channel region T8-A of the oxide semiconductor layer of the voltage stabilizing transistor T8 on the base substrate 1000 to form an overlapping region. In addition, an orthographic projection of the second sub-conducting part 4112 on the base substrate 1000 is respectively overlapped with an orthographic projection of the sixth via hole on the base substrate 1000 and the orthographic projection of the third scanning line GA3 on the base substrate 1000 to form overlapping regions.

It should be noted that the auxiliary conducting part 410, the storage conducting part CC1*a* and the power line Vdd in the same sub-pixel are electrically connected to form the first electrode of the storage capacitor CST, so that the auxiliary conducting part 410 and the storage conducting part CC1*a* have the same potential which is the potential of the power line Vdd. Moreover, the gate electrode CC2*a* of the driving transistor T1 is electrically connected to the second connection part 320 to form the second electrode of the storage capacitor CST, so that the gate electrode CC2*a* of the driving transistor T1 and the second connection part 320 have the same potential which is the potential of the gate electrode of the driving transistor T1. In this way, the storage capacitor may include four stacked substrates, thereby increasing an area and a capacitance value of the storage capacitor CST under the condition that the occupied space is not increased.

During specific implementation, the second planarization layer 752 at the corresponding positions of the auxiliary conducting part 410 and the second connection part 320 may be thinned or removed, and thus, the capacitance value of the storage capacitor CST may be increased.

Figure 33:
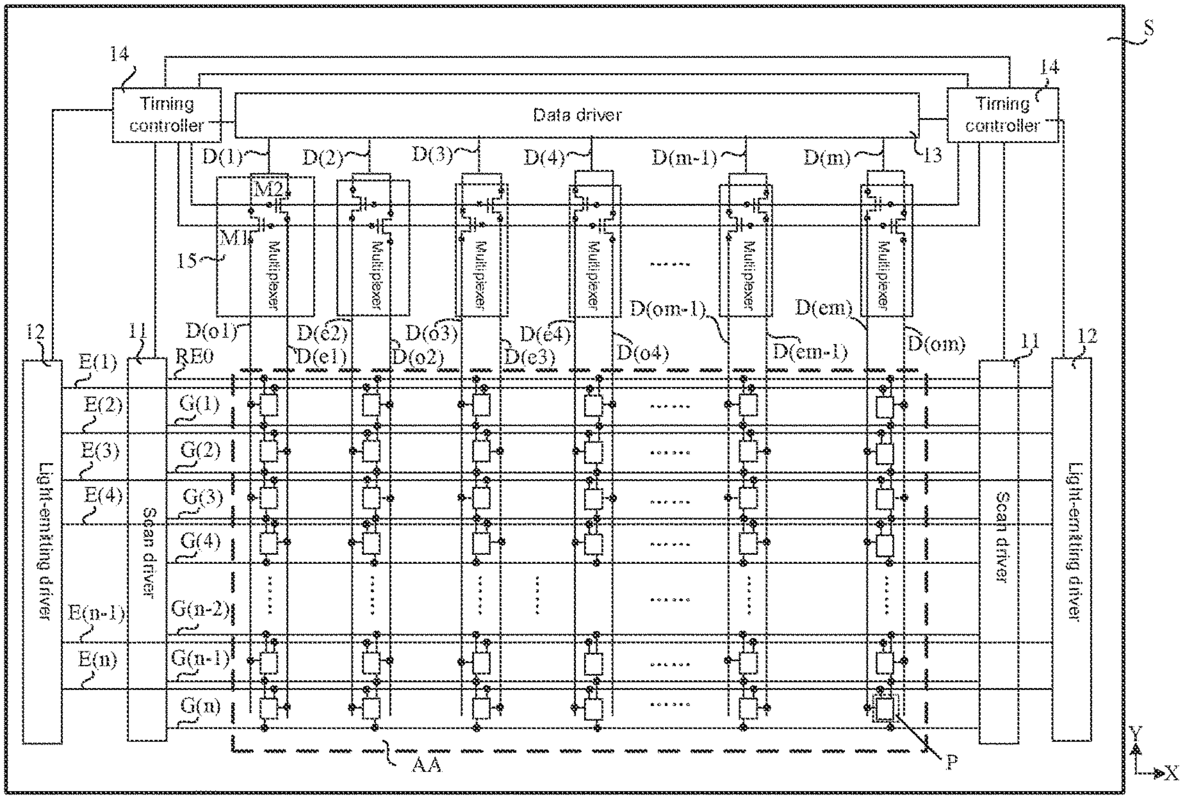
FIG. 33 is a schematic diagram showing a structure of a display panel, in accordance with some embodiments.

Some embodiments of the present disclosure provide a display panel. As shown in FIG. 33, the display panel includes a driving backplane. Wherein, the driving backplane has a display area AA and a peripheral region S. The peripheral region S is located on at least one side of the AA. For example, the peripheral region S may be disposed around the AA.

Figure 34:
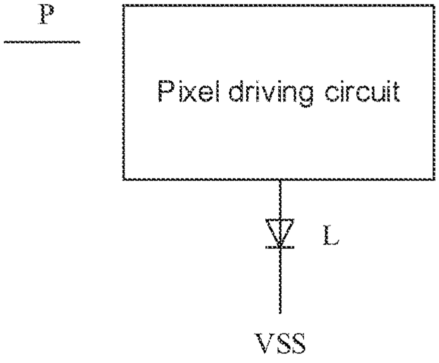
FIG. 34 is a schematic diagram showing a structure of a sub-pixel region, in accordance with some embodiments.

The display area AA has a plurality of sub-pixel regions P. FIG. 34 is a schematic diagram showing a structure of a sub-pixel region P in accordance with some embodiments.

FIG. 33 is an illustration by taking an example in which the plurality of sub-pixel regions P are arranged in an array of n rows and m columns, n and m being both positive integers, but embodiments of the present invention are not limited thereto, and the plurality of sub-pixel regions P may be arranged in other manners. In the embodiments of the present disclosure, all structures located in each sub-pixel region P as a whole are referred to as a sub-pixel.

Figure 35:
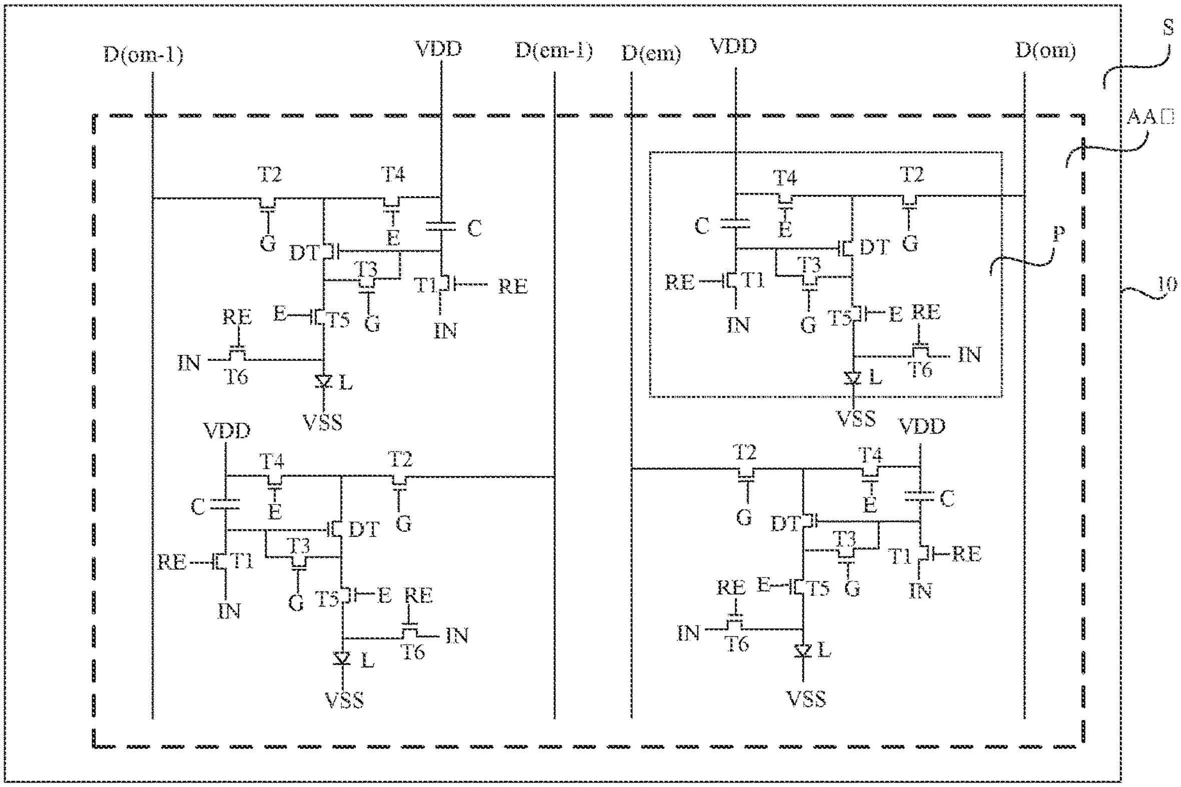
FIG. 35 is a schematic diagram showing a structure of a driving backplane, in accordance with some embodiments.

As shown in FIG. 35, the driving backplane includes a base 10; a plurality of pixel driving circuits disposed on the base 10, one of the plurality of pixel driving circuits being disposed in a sub-pixel region P; and a plurality of data lines D and a plurality of first power supply voltage lines VDD disposed on the base 10. As shown in FIG. 35, the pixel driving circuit is electrically connected to a data line D and a first power supply voltage line VDD.

For example, one pixel driving circuit is electrically connected to one data line D and one first power supply voltage line VDD. It will be noted that, each data line D and each first power supply voltage line VDD are not only connected to one pixel driving circuit. Pixel driving circuits connected to the data line D may be the same as pixel driving circuits connected to the first power supply voltage line VDD. For example, the data line D and the first power supply voltage line VDD are both connected to pixel driving circuits of sub-pixel regions P in a column. Of course, the pixel driving circuits connected to the data line D may not be exactly the same as the pixel driving circuits connected to the first power supply voltage line VDD. For example, the data line D is connected to pixel driving circuits of sub-pixel regions P in odd rows of sub-pixel regions P in a column, and the first power supply voltage line VDD is connected to all pixel driving circuits of sub-pixel regions P in the column. That is, all pixel driving circuits of sub-pixel regions in an i-th column are electrically connected to two data lines D; pixel driving circuits of sub-pixel regions in odd rows are electrically connected to one data line D(om) of the two data lines D, and pixel driving circuits of sub-pixel regions in even rows are electrically connected to another data line D(em) of the two data lines D. All the pixel driving circuits of sub-pixel regions in the i-th column are connected to a same first power supply voltage line VDD. Herein, i is a positive integer greater than or equal to 1 and less than or equal to m.

The data line D and the first power supply voltage line VDD are disposed on a side of the pixel driving circuit away from the base 10, and the data line D and the first power supply voltage line VDD are disposed at intervals in a same layer. Orthographic projections of the data line D and the first power supply voltage line VDD on the base 10 overlap with an orthographic projection of the pixel driving circuit on the base 10.

In some examples, the data line D and the first power supply voltage line VDD are made of a same material, and are both made of a metal material. In this case, the data line D and the first power supply voltage line VDD are disposed in a same layer and made of the same material.

In some examples, the data line D and the first power supply voltage line VDD extend in a same direction.

Figure 36:
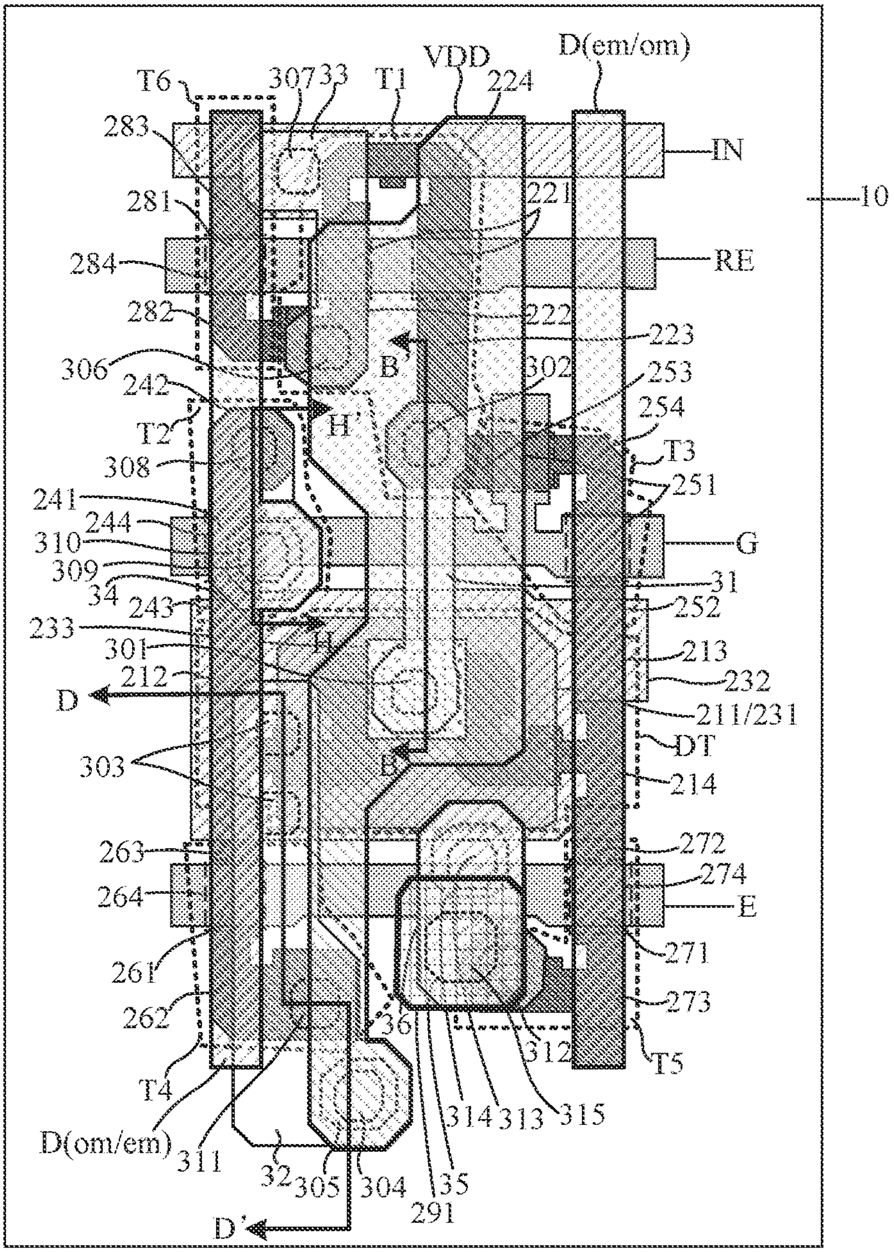
FIG. 36 is a schematic diagram showing a structure of another driving backplane, in accordance with some embodiments.

As shown in FIGS. 35 and 36, the pixel driving circuit includes a driving transistor DT, a first switching transistor T1, and a first conductive pattern 31. The first conductive pattern 31 is located on a side of the driving transistor DT and the first switching transistor T1 away from the base 10. In some examples, the first conductive pattern 31 is disposed between the first power supply voltage line VDD and both the driving transistor DT and the first switching transistor T1.

Figure 37:
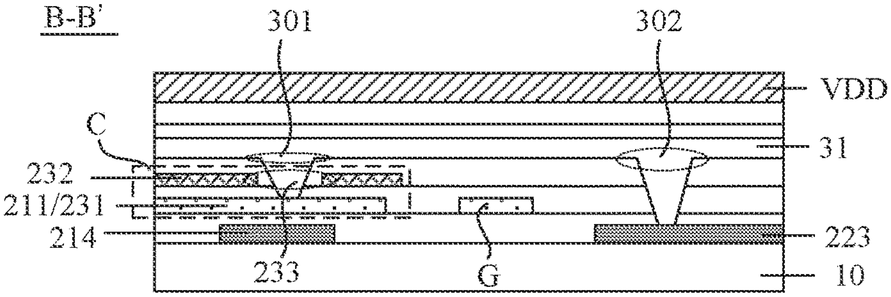
FIG. 37 is schematic sectional view of the driving backplane in FIG. 36 taken along direction B-B'.

As shown in FIGS. 36 and 37, the first conductive pattern 31 is electrically connected to a gate 211 of the driving transistor DT through a first via 301. The first conductive pattern 31 is electrically connected to a second electrode 223 of the first switching transistor T1 through a second via 302. An orthographic projection of the first conductive pattern 31 on the base 10 is located within an orthographic projection of the first power supply voltage line VDD on the base 10.

In some examples, as shown in the figures, the driving transistor DT is a top-gate transistor, and the first switching transistor T1 is a double-gate transistor. That is, the first switching transistor T1 includes two gates 221. In some other examples, the driving transistor DT and the first switching transistor T1 are both top-gate transistors. In some other examples, the driving transistor DT and the first switching transistor T1 are both bottom-gate transistors.

It will be understood that, the first via 301 is disposed in at least one first insulating layer between the first conductive pattern 31 and the gate 211 of the driving transistor DT, and the first via 301 passes through the at least one first insulating layer. The second via 302 is disposed in at least one second insulating layer between the first conductive pattern 31 and the second electrode 223 of the first switching transistor T1, and the second via 302 passes through the at least one second insulating layer. The at least one first insulating layer and the at least one second insulating layer are identical; or, the at least one first insulating layer includes at least one second insulating layer and at least one other insulating layer; or, the at least one second insulating layer includes at least one first insulating layer and at least one other insulating layer.

In the driving backplane provided by some embodiments of the present disclosure, the pixel driving circuit includes the driving transistor DT, the at least one first switching transistor T1, and the first conductive pattern 31. The first conductive pattern 31 is electrically connected to the gate 211 of the driving transistor DT, and the first conductive pattern 31 is electrically connected to the second electrode 223 of the first switching transistor T1. That is, the gate 211 of the driving transistor DT is electrically connected to the second electrode 223 of the first switching transistor T1 through the first conductive pattern 31. Therefore, both the first conductive pattern 31 and the second electrode 223 of the first switching transistor T1 may be regarded as the gate 211 of the driving transistor DT. In this case, since the first power supply voltage line VDD and the data line D are disposed in the same layer and are both made of a metal material, and the orthographic projection of the first conductive pattern 31 on the base 10 is located within the orthographic projection of the first power supply voltage line VDD on the base 10, a parasitic capacitance between the data line D and the gate 211 of the driving transistor DT is shielded, and an influence of a signal of the data line D on the gate 211 of the driving transistor DT may be reduced, so that a risk of a signal coupling between the data line D and the gate 211 of the driving transistor DT may be avoided, and a display effect of the display panel may be improved.

Figure 38:
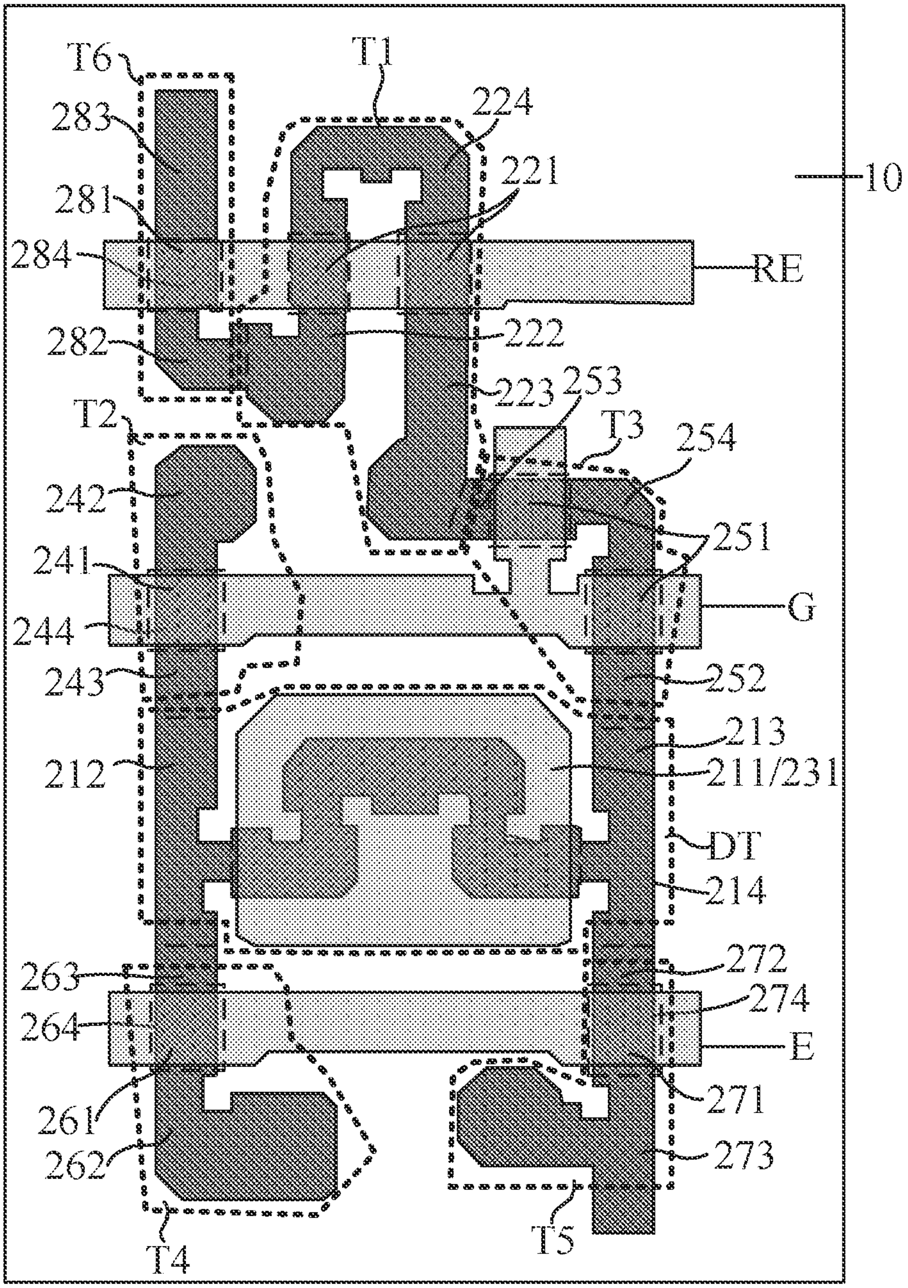
FIG. 38 is a schematic diagram showing a structure of yet another driving backplane, in accordance with some embodiments.

In some embodiments, as shown in FIG. 38, an active pattern 224 of the first switching transistor T1 includes: at least one first channel region, and a first source region and a first drain region located on both sides of the at least one first channel region. Each gate 221 of the first switching transistor T1 is disposed on a side of a corresponding first channel region away from the base 10, and an orthographic projection of the at least one first channel region on the base overlaps with an orthographic projection of the gate 221 of the first switching transistor T1 on the base 10. A first electrode 222 and the second electrode 223 of the first switching transistor T1 are respectively served by portions of the active pattern 224 of the first switching transistor T1 that are located in the first source region and the first drain region. As shown in FIGS. 36 and 37, an orthographic projection of the second electrode 223 of the first switching transistor T1 on the base 10 is located within the orthographic projection of the first power supply voltage line VDD on the base 10.

Here, in a case where the at least one first channel region includes a single first channel region, the first switching transistor T1 is a top-gate transistor. As shown in FIG. 38, in a case where the at least one first channel region includes two first channel regions, the first switching transistor T1 is a double-gate transistor, and correspondingly, there are two gates 221 and they are electrically connected to each other. In this case, the active pattern 224 of the first switching transistor T1 further includes a connection portion located between the two first channel regions.

Since the gate 211 of the driving transistor DT is electrically connected to the second electrode 223 of the first switching transistor T1 through the first conductive pattern 31, both the first conductive pattern 31 and the second electrode 223 of the first switching transistor T1 may be regarded as the gate 211 of the driving transistor DT. Since the first power supply voltage line VDD and the data line D are disposed in the same layer and are both made of a metal material, and the orthographic projections of the first conductive pattern 31 and the second electrode 223 of the first switching transistor T1 on the base 10 are located within the orthographic projection of the first power supply voltage line VDD on the base 10, the parasitic capacitance between the data line D and the gate 211 of the driving transistor DT is shielded and the influence of the signal of the data line D on the gate 211 of the driving transistor DT may be reduced, so that the risk of signal coupling between the data line D and the gate 211 of the driving transistor DT may be avoided.

As shown in FIG. 38, in some embodiments, an active pattern 214 of the driving transistor DT includes a second channel region, and a second source region and a second drain region located on both sides of the second channel region. An orthographic projection of the second channel region on the base 10 overlaps with an orthographic projection of the gate 211 of the driving transistor DT on the base 10. A first electrode 212 and a second electrode 213 of the driving transistor DT are served by portions of the active pattern 214 of the driving transistor DT that are located in the second source region and the second drain region. The active pattern 214 of the driving transistor DT and the active pattern 224 of the first switching transistor T1 are disposed in a same layer. That is, the driving transistor DT is a top-gate transistor.

In this way, the active pattern 214 of the driving transistor DT and the active pattern 224 of the first switching transistor T1 may be formed through one-time patterning process, and the gate 211 of the driving transistor DT and the gate 221 of the first switching transistor T1 may be formed through one-time patterning process.

For example, materials of the active pattern 214 of the driving transistor DT and the active pattern 224 of the first switching transistor T1 are both polysilicon (P-Si).

In a case where the first electrode 212 of the driving transistor DT is a source and the second electrode 213 of the driving transistor DT is a drain, the first electrode 212 of the driving transistor DT is served by a portion of the active pattern 214 of the driving transistor DT that is located in the second source region, and the second electrode 213 of the driving transistor DT is served by a portion of the active pattern 214 of the driving transistor DT that is located in the second drain region. In a case where the first electrode 212 of the driving transistor DT is a drain and the second electrode 213 of the driving transistor DT is a source, the first electrode 212 of the driving transistor DT is served by the portion of the active pattern 214 of the driving transistor DT that is located in the second drain region, and the second electrode 213 of the driving transistor DT is served by the portion of the active pattern 214 of the driving transistor DT that is located in the second source region.

Similarly, in a case where the first electrode 222 of the first switching transistor T1 is a source and the second electrode 223 of the first switching transistor T1 is a drain, the first electrode 222 of the first switching transistor T1 is served by a portion of the active pattern 224 of the first switching transistor T1 that is located in the first source region, and the second electrode 223 of the first switching transistor T1 is served by a portion of the active pattern 224 of the first switching transistor T1 that is located in the first drain region. In a case where the first electrode 222 of the first switching transistor T1 is a drain and the second electrode 223 of the first switching transistor T1 is a source, the first electrode 222 of the first switching transistor T1 is served by the portion of the active pattern 224 of the first switching transistor T1 that is located in the first drain region, and the second electrode 223 of the first switching transistor T1 is served by the portion of the active pattern 224 of the first switching transistor T1 that is located in the first source region.

Figure 39:
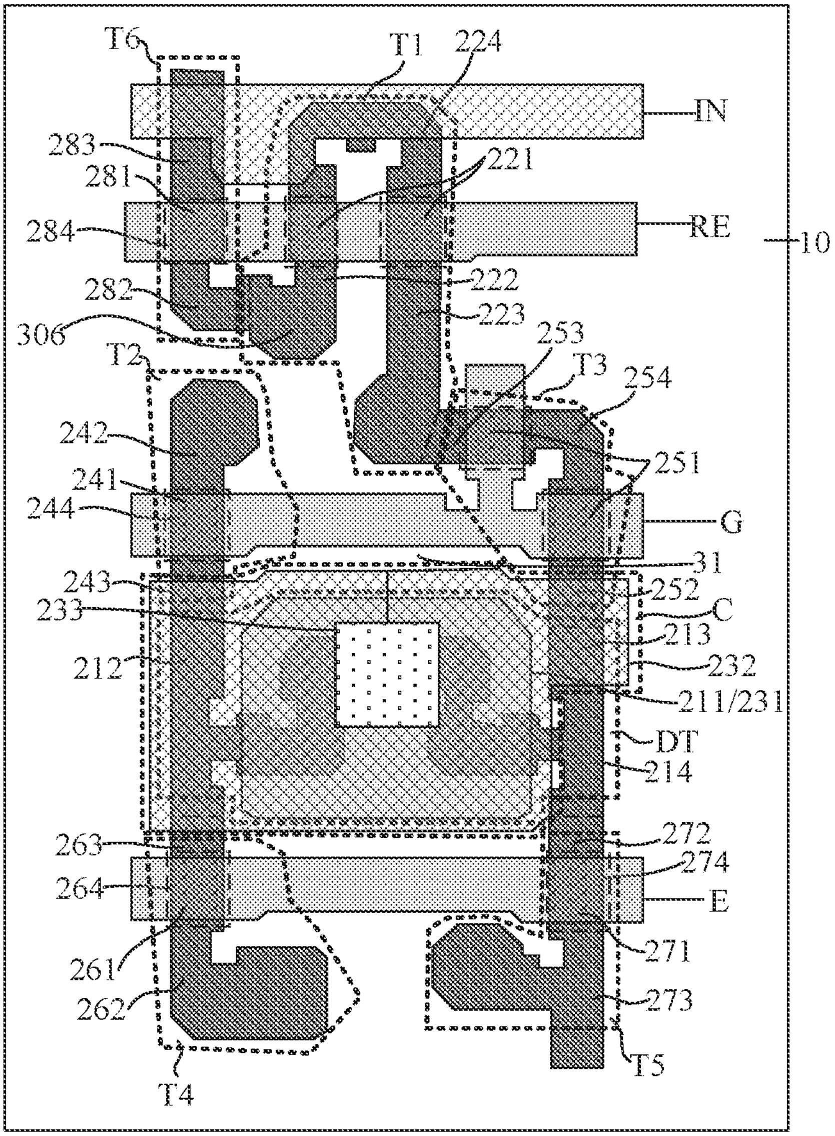
FIG. 39 is a schematic diagram showing a structure of yet another driving backplane, in accordance with some embodiments.

In some embodiments, as shown in FIG. 39, the pixel driving circuit further includes a capacitor C. The gate 211 of the driving transistor DT is multiplexed as a first storage electrode 231 of the capacitor C. A second storage electrode 232 of the capacitor C is located on a side of the first storage electrode 231 away from the base 10.

Figure 40:
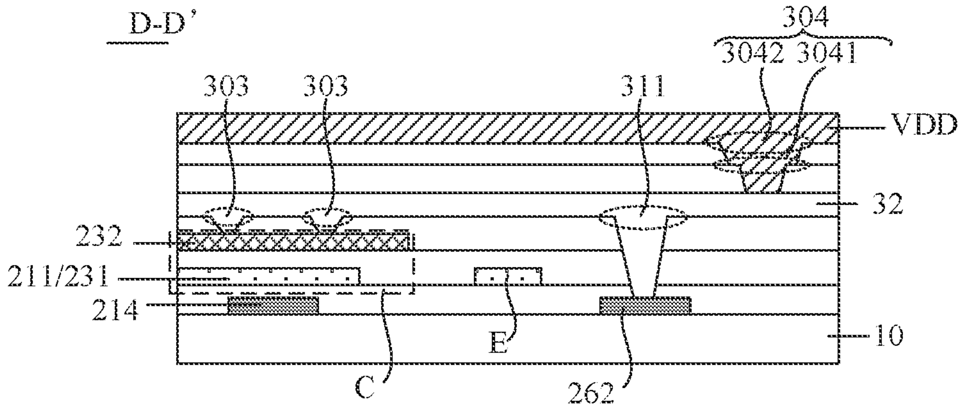
FIG. 40 is schematic sectional view of the driving backplane in FIG. 36 taken along direction D-D'.

As shown in FIG. 40, the pixel driving circuit further includes a second conductive pattern 32. The second conductive pattern 32 is electrically connected to the second storage electrode 232 through at least one third via 303, and the second conductive pattern 32 is electrically connected to the first power supply voltage line VDD through a fourth via 304. FIG. 40 is an illustration by taking an example in which the second conductive pattern 32 is electrically connected to the second storage electrode 232 through two third vias 303, but the embodiments of the present disclosure are not limited thereto. Those skilled in the art may set the number of the third vias 303 according to an area of a portion of the second conductive pattern 32 that overlaps with the second storage electrode 232 of the capacitor C, so as to reduce a contact resistance.

It will be understood that, the third via 303 passes through an insulating layer located between the second conductive pattern 32 and the second storage electrode 232 of the capacitor C.

The first power supply voltage line VDD is electrically connected to the second conductive pattern 32, and the second conductive pattern 32 is electrically connected to the second storage electrode 232 of the capacitor C. That is, the first power supply voltage line VDD is electrically connected to the second storage electrode 232 through the second conductive pattern 32. Therefore, all signals from the first power supply voltage line VDD may be transmitted to the second conductive pattern 32 and the second storage electrode 232 of the capacitor C.

In addition, the second conductive pattern 32 and the first conductive pattern 31 are disposed in a same layer, and the first power supply voltage line VDD is disposed on a side, away from the second storage electrode 232, of a layer where the second conductive pattern 32 and the first conductive pattern 31 are located.

As shown in FIGS. 36, 37 and 39, the second storage electrode 232 of the capacitor C is provided with a hollow region 233, and the first via 301 is directly opposite to the hollow region 233. Here, a size of the first via 301 is less than a size of the hollow region 233. Since the second storage electrode 232 is located between the first storage electrode 231 (i.e., the gate 211 of the driving transistor DT) and the layer where the second conductive pattern 32 and the first conductive pattern 31 are located, in order to cause the first conductive pattern 31 to be electrically connected to the gate 211 of the driving transistor DT through the first via 301, and avoid a short circuit between the first conductive pattern 31 and the second storage electrode 232, the hollow region 233 may be provided in the second storage electrode 232, and the first via 301 may be arranged directly opposite to the hollow region 233.

In some embodiments, as shown in FIG. 40, the fourth via 304 includes a first sub-via 3041 and a second sub-via 3042 that are stacked in a thickness direction of the base 10. The second sub-via 3042 is located on a side, away from the base 10, of the first sub-via 3041, and is communicated with the first sub-via 3041. A size of the second sub-via 3042 is larger than a size of the first sub-via 3041.

There are two insulating layers between the second conductive pattern 32 and the first power supply voltage line VDD. In the two insulating layers, an insulating layer proximate to the base 10 is an inorganic insulating layer, and an insulating layer away from the base 10 is an organic insulating layer. Therefore, the first sub-via 3041 passes through the inorganic insulating layer, and the second sub-via 3042 penetrates the organic insulating layer.

In some embodiments, in sub-pixel regions in a same row in the plurality of sub-pixel regions, second storage electrodes 232 of capacitors C in pixel driving circuits of any adjacent sub-pixel regions are electrically connected to each other.

Figure 41:
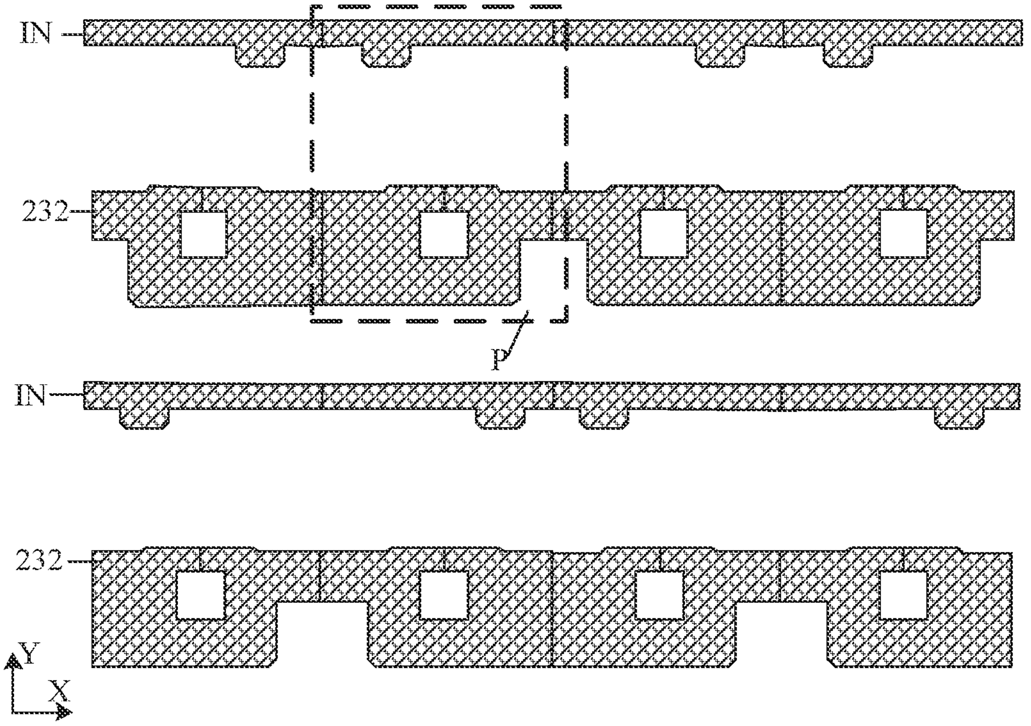
FIG. 41 is a schematic diagram showing a structure of yet another driving backplane, in accordance with some embodiments.

For example, as shown in FIG. 41, sub-pixel regions P arranged in a row in a horizontal direction X are referred to as sub-pixels in a same row, and in the sub-pixels in the same row, the second storage electrodes 232 of the capacitors C in the pixel driving circuits of any adjacent sub-pixel regions are electrically connected in the horizontal direction X.

The first power supply voltage line VDD is electrically connected to the second storage electrode 232 of the capacitor C through the second conductive pattern 32, so that the signal from the first power supply voltage line VDD may be transmitted to the second storage electrode 232 of the capacitor C. Therefore, the second storage electrode 232 of the capacitor C may be regarded as the first power supply voltage line VDD, and a first power supply voltage line VDD formed by the second storage electrode 232 of the capacitor C extends in a row direction of the sub-pixel regions.

Therefore, the first power supply voltage lines VDD are arranged in a grid in the row direction and column direction of the sub-pixel regions, and first power supply voltage lines VDD extending in the row direction are electrically connected to first power supply voltage lines VDD extending in the column direction. In addition, the first power supply voltage lines VDD extending in the row direction may be able to reduce resistances of the first power supply voltage lines VDD extending in the column direction, thereby reducing a voltage drop of the first power supply voltage lines VDD.

Figure 42:
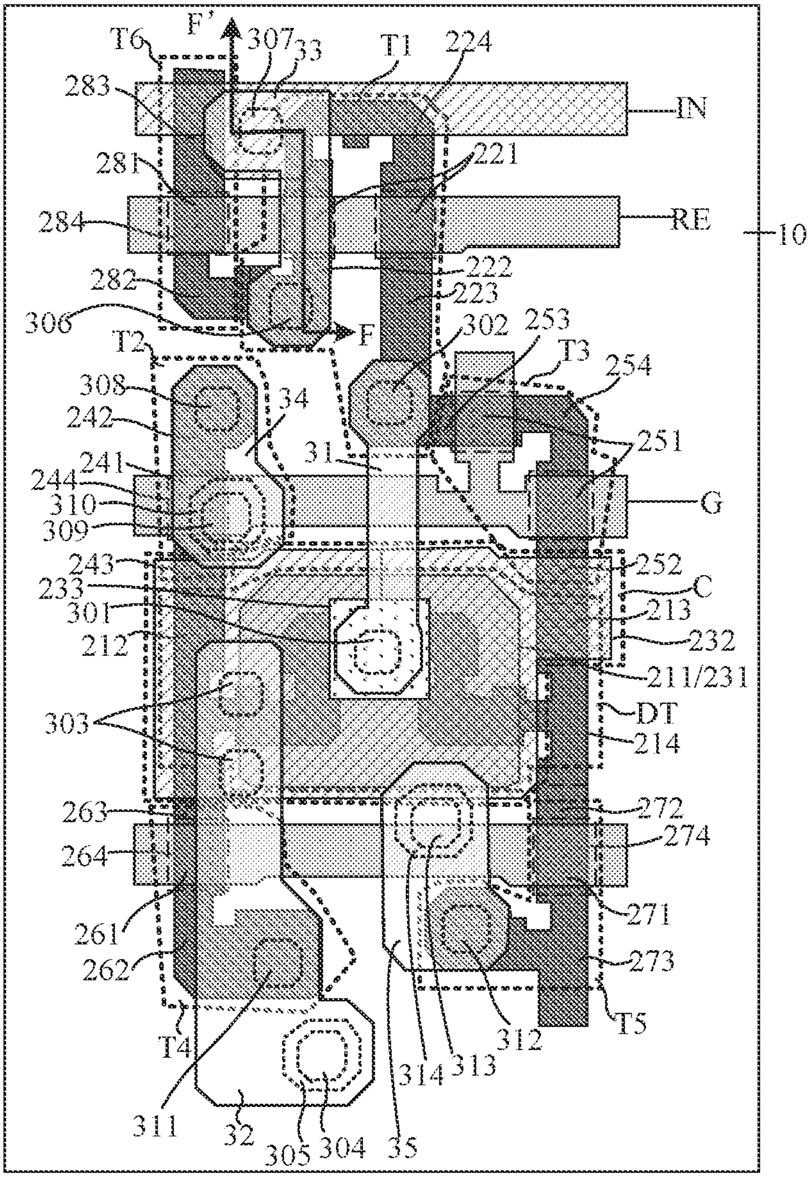
FIG. 42 is a schematic diagram showing a structure of yet another driving backplane, in accordance with some embodiments.

In some embodiments, as shown in FIG. 42, the pixel driving circuit further includes a third conductive pattern 33.

Figure 43:
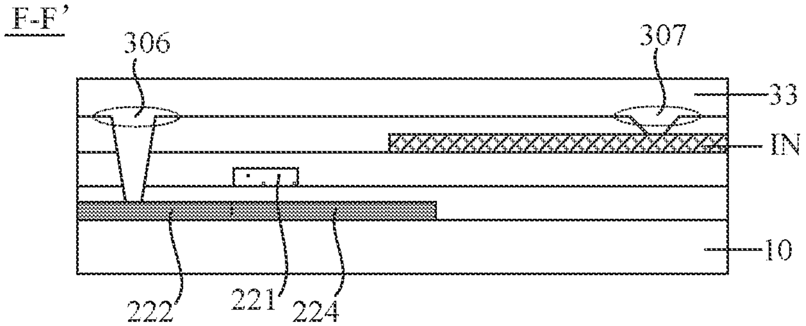
FIG. 43 is schematic sectional view of the driving backplane in FIG. 42 taken along direction F-F'.

As shown in FIGS. 42 and 43, the first electrode 222 of the first switching transistor T1 is electrically connected to the third conductive pattern 33 through a sixth via 306, and the third conductive pattern 33 is electrically connected to an initialization signal line IN through a seventh via 307. The initialization signal line IN and the second electrode 232 of the capacitor C are disposed in a same layer. The third conductive pattern 33 and the second conductive pattern 32 are disposed in a same layer.

The gate 221 of the first switching transistor T1 is served by a reset signal line RE. For example, a portion of the reset signal line RE that overlaps with the orthographic projection of the active pattern 224 of the first switching transistor T1 on the base 10 serves as the gate 221 of the first switching transistor T1. Therefore, the first switching transistor T1 may be turned on or off under the control of the reset signal line RE.

Since the first electrode 222 of the first switching transistor T1 is electrically connected to the third conductive pattern 33, and the third conductive pattern 33 is electrically connected to the initialization signal line IN, the first electrode 222 of the first switching transistor T1 is electrically connected to the initialization signal line IN through the third conductive pattern 33, a signal from the initialization signal line IN may be transmitted to the third conductive pattern 33 and the first electrode 222 of the first switching transistor T1. Since the second electrode 223 of the first switching transistor T1 is electrically connected to the gate 211 of the driving transistor DT through the first conductive pattern 31, the signal from the initialization signal line IN may be transmitted to the gate 211 of the driving transistor DT to initialize the gate 211 of the driving transistor DT, when the first switching transistor T1 is turned on.

In some embodiments, as shown in FIG. 42, the pixel driving circuit further includes a second switching transistor T2 and a fourth conductive pattern 34.

In some embodiments, an active pattern 244 of the second switching transistor T2 includes a third channel region, and a third source region and a third drain region located on both sides of the third channel region. An orthographic projection of a gate 241 of the second switching transistor T2 on the base 10 overlaps with an orthographic projection of the third channel region on the base 10, and a first electrode 242 and a second electrode 243 of the second switching transistor T2 are respectively served by portions of the active pattern 244 of the second switching transistor T2 that are located in the third source region and the third drain region.

The active pattern 244 of the second switching transistor T2 is disposed in a same layer as the active pattern 214 of the driving transistor DT and the active pattern 224 of the first switching transistor T1. The second electrode 243 of the second switching transistor T2 and the first electrode 212 of the driving transistor DT are connected and formed as an integral structure.

As shown in FIG. 38, the gate 241 of the second switching transistor T2 is served by a gate line G, and the gate line G and the gate 211 of the driving transistor DT are disposed in a same layer.

For example, the second switching transistor T2 is a bottom-gate transistor and a double-gate transistor.

For example, materials of the active pattern 244 of the second switching transistor T2, the active pattern 214 of the driving transistor DT, and the active pattern 224 of the first switching transistor T1 are all P-Si.

For example, a portion of the gate line G that overlaps with an orthographic projection of the active pattern 244 of the second switching transistor T2 on the base 10 serves as the gate 241 of the second switching transistor T2. The second switching transistor T2 is turned on or off under the control of the gate line G.

In a case where the first electrode 242 of the second switching transistor T2 is a source and the second electrode 243 of the second switching transistor T2 is a drain, the first electrode 242 of the second switching transistor T2 is served by a portion of the active pattern 244 of the second switching transistor T2 that is located in the third source region, and the second electrode 243 of the second switching transistor T2 is served by a portion of the active pattern 244 of the second switching transistor T2 that is located in the third drain region. In a case where the first electrode 242 of the second switching transistor T2 is a drain and the second electrode 243 of the second switching transistor T2 is a source, the first electrode 242 of the second switching transistor T2 is served by the portion of the active pattern 244 of the second switching transistor T2 that is located in the third drain region, and the second electrode 243 of the second switching transistor T2 is served by the portion of the active pattern 244 of the second switching transistor T2 that is located in the third source region.

Figure 44:
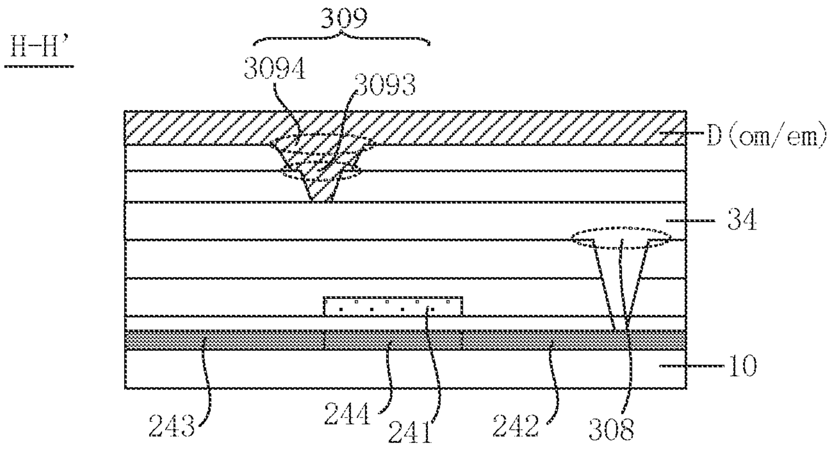
FIG. 44 is schematic sectional view of the driving backplane in FIG. 36 taken along direction H-H'.

As shown in FIGS. 36 and 44, the first electrode 242 of the second switching transistor T2 is electrically connected to the fourth conductive pattern 34 through an eighth via 308, and the fourth conductive pattern 34 is electrically connected to the data line D through a ninth via 309.

The fourth conductive pattern 34 is disposed in a same layer as the first conductive pattern 31 and the second conductive pattern 32.

In some embodiments, as shown in FIG. 44, the ninth via 309 includes a third sub-via 3093 and a fourth sub-via 3094 that are stacked in the thickness direction of the base 10. The fourth sub-via 3094 is located on a side, away from the base 10, of the third sub-via 3093, and is communicated with the third sub-via 3093. A size of the fourth sub-via 3094 is larger than a size of the third sub-via 3093.

Since the data line D and the first power supply voltage line VDD are disposed in a same layer, and the fourth conductive pattern 34 and the second conductive pattern 32 are disposed in a same layer, there are also two insulating layers between the fourth conductive pattern 34 and the data line D. In the two insulating layers, an insulating layer proximate to the base 10 is an inorganic insulating layer, and an insulating layer away from the base 10 is an organic insulating layer. Therefore, the third sub-via 3093 is disposed in the inorganic insulating layer, and the fourth sub-via 3094 is disposed in the organic insulating layer.

It can be seen from this that, the first electrode 242 of the second switching transistor T2 is electrically connected to the data line D through the fourth conductive pattern 34.

In some embodiments, as shown in FIG. 36, the pixel driving circuit further includes a third switching transistor T3.

In some embodiments, an active pattern of the third switching transistor T3 includes a fourth channel region, and a fourth source region and a fourth drain region located on both sides of the fourth channel region. An orthographic projection of a gate 251 of the third switching transistor T3 on the base 10 overlaps with an orthographic projection of the fourth channel region on the base 10. A first electrode 252 and a second electrode 253 of the third switching transistor T3 are respectively served by portions of the active pattern 254 of the third switching transistor T3 that are located in the fourth source region and the fourth drain region.

The first electrode 252 of the third switching transistor T3 and the second electrode 213 of the driving transistor DT are connected and formed as an integral structure, and the second electrode 253 of the third switching transistor T3 and the second electrode 223 of the first switching transistor T1 are connected and formed as an integral structure.

As shown in FIG. 39, the gate 251 of the third switching transistor T3 is served by the gate line G.

For example, the third switching transistor T3 is a bottom-gate transistor.

For example, a portion of the gate line G that overlaps with an orthographic projection of the active pattern 254 of the third switching transistor T3 on the base 10 serves as the gate 251 of the third switching transistor T3. The third switching transistor T3 is turned on or off under the control of the gate line G.

In a case where the first electrode 252 of the third switching transistor T3 is a source and the second electrode 253 of the third switching transistor T3 is a drain, the first electrode 252 of the third switching transistor T3 is served by a portion of the active pattern 254 of the third switching transistor T3 that is located in the fourth source region, and the second electrode 253 of the third switching transistor T3 is served by a portion of the active pattern 254 of the third switching transistor T3 that is located in the fourth drain region. In a case where the first electrode 252 of the third switching transistor T3 is a drain and the second electrode 253 of the third switching transistor is a source, the first electrode 252 of the third switching transistor T3 is served by the portion of the active pattern 254 of the third switching transistor T3 that is located in the fourth drain region, and the second electrode 253 of the third switching transistor T3 is served by the portion of the active pattern 254 of the third switching transistor T3 that is located in the fourth source region.

In this case, the first electrode 252 and the second electrode 253 of the third switching transistor T3 are disposed in a same layer and made of a same material as the active pattern 254 of the third switching transistor T3. Moreover, the first electrode 252 of the third switching transistor T3 and the second electrode 213 of the driving transistor DT are disposed in a same layer, made of a same material, and electrically connected to each other. The second electrode 253 of the third switching transistor T3 and the second electrode 223 of the first switching transistor T1 are disposed in a same layer, made of a same material, and electrically connected to each other.

In some embodiments, as shown in FIG. 36, the pixel driving circuit further includes a fourth switching transistor T4.

An active pattern of the fourth switching transistor T4 includes a fifth channel region, and a fifth source region and a fifth drain region located on both sides of the fifth channel region. An orthographic projection of a gate 261 of the fourth switching transistor T4 on the base 10 overlaps with an orthographic projection of the fifth channel region on the base 10. A first electrode 262 and a second electrode 263 of the fourth switching transistor T4 are served by portions of the active pattern 264 of the fourth switching transistor T4 that are located in the fifth source region and the fifth drain region.

As shown in FIGS. 36 and 40, the first electrode 262 of the fourth switching transistor T4 is electrically connected to the second conductive pattern 32 through an eleventh via 311. The second electrode 263 of the fourth switching transistor T4 and the first electrode 212 of the driving transistor DT are connected and formed as an integral structure.

As shown in FIG. 38, the gate 261 of the fourth switching transistor T4 is served by a light-emitting control line E, and the light-emitting control line E is disposed in a same layer as the gate 211 of the driving transistor DT.

For example, the fourth switching transistor T4 is a bottom-gate transistor.

Since a portion of the light-emitting control line E that overlaps with an orthographic projection of the active pattern 264 of the fourth switching transistor T4 on the base 10 serves as the gate 261 of the fourth switching transistor T4, the fourth switching transistor T4 is turned on or off under the control of the light-emitting control line E.

In a case where the first electrode 262 of the fourth switching transistor T4 is a source and the second electrode 263 of the fourth switching transistor T4 is a drain, the first electrode 262 of the fourth switching transistor T4 is served by a portion of the active pattern 264 of the fourth switching transistor T4 that is located in the fifth source region, and the second electrode 263 of the fourth switching transistor T4 is served by a portion of the active pattern 264 of the fourth switching transistor T4 that is located in the fifth drain region. In a case where the first electrode 262 of the fourth switching transistor T4 is a drain and the second electrode 263 of the fourth switching transistor T4 is a source, the first electrode 262 of the fourth switching transistor T4 is served by the portion of the active pattern 264 of the fourth switching transistor T4 that is located in the fifth drain region, and the second electrode 263 of the fourth switching transistor T4 is served by the portion of the active pattern 264 of the fourth switching transistor T4 that is located in the fifth source region.

The first electrode 262 and the second electrode 263 of the fourth switching transistor T4 and the active pattern 264 of the fourth switching transistor T4 are disposed in a same layer, made of a same material, and electrically connected to each other. The second electrode 263 of the fourth switching transistor T4 and the first electrode 212 of the driving transistor DT are disposed in a same layer, made of a same material, and electrically connected to each other.

Since the first electrode 262 of the fourth switching transistor T4 is electrically connected to the second conductive pattern 32 through the eleventh via 311, and the second conductive pattern 32 is electrically connected to the second storage electrode 232 of the capacitor C and the first power supply voltage line VDD (that is, the first power supply voltage line VDD is electrically connected to the second storage electrode 232 of the capacitor C and the first electrode 262 of the fourth switching transistor T4 through the second conductive pattern 32), a signal from the first power supply voltage line VDD may be transmitted to the second storage electrode 232 of the capacitor C and the first electrode 262 of the fourth switching transistor T4.

Figure 45:
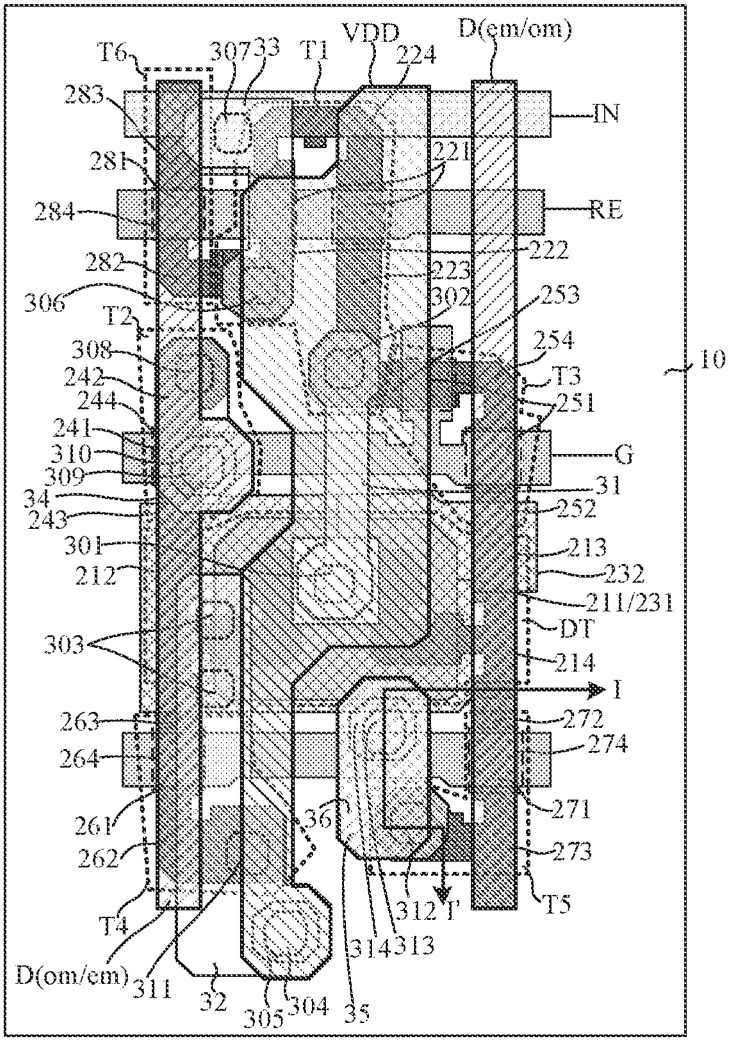
FIG. 45 is a schematic diagram showing a structure of yet another driving backplane, in accordance with some embodiments.

In some embodiments, as shown in FIG. 45, the pixel driving circuit further includes a fifth switching transistor T5, a fifth conductive pattern 35, and a sixth conductive pattern 36.

As shown in FIG. 38, a gate 271 of the fifth switching transistor T5 is served by the light-emitting control line E. An active pattern of the fifth switching transistor T5 includes a sixth channel region, and a sixth source region and a sixth drain region located on both sides of the sixth channel region. An orthographic projection of the gate 271 of the fifth switching transistor T5 on the base 10 overlaps with an orthographic projection of the sixth channel region on the base 10. A first electrode 272 and a second electrode 273 of the fifth switching transistor T5 are served by portions of the active pattern 274 of the fifth switching transistor T5 that are located in the sixth source region and the sixth drain region. In addition, the first electrode 272 of the fifth switching transistor T5 and the second electrode 213 of the driving transistor DT are connected and formed as an integral structure.

Figure 46:
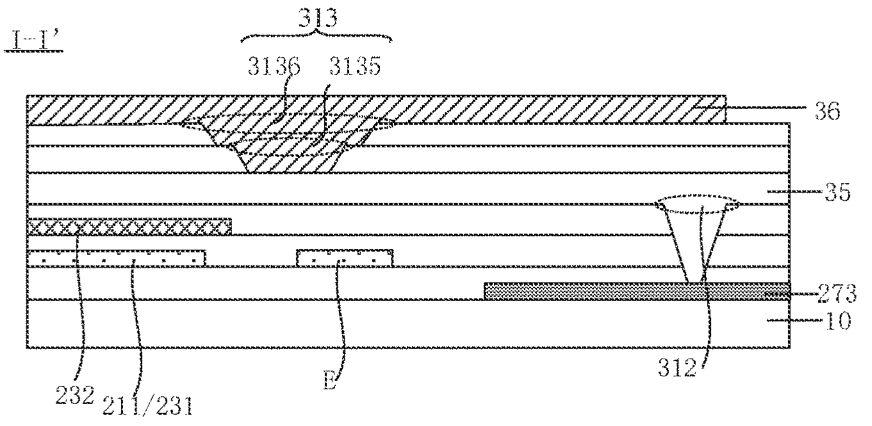
FIG. 46 is schematic sectional view of the driving backplane in FIG. 45 taken along direction I-I'.

As shown in FIGS. 45 and 46, the second electrode 273 of the fifth switching transistor T5 is electrically connected to the fifth conductive pattern 35 through a twelfth via 312. The fifth conductive pattern 35 is electrically connected to the sixth conductive pattern 36 through a thirteenth via 313. The sixth conductive pattern 36 is configured to be electrically connected to a light-emitting device L.

Figure 48:
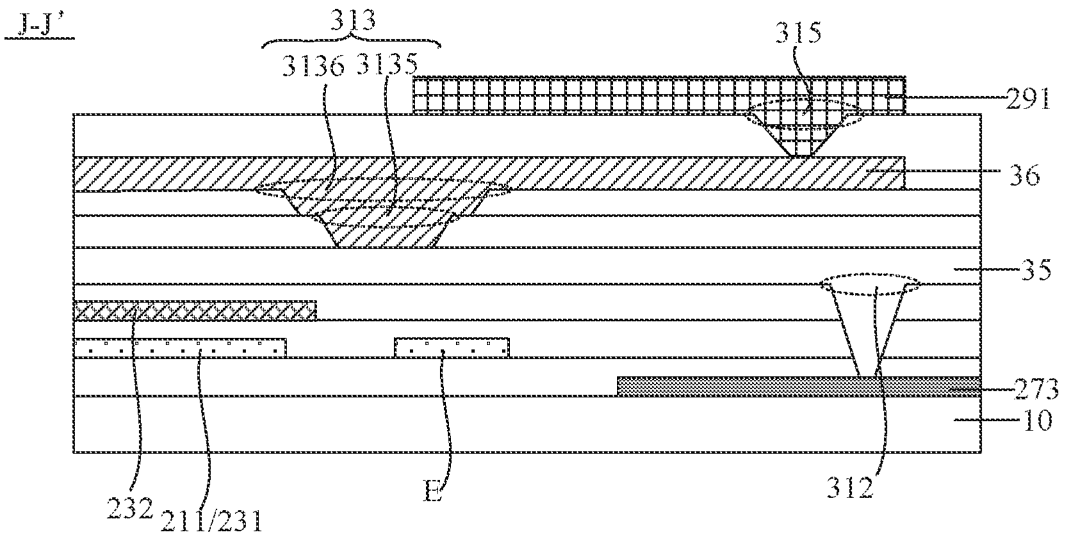
FIG. 48 is schematic sectional view of the driving backplane in FIG. 47 taken along direction J-J.

In some embodiments, as shown in FIG. 48, the thirteenth via 313 includes a fifth sub-via 3135 and a sixth sub-via 3136 that are stacked in the thickness direction of the base 10. The sixth sub-via 3136 is located on a side, away from the base 10, of the fifth sub-via 3135, and is communicated with the fifth sub-via 3135. A size of the sixth sub-via 3136 is larger than a size of the fifth sub-via 3135.

Since a portion of the light-emitting control line E that overlaps with an orthographic projection of the active pattern 274 of the fifth switching transistor T5 on the base 10 serves as the gate 271 of the fifth switching transistor T5, the fifth switching transistor T5 is turned on or off under the control of the light-emitting control line E.

In a case where the first electrode 272 of the fifth switching transistor T5 is a source and the second electrode 273 of the fifth switching transistor T5 is a drain, the first electrode 272 of the fifth switching transistor T5 is served by a portion of the active pattern 274 of the fifth switching transistor T5 that is located in the sixth source region, and the second electrode 273 of the fifth switching transistor T5 is served by a portion of the active pattern 274 of the fifth switching transistor T5 that is located in the sixth drain region. In a case where the first electrode 272 of the fifth switching transistor T5 is a drain and the second electrode 273 of the fifth switching transistor T5 is a source, the first electrode 272 of the fifth switching transistor T5 is served by the portion of the active pattern 274 of the fifth switching transistor T5 that is located in the sixth drain region, and the second electrode 273 of the fifth switching transistor T5 is served by the portion of the active pattern 274 of the fifth switching transistor T5 that is located in the sixth source region.

The first electrode 272 and the second electrode 273 of the fifth switching transistor T5 and the active pattern 274 of the fifth switching transistor T5 are disposed in a same layer, made of a same material, and electrically connected to each other. In addition, the first electrode 272 of the fifth switching transistor T5 and the second electrode 213 of the driving transistor DT are disposed in a same layer, made of a same material, and electrically connected to each other.

For example, the fifth switching transistor T5 is a bottom-gate transistor.

The fifth conductive pattern 35 and the second conductive pattern 32 are disposed in a same layer, and the sixth conductive pattern 36 is disposed in a same layer as the data line D and the first power voltage line VDD.

Since the second electrode 273 of the fifth switching transistor T5 is electrically connected to the fifth conductive pattern 35, and the fifth conductive pattern 35 is electrically connected to the sixth conductive pattern 36, in a case where the sixth conductive pattern 36 is electrically connected to the light-emitting device L, the second electrode 273 of the fifth switching transistor T5 is electrically connected to the light-emitting device L through the fifth conductive pattern 35 and the sixth conductive pattern 36.

There are also two insulating layers between the fifth conductive pattern 35 and the sixth conductive pattern 36. In the two insulating layers, an insulating layer proximate to the base 10 is an inorganic insulating layer, and an insulating layer away from the base 10 is an organic insulating layer. Therefore, the fifth sub-via 3135 passes through the inorganic insulating layer, and the sixth sub-via 3136 passes through the organic insulating layer.

Figure 47:
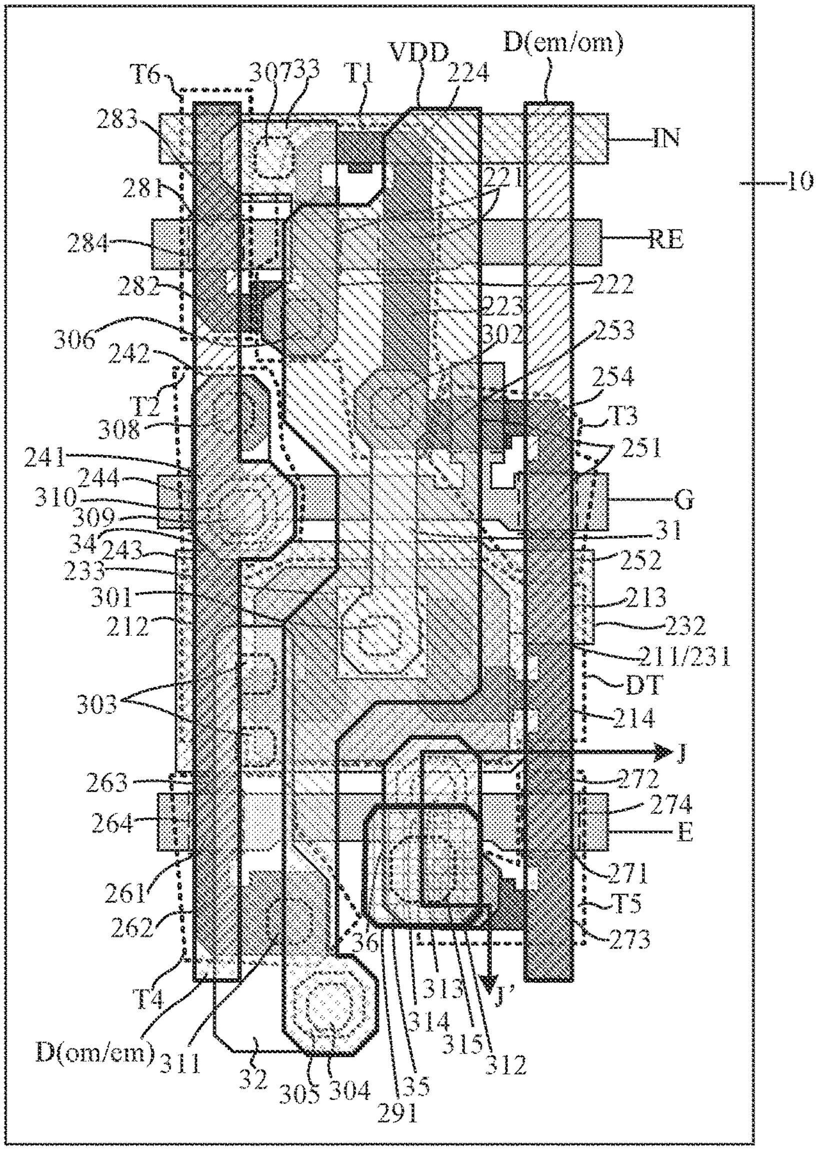
FIG. 47 is a schematic diagram showing a structure of yet another driving backplane, in accordance with some embodiments.

As shown in FIGS. 47 and 48, the sixth conductive pattern 36 may be electrically connected to a first electrode 291 of the light-emitting device L through a fifteenth via 315, and the first electrode 291 of the light-emitting device L is located on a side, away from the base 10, of the sixth conductive pattern 36. Therefore, there is an insulating layer between the light-emitting device L and the sixth conductive pattern 36, and the fifteenth via 315 passes through the insulating layer.

Optionally, the first electrode 291 of the light-emitting device L is an anode.

In some embodiments, as shown in FIG. 36, the pixel driving circuit further includes a sixth switching transistor T6.

An active pattern of the sixth switching transistor T6 includes a seventh channel region, and a seventh source region and a seventh drain region located on both sides of the seventh channel region. An orthographic projection of a gate of the sixth switching transistor T6 on the base 10 overlaps with an orthographic projection of the seventh channel region on the base, and a first electrode 282 and a second electrode 283 of the sixth switching transistor T6 are served by portions of the active pattern 284 of the sixth switching transistor T6 that located in the seventh source region and the seventh drain region. The first electrode 282 of the sixth switching transistor T6 and the first electrode 222 of the first switching transistor T1 are connected and formed as an integral structure.

For example, the sixth switching transistor T6 is a bottom-gate transistor.

As shown in FIG. 38, the gate 281 of the sixth switching transistor T6 is served by the reset signal line RE. For example, a portion of the reset signal line RE that overlaps with an orthographic projection of the active pattern 284 of the sixth switching transistor T6 on the base 10 serves as the gate 281 of the sixth switching transistor T6.

The sixth switching transistor T6 is turned on or off under the control of the reset signal line RE.

In a case where the first electrode 282 of the sixth switching transistor T6 is a source and the second electrode 283 of the sixth switching transistor T6 is a drain, the first electrode 282 of the sixth switching transistor T6 is served by a portion of the active pattern 284 of the sixth switching transistor T6 that is located in the seventh source region, and the second electrode 283 of the sixth switching transistor T6 is served by a portion of the active pattern 284 of the sixth switching transistor T6 that is located in the seventh drain region. In a case where the first electrode 282 of the sixth switching transistor T6 is a drain and the second electrode 283 of the sixth switching transistor T6 is a source, the first electrode 282 of the sixth switching transistor T6 is served by the portion of the active pattern 284 of the sixth switching transistor T6 that is located in the seventh drain region, and the second electrode 283 of the sixth switching transistor T6 is served by the portion of the active pattern 284 of the sixth switching transistor T6 that is located in the seventh source region.

The first electrode 282 and the second electrode 283 of the sixth switching transistor T6 are disposed in a same layer and made of a same material as the active pattern 284 of the sixth switching transistor T6. In addition, the first electrode 282 of the sixth switching transistor T6 and the first electrode 222 of the first switching transistor T1 are disposed in a same layer and made of a same material.

Figure 49:
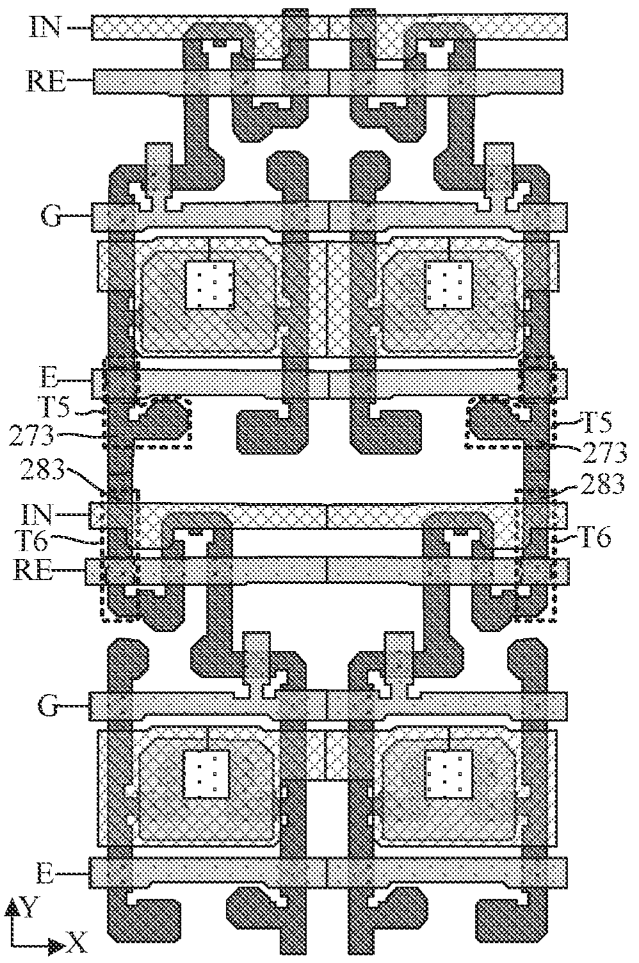
FIG. 49 is a schematic diagram showing a structure of yet another driving backplane, in accordance with some embodiments.

In the embodiments of the present disclosure, as shown in FIG. 49, sub-pixel regions in a same column of the plurality of sub-pixel regions, except for sub-pixel regions in a first row, second electrodes 283 of sixth switching transistors T6 in pixel driving circuits of sub-pixel regions in each row and second electrodes 273 of fifth switching transistors T5 in pixel driving circuits of sub-pixel regions in a previous row are connected and formed as integral structures.

In addition, except for sub-pixel regions in the first row, the second electrodes 283 of the sixth switching transistors T6 in the pixel driving circuits of sub-pixel regions in each row are disposed in a same layer and made of a same material as the second electrodes 273 of the fifth switching transistors T5 in the pixel driving circuits of sub-pixel regions in the previous row.

For example, in addition to the sub-pixel regions in the first row, second electrodes 283 of sixth switching transistors T6 in pixel driving circuits of sub-pixel regions in a j-th row and second electrodes 273 of fifth switching transistors T5 in pixel driving circuits of sub-pixel regions in a (j−1)-th row are connected and formed as integrated structures. Herein, j is a positive integer greater than 1 and less than or equal to n.

Since the second electrode 273 of the fifth switching transistor T5 is electrically connected to the light-emitting device L, a second electrode 283 of a sixth switching transistor T6 that is connected to the second electrode 273 of the fifth switching transistor T5 is also electrically connected to the light-emitting device L. Moreover, since the first electrode 282 of the sixth switching transistor T6 is connected to the first electrode 222 of the first switching transistor T1, and the first electrode 222 of the first switching transistor T1 is electrically connected to the initialization signal line IN (that is, the first electrode 282 of the sixth switching transistor T6 is electrically connected to the initialization signal line IN), when the sixth switching transistor T6 is turned on under the control of the reset signal line RE, the initialization signal line IN may be electrically connected to the light-emitting device L to initialize the light-emitting device L.

Further, in some embodiments, except for the sub-pixel regions in the first row, a reset signal line RE electrically connected to the pixel driving circuits of sub-pixel regions in each row is shared with a gate line G electrically connected to the pixel driving circuits of sub-pixel regions in the previous row.

Therefore, except for the sub-pixels regions in the first row, the pixel driving circuits of sub-pixel regions in each row are also electrically connected to a gate line that is electrically connected to the pixel driving circuits of sub-pixel regions in the previous row. For example, as shown in FIG. 33, a gate line G(1) electrically connected to the pixel driving circuits of sub-pixel regions in the first row, as a reset signal line RE electrically connected to pixel driving circuits of sub-pixels regions in a second row, is electrically connected to the pixel driving circuits of sub-pixel regions in the second row; and a gate line G(n−1) electrically connected to pixel driving circuits of sub-pixel regions in an (n−1)-th row, as a reset signal line RE electrically connected to pixel driving circuits of sub-pixels regions in an n-th row, is electrically connected to the pixel driving circuits of sub-pixel regions in the n-th row.

Therefore, except for sub-pixel regions in a last row, when the pixel driving circuits of sub-pixel regions in each row perform data writing, pixel driving circuits of sub-pixel regions in a next row are reset.

It will be noted that, as shown in FIG. 33, pixel driving circuits of sub-pixel regions in the first row are electrically connected to an initial reset signal line REO, the initial reset signal line REO is electrically connected to a scan driver 11, and the pixel driving circuits of sub-pixel regions in the first row are reset under the control of the initial reset signal line REO.

In some embodiments, pixel driving circuits of sub-pixel regions in any adjacent sub-pixel regions in a same row are arranged in mirror symmetry; and pixel driving circuits of sub-pixel regions in any two adjacent columns are also arranged in mirror symmetry.

Further, in some embodiments, in each sub-pixel region, a shape of an overlapping portion of the first power supply voltage line VDD and the pixel driving circuit is irregular.

Referring to FIG. 45, in a region where the pixel driving circuit is located, the orthographic projection of the first power supply voltage line VDD on the base 10 is in a shape of a Chinese character "刀". An average width of a portion of the orthographic projection of the first power supply voltage line VDD on the base 10 that overlaps with the first conductive pattern 31, the first switching transistor T1, and the driving transistor DT is greater than an average width of a portion of the orthographic projection of the first power supply voltage line VDD on the base 10 that overlaps with the second conductive pattern 32.

In a case where a shape of the first power supply voltage line VDD is irregular, in sub-pixel regions in a column, first power supply voltage lines VDD of two adjacent pixel driving circuits (upper and lower) can be effectively connected.

Figure 50:
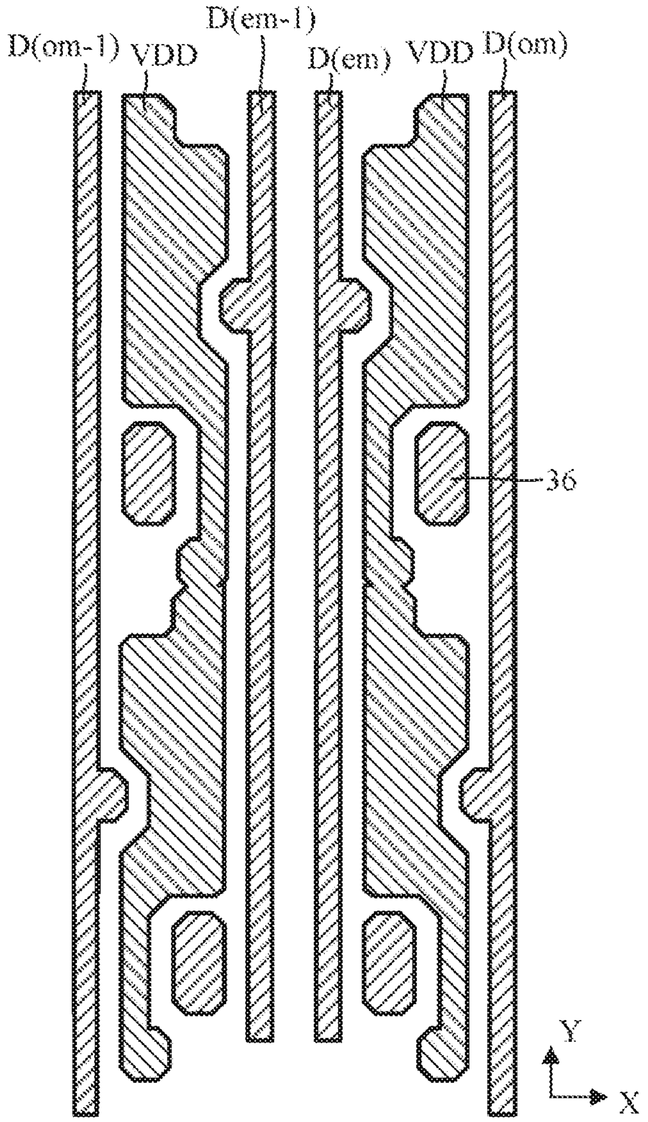
FIG. 50 is a schematic diagram showing a structure of yet another driving backplane, in accordance with some embodiments.

In some embodiments, in a case where the pixel driving circuits of sub-pixel regions in the same column are electrically connected to two data lines, as shown in FIG. 50, a first power supply voltage line VDD electrically connected to the pixel driving circuits of sub-pixel regions in the same column are located between the two data lines. In this case, it may be possible to avoid restrictions on a spatial layout of sub-pixels in the display panel.

Moreover, in the case where the pixel driving circuits of sub-pixel regions in the same column are electrically connected to two data lines, it may be possible to drive the display panel at a high frame rate (for example, 120 Hz) under the premise of ensuring the display effect of the display panel.

In the driving backplane provided in the embodiments of the present disclosure, the base 10 is provided with an active pattern in each transistor in the pixel driving circuit. the gate line G, the gate 211 of the driving transistor DT, the reset signal line RE, and the light-emitting control line E that are disposed in a same layer and made of a same material are provided on a side, away from the base 10, of active patterns that are disposed in a same layer and made of a same material. The initialization signal line IN and the second storage electrode 232 of the capacitor C that are disposed in a same layer and made of a same material are provided on a side, away from the base 10, of the gate line G. the first conductive pattern 31, the second conductive pattern 32, the third conductive pattern 33, the fourth conductive pattern 34, and the fifth conductive pattern 35 that are disposed in a same layer and made of a same material are provided on a side, away from the base 10, of the second storage electrode 232 of the capacitor C. The data line D, the first power supply voltage line VDD and the sixth conductive pattern 36 that are disposed in a same layer and made of a same material are provided on a side, away from the base 10, of the first conductive pattern 31. the first electrode of the light-emitting device L is provided on a side, away from the base, of the sixth conductive pattern 36.

A material of each active pattern may be a semiconductor material. The gate line G, the gate 211 of the driving transistor DT, the reset signal line RE, the light-emitting control line E, the initialization signal line IN, the second electrode 232 of the capacitor C, the first conductive pattern 31, the second conductive pattern 32, the third conductive pattern 33, the fourth conductive pattern 34, the fifth conductive pattern 35, the data line D, the first power supply voltage line VDD, the sixth conductive pattern 36, and the first electrode of the light-emitting device L may all be made of a metal material. In this case, the driving backplane adopts a five-layer metal process to route the pixel driving circuit. In this way, it may be possible to avoid a problem of greater restrictions on the spatial layout of sub-pixels in display panels with a high PPI (Pixels Per Inch; e.g., greater than 500 PPI).

In the embodiments of the present disclosure, as shown in FIG. 34, the display panel further includes a plurality of light-emitting devices L. The light-emitting device L is provided in each of the plurality of sub-pixel regions on the driving backplane, and is electrically connected to the pixel driving circuit. The pixel driving circuit drives the light-emitting device L to operate. The light-emitting device L is also electrically connected to a second power supply voltage line VSS.

For example, the plurality of light-emitting devices L includes a plurality of first color light-emitting devices, a plurality of second color light-emitting devices, and a plurality of third color light-emitting devices. The first color, the second color and the third color are three primary colors (the three primary colors are, for example, red, green and blue).

For example, the light-emitting device L is a micro light-emitting diode (Micro LED), a mini light-emitting diode (Mini LED), or an organic light-emitting diode (OLED).

In some embodiments, as shown in FIG. 33, the display panel further includes a scan driver 11, a light-emitting driver 12, a data driver 13, a timing controller 14 and a plurality of multiplexers 15 disposed in the peripheral region S. Each of the plurality of multiplexers 15 corresponds to the pixel driving circuits of sub-pixel regions in a column of the plurality of sub-pixel regions.

The scan driver 11 is electrically connected to a plurality of gate lines G and the timing controller 40. For example, as shown in FIG. 33, the display panel has n rows of sub-pixel regions. All gate lines, from the gate line G(1) that is electrically connected to the pixel driving circuits of sub-pixel regions in the first row to a gate line G(n) that is electrically connected to the pixel driving circuits of sub-pixel regions in the n-th row, are electrically connected to the scan driver 11.

The light-emitting driver 12 is electrically connected to the light-emitting control lines E and the timing controller 14. For example, as shown in FIG. 33, the display panel has n rows of sub-pixel regions. All light-emitting control lines, from a light-emitting control line E(1) that is electrically connected to the pixel driving circuits of sub-pixel regions in the first row to a light-emitting control line E(n) that is electrically connected to the pixel driving circuits of sub-pixel regions in the n-th row, are electrically connected to the light-emitting driver 12.

The data driver 13 is electrically connected to the multiplexers 15 and the timing controller 14.

For example, as shown in FIG. 33, the display panel has m columns of sub-pixel regions, and correspondingly, the number of the multiplexers 15 is m. Each multiplexer 15 is electrically connected to the data driver 13 through a data cable, and the number of the data cables is m. Specifically, a multiplexer 15 corresponding to sub-pixel regions in a first column is electrically connected to the data driver 13 through a data cable D(1); a multiplexer 15 corresponding to sub-pixel regions in a second column is electrically connected to the data driver 13 through a data cable D(2); . . . ; and a multiplexer 15 corresponding to sub-pixel regions in a m-th column is electrically connected to the data driver 13 through a data cable D(m).

Each of the plurality of multiplexers 15 is also electrically connected to the timing controller 14 and two data lines that are electrically connected to pixel driving circuits of sub-pixel regions in a same column corresponding to each of the plurality of multiplexers 15.

In some embodiments, the pixel driving circuits of the sub-pixel regions in the same column are electrically connected to two data lines. Wherein, one of the two data lines is electrically connected to pixel driving circuits of sub-pixel regions in odd rows, and the other of the two data lines is electrically connected to pixel driving circuits of sub-pixel regions in even rows.

For example, in sub-pixel regions in a column, the pixel driving circuits of sub-pixel regions in the odd rows are electrically connected to a multiplexer 15 corresponding to the sub-pixel regions in this column through a data line, and the pixel driving circuits of sub-pixel regions in the even rows are electrically connected to the multiplexer 15 corresponding to the sub-pixel regions in this column through the other data line.

For example, as shown in FIG. 33, in sub-pixel regions in the first column, the pixel driving circuits of sub-pixel regions in the odd rows are electrically connected to the multiplexer 15 corresponding to the sub-pixel regions in the first column through a data line D(o1), and the pixel driving circuits of sub-pixel regions in the even rows are electrically connected to the multiplexer 15 corresponding to the sub-pixel regions in the first column through a data line D(e1); in sub-pixel regions in the second column, the pixel driving circuits of sub-pixel regions in the odd rows are electrically connected to a multiplexer 15 corresponding to the sub-pixel regions in the second column through a data line D(o2), and the pixel driving circuits of sub-pixel regions in the even rows are electrically connected to the multiplexer 15 corresponding to the sub-pixel regions in the second column through a data line D(e2); . . . ; and in the sub-pixel regions in the m-th column, the pixel driving circuits of sub-pixel regions in the odd rows are electrically connected to the multiplexer 15 corresponding to the sub-pixel regions in the m-th column through a data line D(om), and the pixel driving circuits of sub-pixel regions in the even rows are electrically connected to the multiplexer 15 corresponding to the sub-pixel regions in the m-th column through a data line D(em).

The scan driver 11 is configured to output gate scan signals to the plurality of gate lines G one by one in response to a signal received from the timing controller 14.

For example, the display panel has n rows of sub-pixel regions, and the scan driver 11 sequentially outputs gate scan signals one by one from the first gate line G(1) to the n-th gate line G(n) in response to the signal received from the timing controller 14.

The light-emitting driver 12 is configured to output light-emitting control signals to the light-emitting control lines E one by one in response to the signal received from the timing controller 14.

For example, the display panel has n rows of sub-pixel regions, and the light-emitting driver 12 sequentially outputs light-emitting control signals one by one from the first light-emitting control line E(1) to the n-th light-emitting control line E(n) in response to the signal received from the timing controller 14.

The data driver 13 is configured to output data signals to the plurality of multiplexers 15 in response to the signal received from the timing controller 14.

Each of the plurality of multiplexers 15 is configured to transmit a data signal from the data driver 13 to one of the two data lines and the other of the two data lines in different time periods in response to the signal received from the timing controller 14.

For example, as for sub-pixel regions in the m-th column, if data is to be written into sub-pixel regions in the odd rows, the multiplexer 15 transmits the data signal from the data driver 13 to the data line D(om) in response to the signal received from the timing controller 14, so that the data is written into the sub-pixel regions in the odd rows that are electrically connected to the data line D(om); and if data is to be written into the sub-pixel regions in the even rows, the multiplexer 15 transmits the data signal from the data driver 13 to another data line D(em) in response to the signal received from the timing controller 14, so that the data is written into the sub-pixel regions in the even rows that are electrically connected to the data line D(em).

In some embodiments of the present disclosure, as shown in FIG. 33, each multiplexer 15 includes a first transistor M1 and a second transistor M2. A gate of the first transistor M1 is electrically connected to the timing controller 14, a first electrode of the first transistor M1 is electrically connected to the multiplexer 15, and a second electrode of the first transistor M1 is electrically connected to one of the two data lines; a gate of the second transistor M2 is electrically connected to the timing controller 14, a first electrode of the second transistor M2 is electrically connected to the multiplexer 15, and a second electrode of the second transistor M2 is electrically connected to another of the two data lines.

For example, as for sub-pixel regions in the m-th column, the second electrode of the first transistor M1 is electrically connected to the data line D(om), and the data line D(om) is electrically connected to sub-pixel regions in the odd rows of sub-pixel regions in the m-th column; the second electrode of the second transistor M2 is electrically connected to the data line D(em), and the data line D(em) is electrically connected to sub-pixel regions in the even rows of sub-pixel regions in the m-th column. If data is to be written into sub-pixel regions in the odd rows, under the control of the timing controller 14, the first transistor M1 is turned on, the second transistor M2 is turned off, and the data signal from the data driver 13 is transmitted into the data line D(om) through the first transistor M1, so that the data is written into sub-pixel regions in the odd rows; and if data is to be written into sub-pixel regions in the even rows, under the control of the timing controller 14, the second transistor M2 is turned on, the first transistor M1 is turned off, and the data signal from the data driver 13 is transmitted into the other data line D(em) through the second transistor M2, so that the data is written into sub-pixels regions in the even rows of sub-pixel regions in the m-th column.

The embodiments of the present disclosure are not limited thereto, and those skilled in the art can set the number of the scan drivers 11, the light-emitting drivers 12, the data drivers 13, and the timing controllers 14 according to a resolution of the display panel. For example, two scan drivers 11 are provided on both sides of the peripheral region S, and the two scan drivers 11 are positioned opposite to each other. The two scan drivers 11 are both electrically connected to each gate line G, and work synchronously. Correspondingly, two light-emitting drivers 12 are provided on both sides of the peripheral region S, and the two light-emitting drivers 12 are positioned opposite to each other. The two light-emitting drivers 12 are both electrically connected to each light-emitting control line E, and work synchronously. Further, two timing controllers 14 are provided, one timing controller 14 is electrically connected to a scan driver 11 and a light-emitting driver 12 that are located on one side of the peripheral region S, and the other timing controller 14 is electrically connected to a scan driver 11 and a light-emitting driver 12 that are located on the other side of the peripheral region S. The two timing controllers 14 are electrically connected and work synchronously. Further, the multiplexer 15 may also be electrically connected to the two timing controllers 14. For the sake of clarity, the thickness and size of layers or microstructures are exaggerated in the drawings used to describe the embodiments of the present application. It may be understood that when an element such as a layer, film, region or substrate is referred to as being "on" or "under" another element, the element may be "directly" "on" or "under" the another element, or there may be an intervening element.

Although implementations disclosed in the present application are as the above, the described contents are only implementations used for facilitating understanding the present application, and are not used to limit the present invention. Any person skilled in the art to which the present invention pertains can make any modifications and variations in the form and details of implementation without departing from the spirit and scope disclosed in the present invention. Nevertheless, the scope of patent protection of the present invention shall still be subject to the scope defined by the appended claims.

I claim:

1. A display substrate, comprising:

a plurality of gate lines, a plurality of data lines, a plurality of power lines and a plurality of sub-pixels arranged on a base substrate, wherein:

at least one sub-pixel of the plurality of sub-pixels comprises a light-emitting device and a driving circuit configured to drive the light-emitting device to emit light, and the driving circuit comprises a plurality of transistors and a storage capacitor;

in a plane perpendicular to the display substrate, the base substrate and a plurality of functional layers are arranged on the base substrate;

the plurality of functional layers comprises a semiconductor layer, a first conductive layer, a second conductive layer, a third conductive layer and a fourth conductive layer which are sequentially arranged;

a first insulating layer, a second insulating layer, a third insulating layer and a fourth insulating layer are respectively arranged between the plurality of functional layers;

in an extension direction of the gate lines, the power lines are connected with each other through at least one functional layer of the plurality of functional layers;

in an extension direction of the data lines, the power lines comprise a plurality of sub-power lines connected sequentially, and at least one sub-power line is arranged in one sub-pixel;

a sub-power line of at least one sub-pixel comprises a plurality of power supply parts connected sequentially, and there is an included angle of greater than 90 degrees and smaller than 180 degrees between at least one power supply part and a power supply part connected with the at least one power supply part; and one power supply part of the at least one power supply part and the power supply part connected with the at least one power supply part is arranged in parallel with the data lines.

2. The display substrate according to claim 1, wherein the sub-power line comprises a first power supply part, a second power supply part and a third power supply part; and the second power supply part is configured to connect the first power supply part and the third power supply part, the first power supply part and the third power supply part are arranged in parallel with the data lines, an included angle between the second power supply part and the first power supply part is greater than 90 degrees and smaller than 180 degrees, and an included angle between the second power supply part and the third power supply part is greater than 90 degrees and smaller than 180 degrees.

3. The display substrate according to claim 2, wherein the first power supply part is connected with a third power supply part in a sub-pixel located in a previous row in a same column, and the third power supply part is connected with a first power supply part in a sub-pixel located in a next row in the same column.

4. The display substrate according to claim 3, wherein an extension length of the first power supply part in the extension direction of the data lines is greater than an average width of the first power supply parts, an extension length of the second power supply part in an oblique direction is greater than an average width of the second power supply parts, and an extension length of the third power supply part in the extension direction of the data lines is greater than an average width of the third power supply parts; and the oblique direction is a direction in which the second power supply part and the first power supply part have the included angle therebetween.

5. The display substrate according to claim 4, wherein the average width of the third power supply parts is smaller than the average width of the first power supply parts.

6. The display substrate according to claim 5, wherein an average distance between an edge of the first power supply part close to a side of the third power supply part in the extension direction of the gate lines and an edge of the third power supply part close to a side of the first power supply part in the extension direction of the gate lines is equivalent to the average width of the third power supply parts.

7. The display substrate according to claim 6, wherein the display substrate further comprises a first connection part, a second electrode of a storage capacitor in at least one sub-pixel and a second electrode of a storage capacitor in an adjacent sub-pixel in the extension direction of the gate lines are connected with each other through the first connection part; and in at least one sub-pixel, there is an overlapping area between an orthographic projection of the second power supply part on the base substrate and an orthographic projection of the second electrode of the storage capacitor on the base substrate, or there is an overlapping area between an orthographic projection of the second power supply part on the base substrate and an orthographic projection of the first connection part on the base substrate.

8. The display substrate according to claim 7, wherein there is an overlapping area between the orthographic projection of the second power supply part on the base substrate and an orthographic projection of a first electrode or second electrode of the storage capacitor on the base substrate.

9. The display substrate according to claim 8, wherein there is an overlapping area between the orthographic projection of the second power supply part on the base substrate and an orthographic projection of the gate lines on the base substrate.

10. The display substrate according to claim 9, wherein the plurality of transistors comprise a second transistor, and there is an overlapping area between an orthographic projection of the first power supply part on the base substrate and an orthographic projection of the second transistor on the base substrate.

11. The display substrate according to claim 10, wherein the display substrate further comprises a fifth insulating layer arranged on the fourth conductive layer and a fifth conductive layer arranged on the fifth insulating layer, the fifth insulating layer is provided with a fifth via configured to connect the fifth conductive layer with the fourth conductive layer, and there is no overlapping area between an orthographic projection of the fifth via on the base substrate and an orthographic projection of the sub-power line on the base substrate.

12. The display substrate according to claim 11, wherein in at least one sub-pixel, there is an overlapping area between an orthographic projection of the fifth via on the base substrate and an orthographic projection of a virtual extension line of the first power supply part in the sub-power line in the extension direction of the data lines on the base substrate.

13. The display substrate according to claim 12, wherein the first insulating layer, the second insulating layer and the third insulating layer are provided with an eighth via configured to enable the data line to write a data signal to the semiconductor layer, and there is no overlapping area between an orthographic projection of the eighth via on the base substrate and orthographic projections of the first power supply part and the second power supply part in the sub-power line on the base substrate.

14. The display substrate according to claim 13, wherein in at least one sub-pixel, there is an overlapping area between the orthographic projection of the eighth via on the base substrate and an orthographic projection of a virtual extension line of the third power supply part in the sub-power line in the extension direction of the data lines on the base substrate.

15. The display substrate according to claim 14, wherein the power lines are arranged on the third conductive layer or on the fourth conductive layer, and the power lines are arranged on a same layer as the data lines.

16. The display substrate according to claim 15, wherein the power lines are arranged on the third conductive layer and the data lines are arranged on the fourth conductive layer, or the data lines are arranged on the third conductive layer and the power lines are arranged on the fourth conductive layer.

17. The display substrate according to claim 16, wherein the display substrate further comprises a first connection part, and a second electrode of a storage capacitor in at least one sub-pixel and a second electrode of a storage capacitor in an adjacent sub-pixel in the extension direction of the gate lines are connected with each other through the first connection part.

18. A display apparatus, comprising the display substrate according to claim 1.

* * * * *